(12) United States Patent
Schmidt

(10) Patent No.: US 6,747,580 B1
(45) Date of Patent: Jun. 8, 2004

(54) METHOD AND APPARATUS FOR ENCODING OR DECODING DATA IN ACCORDANCE WITH AN NB/(N+1)B BLOCK CODE, AND METHOD FOR DETERMINING SUCH A BLOCK CODE

(75) Inventor: Brian K. Schmidt, Mountain View, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 10/459,992

(22) Filed: Jun. 12, 2003

(51) Int. Cl.$^7$ ................................................ H03M 7/00
(52) U.S. Cl. .................................... 341/50; 341/106
(58) Field of Search ....................... 341/50, 67, 65, 341/101, 59, 106

(56) References Cited

U.S. PATENT DOCUMENTS

| | | | |
|---|---|---|---|
| 4,486,739 A | 12/1984 | Franaszek et al. | 340/347 |
| 5,144,304 A | 9/1992 | McMahon et al. | 341/58 |
| 5,740,186 A | 4/1998 | Widmer | 371/37.1 |
| 6,198,413 B1 | 3/2001 | Widmer | 341/59 |
| 6,362,757 B1 * | 3/2002 | Lee et al. | 341/102 |
| 6,587,057 B2 * | 7/2003 | Scheuermann | 341/67 |

OTHER PUBLICATIONS

Widmer, Albert X., "*Partitioned DC–Balanced (0,6) 16B/18B Transmission Code*", downloaded from the Internet on Dec. 16, 2002 from http://www.grouper.ieee.org/groups/802/3/10G$_{13}$study/public/july99/widmer_2_0799.pdf, cover sheet and pp. 1–8.

* cited by examiner

*Primary Examiner*—Brian Young
(74) *Attorney, Agent, or Firm*—Girard & Equitz LLP

(57) ABSTRACT

A method and apparatus for encoding or decoding data in accordance with an NB/(N+1)B block code, and a method for determining codebooks for use in such encoding or decoding. Some such methods select positive and negative codebooks that are complements of each other, including by eliminating all candidate code words having negative disparity and filtering the remaining candidate code words in automated fashion based on predetermined spectral properties to select a subset of the candidate code words as the code words of the positive codebook. Preferably, all but a small subset of the (N+1)-bit code words (determined by a primary mapping) can be decoded by simple logic circuitry, and the remaining code words (determined by a secondary mapping) can be decoded by other logic circuitry or table lookup.

93 Claims, 4 Drawing Sheets

METHOD AND APPARATUS FOR ENCODING OR DECODING DATA IN ACCORDANCE WITH AN NB/(N+1)B BLOCK CODE, AND METHOD FOR DETERMINING SUCH A BLOCK CODE

TECHNICAL FIELD OF THE INVENTION

The invention pertains to methods and apparatus for encoding data in accordance with an NB/(N+1)B block code for transmission and to methods and apparatus for decoding the encoded data. The invention is particularly useful in communication environments in which the spectrum of the transmitted signal is significantly constrained, e.g., in high-speed, wired data transmission systems which require the spectrum of the transmitted signal to be restricted to as a narrow a band of high frequencies as possible, and to be free of a DC component.

BACKGROUND OF THE INVENTION

Throughout the disclosure, including in the claims, the notation "nB/mB" code (or "n-bit-to-m-bit" code) is used to denote a block code in which n-bit symbols (input words) are encoded as m-bit code words, where m>n. For example, in a class of well-known conventional block codes are 8B/10B codes in wich 8-bit input words are encoded as 10-bit code words.

Throughout the disclosure, including in the claims, the term "symbol" is used synonymously and interchangeably with the expression "input word."

Throughout the disclosure, including in the claims, the expression "table lookup" denotes a mapping operation that is implemented in any manner (not necessarily by searching a ROM or CAM type memory for an output value in response to an input value). For example, table lookup can be implemented using a memory-based lookup table or a logic-based lookup table, as a complex logic function (that performs the equivalent of a memory-based table lookup), as a logic truth table/Karnaugh map, or in any other suitable manner.

A digital communication channel imposes restrictions on the nature of the data it can carry. For example, during serial data transmission (transmission of a signal indicative of a bit sequence), sufficient transitions must be present to enable accurate clock and data recovery at the receiver, the DC component of the transmitted signal should be eliminated to prevent baseline wander, and the pass band frequency range should be minimized to reduce design complexity. To meet these requirements, conventional high-speed serial communication often transmits data that have been encoded using a conventional 8B/10B block code (e.g., the conventional code, sometimes referred to as the "IBM" 8B/10B code, described in U.S. Pat. No. 4,486,739, issued on Dec. 4, 1984). The IBM 8B/10B block code is DC-free, guarantees 3 transitions per code word, and ensures that the maximum run without a transition is 4 bits. However, an 8B/10B block code provides low channel utilization (only 80% of the channel capacity is available for application use). Communication protocols layered above this channel code further reduce channel capacity for carrying useful data.

To encode data using a block code, a sequence of user data bits is encoded as a larger number of bits according to a predetermined table or function. The added bits of overhead preferably ensure a high transition density to facilitate clock/data recovery, and accomplish DC balancing to maintain running disparity near zero, which enables the use of AC-coupling. Since the code space is larger than the data space, a modest error detection capability is also afforded.

Various serial links for transmitting data and clock signals are well known. One conventional serial link, used primarily for high-speed transmission of video data from a host processor (e.g., a personal computer) to a monitor, is known as a transition minimized differential signaling interface ("TMDS" link). The characteristics of a TMDS link include the following:

1. video data are encoded using an 8B/10B block code and transmitted as encoded words (each 8-bit word of digital video data is converted to an encoded 10-bit word before transmission):
    a. the encoding determines a set of "in-band" words and a set of "out-of-band" words (the encoder can generate only "in-band " words in response to video data, although it can generate "out-of-band" words in response to control or sync signals. Each in-band word is an encoded word resulting from encoding of one input video data word. All words transmitted over the link that are not in-band words are "out-of-band" words);
    b. the encoding of video data is performed such that the in-band words are transition minimized (a sequence of in-band words has a reduced or minimized number of transitions);
    c. the encoding of video data is performed such that the in-band words are DC balanced (the encoding prevents each transmitted voltage waveform that is employed to transmit a sequence of in-band words from deviating by more than a predetermined threshold value from a reference potential. Specifically, the tenth bit of each "in-band" word indicates whether eight of the other nine bits thereof have been inverted during the encoding process to correct for an imbalance between running counts of ones and zeroes in the stream of previously encoded data bits);
2. the encoded video data and a video clock signal are transmitted as differential signals (the video clock and encoded video data are transmitted as differential signals over conductor pairs);
3. three conductor pairs are employed to transmit the encoded video, and a fourth conductor pair is employed to transmit the video clock signal; and
4. signal transmission occurs in one direction, from a transmitter (typically associated with a desktop or portable computer, or other host) to a receiver (typically an element of a monitor or other display device).

A use of the TMDS serial link is the "Digital Visual Interface" interface ("DVI" link) adopted by the Digital Display Working Group. A DVI link can be implemented to include two TMDS links (which share a common conductor pair for transmitting a video clock signal) or one TMDS link, as well as additional control lines between the transmitter and receiver.

A typical DVI link includes a transmitter, a receiver, and a cable comprising conductors connected between the transmitter and receiver. The conductors include a conductor pair for transmitting serialized data over one channel (Channel 0) from an encoder (in the transmitter) to a decoder (in the receiver), a conductor pair for transmitting serialized data over another channel (Channel 1) from another encoder in the transmitter to another decoder in the receiver, a conductor pair for transmitting serialized data over another channel (Channel 2) from a third encoder in the transmitter to third decoder in the receiver, and a conductor pair for transmitting a video clock over a fourth channel (Channel C) from the transmitter to the receiver. The conductors also include wires for a Display Data Channel ("DDC") channel (which can be used for bidirectional I2C communication between the transmitter and receiver), a Hot Plug Detect (HPD) line (on which a monitor associated with the receiver transmits a signal that enables a processor associated with the transmitter to identify the monitor's presence), "Analog" lines for analog video transmission from the transmitter to the receiver, and "Power" lines for provision of power from the transmitter to the receiver.

Each encoder in the transmitter encodes the data to be transmitted over one of Channels 0, 1, and 2, and serializes the encoded bits to be transmitted over the relevant channel. Each encoder responds to a control signal (an active high binary control signal referred to as a "data enable" or "DE" signal) by selectively encoding either digital video words (in response to DE having a high value) or a control or synchronization signal pair (in response to DE having a low value). Each of the encoders receives a different pair of control or synchronization signals: a first encoder receives horizontal and vertical synchronization signals (HSYNC and VSYNC); a second encoder receives control bits CTL0 and CTL1; and a third encoder receives control bits CTL2 and CTL3. Thus, each encoder generates in-band words indicative of video data (in response to DE having a high value), the first encoder generates out-of-band words indicative of the values of HSYNC and VSYN having a low value), the second encoder generates out-of-band words indicative of the values of CTL0 and CTL1 (in response to DE having a low value), and the third encoder generates out-of-band words indicative of the values of CTL2 and CTL3 (in response to DE having a low value). In response to DE having a low value, each of the second and third encoders generates one of four specific out-of-band words indicative of the values 00, 01, 10, or 11, respectively, of control bits CTL0 and CTL1 (or CTL2 and CTL3).

Another serial link is the "High Definition Multimedia Interface" interface ("HDMI" link) developed by Silicon Image, Inc., Matsushita Electric, Royal Philips Electronics, Sony Corporation, Thomson Multimedia, Toshiba Corporation, and Hitachi. It has been proposed to transmit encrypted video and audio data over an HDMI link.

Another serial link (sometimes referred to as a "SATA" link) complies with the standard known as Serial ATA, Revision 1.0, adopted on Aug. 29, 2001, by the Serial ATA Working Group, for communication between a host and storage device. A host can be coupled to each of one or more storage devices, with a SATA link between the host and each storage device.

Other serial links differ from TMDS links by encoding data as N-bit code words that are not 10-bit TMDS code words, or by transmitting encoded video over more than three or less than three conductor pairs, or in other ways.

The term "transmitter" is used herein in a broad sense to denote any device capable of encoding data and transmitting the encoded data over a serial link (and optionally also performing additional functions, which can include encrypting the data to be transmitted and other operations related to encoding, transmission, or encryption of the data). The term "receiver" is used herein in a broad sense to denote any device capable of receiving and decoding data that has been transmitted over a serial link (and optionally also performing additional functions, which can include decrypting the received data and other operations related to decoding, reception, or decryption of the received data). For example, the term transmitter can denote a transceiver that performs the functions of a receiver as well as the functions of a transmitter. For another example, in a system including two transceivers which communicate via a serial link, each transceiver can be both a receiver and a transmitter.

The data transmitted between the transmitter and receiver of a serial link can, but need not, be transmitted differentially (over a pair of conductors). Also, although a TMDS link has four differential pairs (in the single pixel version), three for video data and the other for a video clock, other serial links include a different number of conductors or conductor pairs.

Typically, the primary data transmitted by a TMDS link are video data. What is often significant about this is that the video data are not continuous, and instead have blanking intervals. These blanking intervals provide an opportunity for auxiliary data to be transported, and they represent unused bandwidth. However, many serial links do not transmit data having blanking intervals, and thus do not encode input data (for transmission) in response to a data enable signal. For example, audio serial links would typically transmit continuous data.

The term "stream" of data, as used herein, denotes that all the data are of the same type and are transmitted with the same clock frequency. The term "channel," as used herein, refers to a portion of a serial link that is employed to transmit data serially (e.g., a particular conductor or conductor pair between the transmitter and receiver over which the data are transmitted serially, and specific circuitry within the transmitter and/or receiver used for transmitting and/or recovery of the data) and to the technique employed to transmit the data over the link.

It is known to encode input words in accordance with an NB/(N+1)B block code, and to transmit the resulting (N+1)-bit code words over a serial link. For example, U.S. Pat. No. 6,198,413, issued on Mar. 6, 2001, teaches use of a 7B/8B block code with a 9B/10B block code, with concatenation of the resulting 8 and 10 bit code words to implement 16B/18B encoding. U.S. Pat. No. 6,198,413 suggests (at col. 10, line 51 to col. 11, line 22) generation of some of the code words by logic circuitry (e.g., circuitry that appends a zero or one to a 9-bit input word to generate a 10-bit code word), but that table lookup may need to be used to generate other ones of the code words where logic circuitry for doing so cannot readily be implemented. It also suggests (at col. 11, lines 25–30) use of two sets of logic circuitry for encoding (e.g., logic circuitry for appending a zero or one to some 9-bit input words to generate 10-bit code words, and other logic circuitry which inverts some bits of other 9-bit input words and performs some other logical operation on each resulting 9-bit word to generate a 10-bit code word). It also teaches (e.g., with reference to XOR gates 4008 and 4010 of FIG. 4) an encoding method in which two different codebooks are used to encode each input word of an input word sequence, and a code word is chosen from one codebook (rather than the other) to encode each input word such that the chosen code word will not increase running disparity (and will thus tend to promote DC balance) of a code word sequence indicative of the input word sequence.

However, U.S. Pat. No. 6,198,413 does not teach an automated, robust method for choosing an NB/(N+1)B code, or a method for choosing an NB/(N+1)B code so that table lookup is used only rarely (if ever) during encoding of an input word sequence.

SUMMARY OF THE INVENTION

In preferred embodiments, the invention is a method and apparatus for encoding N-bit input words using a block code to generate (n+1)bit code words. Preferably, "N" is an odd integer (e.g., N=7 or N=9). In some preferred embodiments, (N+M)-bit input words are encoded to generate (N+N+2)-bit code word, using a first block code to encode an N-bit fragment of each input word as an (N+1)-bit code word, using a second block code to encode the remaining M bits of the input word as an (M+1)-bit code word, and concatenating the (N+1)-bit code word with the (M+1)-bit code word. Preferably, "N" and "M" are odd integers.

Block coding in accordance with the invention can provide spectral properties similar to those provided by conventional 8B/10B coding while reducing the channel coding overhead (e.g., to about 10% for a 9B/10B code from about 20% for a conventional 8B/10B code). This provides greater channel capacity for application use, thereby increasing the effective bandwidth of the communication link. Alternatively, the savings from the reduced overhead is redeployed (e.g., by transmitting control bits and/or special characters with the encoded data) to create an enhanced physical and link layer that provides higher level communication protocol functionality (communication protocol functionality at at least one level higher than the link level).

To implement preferred embodiments of the invention, the N most desirable (N+1)-bit code words having disparity greater than or equal to zero (i.e., the N most desirable code words that have more ones than zeros, or an equal number of ones and zeros) are selected to determine a "positive" codebook (each N-bit input word is mapped to one of the code words in the positive codebook). A "negative" codebook, including the complement of each code word in the positive codebook, is also determined. Each code word in the negative codebook has disparity less than or equal to zero, and each of the N-bit input words is mapped to one of the code words in the negative codebook. The code words are chosen so that, for most input words, a simple systematic mapping to an (N+1)-bit code word in the positive codebook exists and can be implemented by simple logic circuitry (e.g., to force a transition with the added bit). During encoding, the other N-bit input words (typically only a small subset of the full set of N-bit symbols) can be replaced by code words of the positive codebook via table lookup. The resulting code words from the positive codebook are then replaced by their complements (members of the negative codebook) as necessary to maintain DC balancing.

When using positive and negative codebooks in which each code word has an even number of bits, code words of neutral disparity (disparity equal to zero) can occur in both codebooks. If each code word has an odd number of bits, each codebook would include only code words with strictly positive (or strictly negative) disparity. In the latter case, the codebooks would be forced to contain disjoint halves of the code space and the spectrum could not be deterministically controlled. Thus, in preferred implementations of NB/(N+1)B coding in accordance with the invention, N is an odd number. However, such codes do not have good affinity with 8-bit data that is typically used in computer systems. If this issue increases the implementation complexity beyond a reasonable measure, two such codes can be used together to form less dense code spaces that possess better alignment with 8-bit data. For example, 9B/10B and 7B/8B codes can be used together to form a 16B/18B code, by concatenating 8-bit and 10-bit code words generated in accordance with the 9B/10B and 7B/8B codes to generate 18-bit code words.

Preferred embodiments of the invention take advantage of the typical case that most of the N-bit input words exhibit the desired spectral properties by implementing a simple, systematic mapping of each such input word to an (N+1)-bit code word (preferably using simple logic circuitry). The input words that do not exhibit desired spectral properties are mapped to code words with more complex functions or via a simple table.

In preferred embodiments, the invention is a method for selecting positive and negative codebooks that are complements of each other that includes the following steps. Selection of the positive codebook begins by eliminating all candidate code words having negative disparity. The remaining candidate code words are then filtered, preferably in automated fashion (e.g., by a programmed computer) based on predetermined spectral properties to select a subset of the candidate code words that determines the positive codebook. For example, simple filters eliminate each of the candidate code words having transition density below a predetermined transition density, each of the candidate code words having disparity greater than a predetermined disparity, and each of the candidate code words having a transition-free run of length that exceeds a predetermined maximum run length. Spectral analysis of the code space can be used to rank the potential code words and select only those above a particular threshold for inclusion in the codebook. For example, code words with runs greater than 5, transition density less than 30%, or disparity greater than 4 can be eliminated. The code words of the positive codebook are then selected from the remaining candidate code words to determine a bijective (injective, in the sense that when $f(x_1)=f(x_2)$, it is true that $x_1=x_2$, and positive codebook. For each input symbol, the code word in the negative codebook is then identified as the complement of the code word in the positive codebook for the input symbol.

In variations, the positive and negative codebooks are not strictly complements of each other. For example, in some embodiments, the code words of the negative codebook having nonzero disparity are complements of corresponding code words of the positive codebook, but the code words of the negative codebook that have zero disparity are identical to (they are not complements of) corresponding code words of the positive codebook.

In preferred embodiments, a mapping is defined from input words to a "positive" codebook containing only code words of neutral or positive disparity, and the mapping of each code word of the positive codebook to a code word of a corresponding "negative" codebook is determined simply by complementing the former code word to generate the latter code word. Alternatively, the mapping of each code word (having nonzero disparity) of the positive codebook to a code word of a corresponding "negative" codebook is determined by complementing the former code word to generate the latter code word, and each code word (having zero disparity) of the positive codebook is identical to a corresponding code word of the "negative" codebook. Ideally, for each codebook, a mapping function from the input words to the code words (of the codebook) is found that is bijective and simple to implement using logic circuitry. However, even if such an ideal mapping function cannot be found, a simple mapping function can typically be identified that covers a large subset of the input symbol space, and the remaining input symbols are handled as special cases (e.g., special input symbols for which encoding must be accomplished using look up tables).

Preferred embodiments in which most input words meet the desired spectral constraints employ a straightforward mapping that systematically concatenates a bit of predetermined value (e.g. a zero bit) with (e.g., prepends or appends the bit to) each input word to form a code word, or systematically inserts a bit of predetermined value (e.g. a zero bit) in a predetermined position among the bits of each input word to form a code word. Possibilities for such mapping functions include inserting a bit so that symbol disparity becomes more positive (and complementing the resulting code word if its disparity is negative) and inserting a bit so that symbol disparity approaches zero (complementing the resulting code word if its disparity is negative). Many other mappings are also possible. The selection of a mapping depends on its symbol coverage and implementation complexity. For small code spaces, the exemplary mappings set forth in this paragraph can provide coverage of roughly 80% of the input words, while requiring only simple logic circuitry to implement.

The input words for which a straightforward mapping (implementable by simple logic circuitry) fails will typically significantly violate the spectral constraints (e.g., they will have very low transition density). These symbols can be subjected to a secondary mapping technique that applies a more complex function. For example, the secondary mapping could perform alternate bit inversion for symbols with low transition density, complementing the resulting code word if its disparity is negative. The implementation cost of the secondary mapping must be weighed against the cost of simply handling all the unmapped symbols as special cases, using a simple implementation structure such as a lookup table.

When the secondary mapping is accomplished by table lookup, the mapping can be arbitrarily complex. This gives greater flexibility to the mapping process. For example, code words can be selected so as to minimize the magnification of bit errors in the encoded data stream.

In a class of embodiments, the invention is a communication system including two endpoints (e.g., a transmitter and receiver or two transceivers) and a serial link (having at least one channel) between the endpoints, at least one of the endpoints is configured to generate encoded data by encoding input words in accordance with a line code and to transmit the resulting code words over each of one or more channels of the link to the other endpoint, and the line code specifies an NB/(N+1)B block code for encoding the input words. Typically, the line code also specifies special characters that are distinguishable from bit sequences of the transmitted code words. Another aspect of the invention is an endpoint device (i.e., a transmitter, receiver, or transceiver) configured to generate encoded data in accordance with a line code (where the line code specifies an NB/(N+1)B block code for encoding input words, and typically also specifies special characters) and to transmit the encoded data over a serial link, and/or to receive and decode such encoded data after the encoded data have propagated over a serial link.

Other aspects of the invention are methods for generating encoded data in accordance with a line code (where the line code specifics an NB/(N+1)B block code for encoding input words, and typically also specifies special characters), methods for decoding such encoded data, and methods for determining a set of code words (e.g., positive and negative codebooks) for implementing such a block code.

DETAILED DESCRIPTION OF THE PREFERRED EMBODIMENTS

Figure 1:
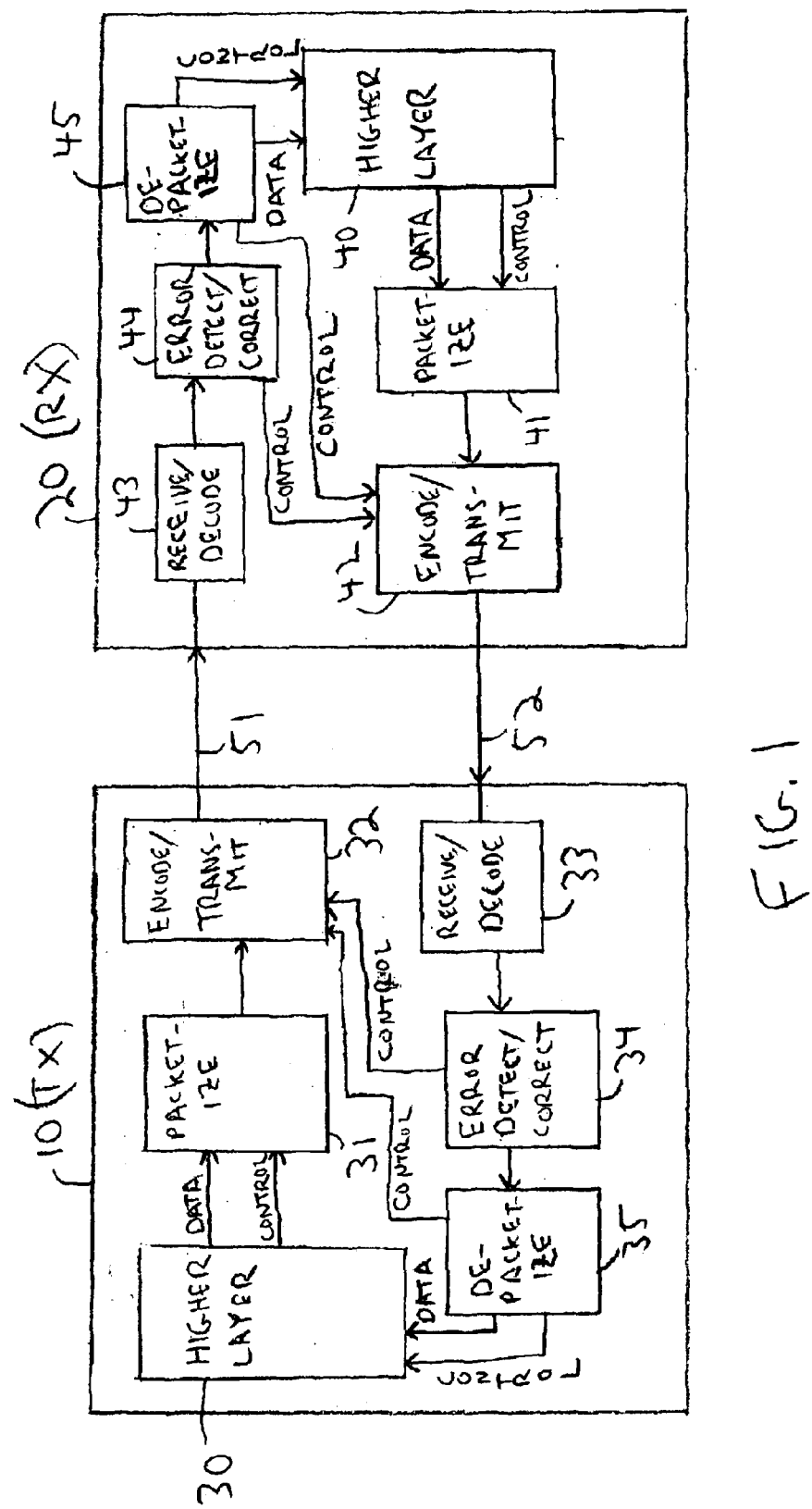
FIG. 1 is a block diagram of an embodiment of the inventive system.

In preferred embodiments, the invention is a method and apparatus for encoding N-bit input words using a block code to generate (N+1)-bit code words. Preferably, "N" is an odd integer (e.g., N=7 or N=9).

Preferred embodiments of the invention take advantage of the typical case that most of the N-bit input words exhibit the desired spectral properties by implementing a simple, systematic mapping of each such input word to an (N+1)-bit code word (preferably using simple logic circuitry). The input words that do not exhibit desired spectral properties are mapped to code words with more complex functions or via a simple table.

To implement preferred embodiments of the invention, the N most desirable (N+1)-bit code words having disparity greater than or equal to zero (i.e., the N most desirable code words that have more ones than zeros, or an equal number of ones and zeros) are selected to determine a "positive" codebook (each N-bit input word is mapped to one of the code words in the positive codebook). A "negative" codebook, including the complement of each code word in the positive codebook, is also determined. Each code word in the negative codebook has disparity less than or equal to zero, and each of the N-bit input words is mapped to one of the code words in the negative codebook. The code words are chosen so that, for most input words, a simple systematic mapping to an (N+1)-bit code word in the positive codebook exists and can be implemented by simple logic circuitry (e.g., to force a transition with the added bit). During encoding, the other N-bit input words (typically only a small subset of the full set of N-bit symbols) can be replaced by code words of the positive codebook via table lookup. The resulting code words from the positive codebook are then replaced by their complements (members of the negative codebook) as necessary to maintain DC balancing.

In variations, the positive and negative codebooks are not strictly complements of each other. For example, in some embodiments, the code words of the negative codebook having nonzero disparity are complements of corresponding code words of the positive codebook, but the code words of the negative codebook that have zero disparity are identical to corresponding code words of the positive codebook. In the embodiments described in the two previous paragraphs, the same code word can belong to both codebooks, and two different input words can map to the same code word (e.g., in the example of 7B/8B encoding shown in Table 3, the input 0000000 maps to "11000011" in the positive codebook and to "00111100" in the negative book, and the input word whose decimal value is "60" maps to "00111100" in the positive book and "11000011" in the negative book). The running disparity value determines which codebook to use in encoding/decoding each value (e.g., in a typical embodiment, the positive codebook is used if the running disparity is negative, and otherwise the negative codebook is used).

One codebook (a "positive" codebook) contains only code words of neutral or positive disparity (i.e., code words containing more 1's than 0's, or an equal number of 1's and 0's), and the other (a "negative" codebook) contains code words of neutral or negative disparity. Symbols are encoded with the codebook that moves the running disparity toward zero (or leaves the running disparity unchanged). When using "positive" and "negative" codebooks, in which each code word has an even number of bits, code words of neutral disparity (disparity equal to zero) can occur in both codebooks. If each code word has an odd number of bits, each codebook would include only code words with strictly positive (or strictly negative) disparity. In the latter case, the codebooks would be forced to contain disjoint halves of the code space and the spectrum could not be deterministically controlled. Thus, in preferred implementations of NB/(N+1)B coding in accordance with the invention, N is an odd number.

Use of two codebooks that are complementary means that if a particular input symbol s maps to code word pcs in the positive disparity codebook and to code word ncs in the negative disparity codebook, then pcs is the bitwise inverse of ncs. This enables circuitry for one codebook (together with code word-inverting logic) to perform encoding/decoding in accordance with both codebooks.

A preferred method for selecting positive and negative codebooks that are complements of each other includes the following steps. Selection of the positive codebook begins by eliminating all candidate code words having negative disparity. The remaining candidate code words are then filtered based on desired spectral properties. For example, simple filters eliminate candidate code words with insufficient transition density, with excessive disparity, or with transition-free runs that widen the pass band too greatly. Spectral analysis of the code space can be used to rank the potential code words and select only those above a particular threshold for inclusion in the codebook. For example, code words with runs greater than 5, transition density less than 30%, or disparity greater than 4 could be eliminated. The code words of the positive codebook are then selected from the remaining candidate code words to create a one-to-one mapping between the symbol space and the positive codebook. For each input symbol, the code word in the negative codebook is then identified as the complement of the code word in the positive codebook for the input symbol.

Another preferred method for selecting positive and negative codebooks includes the following steps. Selection of the positive codebook begins by eliminating all candidate code words having negative disparity. The remaining candidate code words are then filtered based on desired spectral properties. For example, simple filters eliminate candidate code words with insufficient transition density, with excessive disparity, or with transition-free runs that widen the pass band too greatly. Spectral analysis of the code space can be used to rank the potential code words and select only those above a particular threshold for inclusion in the codebook. For example, code words with runs greater than 5, transition density less than 30%, or disparity greater than 4 could be eliminated. The code words of the positive codebook are then selected from the remaining candidate code words to create a one-to-one mapping between the symbol space and the positive codebook. For each input symbol, the code word in the negative codebook is then identified as the complement of the code word in the positive codebook for the input symbol (if the code word in the positive codebook for the symbol has nonzero disparity), or as the code word in the positive codebook for the input symbol (if the code word in the positive codebook for the symbol has zero disparity).

In a class of embodiments, a positive codebook for implementing a target code (e.g. a 9B/10B code) is selected in accordance with the invention as follows. First, guidelines for the desired spectral properties (e.g., minimum transition density and maximum run length) of the encoded data are established. Candidate code spaces are then selected (where "code space" denotes the set of all code words to which a set of input symbols can be mapped) using the guidelines, preferably by searching in automated fashion (e.g., using a programmed computer) through a wide range of possible code spaces. A mapping ("candidate" mapping) from input symbols to code words is determined for each candidate code space, and the candidate mappings are evaluated using a small set of metrics to select at least one "best" code (consisting of a set of input symbols, a positive codebook, and a mapping between each input symbol to a different code word of the positive codebook). For example, in one implementation of the method, the guidelines specify that each code word of a candidate code space must have a minimum transition density of 20% (or 30%), a maximum disparity of 4 (or 6), and a maximum run length of 6 (or 7). In addition, several run length guidelines can be employed, each specifying an allowable pattern of runs in each code word of a candidate code space. For example, the guidelines can specify that a code word be excluded from the code space if there is a run at the left end of the code word of length greater than 3, a run at the right end of the code word of length greater than 3, or a run away from the left and right ends of the code word of length greater than 6 (with the intent to choose code words that can create maximum runs of no more than 6 in any stream of valid code words). However, the same effect could be had by excluding (from the code space) each code word having a run of length greater than 2 on the left (i.e., a run including the most significant bit, and having length greater than 2), a run of length greater than 4 on the right (i.e., a run including the least significant bit, and having length greater than 4), or a run of length greater than 6 away from the left and right ends of the code word has length greater than 6. Also, it is sometimes desirable to select the guidelines so they overconstrain relative to an initial choice of guidelines (e.g., by excluding each code word having a run of length greater than 5 away from the left and right ends of the code word, where exclusion of each code word having a run of length greater than 6 away from the left and right code word ends would achieve adequate results). Run length filters can be applied to runs of 0s and 1s independently. Since allowing any possible disparity and transition density for code words would typically allow selection of more candidate code spaces than would be practical, it is typically desirable to specify constraints on the code space in addition to run length constraints. For example, only code words with a disparity of less than 8 might be allowed, or (where it is desired to find a code with minimum disparity to avoid EMI issues) only code words with a disparity of less than 4 might be allowed.

Once the filters (for selecting candidate code spaces) are defined, a wide range of possible code spaces is preferably searched (e.g., by brute force) to identify candidate code spaces, a mapping is created from the input symbols to the code words of each candidate code space, and the candidate mappings are evaluated based on the small set of metrics. The metrics that are used for evaluation specify spectral properties, and typically include the following: minimum transitions per code word, average transitions per code word over all legal code word pairs (all possible pairs of code words that could appear in a transmission stream of valid code words according to one of the candidate code spaces), normalized DC offset (sum of running disparity values after each bit of a block of code words, divided by the number of bits in the block), maximum run length (e.g., for all possible pairs of code words that could appear in a transmission stream of valid code words according to one of the candidate code spaces), maximum digital sum variation, and the number of exception cases in the code mapping (i.e. the number of mappings that must be implemented using a table lookup, or other secondary mapping, rather than by applying a primary mapping). The best code space and mapping with respect to each parameter are reported, and the ranges of metric values encountered are preferably also reported. Typically, this narrows the code possibilities to not more than six, and the designer can select the most desirable code based on the engineering trade-offs appropriate to the application.

To choose a mapping between the input symbols and the code words of each candidate code space, preferred embodiments of the invention proceed in two phases as follows, using a greedy algorithm (preferably performed by an appropriately programmed personal computer or other processor) in the second phase. The first phase seeks a systematic mapping (sometimes referred to herein as a "primary" mapping) from input symbols to code words that provides the best coverage (i.e., the primary mapping function that successfully maps the largest number of input symbols to valid code words). Typically, several systematic mappings are evaluated, including mappings that: force a transition on the first (or last) bit consider disparity of input symbol and add a bit to make the disparity of the resulting code word approach zero (preferably, insertion of the bit in all possible positions is tested); use alternate bit inversion (i.e. flip every other bit of the input symbol) for symbols with transition density below the minimum; add a 0 bit to the input symbol so that disparity of the resulting code word is less (if the input symbol's disparity is negative, all bits are inverted after the 0 bit is added. Preferably, insertion of the bit in all possible positions is tested); add a 1 bit to the input symbol so that disparity of the resulting code word is greater (if the input symbol's disparity is positive, all bits are inverted after the 1 bit is added. Preferably, insertion of the bit in all possible positions is tested); and always add a 0 bit (or 1 bit) to the input symbol (preferably, insertion of the bit in all possible positions is tested). Many other primary mapping functions are possible.

Once each of the candidate primary mappings has been evaluated, the primary mapping function that successfully maps the most input symbols is selected (for each candidate code space), and the second phase then determines a mapping (for each candidate code space) of the remaining unmapped input symbols to the remaining code words. The second phase considers only symbols that were not mapped by the primary function selected in the first phase, and can determine any of a variety of "secondary" mapping functions for mapping those input symbols that are not mapped to code words by the primary mapping. In preferred embodiments, the secondary mapping is accomplished using table lookup and limits (or minimizes) error magnification. Error magnification occurs when a small error in the transmitted code word results in successful decoding of a symbol that differs from the intended symbol by a larger amount. For example, suppose symbol 000000000 maps to code word 1010101010 and symbol 111111111 maps to code word 1010101011. If the code word 1010101010 is transmitted, but the last bit of this code word receiver will decode the errored word 1010101011 and determine the received symbol to be 111111111. Thus, a 1-bit error in the code space has been magnified to a 9-bit error in the symbol space. Since preferred embodiments of the primary mapping leaves the symbol unchanged and merely adds a bit, the error magnification for these symbols is limited.

Preferably, the second phase searches for individual secondary mappings that minimize error magnification using a greedy algorithm that enumerates through all possible error magnification values, beginning at 1, and tries to map as many symbols as possible so that errors are magnified by no more than the amount specified. For example, the algorithm first maps as many symbols as it can so that each 1-bit error in the code space results in only a 1-bit error in the symbol space. Next, it maps as many symbols as it can so that each 1-bit error in the code space results in only a 1-bit or 2-bit error in the symbol space. This process continues (each time with a relaxed error magnification constraint) until all symbols have been mapped. The greedy algorithm preferably includes the steps of: (a) selecting a code word of the code space that does not have a symbol mapped to it; (b) then, considering all code words that differ from the selected code word by a single bit (i.e. all code words that would result from a single bit error), and identifying each symbol (if any) that maps to one of the errored versions of the selected code word (steps (a) and (b) select an unused code word and identify a first set of symbols that map to all code words that differ from the selected code word by a target error magnification, where the target error magnification is a single bit during the first performance of step (b)); (c) then, searching the unmapped symbols for one that differs from each member of the first set by no more than the target error magnification (which is equal to one bit during the first performance of step (c), and can be equal to two or more bits during subsequent performances of step (c)) and mapping such previously unmapped symbol (if one is found) to the selected code word; (d) then, repeating steps (a), (b), and (c), each time for a different selected code word but without changing the target error magnification, until all previously unmapped symbols are mapped or no new mapping having the target error magnification can be determined; (e) then, if all the symbols have not been mapped, incrementing the target error magnification by one, and repeating steps (a), (b), (c), and (d), using the incremented target error magnification (e.g., two bits during the first performance of step (e), and three bits during the next performance of step (e)) until all previously unmapped symbols are mapped or no new mapping having the increased target error magnification limit can be determined; and (f) then, if all the symbols have not been mapped, again incrementing the target error magnification by one, and repeating step (e) using the newly incremented target error magnification. A mapping determined in accordance with such an algorithm minimizes error magnification during the decoding process.

In preferred embodiments, a mapping is defined from input words to a "positive" codebook containing only code words of neutral or positive disparity, and the mapping of each code word of the positive codebook to a code word of a corresponding "negative" codebook is determined simply by complementing the former code word to generate the latter code word. Alternatively, the mapping of each code word (having nonzero disparity) of the positive codebook to a code word of a corresponding "negative" codebook is determined by complementing the former code word to generate the latter code word, and each code word (having zero disparity) of the positive codebook is identical to a corresponding code word of the "negative" codebook. Ideally, a mapping function from input words to the code words of the positive codebook (or the negative codebook) is found that is bijective and simple to implement using logic circuitry. However, even if such an ideal mapping function cannot be found, a simple mapping function can typically be identified that covers a large subset of the input symbol space, and the remaining input symbols are handled as special cases (e.g., special input symbols for which encoding must be accomplished using lookup tables or other "secondary" encoding circuitry).

For many applications, full lookup tables (for encoding or decoding) are not practical implementation choices. Preferred embodiments for such applications use a systematic mapping technique implemented by simple logic circuitry without any lookup table (or with only a small lookup table for handling a small subset of the full set of input words) for encoding and decoding. The encoder in each of circuit 32 and 42 of the FIG. 1 system preferably implements such a systematic mapping technique.

FIG. 1 is a block diagram of a typical system that embodies the invention. The FIG. 1 system includes transceivers 10 and 20, and a serial link between them. The serial link includes primary channel 51 and back channel 52 (and optionally also other channels, not shown). Transceiver 10 will be referred to as a transmitter since it transmits application data to transceiver 20 over the serial link. Transceiver 20 will be referred to as a receiver since it does not transmit application data to transceiver 10 over the serial link, although it does transmit other data to transceiver 10. The FIG. 1 system implements a bidirectional communication path in which primary channel 51 carries application traffic, and back channel 52 (which typically is smaller than channel 51 in the sense that it carries a smaller volume of data than channel 51) carries link management traffic that is not exposed to the application. Primary channel 51 carries code words indicative of control data (e.g., out-of-band or "OOB" bits to be discussed below) and application data, and typically also special characters (e.g., idle characters used for simplex or duplex link flow control, and link training characters) that are not indicative of application data. Back channel 52 carries information related to error control, end-to-end flow control, and data sequencing. For example, back channel 52 carries code words indicative of control data related to error control, end-to-end flow control, and data sequencing, and typically also special characters (e.g., link training characters). Typically, the same physical layer requirements are applied across both channels 51 and 52. Preferably, a block code is used, and the length of the block code is chosen to ensure that total overhead is comparable to other common line codes while simultaneously minimizing design and implementation complexity.

Some but not all elements of transmitter 10 are shown in FIG. 1. The physical layer and link layer circuitry of transmitter 10 includes packetizing circuit 31, encoding and transmission circuit 32, receiving and decoding circuit 33, error detection and correction circuit 34, and de-packetizing circuit 35, connected as shown. Transmitter 10 also includes higher layer circuitry 30, which typically includes network layer circuitry, transport layer circuitry, and application layer circuitry. In operation, higher layer circuitry 30 provides application data and control data to packetizing circuit 31. For example, the control data provided to circuit 31 by circuitry 30 can determine the XTND, FLOW, OOB1, and OOB2 bits to be described with reference to FIG. 2. In response, packetizing circuit 31 generates (and asserts to circuit 32) sequences of input words (e.g., the 9-bit input words of FIG. 2, each of which comprises eight application data bits and one control bit) that are indicative of cells (e.g., a sequence of code words having the form shown in FIG. 2, each cell including two 64-bit application data blocks, and 16 control bits). In typical implementations, packetizing circuit 31 generates CRC bits for each cell and includes the CRC bits in the input word sequences asserted to circuit 32. Packetizing circuit 31 performs any necessary serialization of the application data and control data from circuitry 30, and asserts the input word sequences as serial data to circuit 32.

Circuit 32 encodes the input words from circuit 31 (e.g., to generate one of the 10-bit code words shown in FIG. 2 in response to each 9-bit input word), and transmits the code words serially over channel 51 to receiver 20. Circuit 32 can also transmit (over channel 51) one or more special characters. In some implementations, circuit 32 transmits each special character before or after a cell of code words (i.e., before or after a sequence of code words indicative of a cell), but does not transmit any special character during a cell. However, in preferred implementations, the set of code words employed to encode cells (for transmission over channel 51) and the special characters are chosen such that no special character can unintentionally occur in a sequence of code words indicative of a cell (i.e., no special character matches any of the code words, and no sequence of bits from any possible sequence of consecutively transmitted code words matches any of the special characters). In such preferred implementations, circuit 32 can transmit any special character at any time (including by interrupting transmission of a cell to transmit the special character), and the circuitry (e.g., circuit 43 of receiver 20) employed for receiving and decoding code words transmitted by circuit 32 can be configured (e.g., can include logic configured) to recognize each transmitted special character, regardless of whether transmission of the special character has or has not interrupted transmission of a cell.

An example of special character transmission by an implementation of circuit 32 is the transmission of special "idle" characters at appropriate times between cells (e.g., for duplex link flow control). For another example, in response to control signals from error detection and correction circuit 34, an implementation of circuit 32 asserts special "link training" characters and special "state exchange" characters with embedded sequence numbers during a link re-training operation initiated by a control signal from circuit 34.

Figure 2:
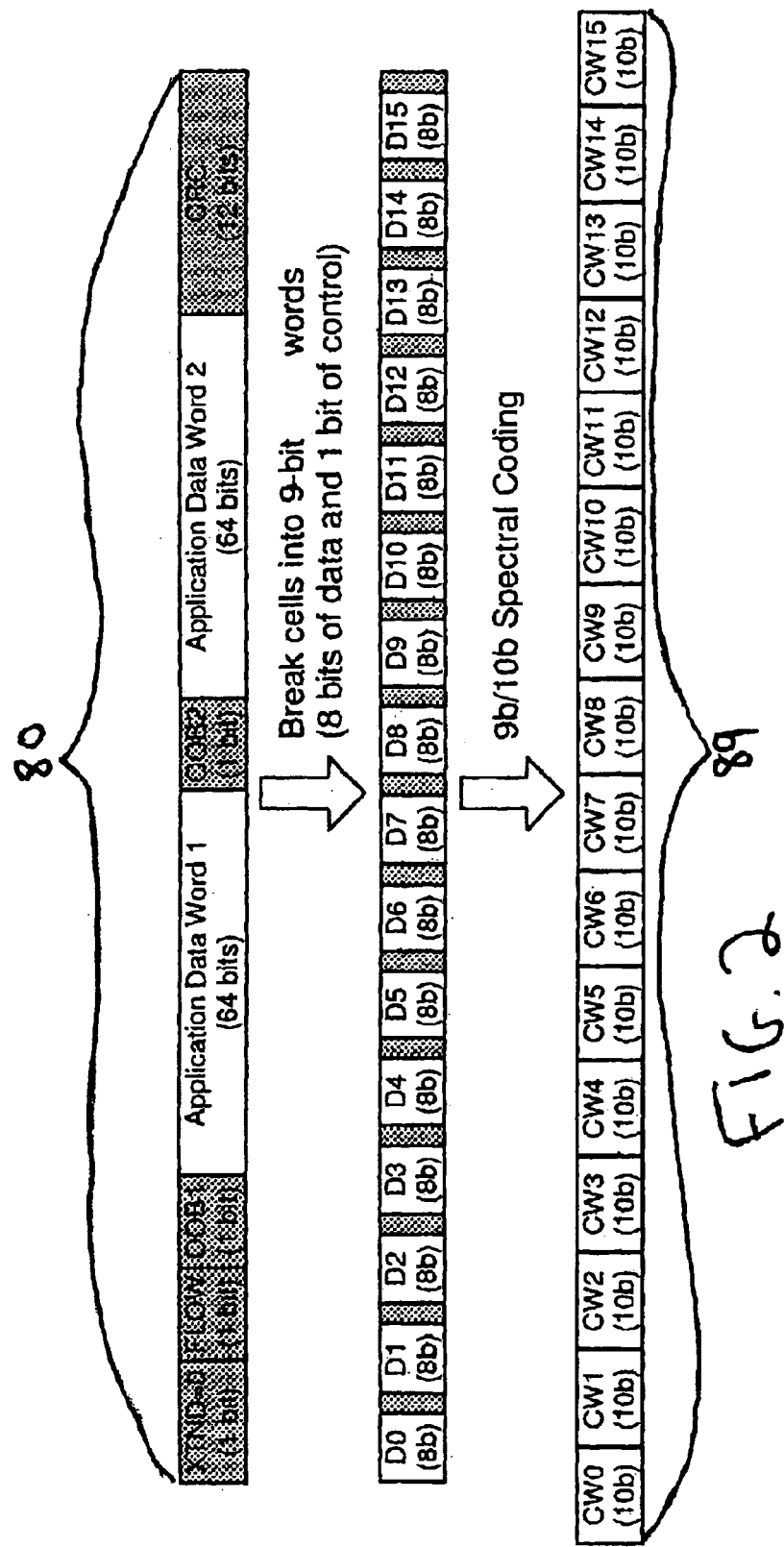
FIG. 2 is a diagram of a cell of data (cell 80), an ordered set of 9-bit words (indicative of the cell) that can be encoded in accordance with the invention, and an ordered set (89) of 10-bit code words (indicative of the cell) generated in accordance with an embodiment of the invention.

Receiving and decoding circuit 33 decodes code words received sequentially on back channel 52 to generate a stream of decoded words (e.g., 9-bit words as shown in FIG. 2, each comprising eight application data bits and one control bit). In various implementations of the FIG. 1 system (and variations thereon) which implement different line codes, the decoded words generated by the receiver are M-bit words (where M can be any integer, although M is odd in preferred embodiments), and the decoded words of a cell can include any predetermined pattern of application data and control bits (e.g., each cell can include a repeating pattern of four control bits followed by thirty-two application data bits, or can consist of four control bits followed by 128 application data bits followed by twelve CRC bits, or any of many other patterns of application data and control bits).

In a typical implementation, error detection and correction circuit 34 identifies CRC bits in the stream of decoded words, uses the CRC bits to perform error detection and correction on a cell of the decoded words (e.g., on a sequence of sixteen 9-bit words having the FIG. 2 format), and asserts the corrected decoded words to de-packetizing circuit 35 (except in the event that circuit 34 identifies an uncorrectable error in a cell).

De-packetizing circuit 35 then determines which of the bits of the corrected, decoded words are application data bits and which are control data bits, and asserts the application data, and appropriate ones of the control bits (separately from the application data) to higher layer circuitry 30 for processing. Circuit 35 performs any necessary deserialization of the data it receives from circuit 34 (e.g., to assert application data and control bits in parallel to circuitry 30).

Some but not all elements of receiver 20 are shown in FIG. 1. The physical layer and link layer circuitry of receiver 20 includes packetizing circuit 41, encoding and transmission circuit 42, receiving and decoding circuit 43, error detection and correction circuit 44, and de-packetizing circuit 45, connected as shown. Receiver 20 also includes higher layer circuitry 40, which typically includes network layer circuitry, transport layer circuitry, and application layer circuitry. In operation, higher layer circuitry 40 can provide application data and control data to packetizing circuit 41. For example, circuitry 40 can provide (to circuit 41) control data (generated by application layer circuitry) that determine the FLOW bits to be described with reference to FIG. 2. In response, packetizing circuit 41 generates (and asserts to circuit 42) sequences of input words (e.g., the 9-bit input words of FIG. 2, each of which comprises eight application data bits and one control bit) that are indicative of cells (e.g., a sequence of code words having the form shown in FIG. 2, each cell including two 64-bit application data blocks, and 16 control bits). In typical implementations, packetizing circuit 41 generates CRC bits for each cell and includes the CRC bits in the input word sequences asserted to circuit 42. Packetizing circuit 41 performs any necessary serialization of the application data and control data from circuitry 40, and asserts the input word sequences as serial data to circuit 42.

Circuit 42 encodes the input words from circuit 41 (e.g., to generate one of the 10-bit code words shown in FIG. 2 in response to each 9-bit input word), and transmits the code words serially over channel 52 to transmitter 10. Circuit 42 can also transmit one or more special characters over channel 52. In some implementations, circuit 42 transmits each special character before or after a cell of code words (i.e., before or after a sequence of code words indicative of a cell), but does not transmit any special character during a cell. However, in preferred implementations, the set of code words employed to encode cells (for transmission over channel 52) and the special characters are chosen such that no special character can unintentionally occur in a sequence of code words indicative of a cell (i.e., no special character matches any of the code words, and no sequence of bits from any possible sequence of consecutively transmitted code words matches any of the special characters). In such preferred implementations, circuit 42 can transmit any special character at any time (including by interrupting transmission of a cell to transmit the special character), and the circuitry (e.g., circuit 33 of transmitter 10) employed for receiving and decoding code words transmitted by circuit 42 can be configured (e.g., can include logic configured) to recognize each transmitted special character, regardless of whether transmission of the special character has or has not interrupted transmission of a cell.

An example of special character transmission by an implementation of circuit is the transmission of special "idle" characters at appropriate times between cells (in a manner to be described below). For another example, in response to control signals from error detection and correction circuit 44, an implementation of circuit 42 asserts special "link training" characters and special "state exchange" characters with embedded sequence numbers during a link re-training operation (to be described below) initiated by a control signal from circuit 44.

Receiving and decoding circuit 43 (of receiver 40) decodes code words received sequentially on channel 51 to generate a stream of decoded words (e.g., 9-bit words as shown in FIG. 2, each comprising eight application data bits and one control bit). In a typical implementation, error detection and correction circuit 44 identifies CRC bits in the stream of decoded words, uses the CRC bits to perform error detection and correction on a cell of the decoded words (e.g., on a sequence of sixteen 9-bit words having the FIG. 2 format), and asserts the corrected decoded words to de-packetizing circuit 45 (except in the event that circuit 44 identifies an uncorrectable error in a cell). De-packetizing circuit 45 then determines which of the bits of the corrected, decoded words are application data bits and which are control data bits, and asserts the application data, and appropriate ones of the control bits (separately from the application data) to higher layer circuitry 40 for processing. Circuit 45 performs any necessary deserialization of the data it receives from circuit 44 (e.g., to assert application data and control bits in parallel to circuitry 40).

In a class of preferred embodiments, code words indicative of cells (of application data and control data) having the format shown in FIG. 2 are transmitted over a serial link. The following steps are performed to accomplish this.

First, logical blocks of application data are defined (e.g. 64-bit blocks as shown in FIG. 2, or 32-bit blocks). This can be accomplished, for example, by application layer circuitry within circuitry 30 (or circuitry 40) of FIG. 1. For each application data block, an out-of-band ("OOB") bit is provided to indicate the priority level of the block, or to specify a virtual channel to which the block belongs. For example, the "OOB1" bit in FIG. 2 can indicate whether the block labeled "Application Data Word 1" consists of low priority data (e.g., application data) or high priority data (e.g., control data), and the "OOB2" bit can similarly indicate whether the block labeled "Application Data Word 2" consists of low priority data (e.g., application data) or high priority data (e.g., control data.

The application data blocks (sometimes referred to as words) are grouped into cells (e.g., by packetizing circuit 31 or 41 of FIG. 1). To minimize latency associated with re-transmission (e.g., after an uncorrectable error during transmission), the number of application data words per cell should be minimized (e.g., there are only two words per cell). A flow control bit (identified as "FLOW" in FIG. 2) is included in each cell. The flow control bits and application data blocks are the only data visible to the application. In each cell, at least one additional control bit (e.g., the XTND control bit of FIG. 2) can be included, and additional bits (e.g., an address extension) can also be included to provide optional functionality such as network addressing. Also, error control bits (e.g., parity bits, or the CRC bits of FIG. 2) are generated for (and included in) each cell to enable error detection and/or correction. FIG. 2 shows an example of such a cell, consisting of 144 bits and not including an extension.

The bits of each cell are grouped into input words (e.g., in packetizing circuit 31 or 41 of FIG. 1). For example, the 144 bits of cell 80 of FIG. 2 are grouped into the sixteen 9-bit input words shown in FIG. 2, each comprising eight application data bits (D0, D1, D2, D3, D4, D5, D6, D7, D8, D9, D10, D11, D12, D13, D14, control bit.

Finally, the input words indicative of each cell are encoded, preferably to transform the frequency spectrum of a serial data stream so as to adapt to channel requirements in a manner to be described below.

In different embodiments of the invention, the sizes of input words (to be encoded), cells of the input words, blocks of CRC bits (or other error control bits) in each cell of input words, and other parameters are adjusted according to desired features and coding efficiency. For a cell having the FIG. 2 format, the above-described coding method provides 131 bits of application information (128 bits of application data, two OOB bits, and one FLOW bit) with 29 bits of protocol overhead per cell, which gives an 82% coding efficiency. The commonly used conventional 8B/10B coding scheme achieves only 80% efficiency for the physical layer alone.

In many contemplated embodiments, code words indicative of cells (of application data and control data) having format other than that shown in FIG. 2 are transmitted. For example, in some embodiments the XTND bit discussed with reference to FIG. 2 is replaced by a second FLOW bit. If each cell includes two evenly spaced FLOW bits (each applying to all priority levels of application data), no more than half a cell time would be wasted on either endpoint when the value of the FLOW bit is to be changed, which would reduce system buffering requirements by one cell.

In other exemplary embodiments, the FLOW bit of FIG. 2 is removed and replaced by a "Valid" bit that indicates whether or not the second 64-bit block of application data in the cell contains valid data (in such embodiments the first 64-bit application data block is always valid; otherwise, the transmitter would transmit "idle" characters, of the type mentioned above and discussed further below, rather than code words indicative of cells). The line code employed in some embodiments of the invention has a coding efficiency of less than 80%, although many other embodiments have a coding efficiency greater than 80%.

Figure 3:
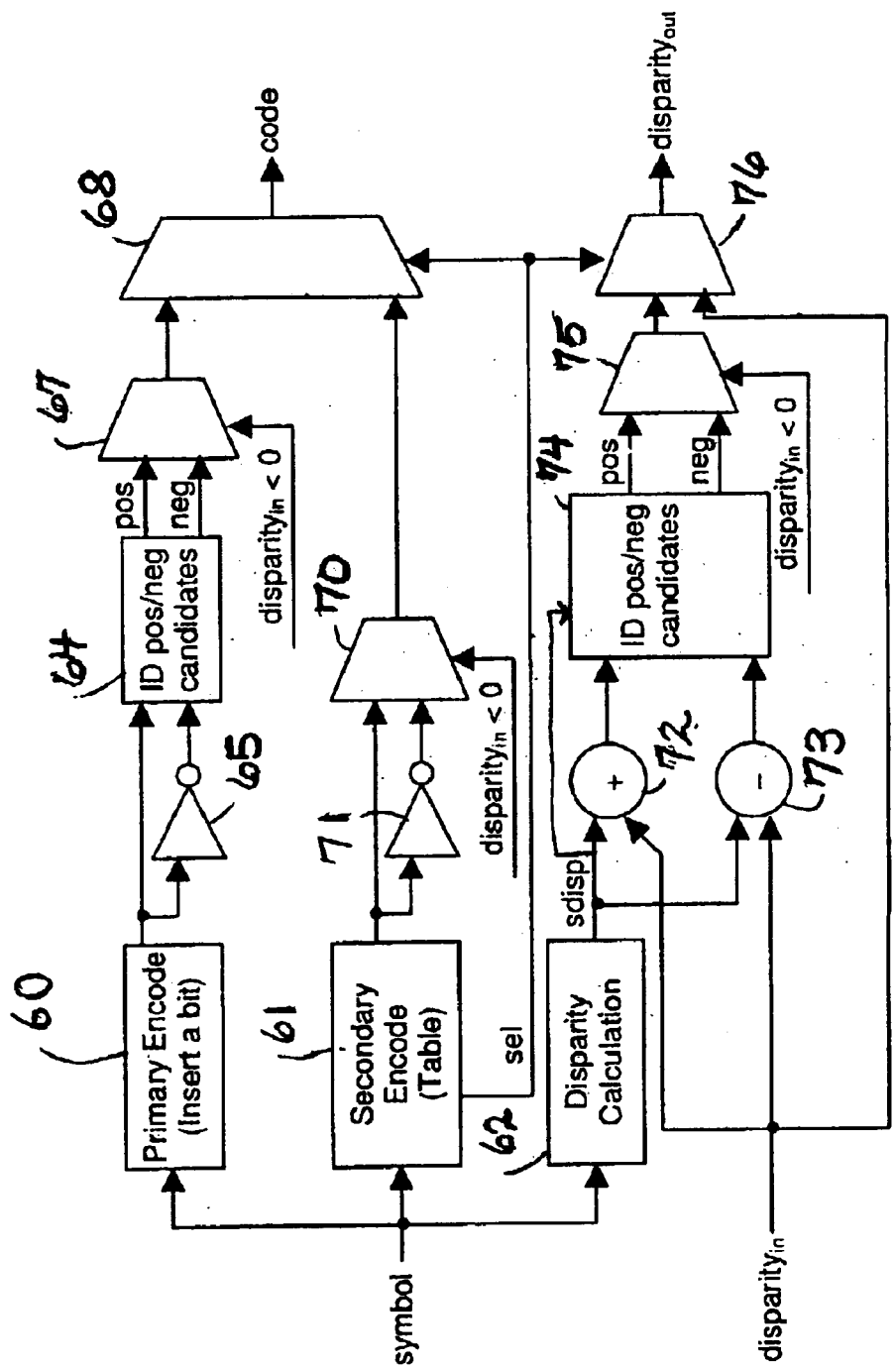
FIG. 3 is a block diagram of an embodiment of an encoder that can be included in circuit 32 of transmitter 10, and in circuit 42 of receiver 20, of the FIG. 1 system.

FIG. 3 is a block diagram of an embodiment of an encoder that can be included in circuit 32 of transmitter 10 and in circuit 42 of receiver 20 of the FIG. 1 system. The FIG. 3 circuit includes encoding logic circuit 60 ("primary" encoding logic 60), lookup table circuit 61 ("secondary" encoding circuit 61), and disparity calculation circuit 62, each coupled to receive a sequence of symbols to be encoded. Each symbol consists of N bits. Each of circuits 60 and 61 outputs an (N+1)-bit code word in response to an N-bit symbol at its input. The output of circuit 61 (the codebook, and the output of circuit 60 can be a member of either the positive codebook or the negative codebook. Inverter 65 outputs the complement of each code word output from circuit 60. Inverter 71 outputs the complement of each code word output from circuit 61.

The FIG. 3 circuit operates as follows to perform encoding in accordance with the invention. A running disparity value (the "disparity$_{in}$" value) is asserted to an input of each of addition unit 72, subtraction unit 73, and multiplexer 76. The running disparity value is indicative of the accumulated disparity of a sequence of code words generated by the FIG. 3 circuit. Typically, the running disparity value is initially set to one (for processing the first input symbol). The running disparity value is then updated each time another input symbol is generated. When a new symbol is ready to be encoded, the current running disparity (the current "disparity$_{in}$" value) is used to select the appropriate codebook (the positive or negative codebook) to be used to encode the symbol. If the current "disparity$_{in}$" value is less than zero, the positive disparity codebook is used (the first, or upper, input of each of multiplexers 67, 70 and 75 is selected). Otherwise, the negative disparity codebook is used (the second, or lower, input of each of multiplexers 67, 70, and 75 is selected). For each symbol of a subset of the full set of symbols, a look up table (implemented by circuit 61) determines the code word. The code word for each symbol is output (at the output of multiplexer 68) and its disparity is added to the running disparity value to generate an updated running disparity value (the "disparity$_{out}$" value) which is asserted at the output of multiplexer 76.

Both the primary mapping and secondary mapping of the input symbol are applied (by circuits 60 and 61, respectively) to generate candidate code words, and the complements of these candidate code words are also created (in inverters 65 and 71). Thus, four candidate code words (the outputs of circuits 60 and 61 and inverters 65 and 71) are generated in response to each input symbol.

Primary encoding logic 60 concatenates a zero bit with the N-bit input symbol so that the most significant bit (MSB$_0$) of the resulting (N+1)-bit candidate code word is a zero. In variations on the FIG. 3 embodiment, other primary mapping functions are utilized.

Lookup table circuit 61 asserts an (N+1)-bit candidate code word in response to each N-bit input symbol that is a member of a small subset of the full set of $2^N$ input symbols (the members of this subset are sometimes referred to herein as "secondary" symbols). The output of circuit 61 is valid (as indicated by a "one" value of the "SEL" bit asserted by circuit 61) when the input symbol asserted thereto is a secondary symbol. Circuit 61 does not output valid lookup table values in response to input symbols that are not secondary symbols. A "zero" value of the SEL bit indicates that the output of circuit 61 is not valid. In other words, the SEL bit indicates whether or not the lookup table (implemented by circuit 61) includes a code word determined by the most recent input symbol, and thus indicates whether or not the input symbol's spectral properties meet the criteria for primary mapping by logic circuit 60. The SEL bit is asserted as a control signal to multiplexer 68, to cause multiplexer 68 to select a candidate code word generated by the primary mapping (the output of multiplexer 67) if SEL has a "zero" value, or to select a candidate code word generated by the secondary mapping (the output of multiplexer 70) if SEL has a "one" value. The SEL bit is also asserted as a control signal to multiplexer 76, to cause multiplexer 76 to select the appropriate updated running disparity value (in a manner to be discussed below).

Each valid word output from circuit 61 is an (N+1)-bit candidate code word having known disparity (e.g., zero disparity assuming that the code is as set forth in Table 1, 3, 4, or 5, or positive disparity in other possible codes generated in accordance with the invention). Thus, the complement of each such valid word (asserted at the output of inverter 71) also has known disparity. The output of circuit 61 is asserted to the first input (the upper input in FIG. 3) of multiplexer 70, and its complement is asserted to the second input (the lower input in FIG. 3) of multiplexer 70.

The disparity of the input symbol must be determined to identify whether the candidate code word output from circuit 60, or its complement (the candidate code word asserted at the output of inverter 65) is a member of the positive codebook. This operation is performed by logic circuit 64. Circuit 64 calculates the disparity of the candidate code word output from circuit 60 by summing its bits. If the candidate code word output from circuit 60 has non-negative disparity, circuit 64 asserts to the first (upper) input of multiplexer 67 the output of circuit 60 and asserts to the second (lower) input of multiplexer 67 the output of circuit 65. If the candidate code word output by circuit 60 has negative disparity, circuit 64 asserts to the first input of multiplexer 67 the output of circuit 65 and asserts to the second input of multiplexer 67 the output of circuit 60. This description assumes that each code word of the negative codebook is the complement of a corresponding code word of the positive codebook. Of course, if the code words of the negative codebook having zero disparity are identical to corresponding code words of the positive codebook, the encoding circuitry would be modified accordingly (so that the complement is never selected for zero disparity code words).

The current running disparity (the "disparity$_{in}$" value at the inputs of addition unit 72 and subtraction unit 73) is updated as follows to generate the updated running disparity (the "disparity$_{out}$" value at the output of multiplexer 76).

If we assume that all code words determined by the lookup table (implemented by circuit 61) have zero disparity (as is true in the cases that the FIG. 3 circuit implements the code to be described with reference to Table1, 3, 4, or 5), then each code word determined by the secondary mapping (i.e., each code word output from multiplexer 68 when SEL=1) has zero disparity. Thus, in response to the control signal value SEL=1, multiplexer 76 selects the current running disparity ("disparity$_{in}$") as the updated running disparity ("disparity$_{out}$").

To determine the updated running disparity in the case that the primary mapping is used (i.e., when SEL=0), disparity calculation circuit 62 determines the disparity ("sdisp") of a candidate code word that consists of a zero bit concatenated with (e.g., appended or prepended to) the bits of the input symbol (i.e., circuit 62 determines the disparity of the input symbol and subtracts one therefrom). Disparity calculation circuit 62 asserts a signal indicative of the disparity value "sdisp" to circuit 74 and to an input of each of units 72 and 73. It should be kept in mind that the candidate code word whose disparity is determined by circuit 62 can be the actual code word asserted at the output of multiplexer 68, or the complement of such actual code word.

If the value "sdisp" is negative, circuit elements 74, 75, and 76 ensure that the updated running disparity ("disparity$_{out}$") is the output of addition unit 72 ("sdisp" plus "disparity$_{in}$," where disparity$_{in}$ is the current running disparity) when disparity$_{in}$ is positive, and that disparity$_{out}$ is the output of subtraction unit 73 ("disparity$_{in}$" minus "sdisp") when disparity$_{in}$ is negative. If the value "sdisp" is positive or zero, circuit elements 74, 75, and 76 ensure that the updated running disparity ("disparity$_{out}$") is the output of addition unit 72 ("sdisp" plus "disparity$_{in}$") when disparity$_{in}$ is negative and that the updated running disparity ("disparity$_{out}$") is the output of subtraction unit 72 ("disparity$_{in}$" minus "sdisp") when disparity$_{in}$ is positive.

Thus, circuit 74 asserts the output of addition unit 72 to the first (upper) input of multiplexer 75 and the output of subtraction unit 73 to the second (lower) input of multiplexer 75 when "sdisp" is positive or zero, and circuit 74 asserts the output of addition unit 72 to the second input of multiplexer 75 and the output of subtraction unit 73 to the first input of multiplexer 75 when "sdisp" is negative or zero. Multiplexer 75 passes through the value at its first input to multiplexer 76 when the current running disparity (disparity$_{in}$) is negative, and multiplexer 75 passes through the value at its second input to multiplexer 76 when disparity$_{in}$ is non-negative.

Multiplexer 76 passes through to its output the value it receives from multiplexer 75 when the primary mapping is used (i.e., when SEL=0). Otherwise, multiplexer 76 passes through to its output the current running disparity (disparity$_{in}$).

Figure 4:
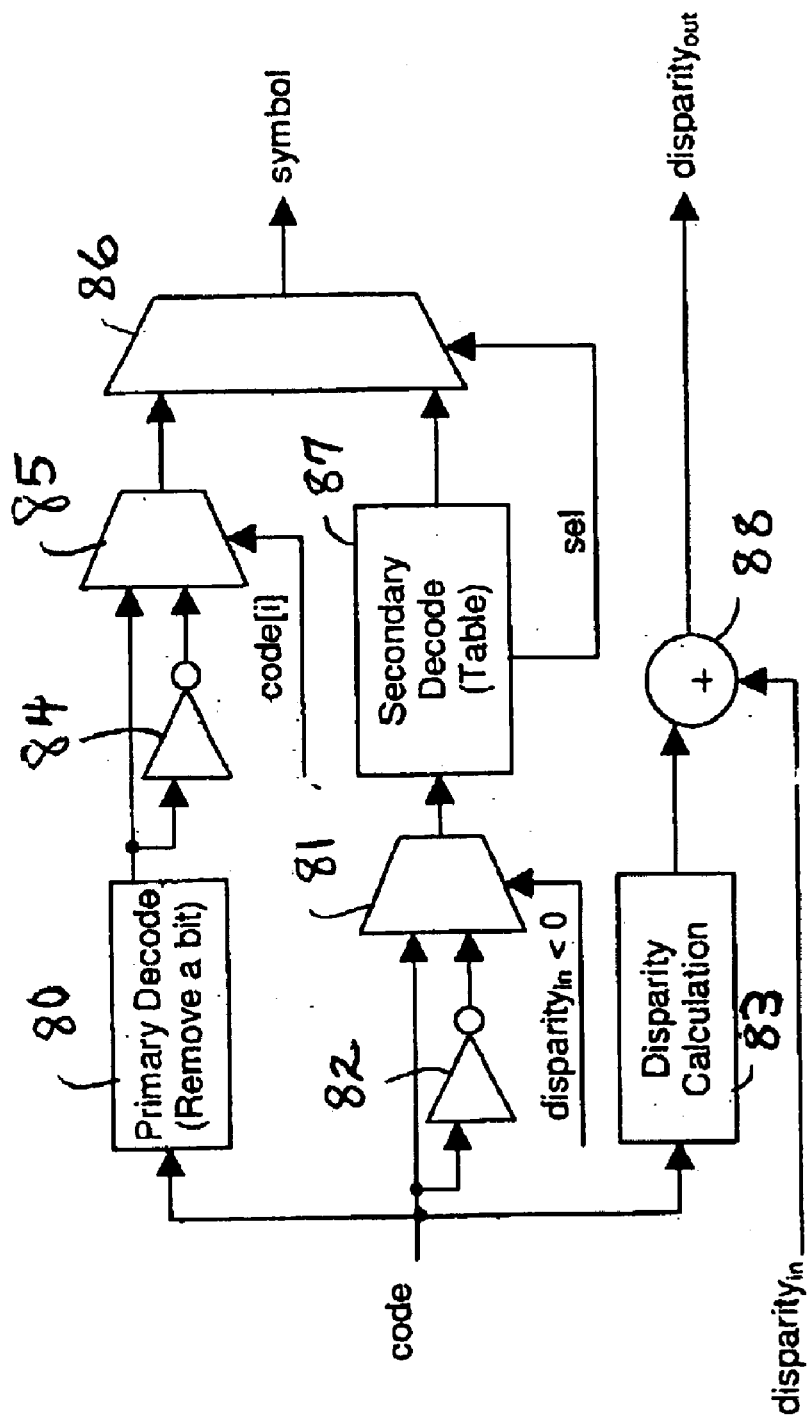
FIG. 4 is a block diagram of an embodiment of a decoder that can be included in circuit 33 of transmitter 10, and in circuit 43 of receiver 20, of the FIG. 1 system.

With reference to FIG. 4, we next describe an embodiment of the inventive circuitry for decoding the code words generated by the encoder of FIG. 3. In some implementations of the FIG. 1 system, the decoder circuit of FIG. 4 is included in block 33 of transmitter 10 of FIG. 1, and in block 43 of receiver 20 of FIG. 1. The FIG. 4 circuit includes decoding logic circuit 80 ("primary" decoding logic 80), lookup table circuit 87 ("secondary" decoding circuit 87), multiplexers 81, 85, and 86, inverters 82 and 84, and disparity calculation circuit 83, connected as shown. Each of elements 80, 81, 82, and 83 is coupled to receive a sequence of code words to be decoded. Each code word consists of N+1 bits. Each of circuits 80 and 87 outputs an N-bit symbol in response to an (N+1)-bit code word at its input. Inverter 82 outputs the complement of each code word, and asserts this complement to the second input of multiplexer 81.

The FIG. 4 circuit operates as follows to perform decoding in accordance with the invention. The decoding method is essentially the reverse of the encoding method performed by the FIG. 3 circuit.

Primary decoding logic 80 decodes each (N+1)-bit code word that it receives by passing through, to inverter 84 and the first (upper) input of multiplexer 85, the N least significant bits of the code word. The output of inverter 84, which is the complement of each N-bit symbol received at its input, is asserted to the second (lower) input of multiplexer 85. Multiplexer 85 passes through to a first input of multiplexer 86 the N-bit symbol at its first input when the value of the bit by the primary encoding function (e.g., the MSB) is zero, and otherwise passes through to the first input of multiplexer 86 the N-bit symbol at its second input. In variations on the implementation described in the preceding sentence, another Boolean function (a Boolean function that does not simply look at the value of the inserted bit) is used as the selection criterion for multiplexer 85.

Inverter 82 generates the complement of each (N+1)-bit code word that it receives. Multiplexer 81 has a first input coupled to receive each (N+1)-bit code word received by the FIG. 4 decoder, and a second input coupled to the output of inverter 82 to receive the complement of each such code word. Multiplexer 81 passes through to secondary decoding circuit 87 the code word at its first input when the current "disparity$_{in}$" value (to be describe below) is less than zero, and otherwise passes through to secondary decoding circuit 87 the code word at its second input. If the code word asserted to the input of circuit 87 belongs to the domain of the lookup table implemented by circuit 87, circuit 87 asserts to a second input of multiplexer 86 the N-bit symbol (lookup table value) that corresponds to suc asserts a control bit (the "SEL" bit) with a "one" value to indicate that the output of circuit 87 is valid. This description assumes that each code word of the negative codebook is the complement of a corresponding code word of the positive codebook. Of course, if the code words of the negative codebook having zero disparity are identical to corresponding code words of the positive codebook, the decoding circuitry would be modified accordingly (so that the modified circuitry never complements zero disparity code words).

If the code word asserted to the input of circuit 87 does not belong to the domain of the lookup table implemented by circuit 87, circuit 87 does not output a valid lookup table value, and asserts the SEL bit with a "zero" value to indicate that the output of circuit 87 is not valid. The SEL bit thus indicates whether or not the lookup table (implemented by circuit 87) includes a symbol determined by the most recent code word.

The SEL bit is asserted as a control signal to multiplexer 86, to cause multiplexer 86 to select the N-bit symbol received at its first input from multiplexer 85 (if SEL has a "zero" value) or to select the N-bit symbol received at its second input from circuit 87 (if SEL has a "one" value).

A running digital sum ("$disparity_{in}$") indicative of the accumulated disparity of the code words received by the FIG. 4 circuit is initially set to one (for decoding the first received code word) and then updated each time another code word is received. Disparity calculation circuit 83 calculates the disparity of each received code word (the sum of its "one" bits minus the sum of its "zero" bits) and asserts a value indicative of each calculated disparity to a first input of adder 88. The current "$disparity_{in}$" value is asserted to the second input of adder 88. The output of adder 88 is an updated disparity value ("$disparity_{out}$") which replaces the current "$disparity_{in}$" value. The updated disparity value is asserted to the second input of adder 88 before circuit 83 processes the next received code word.

The current $disparity_{in}$ value, or a signal (generated by circuitry not shown) that is indicative of whether current $disparity_{in}$ value is less than zero, is asserted as a control signal to multiplexer 81. In response, multiplexer 81 passes through the appropriate one of its inputs, as described above. If the current $disparity_{in}$ value is less than zero, multiplexer 81 passes through to circuit 87 an (N+1)-bit code word at its input that was generated by an encoding operation using the positive disparity codebook.

In cases in which a full lookup table implementation is practical, the FIG. 4 circuit can be replaced by a variation on the FIG. 4 circuit in which elements 80, 84, 85, and 86 are omitted. Typically, the lookup table implemented by such a variation on the FIG. 4 circuit would be much larger than that implemented by circuit 87 of FIG. 4 since it would need to provide output values for all (rather than a small subset) of the code words in the relevant codebook.

The FIG. 4 decoder can decode the code words generated by the FIG. 3 encoder only if symbol framing has been established on the serial link over which the encoder transmits the code words to the decoder. For example, when the FIG. 3 encoder is included in circuit 32 of transmitter 10 of FIG. 1 and the FIG. 4 decoder is included in circuit. 43 of receiver 20 of FIG. 1, symbol framing must be established on channels 51 and 52 before circuit 32 commences transmission of code words over channel 51 to circuit 43.

Symbol framing is "physical layer" framing that determines the boundaries of transmitted code words, so that physical layer circuitry can decode the code words to produce decoded symbols for processing by link layer circuitry. Typically, link layer circuitry recognizes that the decoded symbols (generated by decoding a sequence of code words generated in accordance with the invention) comprise cells of application data and control bits, the link layer circuitry forwards the application data (and at least some of the control bits) to higher layer circuitry, and the link layer circuitry typically also operates in response to at least some of the control bits. "Link layer" framing allows the link layer circuitry to determine the boundaries of blocks of application data (and blocks of control bits) within cells of the decoded symbol, where the blocks of application data (or control bits) are to be utilized by higher layer circuitry.

To establish both physical layer framing and link layer framing upon startup or after a link error during operation of typical implementations of the FIG. 1 system, transmitter 10 and receiver 20 transmit at least one special "link training" character (sometimes referred to herein as a training character "T") and optionally also at least one special "synchronization" or "state exchange" character. State exchange characters are sometimes denoted herein as "Si" characters, where the notation "Si" indicates that there are "i" different state exchange characters. For example, the "i"th state exchange character can communicate the value "i" to the endpoint that receives it, in order to exchange state information. The endpoint that receives a state exchange character "Si" interprets its value "i" in a predetermined manner. For example, the value "i" can be a sequence number which takes on the values 0,1, ..., 7. In typical cases, less than ten different "Si" characters would be needed.

Preferably, no link training (or state exchange) character appears in any valid stream of code words that is indicative of a cell (of application data and control bits), and each such special character is self-identifying. Preferably, each link training and state exchange special character includes a preamble used for link training (e.g., to establish framing) and also a discriminant pattern that distinguishes the character from other characters. The discriminant pattern can be indicative of state information (e.g., state information useful for recovery from a link error).

In a class of implementations of the FIG. 1 system, upon startup or after a link error, a communications endpoint (e.g., transmitter 10 upon startup, or receiver 20 after a link error) enters a link training phase (or training "mode" or "state") having an initial handshake phase. In response to one or more special characters sent by one endpoint in the handshake phase, the other endpoint enters the link training phase and participates in the handshake phase. During the handshake phase (which is implemented at the physical level), the endpoints establish symbol alignment (typically by exchanging one or more link training characters). After the handshake phase (during or after the link training phase), the endpoints exchange state information and establish cell alignment.

In typical implementations in this class, at least one state exchange character is sent (potentially with redundancy to guard against link errors) after the handshake phase. Typically, both endpoints exchange state information after the handshake phase (i.e., each endpoint sends one state exchange character, or a number of state exchange characters, to the other endpoint). Ideally, each state exchange character contains the same preamble as does each link training character sent during the handshake phase, or has some other unique property that enables link training to occur.

In some implementations, each state exchange character indicates state information regarding the endpoint that sends it. For example, one state exchange character identifies the last cell successfully received (by the endpoint that sends the state exchange character) before the link training operation, or a sequence of state exchange characters (which need not all be identical) identifies the last cell successfully received (by the endpoint that sends the state exchange character) before the link training operation. For example, each state exchange character can include a preamble (for framing) and a sequence number indicative of the last cell successfully received (by the endpoint that sends the state exchange character) before the link training operation.

In other implementations in this class, at least one state exchange character sent (potentially with redundancy to guard against link errors) after the handshake phase indicates that the first cell of normal data to be transmitted after the link training operation contains state information to be exchanged, and optionally indicates a number of cells (after such first cell) that contain additional state information. Alternatively, some portion of the first cell indicates the total number of cells that contain state information.

In other implementations in this class, no state exchange character is sent after the handshake phase. Instead, by convention, the first cell (or each of the first few cells) sent after the handshake phase contains state information to be exchanged.

In some implementations, after the handshake phase of a link training operation, at least one endpoint sends a sequence of state exchange characters, rather than a single state exchange character, whenever it sends a state exchange character. For example, a first endpoint can send a sequence of a predetermined number of Si characters (e.g., X "Si" characters, each "Si" character including a sequence number indicative of the last cell received by the first endpoint from the second endpoint). Each such sequence can be indicative of arbitrary state information. For example, such a sequence can be indicative of the sequence number of the last cell received by the endpoint that sends the state exchange character sequence (e.g., if each state exchange character in the sequence is indicative of a binary "1" or "0" and the sequence consists of N characters, the sequence number of the cell can be an N-bit binary number determined by the N-character sequence).

We next describe specific examples of codebooks that are used in preferred embodiments of the invention. Positive and negative codebooks that implement an 9B/10B code are set forth as Tables 1, 4, and 5. Table 2 sets forth special characters that are suitable for use with the 10-bit code words set forth in Table 1. Positive and negative codebooks that implement a 7B/8B code are set forth as Table 3.

We first describe the 9B/10B code whose code words are set forth as Table 1.

TABLE 1

| Symbol | Positive Code | Positive Disparity | Negative Code | Negative Disparity | Primary Mapping? |
|---|---|---|---|---|---|
| 0 | 1001000111 | 0 | 0110111000 | 0 | |
| 1 | 1000011110 | 0 | 0111100001 | 0 | |
| 2 | 1000011101 | 0 | 0111100010 | 0 | |
| 3 | 1110011000 | 0 | 0001100111 | 0 | |
| 4 | 1000011011 | 0 | 0111100100 | 0 | |
| 5 | 1110100010 | 0 | 0001011101 | 0 | |
| 6 | 1100010101 | 0 | 0011101010 | 0 | |
| 7 | 1110101000 | 0 | 0001010111 | 0 | |
| 8 | 1000010111 | 0 | 0111101000 | 0 | |
| 9 | 1110000110 | 0 | 0001111001 | 0 | |
| 10 | 1110000101 | 0 | 0001111010 | 0 | |
| 11 | 1110110000 | 0 | 0001001111 | 0 | |
| 12 | 1100100011 | 0 | 0011011100 | 0 | |
| 13 | 1100010110 | 0 | 0011101001 | 0 | |
| 14 | 1100100101 | 0 | 0011011010 | 0 | |
| 15 | 1100011010 | 0 | 0011100101 | 0 | |
| 16 | 1000101011 | 0 | 0111010100 | 0 | |
| 17 | 1100001110 | 0 | 0011110001 | 0 | |
| 18 | 1100001101 | 0 | 0011110010 | 0 | |
| 19 | 1100100110 | 0 | 0011011001 | 0 | |
| 20 | 1100001011 | 0 | 0011110100 | 0 | |
| 21 | 1100101010 | 0 | 0011010101 | 0 | |
| 22 | 1100101001 | 0 | 0011010110 | 0 | |
| 23 | 1100101100 | 0 | 0011010011 | 0 | |
| 24 | 1001001011 | 0 | 0110110100 | 0 | |
| 25 | 1100110010 | 0 | 0011001101 | 0 | |
| 26 | 1100110001 | 0 | 0011001110 | 0 | |
| 27 | 1100110100 | 0 | 0011001011 | 0 | |
| 28 | 1001010011 | 0 | 0110101100 | 0 | |
| 29 | 1101001010 | 0 | 0010110101 | 0 | |
| 30 | 1000101101 | 0 | 0111010010 | 0 | |
| 31 | 1101010010 | 0 | 0010101101 | 0 | |
| 32 | 1001100011 | 0 | 0110011100 | 0 | |
| 33 | 1101010100 | 0 | 0010101011 | 0 | |
| 34 | 1000110101 | 0 | 0111001010 | 0 | |
| 35 | 1101011000 | 0 | 0010100111 | 0 | |

TABLE 1-continued

| Symbol | Positive Code | Positive Disparity | Negative Code | Negative Disparity | Primary Mapping? |
|---|---|---|---|---|---|
| 36 | 1010001011 | 0 | 0101110100 | 0 | |
| 37 | 1101100010 | 0 | 0010011101 | 0 | |
| 38 | 1001001101 | 0 | 0110110010 | 0 | |
| 39 | 1101101000 | 0 | 0010010111 | 0 | |
| 40 | 1010010011 | 0 | 0101101100 | 0 | |
| 41 | 1101110000 | 0 | 0010001111 | 0 | |
| 42 | 1001010101 | 0 | 0110101010 | 0 | |
| 43 | 1000101110 | 0 | 0111010001 | 0 | |
| 44 | 1010100011 | 0 | 0101011100 | 0 | |
| 45 | 1000110110 | 0 | 0111001001 | 0 | |
| 46 | 1001011001 | 0 | 0110100110 | 0 | |
| 47 | 1000111010 | 0 | 0111000101 | 0 | |
| 48 | 1001100101 | 0 | 0110011010 | 0 | |
| 49 | 1001001110 | 0 | 0110110001 | 0 | |
| 50 | 1001101001 | 0 | 0110010110 | 0 | |
| 51 | 1001010110 | 0 | 0110101001 | 0 | |
| 52 | 1001110001 | 0 | 0110001110 | 0 | |
| 53 | 1001011010 | 0 | 0110100101 | 0 | |
| 54 | 1010001101 | 0 | 0101110010 | 0 | |
| 55 | 1001100110 | 0 | 0110011001 | 0 | |
| 56 | 1010010101 | 0 | 0101101010 | 0 | |
| 57 | 1001101010 | 0 | 0110010101 | 0 | |
| 58 | 1010011001 | 0 | 0101100110 | 0 | |
| 59 | 1001110010 | 0 | 0110001101 | 0 | |
| 60 | 1010100101 | 0 | 0101011010 | 0 | |
| 61 | 1001110100 | 0 | 0110001011 | 0 | |
| 62 | 1010101001 | 0 | 0101010110 | 0 | |
| 63 | 1010001110 | 0 | 0101110001 | 0 | |
| 64 | 1110100001 | 0 | 0001011110 | 0 | |
| 65 | 1110111110 | 6 | 0001000001 | −6 | Y |
| 66 | 1110111101 | 6 | 0001000010 | −6 | Y |
| 67 | 1110111100 | 4 | 0001000011 | −4 | Y |
| 68 | 1110111011 | 6 | 0001000100 | −6 | Y |
| 69 | 1110111010 | 4 | 0001000101 | −4 | Y |
| 70 | 1110111001 | 4 | 0001000110 | −4 | Y |
| 71 | 1110111000 | 2 | 0001000111 | −2 | Y |
| 72 | 1110110111 | 6 | 0001001000 | −6 | Y |
| 73 | 1110110110 | 4 | 0001001001 | −4 | Y |
| 74 | 1110110101 | 4 | 0001001010 | −4 | Y |
| 75 | 1110110100 | 2 | 0001001011 | −2 | Y |
| 76 | 1110110011 | 4 | 0001001100 | −4 | Y |
| 77 | 1110110010 | 2 | 0001001101 | 2 | Y |
| 78 | 1110110001 | 2 | 0001001110 | −2 | Y |
| 79 | 0001001111 | 0 | 1110110000 | 0 | Y |
| 80 | 1110101111 | 6 | 0001010000 | −6 | Y |
| 81 | 1110101110 | 4 | 0001010001 | −4 | Y |
| 82 | 1110101101 | 4 | 0001010010 | −4 | Y |
| 83 | 1110101100 | 2 | 0001010011 | −2 | Y |
| 84 | 1110101011 | 4 | 0001010100 | −4 | Y |
| 85 | 1110101010 | 2 | 0001010101 | −2 | Y |
| 86 | 1110101001 | 2 | 0001010110 | −2 | Y |
| 87 | 0001010111 | 0 | 1110101000 | 0 | Y |
| 88 | 1110100111 | 4 | 0001011000 | −4 | Y |
| 89 | 1110100110 | 2 | 0001011001 | −2 | Y |
| 90 | 1110100101 | 2 | 0001011010 | −2 | Y |
| 91 | 0001011011 | 0 | 1110100100 | 0 | Y |
| 92 | 1110100011 | 2 | 0001011100 | −2 | Y |
| 93 | 0001011101 | 0 | 1110100010 | 0 | Y |
| 94 | 0001011110 | 0 | 1110100001 | 0 | Y |
| 95 | 1110100100 | 0 | 0001011011 | 0 | |
| 96 | 1110010001 | 0 | 0001101110 | 0 | |
| 97 | 1110011110 | 4 | 0001100001 | −4 | Y |
| 98 | 1110011101 | 4 | 0001100010 | −4 | Y |
| 99 | 1110011100 | 2 | 0001100011 | −2 | Y |
| 100 | 1110011011 | 4 | 0001100100 | −4 | Y |
| 101 | 1110011010 | 2 | 0001100101 | −2 | Y |
| 102 | 1110011001 | 2 | 0001100110 | −2 | Y |
| 103 | 0001100111 | 0 | 1110011000 | 0 | Y |
| 104 | 1110010111 | 4 | 0001101000 | −4 | Y |
| 105 | 1110010110 | 2 | 0001101001 | −2 | Y |
| 106 | 1110010101 | 2 | 0001101010 | −2 | Y |
| 107 | 0001101011 | 0 | 1110010100 | 0 | Y |
| 108 | 1110010011 | 2 | 0001101100 | −2 | Y |
| 109 | 0001101101 | 0 | 1110010010 | 0 | Y |
| 110 | 0001101110 | 0 | 1110010001 | 0 | Y |
| 111 | 0001101111 | 2 | 1110010000 | −2 | Y |

TABLE 1-continued

| Symbol | Positive Code | Positive Disparity | Negative Code | Negative Disparity | Primary Mapping? |
|---|---|---|---|---|---|
| 112 | 1110001010 | 0 | 0001110101 | 0 | |
| 113 | 1110001110 | 2 | 0001110001 | −2 | Y |
| 114 | 1110001101 | 2 | 0001110010 | −2 | Y |
| 115 | 0001110011 | 0 | 1110001100 | 0 | Y |
| 116 | 1110001011 | 2 | 0001110100 | −2 | Y |
| 117 | 0001110101 | 0 | 1110001010 | 0 | Y |
| 118 | 0001110110 | 0 | 1110001001 | 0 | Y |
| 119 | 0001110111 | 2 | 1110001000 | −2 | |
| 120 | 1110010010 | 0 | 0001101101 | 0 | |
| 121 | 0001111001 | 0 | 1110000110 | 0 | Y |
| 122 | 0001111010 | 0 | 1110000101 | 0 | Y |
| 123 | 0001111011 | 2 | 1110000100 | −2 | Y |
| 124 | 1110010100 | 0 | 0001101011 | 0 | |
| 125 | 0001111101 | 2 | 1110000010 | −2 | Y |
| 126 | 1110001001 | 0 | 0001110110 | 0 | |
| 127 | 1110001100 | 0 | 0001110011 | 0 | |
| 128 | 1101000011 | 0 | 0010111100 | 0 | |
| 129 | 1101111110 | 6 | 0010000001 | −6 | Y |
| 130 | 1101111101 | 6 | 0010000010 | −6 | Y |
| 131 | 1101111100 | 4 | 0010000011 | −4 | Y |
| 132 | 1101111011 | 6 | 0010000100 | −6 | Y |
| 133 | 1101111010 | 4 | 0010000101 | −4 | Y |
| 134 | 1101111001 | 4 | 0010000110 | −4 | Y |
| 135 | 1101111000 | 2 | 0010000111 | −2 | Y |
| 136 | 1101110111 | 6 | 0010001000 | −6 | Y |
| 137 | 1101110110 | 4 | 0010001001 | −4 | Y |
| 138 | 1101110101 | 4 | 0010001010 | −4 | Y |
| 139 | 1101110100 | 2 | 0010001011 | −2 | Y |
| 140 | 1101110011 | 4 | 0010001100 | −4 | Y |
| 141 | 1101110010 | 2 | 0010001101 | −2 | Y |
| 142 | 1101110001 | 2 | 0010001110 | −2 | Y |
| 143 | 0010001111 | 0 | 1101110000 | 0 | Y |
| 144 | 1101101111 | 6 | 0010010000 | −6 | Y |
| 145 | 1101101110 | 4 | 0010010001 | −4 | Y |
| 146 | 1101101101 | 4 | 0010010010 | −4 | Y |
| 147 | 1101101100 | 2 | 0010010011 | −2 | Y |
| 148 | 1101101011 | 4 | 0010010100 | −4 | Y |
| 149 | 1101101010 | 2 | 0010010101 | −2 | Y |
| 150 | 1101101001 | 2 | 0010010110 | −2 | Y |
| 151 | 0010010111 | 0 | 1101101000 | 0 | Y |
| 152 | 1101100111 | 4 | 0010011000 | −4 | Y |
| 153 | 1101100110 | 2 | 0010011001 | −2 | Y |
| 154 | 1101100101 | 2 | 0010011010 | −2 | Y |
| 155 | 0010011011 | 0 | 1101100100 | 0 | Y |
| 156 | 1101100011 | 2 | 0010011100 | −2 | Y |
| 157 | 0010011101 | 0 | 1101100010 | 0 | Y |
| 158 | 0010011110 | 0 | 1101100001 | 0 | Y |
| 159 | 1101100100 | 0 | 0010011011 | 0 | |
| 160 | 1101000101 | 0 | 0010111010 | 0 | |
| 161 | 1101011110 | 4 | 0010100001 | −4 | Y |
| 162 | 1101011101 | 4 | 0010100010 | −4 | Y |
| 163 | 1101011100 | 2 | 0010100011 | −2 | Y |
| 164 | 1101011011 | 4 | 0010100100 | −4 | Y |
| 165 | 1101011010 | 2 | 0010100101 | −2 | Y |
| 166 | 1101011001 | 2 | 0010100110 | −2 | Y |
| 167 | 0010100111 | 0 | 1101011000 | 0 | Y |
| 168 | 1101010111 | 4 | 0010101000 | −4 | Y |
| 169 | 1101010110 | 2 | 0010101001 | −2 | Y |
| 170 | 1101010101 | 2 | 0010101010 | −2 | Y |
| 171 | 0010101011 | 0 | 1101010100 | 0 | Y |
| 172 | 1101010011 | 2 | 0010101100 | −2 | Y |
| 173 | 0010101101 | 0 | 1101010010 | 0 | Y |
| 174 | 0010101110 | 0 | 1101010001 | 0 | Y |
| 175 | 0010101111 | 2 | 1101010000 | −2 | Y |
| 176 | 1101001111 | 4 | 0010110000 | −4 | Y |
| 177 | 1101001110 | 2 | 0010110001 | −2 | Y |
| 178 | 1101001101 | 2 | 0010110010 | −2 | Y |
| 179 | 0010110011 | 0 | 1101001100 | 0 | Y |
| 180 | 1101001011 | 2 | 0010110100 | −2 | Y |
| 181 | 0010110101 | 0 | 1101001010 | 0 | Y |
| 182 | 0010110110 | 0 | 1101001001 | 0 | Y |
| 183 | 0010110111 | 2 | 1101001000 | −2 | Y |
| 184 | 1101000111 | 2 | 0010111000 | −2 | Y |
| 185 | 0010111001 | 0 | 1101000110 | 0 | Y |
| 186 | 0010111010 | 0 | 1101000101 | 0 | Y |
| 187 | 0010111011 | 2 | 1101000100 | −2 | Y |
| 188 | 0010111100 | 0 | 1101000011 | 0 | |
| 189 | 0010111101 | 2 | 1101000010 | −2 | Y |
| 190 | 0010111110 | 2 | 1101000001 | −2 | Y |
| 191 | 1001001100 | 0 | 0010110010 | 0 | |
| 192 | 1101001001 | 0 | 0010110110 | 0 | |
| 193 | 1100111110 | 4 | 0011000001 | −4 | Y |
| 194 | 1100111101 | 4 | 0011000010 | −4 | Y |
| 195 | 1100111100 | 2 | 0011000011 | −2 | Y |
| 196 | 1100111011 | 4 | 0011000100 | −4 | Y |
| 197 | 1100111010 | 2 | 0011000101 | −2 | Y |
| 198 | 1100111001 | 2 | 0011000110 | −2 | Y |
| 199 | 0011000111 | 0 | 1100111000 | 0 | Y |
| 200 | 1100110111 | 4 | 0011001000 | −4 | Y |
| 201 | 1100110110 | 2 | 0011001001 | −2 | Y |
| 202 | 1100110101 | 2 | 0011001010 | −2 | Y |
| 203 | 0011001011 | 0 | 1100110100 | 0 | Y |
| 204 | 1100110011 | 2 | 0011001100 | −2 | Y |
| 205 | 0011001101 | 0 | 1100110010 | 0 | Y |
| 206 | 0011001110 | 0 | 1100110001 | 0 | Y |
| 207 | 0011001111 | 2 | 1100110000 | −2 | Y |
| 208 | 1100101111 | 4 | 0011010000 | −4 | Y |
| 209 | 1100101110 | 2 | 0011010001 | −2 | Y |
| 210 | 1100101101 | 2 | 0011010010 | −2 | Y |
| 211 | 0011010011 | 0 | 1100101100 | 0 | Y |
| 212 | 1100101011 | 2 | 0011010100 | −2 | Y |
| 213 | 0011010101 | 0 | 1100101010 | 0 | Y |
| 214 | 0011010110 | 0 | 1100101001 | 0 | Y |
| 215 | 0011010111 | 2 | 1100101000 | −2 | Y |
| 216 | 1100100111 | 2 | 0011011000 | −2 | Y |
| 217 | 0011011001 | 0 | 1100100110 | 0 | Y |
| 218 | 0011011010 | 0 | 1100100101 | 0 | Y |
| 219 | 0011011011 | 2 | 1100100100 | −2 | Y |
| 220 | 0011011100 | 0 | 1100100011 | 0 | Y |
| 221 | 0011011101 | 2 | 1100100010 | −2 | Y |
| 222 | 0011011110 | 2 | 1100100001 | −2 | Y |
| 223 | 1100111000 | 0 | 0011000111 | 0 | |
| 224 | 1101010001 | 0 | 0010101110 | 0 | |
| 225 | 1100011110 | 2 | 0011100001 | −2 | Y |
| 226 | 1100011101 | 2 | 0011100010 | −2 | Y |
| 227 | 0011100011 | 0 | 1100011100 | 0 | Y |
| 228 | 1100011011 | 2 | 0011100100 | −2 | Y |
| 229 | 0011100101 | 0 | 1100011010 | 0 | Y |
| 230 | 0011100110 | 0 | 1100011001 | 0 | Y |
| 231 | 0011100111 | 2 | 1100011000 | −2 | Y |
| 232 | 1100011011 | 2 | 0011101000 | −2 | Y |
| 233 | 0011101001 | 0 | 1100010110 | 0 | Y |
| 234 | 0011101010 | 0 | 1100010101 | 0 | Y |
| 235 | 0011101011 | 2 | 1100010100 | −2 | Y |
| 236 | 0011101100 | 0 | 1100010011 | 0 | Y |
| 237 | 0011101101 | 2 | 1100010010 | −2 | Y |
| 238 | 0011101110 | 2 | 1100010001 | −2 | Y |
| 239 | 0011101111 | 4 | 1100010000 | −4 | Y |
| 240 | 1101100001 | 0 | 0010011110 | 0 | |
| 241 | 0011110001 | 0 | 1100001110 | 0 | Y |
| 242 | 0011110010 | 0 | 1100001101 | 0 | Y |
| 243 | 0011110011 | 2 | 1100001100 | −2 | Y |
| 244 | 0011110100 | 0 | 1100001011 | 0 | Y |
| 245 | 0011110101 | 2 | 1100001010 | −2 | Y |
| 246 | 0011110110 | 2 | 1100001001 | −2 | Y |
| 247 | 0011110111 | 4 | 1100001000 | −4 | Y |
| 248 | 1101000110 | 0 | 0010111001 | 0 | |
| 249 | 0011111001 | 2 | 1100000110 | −2 | Y |
| 250 | 0011111010 | 2 | 1100000101 | −2 | Y |
| 251 | 0011111011 | 4 | 1100000100 | −4 | Y |
| 252 | 1100010011 | 0 | 0011101100 | 0 | |
| 253 | 0011111101 | 4 | 1100000010 | −4 | Y |
| 254 | 1100011001 | 0 | 0011100110 | 0 | |
| 255 | 1100011100 | 0 | 0011100011 | 0 | |
| 256 | 1010000111 | 0 | 0101111000 | 0 | |
| 257 | 1011111110 | 6 | 0100000001 | −6 | Y |
| 258 | 1011111101 | 6 | 0100000010 | −6 | Y |
| 259 | 1011111100 | 4 | 0100000011 | −4 | Y |
| 260 | 1011111011 | 6 | 0100000100 | −6 | Y |
| 261 | 1011111010 | 4 | 0100000101 | −4 | Y |
| 262 | 1011111001 | 4 | 0100000110 | −4 | Y |
| 263 | 1011111000 | 2 | 0100000111 | −2 | Y |

TABLE 1-continued

| Symbol | Positive Code | Positive Disparity | Negative Code | Negative Disparity | Primary Mapping? |
|---|---|---|---|---|---|
| 264 | 1011110111 | 6 | 0100001000 | −6 | Y |
| 265 | 1011110110 | 4 | 0100001001 | −4 | Y |
| 266 | 1011110101 | 4 | 0100001010 | −4 | Y |
| 267 | 1011110100 | 2 | 0100001011 | −2 | Y |
| 268 | 1011110011 | 4 | 0100001100 | −4 | Y |
| 269 | 1011110010 | 2 | 0100001101 | −2 | Y |
| 270 | 1011110001 | 2 | 0100001110 | −2 | Y |
| 271 | 0100001111 | 0 | 1011110000 | 0 | Y |
| 272 | 1011101111 | 6 | 0100010000 | −6 | Y |
| 273 | 1011101110 | 4 | 0100010001 | −4 | Y |
| 274 | 1011101101 | 4 | 0100010010 | −4 | Y |
| 275 | 1011101100 | 2 | 0100010011 | −2 | Y |
| 276 | 1011101011 | 4 | 0100010100 | −4 | Y |
| 277 | 1011101010 | 2 | 0100010101 | −2 | Y |
| 278 | 1011101001 | 2 | 0100010110 | −2 | Y |
| 279 | 0100010111 | 0 | 1011101000 | 0 | Y |
| 280 | 1011100111 | 4 | 0100011000 | −4 | Y |
| 281 | 1011100110 | 2 | 0100011001 | −2 | Y |
| 282 | 1011100101 | 2 | 0100011010 | −2 | Y |
| 283 | 0100011011 | 0 | 1011100100 | 0 | Y |
| 284 | 1011100011 | 2 | 0100011100 | −2 | Y |
| 285 | 0100011101 | 0 | 1011100010 | 0 | Y |
| 286 | 0100011110 | 0 | 1011100001 | 0 | Y |
| 287 | 1011100100 | 0 | 0100011011 | 0 | |
| 288 | 1011000011 | 0 | 0100111100 | 0 | |
| 289 | 1011011110 | 4 | 0100100001 | −4 | Y |
| 290 | 1011011101 | 4 | 0100100010 | −4 | Y |
| 291 | 1011011100 | 2 | 0100100011 | −2 | Y |
| 292 | 1011011011 | 4 | 0100100100 | −4 | Y |
| 293 | 1011011010 | 2 | 0100100101 | −2 | Y |
| 294 | 1011011001 | 2 | 0100100110 | −2 | Y |
| 295 | 0100100111 | 0 | 1011011000 | 0 | Y |
| 296 | 1011010111 | 0 | 0100101000 | −4 | Y |
| 297 | 1011010110 | 2 | 0100101001 | −2 | Y |
| 298 | 1011010101 | 2 | 0100101010 | −2 | Y |
| 299 | 0100101011 | 0 | 1011010100 | 0 | Y |
| 300 | 1011010011 | 2 | 0100101100 | −2 | Y |
| 301 | 0100101101 | 0 | 1011010010 | 0 | Y |
| 302 | 0100101110 | 0 | 1011010001 | 0 | Y |
| 303 | 0100101111 | 2 | 1011010000 | −2 | Y |
| 304 | 1011001111 | 4 | 0100110000 | −4 | Y |
| 305 | 1011001110 | 2 | 0100110001 | −2 | Y |
| 306 | 1011001101 | 2 | 0100110010 | −2 | Y |
| 307 | 0100110011 | 0 | 1011001100 | 0 | Y |
| 308 | 1011001011 | 2 | 0100110100 | −2 | Y |
| 309 | 0100110101 | 0 | 1011001010 | 0 | Y |
| 310 | 0100110110 | 0 | 1011001001 | 0 | Y |
| 311 | 0100110111 | 2 | 1011001000 | −2 | Y |
| 312 | 1011000111 | 2 | 0100111000 | −2 | Y |
| 313 | 0100111001 | 0 | 1011000110 | 0 | Y |
| 314 | 0100111010 | 0 | 1011000101 | 0 | Y |
| 315 | 0100111011 | 2 | 1011000100 | −2 | Y |
| 316 | 0100111100 | 0 | 1011000011 | 0 | Y |
| 317 | 0100111101 | 2 | 1011000010 | −2 | Y |
| 318 | 0100111110 | 2 | 1011000001 | −2 | Y |
| 319 | 1011001100 | 0 | 0100110011 | 0 | |
| 320 | 1011000101 | 0 | 0100111010 | 0 | |
| 321 | 1010111110 | 4 | 0101000001 | −4 | Y |
| 322 | 1010111101 | 4 | 0101000010 | −4 | Y |
| 323 | 1010111100 | 2 | 0101000011 | −2 | Y |
| 324 | 1010111011 | 4 | 0101000100 | −4 | Y |
| 325 | 1010111010 | 2 | 0101000101 | −2 | Y |
| 326 | 1010111001 | 2 | 0101000110 | −2 | Y |
| 327 | 0101000111 | 0 | 1010111000 | 0 | Y |
| 328 | 1010110111 | 4 | 0101001000 | −4 | Y |
| 329 | 1010110110 | 2 | 0101001001 | −2 | Y |
| 330 | 1010110101 | 2 | 0101001010 | −2 | Y |
| 331 | 0101001011 | 0 | 1010110100 | 0 | Y |
| 332 | 1010110011 | 2 | 0101001100 | −2 | Y |
| 333 | 0101001101 | 0 | 1010110010 | 0 | Y |
| 334 | 0101001110 | 0 | 1010110001 | 0 | Y |
| 335 | 0101001111 | 2 | 1010110000 | −2 | Y |
| 336 | 1010101111 | 4 | 0101010000 | −4 | Y |
| 337 | 1010101110 | 2 | 0101010001 | −2 | Y |
| 338 | 1010101101 | 2 | 0101010010 | −2 | Y |
| 339 | 0101010011 | 0 | 1010101100 | 0 | Y |
| 340 | 1010101011 | 2 | 0101010100 | −2 | Y |
| 341 | 0101010101 | 0 | 1010101010 | 0 | Y |
| 342 | 0101010110 | 0 | 1010101001 | 0 | Y |
| 343 | 0101010111 | 2 | 1010101000 | −2 | Y |
| 344 | 1010100111 | 2 | 0101011000 | −2 | Y |
| 345 | 0101011001 | 0 | 1010100110 | 0 | Y |
| 346 | 0101011010 | 0 | 1010100101 | 0 | Y |
| 347 | 0101011011 | 2 | 1010100100 | −2 | Y |
| 348 | 0101011100 | 0 | 1010100011 | 0 | Y |
| 349 | 0101011101 | 2 | 1010100010 | −2 | Y |
| 350 | 0101011110 | 2 | 1010100001 | −2 | Y |
| 351 | 1010101100 | 0 | 0101010011 | 0 | |
| 352 | 1011001001 | 0 | 0100110110 | 0 | |
| 353 | 1010011110 | 2 | 0101100001 | −2 | Y |
| 354 | 1010011101 | 2 | 0101100010 | −2 | Y |
| 355 | 0101100011 | 0 | 1010011100 | 0 | Y |
| 356 | 1010011011 | 2 | 0101100100 | −2 | Y |
| 357 | 0101100101 | 0 | 1010011010 | 0 | Y |
| 358 | 0101100110 | 0 | 1010011001 | 0 | Y |
| 359 | 0101100111 | 2 | 1010011000 | −2 | Y |
| 360 | 1010010111 | 2 | 0101101000 | −2 | Y |
| 361 | 0101101001 | 0 | 1010010110 | 0 | Y |
| 362 | 0101101010 | 0 | 1010010101 | 0 | Y |
| 363 | 0101101011 | 2 | 1010010100 | −2 | Y |
| 364 | 0101101100 | 0 | 1010010011 | 0 | Y |
| 365 | 0101101101 | 2 | 1010010010 | −2 | Y |
| 366 | 0101101110 | 2 | 1010010001 | −2 | Y |
| 367 | 0101101111 | 4 | 1010010000 | −4 | Y |
| 368 | 1010001111 | 2 | 0101110000 | −2 | Y |
| 369 | 0101110001 | 0 | 1010001110 | 0 | Y |
| 370 | 0101110010 | 0 | 1010001101 | 0 | Y |
| 371 | 0101110011 | 2 | 1010001100 | −2 | Y |
| 372 | 0101110100 | 0 | 1010001011 | 0 | Y |
| 373 | 0101110101 | 2 | 1010001010 | −2 | Y |
| 374 | 0101110110 | 2 | 1010001001 | −2 | Y |
| 375 | 0101110111 | 4 | 1010001000 | −4 | Y |
| 376 | 0101111000 | 0 | 1010000111 | 0 | Y |
| 377 | 0101111001 | 2 | 1010000110 | −2 | Y |
| 378 | 0101111010 | 2 | 1010000101 | −2 | Y |
| 379 | 0101111011 | 4 | 1010000100 | −4 | Y |
| 380 | 0101111100 | 2 | 1010000011 | −2 | Y |
| 381 | 0101111101 | 4 | 1010000010 | −4 | Y |
| 382 | 0101111110 | 4 | 1010000001 | −4 | Y |
| 383 | 1010011100 | 0 | 0101100011 | 0 | |
| 384 | 1011010100 | 0 | 0100101011 | 0 | |
| 385 | 1001111110 | 4 | 0110000001 | −4 | Y |
| 386 | 1001111101 | 4 | 0110000010 | −4 | Y |
| 387 | 1001111100 | 2 | 0110000011 | −2 | Y |
| 388 | 1001111011 | 4 | 0110000100 | −4 | Y |
| 389 | 1001111010 | 2 | 0110000101 | −2 | Y |
| 390 | 1001111001 | 2 | 0110000110 | −2 | Y |
| 391 | 0110000111 | 0 | 1001111000 | 0 | Y |
| 392 | 1001110111 | 4 | 0110001000 | −4 | Y |
| 393 | 1001110110 | 2 | 0110001001 | −2 | Y |
| 394 | 1001110101 | 2 | 0110001010 | −2 | Y |
| 395 | 0110001011 | 0 | 1001110100 | 0 | Y |
| 396 | 1001110011 | 2 | 0110001100 | −2 | Y |
| 397 | 0110001101 | 0 | 1001110010 | 0 | Y |
| 398 | 0110001110 | 0 | 1001110001 | 0 | Y |
| 399 | 0110001111 | 2 | 1001110000 | −2 | Y |
| 400 | 1001101111 | 4 | 0110010000 | −4 | Y |
| 401 | 1001101110 | 2 | 0110010001 | −2 | Y |
| 402 | 1001101101 | 2 | 0110010010 | −2 | Y |
| 403 | 0110010011 | 0 | 1001101100 | 0 | Y |
| 404 | 1001101011 | 2 | 0110010100 | −2 | Y |
| 405 | 0110010101 | 0 | 1001101010 | 0 | Y |
| 406 | 0110010110 | 0 | 1001101001 | 0 | Y |
| 407 | 0110010111 | 2 | 1001101000 | −2 | Y |
| 408 | 1001100111 | 2 | 0110011000 | −2 | Y |
| 409 | 0110011001 | 0 | 1001100110 | 0 | Y |
| 410 | 0110011010 | 0 | 1001100101 | 0 | Y |
| 411 | 0110011011 | 2 | 1001100100 | −2 | Y |
| 412 | 0110011100 | 0 | 1001100011 | 0 | Y |
| 413 | 0110011101 | 2 | 1001100010 | −2 | Y |
| 414 | 0110011110 | 2 | 1001100001 | −2 | Y |
| 415 | 1001111000 | 0 | 0110000111 | 0 | |

TABLE 1-continued

| Symbol | Positive Code | Positive Disparity | Negative Code | Negative Disparity | Primary Mapping? |
|---|---|---|---|---|---|
| 416 | 1011100001 | 0 | 0100011110 | 0 | |
| 417 | 1001011110 | 2 | 0110100001 | −2 | Y |
| 418 | 1001011101 | 2 | 0110100010 | −2 | Y |
| 419 | 0110100011 | 0 | 1001011100 | 0 | Y |
| 420 | 1001011011 | 2 | 0110100100 | −2 | Y |
| 421 | 0110100101 | 0 | 1001011010 | 0 | Y |
| 422 | 0110100110 | 0 | 1001011001 | 0 | Y |
| 423 | 0110100111 | 2 | 1001011000 | −2 | Y |
| 424 | 1001010111 | 2 | 0110101000 | −2 | Y |
| 425 | 0110101001 | 0 | 1001010110 | 0 | Y |
| 426 | 0110101010 | 0 | 1001010101 | 0 | Y |
| 427 | 0110101011 | 2 | 1001010100 | −2 | Y |
| 428 | 0110101100 | 0 | 1001010011 | 0 | Y |
| 429 | 0110101101 | 2 | 1001010010 | −2 | Y |
| 430 | 0110101110 | 2 | 1001010001 | −2 | Y |
| 431 | 0110101111 | 4 | 1001010000 | −4 | Y |
| 432 | 1001001111 | 2 | 0110110000 | −2 | Y |
| 433 | 0110110001 | 0 | 1001001110 | 0 | Y |
| 434 | 0110110010 | 0 | 1001001101 | 0 | Y |
| 435 | 0110110011 | 2 | 1001001100 | −2 | Y |
| 436 | 0110110100 | 0 | 1001001011 | 0 | Y |
| 437 | 0110110101 | 2 | 1001001010 | −2 | Y |
| 438 | 0110110110 | 2 | 1001001001 | −2 | Y |
| 439 | 0110110111 | 4 | 1001001000 | −4 | Y |
| 440 | 0110111000 | 0 | 1001000111 | 0 | Y |
| 441 | 0110111001 | 2 | 1001000110 | −2 | Y |
| 442 | 0110111010 | 2 | 1001000101 | −2 | Y |
| 443 | 0110111011 | 4 | 1001000100 | −4 | Y |
| 444 | 0110111100 | 2 | 1001000011 | −2 | Y |
| 445 | 0110111101 | 4 | 1001000010 | −4 | Y |
| 446 | 0110111110 | 4 | 1001000001 | −4 | Y |
| 447 | 1000111100 | 0 | 0111000011 | 0 | |
| 448 | 1010110001 | 0 | 0101001110 | 0 | |
| 449 | 1000111110 | 2 | 0111000001 | −2 | Y |
| 450 | 1000111101 | 2 | 0111000010 | −2 | Y |
| 451 | 0111000011 | 0 | 1000111100 | 0 | Y |
| 452 | 1000111011 | 2 | 0111000100 | −2 | Y |
| 453 | 0111000101 | 0 | 1000111010 | 0 | Y |
| 454 | 0111000110 | 0 | 1000111001 | 0 | Y |
| 455 | 0111000111 | 2 | 1000111000 | −2 | Y |
| 456 | 1000110111 | 2 | 0111001000 | −2 | Y |
| 457 | 0111001001 | 0 | 1000110110 | 0 | Y |
| 458 | 0111001010 | 0 | 1000110101 | 0 | Y |
| 459 | 0111001011 | 2 | 1000110100 | −2 | Y |
| 460 | 0111001100 | 0 | 1000110011 | 0 | Y |
| 461 | 0111001101 | 2 | 1000110010 | −2 | Y |
| 462 | 0111001110 | 2 | 1000110001 | −2 | Y |
| 463 | 0111001111 | 4 | 1000110000 | −4 | Y |
| 464 | 1000101111 | 2 | 0111010000 | −2 | Y |
| 465 | 0111010001 | 0 | 1000101110 | 0 | Y |
| 466 | 0111010010 | 0 | 1000101101 | 0 | Y |
| 467 | 0111010011 | 2 | 1000101100 | −2 | Y |
| 468 | 0111010100 | 0 | 1000101011 | 0 | Y |
| 469 | 0111010101 | 2 | 1000101010 | −2 | Y |
| 470 | 0111010110 | 2 | 1000101001 | −2 | Y |
| 471 | 0111010111 | 4 | 1000101000 | −4 | Y |
| 472 | 0111011000 | 0 | 1000100111 | 0 | Y |
| 473 | 0111011001 | 2 | 1000100110 | −2 | Y |
| 474 | 0111011010 | 2 | 1000100101 | −2 | Y |
| 475 | 0111011011 | 4 | 1000100100 | −4 | Y |
| 476 | 0111011100 | 2 | 1000100011 | −2 | Y |
| 477 | 0111011101 | 4 | 1000100010 | −4 | Y |
| 478 | 0111011110 | 4 | 1000100001 | −4 | Y |
| 479 | 1001011100 | 0 | 0110100011 | 0 | |
| 480 | 1011000110 | 0 | 0100111001 | 0 | |
| 481 | 0111100001 | 0 | 1000011110 | 0 | Y |
| 482 | 0111100010 | 0 | 1000011101 | 0 | Y |
| 483 | 0111100011 | 2 | 1000011100 | −2 | Y |
| 484 | 0111100100 | 0 | 1000011011 | 0 | Y |
| 485 | 0111100101 | 2 | 1000011010 | −2 | Y |
| 486 | 0111100110 | 2 | 1000011001 | −2 | Y |
| 487 | 0111100111 | 4 | 1000011000 | −4 | Y |
| 488 | 0111101000 | 0 | 1000010111 | 0 | Y |
| 489 | 0111101001 | 2 | 1000010110 | −2 | Y |
| 490 | 0111101010 | 2 | 1000010101 | −2 | Y |
| 491 | 0111101011 | 4 | 1000010100 | −4 | Y |
| 492 | 0111101100 | 2 | 1000010011 | −2 | Y |
| 493 | 0111101101 | 4 | 1000010010 | −4 | Y |
| 494 | 0111101110 | 4 | 1000010001 | −4 | Y |
| 495 | 0111101111 | 6 | 1000010000 | −6 | Y |
| 496 | 1011001010 | 0 | 0100110101 | 0 | |
| 497 | 0111110001 | 2 | 1000001110 | −2 | Y |
| 498 | 0111110010 | 2 | 1000001101 | −2 | Y |
| 499 | 0111110011 | 4 | 1000001100 | −4 | Y |
| 500 | 0111110100 | 2 | 1000001011 | −2 | Y |
| 501 | 0111110101 | 4 | 1000001010 | −4 | Y |
| 502 | 0111110110 | 4 | 1000001001 | −4 | Y |
| 503 | 0111110111 | 6 | 1000001000 | −6 | Y |
| 504 | 1000100111 | 0 | 0111011000 | 0 | |
| 505 | 0111111001 | 4 | 1000000110 | −4 | Y |
| 506 | 0111111010 | 4 | 1000000101 | −4 | Y |
| 507 | 0111111011 | 6 | 1000000100 | −6 | Y |
| 508 | 1000110011 | 0 | 0111001100 | 0 | |
| 509 | 0111111101 | 6 | 1000000010 | −6 | Y |
| 510 | 1000111001 | 0 | 0111000110 | 0 | |
| 511 | 1001101100 | 0 | 0110010011 | 0 | |

The primary mapping for the 9B/10B code of Table 1 prepends a 0 bit to the input symbol so that disparity of the resulting code word (the number of "one" bits thereof minus the number of "0" bits thereof) is less than the disparity of the input symbol, and complements the resulting code word if its disparity is negative. This determines the 408 code words of the positive disparity codebook (set forth in Table 1 in the second column from the left) to which the input symbols are mapped by the primary mapping. Each code word in the positive disparity codebook (sometimes referred to as the "positive" codebook) has the non-negative disparity indicated (in the third column from the left in Table 1).

The complement of each code word of positive disparity codebook determines the code word of the negative disparity codebook to which the relevant input symbol maps. This determines the 408 code words of the negative disparity codebook (set forth in Table 1 in the fourth column from the left) to which the input symbols are mapped by the primary mapping. Each code word in the negative disparity codebook (sometimes referred to as the "negative" codebook) has the non-positive disparity indicated (in the second column from the right in Table 1).

The secondary mapping for the 9B/10B code of Table 1 determines those code words in each row of Table 1 in which there is no "Y" symbol in the right column. (The primary mapping for this code determines those code words in each row of Table 1 in which there is a "Y" symbol in the right column).

Each input symbol maps to both a code word in the positive disparity codebook and a code word in the negative disparity codebook. The choice of which code word is used to encode each input symbol (in a sequence of input symbols to be encoded) is determined by the cumulative disparity of the code words that have been used to encode the previous input symbols in the sequence. More specifically, the code word from the positive codebook is used if the cumulative disparity is less than zero, and the code word from the negative codebook is used if the cumulative disparity is greater than or equal to zero.

For example, if the first input symbol (in a sequence of input symbols to be encoded) is the symbol "0" (the binary word 000000000), this input symbol is mapped to the code word "1001000111" from the positive codebook. This code word is determined by the secondary mapping, so that typically, a lookup table (e.g., a lookup table implemented by circuit 61 of FIG. 3) is used to generate the code word in response to the input symbol.

If the next input symbol (in the same sequence) is the symbol "65" (the binary word 001000001), this input symbol is mapped to the code word "1110111110" from the positive codebook. This code word is determined by the primary mapping, so that typically, logic circuitry (e.g., circuit 60 of FIG. 3) is used to generate the code word in response to the input symbol.

If the third input symbol (in the same sequence) is also the symbol "65" (the binary word 001000001), this input symbol is mapped to the code word "0001000001" from the negative codebook (since the cumulative disparity of the two previously generated code words is a positive number, 6).

The code words of the 9B/10B code of Table 1 are selected so that each code word has disparity in the range of [−6, 6] (even values only), so that each sequence of the code words has a maximum run length of 7, a running digital sum variation of 10, a transition density of at least 30% (i.e. at least 3 transitions per code word), and so that only a relative small number of input symbols (i.e., 104 symbols of the total set of 512 symbols) do not have a successful primary mapping (i.e., each of the positive and negative codebooks has 104 symbols that are determined by the secondary mapping). The code of Table 1 has an average of 5.207 transitions per code word (over all legal code pairs). Error magnification is minimized so that only 16% to 17% of single bit errors result in a burst error of 6, 7, 8, or 9 bits in the decoded symbol.

The 9B/10B code of Table 1 has been compared with the 9B/10B code outlined in U.S. Pat. No. 6,198,413, and the two codes differ in several respects. For example, the 9B/10B code of Table 1 (but not the 9B/10B code outlined in U.S. Pat. No. 6,198,413) has a normalized DC offset of 7.1.

In some embodiments, the inventive code is a 9B/10B block code having positive and negative codebooks (and a maximum run length of 7), each of the positive and negative codebooks has not more than 104 symbols that are determined by the secondary mapping, each of the code words has disparity equal to one of 6, −6, 4, −4, 2, −2, and zero, none of the code words has a run of length greater than three at one end (or a run of length greater than four at its other end, or a run of length greater than seven away from its ends), and none of the code words has less than three transitions.

Table 2 sets forth examples of special characters ("out-of-band" or "OOB" characters) that can be inserted in a stream of code words generated in accordance with the 9B/10B code of Table 1 (or the 9B/10B code of Table 4 or Table 5, described below).

TABLE 2

| OOB | 9B/10B Out-of-Band Codes | | | |
|---|---|---|---|---|
| | Positive | | Negative | |
| Code | Preamble | Discriminant | Preamble | Discriminant |
| OOB00 | 1100000000 | 1111111001 | 0011111111 | 0000000110 |
| OOB01 | 1100000000 | 1111110011 | 0011111111 | 0000001100 |
| OOB02 | 1100000000 | 1111100111 | 0011111111 | 0000011000 |
| OOB03 | 1100000000 | 1111111010 | 0011111111 | 0000000101 |
| OOB04 | 1100000000 | 1111110101 | 0011111111 | 0000001010 |
| OOB05 | 1100000000 | 1111101011 | 0011111111 | 0000010100 |

TABLE 2-continued

| OOB | 9B/10B Out-of-Band Codes | | | |
|---|---|---|---|---|
| | Positive | | Negative | |
| Code | Preamble | Discriminant | Preamble | Discriminant |
| OOB06 | 1100000000 | 1111010111 | 0011111111 | 0000101000 |
| OOB07 | 1100000000 | 1111110110 | 0011111111 | 0000001001 |
| OOB08 | 1100000000 | 1111101101 | 0011111111 | 0000010010 |
| OOB09 | 1100000000 | 1111011011 | 0011111111 | 0000100100 |
| OOB10 | 1100000000 | 1110110111 | 0011111111 | 0001001000 |
| OOB11 | 1100000000 | 1111101110 | 0011111111 | 0000010001 |
| OOB12 | 1100000000 | 1111011101 | 0011111111 | 0000100010 |
| OOB13 | 1100000000 | 1110111011 | 0011111111 | 0001000100 |
| OOB14 | 1100000000 | 1101110111 | 0011111111 | 0010001000 |
| OOB15 | 1100000000 | 1111011110 | 0011111111 | 0000100001 |
| OOB16 | 1100000000 | 1110111101 | 0011111111 | 0001000010 |
| OOB17 | 1100000000 | 1101111011 | 0011111111 | 0010000100 |
| OOB18 | 1100000000 | 1011110111 | 0011111111 | 0100001000 |
| OOB19 | 1100000000 | 1110111110 | 0011111111 | 0001000001 |
| OOB20 | 1100000000 | 1101111101 | 0011111111 | 0010000010 |
| OOB21 | 1100000000 | 1011111011 | 0011111111 | 0100000100 |
| OOB22 | 1100000000 | 1101111110 | 0011111111 | 0010000001 |
| OOB23 | 1100000000 | 1011111101 | 0011111111 | 0100000010 |
| OOB24 | 1100000000 | 1011111110 | 0011111111 | 0100000001 |

In Table 2, each special character consists of a 10-bit preamble followed by a 10-bit discriminant pattern. Each special character is thus a sequence of two, 10-bit words. The preamble contains a run of eight 0s or 1s, which guarantees it never appears in a legal sequence of 9B/10B code words (assuming that the Table 1, Table 4, or Table 5 implementation of the 9B/10B code is employed). Thus, the preamble can be used to establish symbol alignment. The preamble is commonly referred to as the "comma," "comma character," or "comma symbol."

The discriminant identifies the code type. Applications may assign logical meanings to the OOB codes as necessary. For example, one OOB code can be used as an "idle" character (of a type described elsewhere herein) for simplex or duplex flow control, another can be used as a "link training" character (of a type described elsewhere herein), and others can be used as "state exchange" characters ("Si") of a type described elsewhere herein. A particular application may choose to use a subset of the possible OOB values in order to increase the Hamming distance between allowable codes, thereby reducing the probability of missing errors in the transmitted characters.

Each OOB code has a "positive" and "negative" version. "Positive" OOB codes are used when the current running disparity is positive. "Negative" OOB codes are used when the current running disparity is negative. This ensures that the maximum digital sum variation does not grow too large. OOB code bits are transmitted MSB first, where the MSB is depicted on the left in Table 2. It is an error to transmit or receive a sequence with a run of eight (or more) identical bits that does not match an OOB code, and it is also an error to transmit or receive a positive OOB code when current running disparity is negative or a negative OOB code when current running disparity is positive.

Since all the OOB codes start with a run of length two and end with runs of length no more than three, they may be inserted between any pair of 9B/10B code words (assuming that the 9B/10B code words begin and end with runs of length no greater than four in all cases) without producing a run of length greater than seven (except for the run of length eight within the preamble).

We next describe the 7B/8B code whose code words are set forth as Table 3.

TABLE 3

| Symbol | Positive Code | Positive Disparity | Negative Code | Negative Disparity | Primary Mapping? |
|---|---|---|---|---|---|
| 0 | 11000011 | 0 | 00111100 | 0 | |
| 1 | 10001110 | 0 | 01110001 | 0 | |
| 2 | 10001101 | 0 | 01110010 | 0 | |
| 3 | 11100100 | 0 | 00011011 | 0 | |
| 4 | 10001011 | 0 | 01110100 | 0 | |
| 5 | 11101000 | 0 | 00010111 | 0 | |
| 6 | 11000101 | 0 | 00111010 | 0 | |
| 7 | 11000110 | 0 | 00111001 | 0 | |
| 8 | 10000111 | 0 | 01111000 | 0 | |
| 9 | 11001010 | 0 | 00110101 | 0 | |
| 10 | 11001001 | 0 | 00110110 | 0 | |
| 11 | 11010100 | 0 | 00101011 | 0 | |
| 12 | 10010011 | 0 | 01101100 | 0 | |
| 13 | 11011000 | 0 | 00100111 | 0 | |
| 14 | 10010101 | 0 | 01101010 | 0 | |
| 15 | 10011010 | 0 | 01100101 | 0 | |
| 16 | 11100001 | 0 | 00011110 | 0 | |
| 17 | 11101110 | 4 | 00010001 | −4 | Y |
| 18 | 11101101 | 4 | 00010010 | −4 | Y |
| 19 | 11101100 | 2 | 00010011 | −2 | Y |
| 20 | 11101011 | 4 | 00010100 | −4 | Y |
| 21 | 11101010 | 2 | 00010101 | −2 | Y |
| 22 | 11101001 | 2 | 00010110 | −2 | Y |
| 23 | 00010111 | 0 | 11101000 | 0 | Y |
| 24 | 11100111 | 4 | 00011000 | −4 | Y |
| 25 | 11100110 | 2 | 00011001 | −2 | Y |
| 26 | 11100101 | 2 | 00011010 | −2 | Y |
| 27 | 00011011 | 0 | 11100100 | 0 | Y |
| 28 | 11100011 | 2 | 00011100 | −2 | Y |
| 29 | 00011101 | 0 | 11100010 | 0 | Y |
| 30 | 00011110 | 0 | 11100001 | 0 | Y |
| 31 | 11100010 | 0 | 00011101 | 0 | |
| 32 | 11010001 | 0 | 00101110 | 0 | |
| 33 | 11011110 | 4 | 00100001 | −4 | Y |
| 34 | 11011101 | 4 | 00100010 | −4 | Y |
| 35 | 11011100 | 2 | 00100011 | −2 | Y |
| 36 | 11011011 | 4 | 00100100 | −4 | Y |
| 37 | 11011010 | 2 | 00100101 | −2 | Y |
| 38 | 11011001 | 2 | 00100110 | −2 | Y |
| 39 | 00100111 | 0 | 11011000 | 0 | Y |
| 40 | 11010111 | 4 | 00101000 | −4 | Y |
| 41 | 11010110 | 2 | 00101001 | −2 | Y |
| 42 | 11010101 | 2 | 00101010 | −2 | Y |
| 43 | 00101011 | 0 | 11010100 | 0 | Y |
| 44 | 11010011 | 2 | 00101100 | −2 | Y |
| 45 | 00101101 | 0 | 11010010 | 0 | Y |
| 46 | 00101110 | 0 | 11010001 | 0 | Y |
| 47 | 11010010 | 0 | 00101101 | 0 | |
| 48 | 10100011 | 0 | 01011100 | 0 | |
| 49 | 11001110 | 2 | 00110001 | −2 | Y |
| 50 | 11001101 | 2 | 00110010 | −2 | Y |
| 51 | 00110011 | 0 | 11001100 | 0 | Y |
| 52 | 11001011 | 2 | 00110100 | −2 | Y |
| 53 | 00110101 | 0 | 11001010 | 0 | Y |
| 54 | 00110110 | 0 | 11001001 | 0 | Y |
| 55 | 00110111 | 2 | 11001000 | −2 | Y |
| 56 | 11000111 | 2 | 00111000 | −2 | Y |
| 57 | 00111001 | 0 | 11000110 | 0 | Y |
| 58 | 00111010 | 0 | 11000101 | 0 | Y |
| 59 | 00111011 | 2 | 11000100 | −2 | Y |
| 60 | 00111100 | 0 | 11000011 | 0 | Y |
| 61 | 00111101 | 2 | 11000010 | −2 | Y |
| 62 | 00111110 | 2 | 11000001 | −2 | Y |
| 63 | 11001100 | 0 | 00110011 | 0 | |
| 64 | 10110001 | 0 | 01001110 | 0 | |
| 65 | 10111110 | 4 | 01000001 | −4 | Y |
| 66 | 10111101 | 4 | 01000010 | −2 | Y |
| 67 | 10111100 | 2 | 01000011 | −2 | Y |
| 68 | 10111011 | 4 | 01000100 | −4 | Y |
| 69 | 10111010 | 2 | 01000101 | −2 | Y |
| 70 | 10111001 | 2 | 01000110 | −2 | Y |
| 71 | 01000111 | 0 | 10111000 | 0 | Y |
| 72 | 10110111 | 4 | 01001000 | −4 | Y |
| 73 | 10110110 | 2 | 01001001 | −2 | Y |
| 74 | 10110101 | 2 | 01001010 | −2 | Y |
| 75 | 01001011 | 0 | 10110100 | 0 | Y |
| 76 | 10110011 | 2 | 01001100 | −2 | Y |
| 77 | 01001101 | 0 | 10110010 | 0 | Y |
| 78 | 01001110 | 0 | 10110001 | 0 | Y |
| 79 | 10110010 | 0 | 01001101 | 0 | |
| 80 | 10110100 | 0 | 01001011 | 0 | |
| 81 | 10101110 | 2 | 01010001 | −2 | Y |
| 82 | 10101101 | 2 | 01010010 | −2 | Y |
| 83 | 01010011 | 0 | 10101100 | 0 | Y |
| 84 | 10101011 | 2 | 01010100 | −2 | Y |
| 85 | 01010101 | 0 | 10101010 | 0 | Y |
| 86 | 01010110 | 0 | 10101001 | 0 | Y |
| 87 | 01010111 | 2 | 10101000 | −2 | Y |
| 88 | 10100111 | 2 | 01011000 | −2 | Y |
| 89 | 01011001 | 0 | 10100110 | 0 | Y |
| 90 | 01011010 | 0 | 10100101 | 0 | Y |
| 91 | 01011011 | 2 | 10100100 | −2 | Y |
| 92 | 01011100 | 0 | 10100011 | 0 | Y |
| 93 | 01011101 | 2 | 10100010 | −2 | Y |
| 94 | 01011110 | 2 | 10100001 | −2 | Y |
| 95 | 10101100 | 0 | 01010011 | 0 | |
| 96 | 10011001 | 0 | 11001100 | 0 | |
| 97 | 10011110 | 2 | 01100001 | −2 | Y |
| 98 | 10011101 | 2 | 01100010 | −2 | Y |
| 99 | 01100011 | 0 | 10011100 | 0 | Y |
| 100 | 10011011 | 2 | 01100100 | −2 | Y |
| 101 | 01100101 | 0 | 10011010 | 0 | Y |
| 102 | 01100110 | 0 | 10011001 | 0 | Y |
| 103 | 01100111 | 2 | 10011000 | −2 | Y |
| 104 | 10010111 | 2 | 01101000 | −2 | Y |
| 105 | 01101001 | 0 | 10010110 | 0 | Y |
| 106 | 01101010 | 0 | 10010101 | 0 | Y |
| 107 | 01101011 | 2 | 10010100 | −2 | Y |
| 108 | 01101100 | 0 | 10010011 | 0 | Y |
| 109 | 01101101 | 2 | 10010010 | −2 | Y |
| 110 | 01101110 | 2 | 10010001 | −2 | Y |
| 111 | 10011100 | 0 | 01100011 | 0 | |
| 112 | 10100101 | 0 | 01011010 | 0 | |
| 113 | 01110001 | 0 | 10001110 | 0 | Y |
| 114 | 01110010 | 0 | 10001101 | 0 | Y |
| 115 | 01110011 | 2 | 10001100 | −2 | Y |
| 116 | 01110100 | 0 | 10001011 | 0 | Y |
| 117 | 01110101 | 2 | 10001010 | −2 | Y |
| 118 | 01110110 | 2 | 10001001 | −2 | Y |
| 119 | 01110111 | 4 | 10001000 | −4 | Y |
| 120 | 01111000 | 0 | 10000111 | 0 | Y |
| 121 | 01111001 | 2 | 10000110 | −2 | Y |
| 122 | 01111010 | 2 | 10000101 | −2 | Y |
| 123 | 01111011 | 4 | 10000100 | −4 | Y |
| 124 | 01111100 | 2 | 10000011 | −2 | Y |
| 125 | 01111011 | 4 | 10000010 | −4 | Y |
| 126 | 01111110 | 4 | 10000001 | −4 | Y |
| 127 | 10010110 | 0 | 01101001 | 0 | |

The primary mapping for the 7B/8B code of Table 3 also prepends a 0 bit to the input symbol so that disparity of the resulting code word (the number of "one" bits thereof minus the number of "0" bits thereof) is less than the disparity of the input symbol, and complements the resulting code word if its disparity is negative. This determines the 98 code words of the positive disparity codebook (set forth in Table 3 in the second column from the left) to which the input symbols are mapped by the primary mapping. Each code word in the positive disparity codebook (sometimes referred to as the "positive" codebook) has the non-negative disparity indicated (in the third column from the left in Table 3).

The complement of each code word of positive disparity codebook determines the code word of the negative disparity codebook to which the relevant input symbol maps. This determines the 98 code words of the negative disparity codebook (set forth in Table 3 in the fourth column from the left) to which the input symbols are mapped by the primary mapping. Each code word in the negative disparity codebook (sometimes referred to as the "negative" codebook) has the non-positive disparity indicated (in the second column from the right in Table 3).

The secondary mapping for the 7B/8B code of Table 3 determines those code words in each row of Table 3 in which there is no "Y" symbol in the right column. (The primary mapping for this code determines those code words in each row of Table 3 in which there is a "Y" symbol in the right column).

Each input symbol maps to both a code word in the positive disparity codebook and a code word in the negative disparity codebook. The choice of which code word is used to encode each input symbol (in a sequence of input symbols to be encoded) is determined by the cumulative disparity of the code words that have been used to encode the previous input symbols in the sequence. More specifically, the code word from the positive codebook is used if the cumulative disparity is less than zero, and the code word from the negative codebook is used if the cumulative disparity is greater than or equal to zero.

The code words of the 7B/8B code of Table 3 are selected so that each code word has disparity in the range of [−4, 4] (even values only), so that each sequence of the code words has a maximum run length of 6, a running digital sum range of 16, a minimum transition density of 25% (i.e. at least 2 transitions per code word), and an average transition density of 4.181 transitions per code word (over all legal code word pairs), and so that only a relative small number of input symbols (i.e., 30 symbols of the total set of 128 symbols) do not have a successful primary mapping (i.e., each of the positive and negative codebooks has 30 symbols that are determined by the secondary mapping). The normalized DC offset is 4.75. Error magnification is minimized so that only 10% of single bit errors result in a burst error of 6 or 7 bits in the decoded symbol.

In some embodiments, the inventive code is a 7B/8B block code having positive and negative codebooks (and a maximum run length of 6), each of the positive and negative codebooks has not more than 30 symbols that are determined by the secondary mapping, each of the code words has disparity equal to one of 4, −4, 2, −2, and zero, none of the code words has a run of length greater than three at either end, none of the code words has a run of length greater than six away from its ends, and none of the code words has less than two transitions.

A 16B/18B code is determined by using the block code of Table 1 to encode a 9-bit fragment of each 16-bit input word as a 10-bit code word, using the block code of Table 3 to encode the remaining 7 bits of the input word as an 8-bit code word, and concatenating the 10 bit code word with the 8-bit code word. This 16B/18B code has a maximum run length of 7, a running digital sum variation of 15, and a transition density of 28% (i.e., at least 5 transitions per code word).

Different 16B/18B codes can be created using various 9B/10B codes generated in accordance with the invention (including those described with reference to Tables 4 and 5).

We next describe the 9B/10B code whose code words are set forth as Table 4.

TABLE 4

| Symbol | Positive Code | Positive Disparity | Negative Code | Negative Disparity | Primary Mapping? |
|---|---|---|---|---|---|
| 0 | 1100010011 | 0 | 0011101100 | 0 | N |
| 1 | 1000011110 | 0 | 0111100001 | 0 | N |
| 2 | 1000011101 | 0 | 0111100010 | 0 | N |
| 3 | 1110000110 | 0 | 0001111001 | 0 | N |
| 4 | 1000011011 | 0 | 0111100100 | 0 | N |
| 5 | 1110001010 | 0 | 0001110101 | 0 | N |
| 6 | 1110000101 | 0 | 0001111010 | 0 | N |
| 7 | 1110010010 | 0 | 0001101101 | 0 | N |
| 8 | 1000010111 | 0 | 0111101000 | 0 | N |
| 9 | 1110010100 | 0 | 0001101011 | 0 | N |
| 10 | 1110001001 | 0 | 0001110110 | 0 | N |
| 11 | 1100010110 | 0 | 0011101001 | 0 | N |
| 12 | 1100100011 | 0 | 0011011100 | 0 | N |
| 13 | 1100011010 | 0 | 0011100101 | 0 | N |
| 14 | 1110010001 | 0 | 0001101110 | 0 | N |
| 15 | 1100100110 | 0 | 0011011001 | 0 | N |
| 16 | 1101000011 | 0 | 0010111100 | 0 | N |
| 17 | 1100001110 | 0 | 0011110001 | 0 | N |
| 18 | 1100001101 | 0 | 0011110010 | 0 | N |
| 19 | 1100101010 | 0 | 0011010101 | 0 | N |
| 20 | 1100001011 | 0 | 0011110100 | 0 | N |
| 21 | 1100110010 | 0 | 0011001101 | 0 | N |
| 22 | 1100010101 | 0 | 0011101010 | 0 | N |
| 23 | 1101000110 | 0 | 0010111001 | 0 | N |
| 24 | 1100000111 | 0 | 0011111000 | 0 | N |
| 25 | 1101001010 | 0 | 0010110101 | 0 | N |
| 26 | 1100011001 | 0 | 0011100110 | 0 | N |
| 27 | 1101010010 | 0 | 0010101101 | 0 | N |
| 28 | 1000110011 | 0 | 0111001100 | 0 | N |
| 29 | 1101010100 | 0 | 0010101011 | 0 | N |
| 30 | 1100100101 | 0 | 0011011010 | 0 | N |
| 31 | 1001110010 | 0 | 0110001101 | 0 | N |
| 32 | 1001010011 | 0 | 0110101100 | 0 | N |
| 33 | 1000101110 | 0 | 0111010001 | 0 | N |
| 34 | 1000101101 | 0 | 0111010010 | 0 | N |
| 35 | 1111011100 | 4 | 0000100011 | −4 | Y |
| 36 | 1000101011 | 0 | 0111010100 | 0 | N |
| 37 | 1111011010 | 4 | 0000100101 | −4 | Y |
| 38 | 1111011001 | 4 | 0000100110 | −4 | Y |
| 39 | 1111011000 | 2 | 0000100111 | −2 | Y |
| 40 | 1000100111 | 0 | 0111011000 | 0 | N |
| 41 | 1111010110 | 4 | 0000101001 | −4 | Y |
| 42 | 1111010101 | 4 | 0000101010 | −4 | Y |
| 43 | 1111010100 | 2 | 0000101011 | −2 | Y |
| 44 | 1111010011 | 4 | 0000101100 | −4 | Y |
| 45 | 1111010010 | 2 | 0000101101 | −2 | Y |
| 46 | 1111010001 | 2 | 0000101110 | −2 | Y |
| 47 | 1010010110 | 0 | 0101101001 | 0 | N |
| 48 | 1001100011 | 0 | 0110011100 | 0 | N |
| 49 | 1111001110 | 4 | 0000110001 | −4 | Y |
| 50 | 1111001101 | 4 | 0000110010 | −4 | Y |
| 51 | 1111001100 | 2 | 0000110011 | −2 | Y |
| 52 | 1111001011 | 4 | 0000110100 | −4 | Y |
| 53 | 1111001010 | 2 | 0000110101 | −2 | Y |
| 54 | 1111001001 | 2 | 0000110110 | −2 | Y |
| 55 | 1010011010 | 0 | 0101100101 | 0 | N |
| 56 | 1111000111 | 4 | 0000111000 | −4 | Y |
| 57 | 1111000110 | 2 | 0000111001 | −2 | Y |
| 58 | 1111000101 | 2 | 0000111010 | −2 | Y |
| 59 | 1010100110 | 0 | 0101011001 | 0 | N |
| 60 | 1111000011 | 2 | 0000111100 | −2 | Y |
| 61 | 1010101010 | 0 | 0101010101 | 0 | N |
| 62 | 1100101001 | 0 | 0011010110 | 0 | N |
| 63 | 1010110010 | 0 | 0101001101 | 0 | N |
| 64 | 1110100001 | 0 | 0001011110 | 0 | N |
| 65 | 1001001110 | 0 | 0110110001 | 0 | N |
| 66 | 1001001101 | 0 | 0110110010 | 0 | N |
| 67 | 1110111100 | 4 | 0001000011 | −4 | Y |
| 68 | 1110000011 | 0 | 0001111100 | 0 | N |
| 69 | 1110111010 | 4 | 0001000101 | −4 | Y |
| 70 | 1110111001 | 4 | 0001000110 | −4 | Y |
| 71 | 1110111000 | 2 | 0001000111 | −2 | Y |
| 72 | 1001000111 | 0 | 0110111000 | 0 | N |
| 73 | 1110110110 | 4 | 0001001001 | −4 | Y |
| 74 | 1110110101 | 4 | 0001001010 | −4 | Y |
| 75 | 1110110100 | 2 | 0001001011 | −2 | Y |
| 76 | 1110110011 | 4 | 0001001100 | −4 | Y |
| 77 | 1110110010 | 2 | 0001001101 | −2 | Y |

| | | | | | | | | | | | |
|---|---|---|---|---|---|---|---|---|---|---|---|
| 78 | 1110110001 | 2 | 0001001110 | −2 | Y | | 160 | 1011000011 | 0 | 0100111100 | 0 | N |
| 79 | 1110100010 | 0 | 0001011101 | 0 | N | | 161 | 1101011110 | 4 | 0010100001 | −4 | Y |
| 80 | 1110101000 | 0 | 0001010111 | 0 | N | | 162 | 1101011101 | 4 | 0010100010 | −4 | Y |
| 81 | 1110101110 | 4 | 0001010001 | −4 | Y | | 163 | 1101011100 | 2 | 0010100011 | −2 | Y |
| 82 | 1110101101 | 4 | 0001010010 | −4 | Y | | 164 | 1101011011 | 4 | 0010100100 | 4 | Y |
| 83 | 1110101100 | 2 | 0001010011 | −2 | Y | | 165 | 1101011010 | 2 | 0010100101 | −2 | Y |
| 84 | 1110101011 | 4 | 0001010100 | −4 | Y | | 166 | 1101011001 | 2 | 0010100110 | −2 | Y |
| 85 | 1110101010 | 2 | 0001010101 | −2 | Y | | 167 | 0010100111 | 0 | 1101011000 | 0 | Y |
| 86 | 1110101001 | 2 | 0001010110 | −2 | Y | | 168 | 1101010111 | 4 | 0010101000 | −4 | Y |
| 87 | 0001010111 | 0 | 1110101000 | 0 | Y | | 169 | 1101010110 | 2 | 0010101001 | −2 | Y |
| 88 | 1110100111 | 4 | 0001011000 | −4 | Y | | 170 | 1101010101 | 2 | 0010101010 | −2 | Y |
| 89 | 1110100110 | 2 | 0001011001 | −2 | Y | | 171 | 0010101011 | 0 | 1101010100 | 0 | Y |
| 90 | 1110100101 | 2 | 0001011010 | −2 | Y | | 172 | 1101010011 | 2 | 0010101100 | −2 | Y |
| 91 | 0001011011 | 0 | 1110100100 | 0 | Y | | 173 | 0010101101 | 0 | 1101010010 | 0 | Y |
| 92 | 1110100011 | 2 | 0001011100 | −2 | Y | | 174 | 0010101110 | 0 | 1101010001 | 0 | Y |
| 93 | 0001011101 | 0 | 1110100010 | 0 | Y | | 175 | 1101011000 | 0 | 0010100111 | 0 | N |
| 94 | 0001011110 | 0 | 1110100001 | 0 | Y | | 176 | 1100110001 | 0 | 0011001110 | 0 | N |
| 95 | 1110100100 | 0 | 0001011011 | 0 | N | | 177 | 1101100101 | 2 | 0010110010 | −2 | Y |
| 96 | 1010010011 | 0 | 0101101100 | 0 | N | | 178 | 1101001101 | 2 | 0010110010 | −2 | Y |
| 97 | 1110011110 | 4 | 0001100001 | −4 | Y | | 179 | 0010110011 | 0 | 1101001100 | 0 | Y |
| 98 | 1110011101 | 4 | 0001100010 | −4 | Y | | 180 | 1101001011 | 2 | 0010110100 | −2 | Y |
| 99 | 1110011100 | 2 | 0001100011 | −2 | Y | | 181 | 0010110101 | 0 | 1101001010 | 0 | Y |
| 100 | 1110011011 | 4 | 0001100100 | −4 | Y | | 182 | 0010110110 | 0 | 1101001001 | 0 | Y |
| 101 | 1110011010 | 2 | 0001100101 | −2 | Y | | 183 | 0010110111 | 2 | 1101001000 | −2 | Y |
| 102 | 1110011001 | 2 | 0001100110 | −2 | Y | | 184 | 1101000111 | 2 | 0010111000 | −2 | Y |
| 103 | 0001100111 | 0 | 1110011000 | 0 | Y | | 185 | 0010111001 | 0 | 1101000110 | 0 | Y |
| 104 | 1110010111 | 4 | 0001101000 | −4 | Y | | 186 | 0010111010 | 0 | 1101000101 | 0 | Y |
| 105 | 1110010110 | 2 | 0001101001 | −2 | Y | | 187 | 0010111011 | 2 | 1101000100 | −2 | Y |
| 106 | 1110010101 | 2 | 0001101010 | −2 | Y | | 188 | 0010111100 | 0 | 1101000011 | 0 | Y |
| 107 | 0001101011 | 0 | 1110010100 | 0 | Y | | 189 | 0010111101 | 2 | 1101000010 | −2 | Y |
| 108 | 1110010011 | 2 | 101101100 | −2 | Y | | 190 | 0010111110 | 2 | 1101000001 | −2 | Y |
| 109 | 0001101101 | 0 | 1110010010 | 0 | Y | | 191 | 1101001100 | 0 | 0010110011 | 0 | N |
| 110 | 0001101110 | 0 | 1110010001 | 0 | Y | | 192 | 1101000101 | 0 | 0010111010 | 0 | N |
| 111 | 1110011000 | 0 | 0001100111 | 0 | N | | 193 | 1100111110 | 4 | 0011000001 | −4 | Y |
| 112 | 1010100011 | 0 | 0101011100 | 0 | N | | 194 | 1100111101 | 4 | 0011000010 | −4 | Y |
| 113 | 1110001110 | 2 | 0001110001 | −2 | Y | | 195 | 1100111100 | 2 | 0011000011 | −2 | Y |
| 114 | 1110001101 | 2 | 0001110010 | −2 | Y | | 196 | 1100111011 | 4 | 0011000100 | −4 | Y |
| 115 | 0001110011 | 0 | 1110001100 | 0 | Y | | 197 | 1100111010 | 2 | 0011000101 | −2 | Y |
| 116 | 1110001011 | 2 | 0001110100 | −2 | Y | | 198 | 1100111001 | 2 | 0011000110 | −2 | Y |
| 117 | 0001110101 | 0 | 1110001010 | 0 | Y | | 199 | 0011000111 | 0 | 1100111000 | 0 | Y |
| 118 | 0001110110 | 0 | 1110001001 | 0 | Y | | 200 | 1100110111 | 4 | 0011001000 | −4 | Y |
| 119 | 0001110111 | 2 | 1110001000 | −2 | Y | | 201 | 1100110110 | 2 | 0011001001 | −2 | Y |
| 120 | 1110000111 | 2 | 0001111000 | −2 | Y | | 202 | 1100110101 | 2 | 0011001010 | −2 | Y |
| 121 | 0001111001 | 0 | 1110000110 | 0 | Y | | 203 | 0011001011 | 0 | 1100110100 | 0 | Y |
| 122 | 0001111010 | 0 | 1110000101 | 0 | Y | | 204 | 1100110011 | 2 | 0011001100 | −2 | Y |
| 123 | 0001111011 | 2 | 1110000100 | −2 | Y | | 205 | 0011001101 | 0 | 1100110010 | 0 | Y |
| 124 | 0001111100 | 0 | 1110000011 | 0 | Y | | 206 | 0011001110 | 0 | 1100110001 | 0 | Y |
| 125 | 0001111101 | 2 | 1110000010 | −2 | Y | | 207 | 1100111000 | 0 | 0011000111 | 0 | N |
| 126 | 0001111110 | 2 | 1110000001 | −2 | Y | | 208 | 1101001001 | 0 | 0010110110 | 0 | N |
| 127 | 1110001100 | 0 | 0001110011 | 0 | N | | 209 | 1100101110 | 2 | 0011010001 | −2 | Y |
| 128 | 1101100001 | 0 | 0010011110 | 0 | N | | 210 | 1100101101 | 2 | 0011010010 | −2 | Y |
| 129 | 1010001110 | 0 | 0101110001 | 0 | N | | 211 | 0011010011 | 0 | 1100101100 | 0 | Y |
| 130 | 1010001101 | 0 | 0101110010 | 0 | N | | 212 | 1100101011 | 2 | 0011010100 | −2 | Y |
| 131 | 1101111100 | 4 | 0010000011 | −4 | Y | | 213 | 0011010101 | 0 | 1100101010 | 0 | Y |
| 132 | 1001001011 | 0 | 0101101100 | 0 | N | | 214 | 0011010110 | 0 | 1100101001 | 0 | Y |
| 133 | 1101111010 | 4 | 0010000101 | −4 | Y | | 215 | 0011010111 | 2 | 1100101000 | −2 | Y |
| 134 | 1101111001 | 4 | 0010000110 | −4 | Y | | 216 | 1100100111 | 2 | 0011011000 | −2 | Y |
| 135 | 1101111000 | 2 | 0010000111 | −2 | Y | | 217 | 0011011001 | 0 | 1100100110 | 0 | Y |
| 136 | 1010000111 | 0 | 0101111000 | 0 | N | | 218 | 0011011010 | 0 | 1100100101 | 0 | Y |
| 137 | 1101110110 | 4 | 0010001001 | −4 | Y | | 219 | 0011011011 | 2 | 1100100100 | −2 | Y |
| 138 | 1101110101 | 4 | 0010001010 | −4 | Y | | 220 | 0011011100 | 0 | 1100100011 | 0 | Y |
| 139 | 1101110100 | 2 | 0010001011 | −2 | Y | | 221 | 0011011101 | 2 | 1100100010 | −2 | Y |
| 140 | 1101110011 | 4 | 0010001100 | −4 | Y | | 222 | 0011011110 | 2 | 1100100001 | −2 | Y |
| 141 | 1101110010 | 2 | 0010001101 | −2 | Y | | 223 | 1100100011 | 0 | 0011011100 | 0 | N |
| 142 | 1101110001 | 2 | 0010001110 | −2 | Y | | 224 | 1101010001 | 0 | 0010101110 | 0 | N |
| 143 | 1101100010 | 0 | 0010011101 | 0 | N | | 225 | 1100011110 | 2 | 0011100001 | −2 | Y |
| 144 | 1101101000 | 0 | 0010010111 | 0 | N | | 226 | 1100011101 | 2 | 0011100010 | −2 | Y |
| 145 | 1101101110 | 4 | 0010010001 | −4 | Y | | 227 | 0011100011 | 0 | 1100011100 | 0 | Y |
| 146 | 1101101101 | 4 | 0010010010 | −4 | Y | | 228 | 1100011011 | 2 | 0011100100 | −2 | Y |
| 147 | 1101101100 | 2 | 0010010011 | −2 | Y | | 229 | 0011100101 | 0 | 1100011010 | 0 | Y |
| 148 | 1101101011 | 4 | 0010010100 | −4 | Y | | 230 | 0011100110 | 0 | 1100011001 | 0 | Y |
| 149 | 1101101010 | 2 | 0010010101 | −2 | Y | | 231 | 0011100111 | 2 | 1100011000 | −2 | Y |
| 150 | 1101101001 | 2 | 0010010110 | −2 | Y | | 232 | 1100010111 | 2 | 0011101000 | −2 | Y |
| 151 | 0010010111 | 0 | 1101101000 | 0 | Y | | 233 | 0011101001 | 0 | 1100010110 | 0 | Y |
| 152 | 1101100111 | 4 | 0010011000 | −4 | Y | | 234 | 0011101010 | 0 | 1100010101 | 0 | Y |
| 153 | 1101100110 | 2 | 0010011001 | −2 | Y | | 235 | 0011101011 | 2 | 1100010100 | −2 | Y |
| 154 | 1101100101 | 2 | 0010011010 | −2 | Y | | 236 | 0011101100 | 0 | 1100010011 | 0 | Y |
| 155 | 0010011011 | 0 | 1101100100 | 0 | Y | | 237 | 0011101101 | 2 | 1100010010 | −2 | Y |
| 156 | 1101100011 | 2 | 0010011100 | −2 | Y | | 238 | 0011101110 | 2 | 1100010001 | −2 | Y |
| 157 | 1101101101 | 0 | 1101100010 | 0 | Y | | 239 | 1100011100 | 0 | 0011100011 | 0 | N |
| 158 | 0010011110 | 0 | 1101100001 | 0 | Y | | 240 | 1000110101 | 0 | 0111001010 | 0 | N |
| 159 | 1101100100 | 0 | 0010011011 | 0 | N | | 241 | 0011110001 | 0 | 1100001110 | 0 | Y |

| | | | | | | | | | | | |
|---|---|---|---|---|---|---|---|---|---|---|---|
| 242 | 0011110010 | 0 | 1100001101 | 0 | Y | 324 | 1010111011 | 4 | 0101000100 | −4 | Y |
| 243 | 0011110011 | 2 | 1100001100 | −2 | Y | 325 | 1010111010 | 2 | 0101000101 | −2 | Y |
| 244 | 0011110100 | 0 | 1100001011 | 0 | Y | 326 | 1010111001 | 2 | 0101000110 | −2 | Y |
| 245 | 0011110101 | 2 | 1100001010 | −2 | Y | 327 | 0101000111 | 0 | 1010111000 | 0 | Y |
| 246 | 0011110110 | 2 | 1100001001 | −2 | Y | 328 | 1010110111 | 4 | 0101001000 | −4 | Y |
| 247 | 0011110111 | 4 | 1100001000 | −4 | Y | 329 | 1010110110 | 2 | 0101001001 | −2 | Y |
| 248 | 0011111000 | 0 | 1100000111 | 0 | Y | 330 | 1010110101 | 2 | 0101001010 | −2 | Y |
| 249 | 0011111001 | 2 | 1100000110 | −2 | Y | 331 | 0101001011 | 0 | 1010110100 | 0 | Y |
| 250 | 0011111010 | 2 | 1100000101 | −2 | Y | 332 | 1010110011 | 2 | 0101001100 | −2 | Y |
| 251 | 0011111011 | 4 | 1100000100 | −4 | Y | 333 | 0101001101 | 0 | 1010110010 | 0 | Y |
| 252 | 0011111100 | 2 | 1100000011 | −2 | Y | 334 | 0101001110 | 0 | 1010110001 | 0 | Y |
| 253 | 0011111101 | 4 | 1100000010 | −4 | Y | 335 | 1010111000 | 0 | 0101000111 | 0 | N |
| 254 | 0011111110 | 4 | 1100000001 | −4 | Y | 336 | 1010010100 | 0 | 0101101011 | 0 | N |
| 255 | 1100110100 | 0 | 0011001011 | 0 | N | 337 | 1010101110 | 2 | 0101010001 | −2 | Y |
| 256 | 1011100001 | 0 | 0100011110 | 0 | N | 338 | 1010101101 | 2 | 0101010010 | −2 | Y |
| 257 | 1011100010 | 0 | 0100011101 | 0 | N | 339 | 0101010011 | 0 | 1010101100 | 0 | Y |
| 258 | 1011101000 | 0 | 0100010111 | 0 | N | 340 | 1010101011 | 2 | 0101010100 | −2 | Y |
| 269 | 1011111100 | 4 | 0100000011 | −4 | Y | 341 | 0101010101 | 0 | 1010101010 | 0 | Y |
| 260 | 1010001011 | 0 | 0101110100 | 0 | N | 342 | 0101010110 | 0 | 1010101001 | 0 | Y |
| 261 | 1011111010 | 4 | 0100000101 | −4 | Y | 343 | 0101010111 | 2 | 1010101000 | −2 | Y |
| 262 | 1011111001 | 4 | 0100000110 | −4 | Y | 344 | 1010100111 | 2 | 0101011000 | −2 | Y |
| 263 | 1011111000 | 2 | 0100000111 | −2 | Y | 345 | 0101011001 | 0 | 1010100110 | 0 | Y |
| 264 | 1001010101 | 0 | 0110101010 | 0 | N | 346 | 0101011010 | 0 | 1010100101 | 0 | Y |
| 265 | 1011110110 | 4 | 0100001001 | −4 | Y | 347 | 0101011011 | 2 | 1010100100 | −2 | Y |
| 266 | 1011110101 | 4 | 0100001010 | −4 | Y | 348 | 0101011100 | 0 | 1010100011 | 0 | Y |
| 267 | 1011110100 | 2 | 0100001011 | −2 | Y | 349 | 0101011101 | 2 | 1010100010 | −2 | Y |
| 268 | 1011110011 | 4 | 0100001100 | −4 | Y | 350 | 0101011110 | 2 | 1010100001 | −2 | Y |
| 269 | 1011110010 | 2 | 0100001101 | −2 | Y | 351 | 1010110100 | 0 | 0101001011 | 0 | N |
| 270 | 1011110001 | 2 | 0100001110 | −2 | Y | 352 | 1010011001 | 0 | 0101100110 | 0 | N |
| 271 | 1010100111 | 0 | 0100100111 | 0 | N | 353 | 1010011110 | 2 | 0101100001 | −2 | Y |
| 272 | 1001011001 | 0 | 0110100110 | 0 | N | 354 | 1010011101 | 2 | 0101100010 | −2 | Y |
| 273 | 1011101110 | 4 | 0100010001 | −4 | Y | 355 | 0101100011 | 0 | 1010011100 | 0 | Y |
| 274 | 1011101101 | 4 | 0100010010 | −4 | Y | 356 | 1010011011 | 2 | 0101100100 | −2 | Y |
| 275 | 1011101100 | 2 | 0100010011 | −2 | Y | 357 | 0101100101 | 0 | 1010011010 | 0 | Y |
| 276 | 1011101011 | 4 | 0100010100 | −4 | Y | 358 | 0101100110 | 0 | 1010011001 | 0 | Y |
| 277 | 1011101010 | 2 | 0100010101 | −2 | Y | 359 | 0101100111 | 2 | 1010011000 | −2 | Y |
| 278 | 1011101001 | 2 | 0100010110 | −2 | Y | 360 | 1010010111 | 2 | 0101101000 | −2 | Y |
| 279 | 0100010111 | 0 | 1011101000 | 0 | Y | 361 | 0101101001 | 0 | 1010010110 | 0 | Y |
| 280 | 1011100111 | 4 | 0100011000 | −4 | Y | 362 | 0101101010 | 0 | 1010010101 | 0 | Y |
| 281 | 1011100110 | 2 | 0100011001 | −2 | Y | 363 | 0101101011 | 2 | 1010010100 | −2 | Y |
| 282 | 1011100101 | 2 | 0100011010 | −2 | Y | 364 | 0101101100 | 0 | 1010010011 | 0 | Y |
| 283 | 0100011011 | 0 | 1011100100 | 0 | Y | 365 | 0101101101 | 2 | 1010010010 | 0 | Y |
| 284 | 1011100011 | 2 | 0100011100 | −2 | Y | 366 | 0101101110 | 2 | 1010010001 | −2 | Y |
| 285 | 0100011101 | 0 | 1011100010 | 0 | Y | 367 | 1011001100 | 0 | 0100110011 | 0 | N |
| 286 | 0100011110 | 0 | 1011100001 | 0 | Y | 368 | 1010100101 | 0 | 0101011010 | 0 | N |
| 287 | 1011100100 | 0 | 0100011011 | 0 | N | 369 | 0101110001 | 0 | 1010001110 | 0 | Y |
| 288 | 1001100101 | 0 | 0110011010 | 0 | N | 370 | 0101110010 | 0 | 1010001101 | 0 | Y |
| 289 | 1011011110 | 4 | 0100100001 | −4 | Y | 371 | 0101110011 | 2 | 1010001100 | −2 | Y |
| 290 | 1011011101 | 4 | 0100100010 | −4 | Y | 372 | 0101110100 | 0 | 1010001011 | 0 | Y |
| 291 | 1011011100 | 2 | 0100100011 | −2 | Y | 373 | 0101110101 | 2 | 1010001010 | −2 | Y |
| 292 | 1011011011 | 4 | 0100100100 | −4 | Y | 374 | 0101110110 | 2 | 1010001001 | −2 | Y |
| 293 | 1011011010 | 2 | 0100100101 | −2 | Y | 375 | 0101110111 | 4 | 1010001000 | −4 | Y |
| 294 | 1011011001 | 2 | 0100100110 | −2 | Y | 376 | 0101111000 | 0 | 1010000111 | 0 | Y |
| 295 | 0100100111 | 0 | 1011011000 | 0 | Y | 377 | 0101111001 | 2 | 1010000110 | −2 | Y |
| 296 | 1011010111 | 4 | 0100101000 | −4 | Y | 378 | 0101111010 | 2 | 1010000101 | −2 | Y |
| 297 | 1011010110 | 2 | 0100101001 | −2 | Y | 379 | 0101111011 | 4 | 1010000100 | −4 | Y |
| 298 | 1011010101 | 2 | 0100101010 | −2 | Y | 380 | 0101111100 | 2 | 1010000011 | −2 | Y |
| 299 | 0100101011 | 0 | 1011010100 | 0 | Y | 381 | 0101111101 | 4 | 1010000010 | −4 | Y |
| 300 | 1011010011 | 2 | 0100101100 | −2 | Y | 382 | 0101111110 | 4 | 1010000001 | −4 | Y |
| 301 | 0100101101 | 0 | 1011010010 | 0 | Y | 383 | 1011010100 | 0 | 0100101011 | 0 | N |
| 302 | 0100101110 | 0 | 1011010001 | 0 | Y | 384 | 1010101001 | 0 | 0101010110 | 0 | N |
| 303 | 1010011100 | 0 | 0101100011 | 0 | N | 385 | 1001111110 | 4 | 0110000001 | −4 | Y |
| 304 | 1001101001 | 0 | 0110010110 | 0 | N | 386 | 1001111101 | 4 | 0110000010 | −4 | Y |
| 305 | 1011001110 | 2 | 0100110001 | −2 | Y | 387 | 1001111100 | 2 | 0110000011 | −2 | Y |
| 306 | 1011001101 | 2 | 0100110010 | −2 | Y | 388 | 1001111011 | 4 | 0110000100 | −4 | Y |
| 307 | 0100110011 | 0 | 1011001100 | 0 | Y | 389 | 1001111010 | 2 | 0110000101 | −2 | Y |
| 308 | 1011001011 | 2 | 0100110100 | −2 | Y | 390 | 1001111001 | 2 | 0110000110 | −2 | Y |
| 309 | 0100110101 | 0 | 1011001010 | 0 | Y | 391 | 0110000111 | 0 | 1001111000 | 0 | Y |
| 310 | 0100110110 | 0 | 1011001001 | 0 | Y | 392 | 1001110111 | 4 | 0110001000 | −4 | Y |
| 311 | 0100110111 | 2 | 1011001000 | −2 | Y | 393 | 1001110110 | 2 | 0110001001 | −2 | Y |
| 312 | 1011000111 | 2 | 0100111000 | −2 | Y | 394 | 1001110101 | 2 | 0110001010 | −2 | Y |
| 313 | 0100111001 | 0 | 1011000110 | 0 | Y | 395 | 0110001011 | 0 | 1001110100 | 0 | Y |
| 314 | 0100111010 | 0 | 1011000101 | 0 | Y | 396 | 1001110011 | 2 | 0110001100 | −2 | Y |
| 315 | 0100111011 | 2 | 1011000100 | −2 | Y | 397 | 0110001101 | 0 | 1001110010 | 0 | Y |
| 316 | 0100111100 | 0 | 1011000011 | 0 | Y | 395 | 0110001110 | 0 | 1001110001 | 0 | Y |
| 317 | 0100111101 | 2 | 1011000010 | −2 | Y | 399 | 1110000111 | 0 | 0110000111 | 0 | N |
| 318 | 0100111110 | 2 | 1011000001 | −2 | Y | 400 | 1010110001 | 0 | 0101001110 | 0 | N |
| 319 | 1010101100 | 0 | 0101010011 | 0 | N | 401 | 1001101110 | 2 | 0110010001 | −2 | Y |
| 320 | 1001110001 | 0 | 0110001110 | 0 | N | 402 | 1001101101 | 2 | 0110010010 | −2 | Y |
| 321 | 1010111110 | 4 | 0101000001 | −4 | Y | 403 | 0110010011 | 0 | 1001101100 | 0 | Y |
| 322 | 1010111101 | 4 | 0101000010 | −4 | Y | 404 | 1001101011 | 2 | 0110010100 | −2 | Y |
| 323 | 1010111100 | 2 | 0101000011 | −2 | Y | 405 | 0110010101 | 0 | 1001101010 | 0 | Y |

| | | | | | |
|---|---|---|---|---|---|
| 406 | 0110010110 | 0 | 1001101001 | 0 | Y |
| 407 | 0110010111 | 2 | 1001101000 | -2 | Y |
| 408 | 1001100111 | 2 | 0110011000 | -2 | Y |
| 409 | 0110011001 | 0 | 1001100110 | 0 | Y |
| 410 | 0110011010 | 0 | 1001100101 | 0 | Y |
| 411 | 0110011011 | 2 | 1001100100 | -2 | Y |
| 412 | 0110011100 | 0 | 1001100011 | 0 | Y |
| 413 | 0110011101 | 2 | 1001100010 | -2 | Y |
| 414 | 0110011110 | 2 | 1001100001 | -2 | Y |
| 415 | 1001011100 | 0 | 0110100011 | 0 | N |
| 416 | 1011000101 | 0 | 0100111010 | 0 | N |
| 417 | 1001011110 | 2 | 0110100001 | -2 | Y |
| 418 | 1001011101 | 2 | 0110100010 | -2 | Y |
| 419 | 0110100011 | 0 | 1001011100 | 0 | Y |
| 420 | 1001011011 | 2 | 0110100100 | -2 | Y |
| 421 | 0110100101 | 0 | 1001011010 | 0 | Y |
| 422 | 0110100110 | 0 | 1001011001 | 0 | Y |
| 423 | 0110100111 | 2 | 1001011000 | -2 | Y |
| 424 | 1001010111 | 2 | 0110101000 | -2 | Y |
| 425 | 0110101001 | 0 | 1001010110 | 0 | Y |
| 426 | 0110101010 | 0 | 1001010101 | 0 | Y |
| 427 | 0110101011 | 2 | 1001010100 | -2 | Y |
| 428 | 0110101100 | 0 | 1001010011 | 0 | Y |
| 429 | 0110101101 | 2 | 1001010010 | -2 | Y |
| 430 | 0110101110 | 2 | 1001010001 | -2 | Y |
| 431 | 1001101011 | 0 | 0110010011 | 0 | N |
| 432 | 1011001001 | 0 | 0100110110 | 0 | N |
| 433 | 0110110001 | 0 | 1001001110 | 0 | Y |
| 434 | 0110110010 | 0 | 1001001101 | 0 | Y |
| 435 | 0110110011 | 2 | 1001001100 | -2 | Y |
| 436 | 0110110100 | 0 | 1001001011 | 0 | Y |
| 437 | 0110110101 | 2 | 1001001010 | -2 | Y |
| 438 | 0110110110 | 2 | 1001001001 | -2 | Y |
| 439 | 0110110111 | 4 | 1001001000 | -4 | Y |
| 440 | 0110111000 | 0 | 1001000111 | 0 | Y |
| 441 | 0110111001 | 2 | 1001000110 | -2 | Y |
| 442 | 0110111010 | 2 | 1001000101 | -2 | Y |
| 443 | 0110111011 | 4 | 1001000100 | -4 | Y |
| 444 | 0110111100 | 2 | 1001000011 | -2 | Y |
| 445 | 0110111101 | 4 | 1001000010 | -4 | Y |
| 446 | 0110111110 | 4 | 1001000001 | -4 | Y |
| 447 | 1001110100 | 0 | 0110001011 | 0 | N |
| 448 | 1011010001 | 0 | 0100101110 | 0 | N |
| 449 | 1000111110 | 2 | 0111000001 | -2 | Y |
| 450 | 1000111101 | 2 | 0111000010 | -2 | Y |
| 451 | 0111000011 | 0 | 1000111100 | 0 | Y |
| 452 | 1000111011 | 2 | 0111000100 | -2 | Y |
| 453 | 0111000101 | 0 | 1000111010 | 0 | Y |
| 454 | 0111000110 | 0 | 1000111001 | 0 | Y |
| 455 | 0111000111 | 2 | 1000111000 | -2 | Y |
| 456 | 1000110111 | 2 | 0111001000 | -2 | Y |
| 457 | 0111001001 | 0 | 1000110110 | 0 | Y |
| 458 | 0111001010 | 0 | 1000110101 | 0 | Y |
| 459 | 0111001011 | 2 | 1000110100 | -2 | Y |
| 460 | 0111001100 | 0 | 1000110011 | 0 | Y |
| 461 | 0111001101 | 2 | 1000110010 | -2 | Y |
| 462 | 0111001110 | 2 | 1000110001 | -2 | Y |
| 463 | 1000110110 | 0 | 0111001001 | 0 | N |
| 464 | 1011010110 | 0 | 0100101001 | 0 | N |
| 465 | 0111010001 | 0 | 1000101110 | 0 | Y |
| 466 | 0111010010 | 0 | 1000101101 | 0 | Y |
| 467 | 0111010011 | 2 | 1000101100 | -2 | Y |
| 468 | 0111010110 | 0 | 1000101011 | 0 | Y |
| 469 | 0111010101 | 2 | 1000101010 | -2 | Y |
| 470 | 0111010110 | 2 | 1000101001 | -2 | Y |
| 471 | 0111010111 | 4 | 1000101000 | -4 | Y |
| 472 | 0111011000 | 0 | 1000100111 | 0 | Y |
| 473 | 0111011001 | 2 | 1000100110 | -2 | Y |
| 474 | 0111011010 | 2 | 1000100101 | -2 | Y |
| 475 | 0111011011 | 4 | 1000100100 | -4 | Y |
| 476 | 1111011100 | 2 | 1000100011 | -2 | Y |
| 477 | 0111011101 | 4 | 1000100010 | -4 | Y |
| 478 | 0111011110 | 4 | 1000100001 | -4 | Y |
| 479 | 1001010110 | 0 | 0110101001 | 0 | N |
| 480 | 1011001010 | 0 | 0100110101 | 0 | N |
| 481 | 0111100001 | 0 | 1000011110 | 0 | Y |
| 482 | 0111100010 | 0 | 1000011101 | 0 | Y |
| 483 | 0111100011 | 2 | 1000011100 | -2 | Y |
| 484 | 0111100100 | 0 | 1000011011 | 0 | Y |
| 485 | 0111100101 | 2 | 1000011010 | -2 | Y |
| 486 | 0111100110 | 2 | 1000011001 | -2 | Y |
| 487 | 0111100111 | 4 | 1000011000 | -4 | Y |
| 488 | 0111101000 | 0 | 1000010111 | 0 | Y |
| 489 | 0111101001 | 2 | 1000010110 | -2 | Y |
| 490 | 0111101010 | 2 | 1000010101 | -2 | Y |
| 491 | 0111101011 | 4 | 1000010100 | -4 | Y |
| 492 | 0111101100 | 2 | 1000010011 | -2 | Y |
| 493 | 0111101101 | 4 | 1000010010 | -4 | Y |
| 494 | 0111101110 | 4 | 1000010001 | -4 | Y |
| 495 | 1001011010 | 0 | 0110100101 | 0 | N |
| 496 | 1011010010 | 0 | 0100101101 | 0 | N |
| 497 | 0111110001 | 2 | 1000001110 | -2 | Y |
| 498 | 0111110010 | 2 | 1000001101 | -2 | Y |
| 499 | 0111110011 | 4 | 1000001100 | -4 | Y |
| 500 | 0111110100 | 2 | 1000001011 | -2 | Y |
| 501 | 0111110101 | 4 | 1000001010 | -4 | Y |
| 502 | 0111110110 | 4 | 1000001001 | -4 | Y |
| 503 | 1001100110 | 0 | 0110011001 | 0 | N |
| 504 | 0111111000 | 2 | 1000000111 | -2 | Y |
| 505 | 0111111001 | 4 | 1000000110 | -4 | Y |
| 506 | 0111111010 | 4 | 1000000101 | -4 | Y |
| 507 | 1000111100 | 0 | 0111000011 | 0 | N |
| 508 | 0111111100 | 4 | 1000000011 | -4 | Y |
| 509 | 1000111010 | 0 | 0111000101 | 0 | N |
| 510 | 1000111001 | 0 | 0111000110 | 0 | N |
| 511 | 1001101010 | 0 | 0110010101 | 0 | N |

In Table 4, the 512 code words set forth in the second column from the left determine the positive disparity codebook of the Table 4 code to which the input symbols map. Each code word in the positive disparity codebook (sometimes referred to as the "positive" codebook) has the non-negative disparity indicated (in the third column from the left in Table 4). The complement of each code word of positive disparity codebook determines the code word of the negative disparity codebook to wich the relevant input symbol maps. This determines the 512 code words of the negative disparity codebook (set forth in Table 4 in the fourth column from the left) to which the input symbols map. Each code word in the negative disparity codebook (sometimes referred to as the "negative" codebook) has the non-positive disparity indicated (in the second column from the right in Table 4).

The secondary mapping for the 9B/10B code of Table 4 determines those code words in each row of Table 4 in which there is an "N" symbol in the right column. (The primary mapping for this code determines those code words in each row of Table 4 in which there is a "Y" symbol in the right column).

The Table 4 code favors lower digital sum variation over higher transition density with the goal of providing better EMI characteristics for transmission of long distances. The code space is defined as follows:

each code word having disparity 0 has a run of length three or less on either end, and includes no run of length greater than six away from its ends;

each code word having disparity 2, -2, 4, or -4 has a run of length four or less on the left, a run of length three or less on the right, and includes no run of length greater than seven away from its ends;

no code word has disparity greater than 4 or less than -4; and no code word has less than 2 transitions.

The code set forth in Table 4 differs from (and is improved in several respects over) the 9B/10B block code outlined in above-cited U.S. Pat. No. 6,198,413. The code of Table 4 has a maximum run length of 7, a maximum digital sum variation of 16, an average of 5.248 transitions per code word (over all legal code pairs), and a normalized DC offset of 4.9. Of the 512 code words in the positive codebook, only 116 are not determined by the primary mapping.

In variations on the code set forth in Table 4 (or Table 1 or 3), the positive and negative codebooks are not strictly complements of each other. Rather, the code words having nonzero disparity are identical to those of Table 4 (or Table 1 or 3), so that the code words of the negative codebook having nonzero disparity are complements of corresponding code words of the positive codebook, but the code words of the negative codebook that have zero disparity are identical to corresponding code words of the positive codebook. The code words having zero disparity can be either the zero-disparity code words of the positive codebook of Table 4 (or 1 or 3) or the zero-disparity code words of the negative codebook of Table 4 (or 1 or 3).

We next describe the 9B/10B code whose code words are set forth as Table 5.

TABLE 5

| Symbol | Positive Code | Positive Disparity | Negative Code | Negative Disparity | Primary Mapping? |
|---|---|---|---|---|---|
| 0 | 1001000111 | 0 | 0110111000 | 0 | N |
| 1 | 1000011110 | 0 | 0111100001 | 0 | N |
| 2 | 1000011101 | 0 | 0111100010 | 0 | N |
| 3 | 1100010110 | 0 | 0011101001 | 0 | N |
| 4 | 1000011011 | 0 | 0111100100 | 0 | N |
| 5 | 1100011010 | 0 | 0011100101 | 0 | N |
| 6 | 1100010101 | 0 | 0011101010 | 0 | N |
| 7 | 1100100110 | 0 | 0011011001 | 0 | N |
| 8 | 1000010111 | 0 | 0111101000 | 0 | N |
| 9 | 1110000110 | 0 | 0001111001 | 0 | N |
| 10 | 1110000101 | 0 | 0001111010 | 0 | N |
| 11 | 1100101010 | 0 | 0011010101 | 0 | N |
| 12 | 1100100011 | 0 | 0011011100 | 0 | N |
| 13 | 1100101100 | 0 | 0011010011 | 0 | N |
| 14 | 1100100101 | 0 | 0011011010 | 0 | N |
| 15 | 1100110010 | 0 | 0011001101 | 0 | N |
| 16 | 1000101011 | 0 | 0111010100 | 0 | N |
| 17 | 1100001110 | 0 | 0011110001 | 0 | N |
| 18 | 1100001101 | 0 | 0011110010 | 0 | N |
| 19 | 1100110100 | 0 | 0011001011 | 0 | N |
| 20 | 1100001011 | 0 | 0011110100 | 0 | N |
| 21 | 1101010010 | 0 | 0010101101 | 0 | N |
| 22 | 1100101001 | 0 | 0011010110 | 0 | N |
| 23 | 1101010100 | 0 | 0010101011 | 0 | N |
| 24 | 1001001011 | 0 | 0110110100 | 0 | N |
| 25 | 1101011000 | 0 | 0010100111 | 0 | N |
| 26 | 1100110001 | 0 | 0011001110 | 0 | N |
| 27 | 1101100010 | 0 | 0010011101 | 0 | N |
| 28 | 1001010011 | 0 | 0110101100 | 0 | N |
| 29 | 1101101000 | 0 | 0010010111 | 0 | N |
| 30 | 1000101101 | 0 | 0111010010 | 0 | N |
| 31 | 1000101110 | 0 | 0111010001 | 0 | N |
| 32 | 1001100011 | 0 | 0110011100 | 0 | N |
| 33 | 1000110110 | 0 | 0111001001 | 0 | N |
| 34 | 1000110101 | 0 | 0111001010 | 0 | N |
| 35 | 1001001110 | 0 | 0110110001 | 0 | N |
| 36 | 1010001011 | 0 | 0101110100 | 0 | N |
| 37 | 1001010110 | 0 | 0110101001 | 0 | N |
| 38 | 1001001101 | 0 | 0110110010 | 0 | N |
| 39 | 1001011010 | 0 | 0110100101 | 0 | N |
| 40 | 1010010011 | 0 | 0101101100 | 0 | N |
| 41 | 1001100110 | 0 | 0110011001 | 0 | N |
| 42 | 1001010101 | 0 | 0110101010 | 0 | N |
| 43 | 1001101010 | 0 | 0110010101 | 0 | N |
| 44 | 1010100011 | 0 | 0101011100 | 0 | N |
| 45 | 1001110010 | 0 | 0110001101 | 0 | N |
| 46 | 1001011001 | 0 | 0110100110 | 0 | N |
| 47 | 1001110100 | 0 | 0110001011 | 0 | N |
| 48 | 1001100101 | 0 | 0110011010 | 0 | N |
| 49 | 1010001110 | 0 | 0101110001 | 0 | N |
| 50 | 1001101001 | 0 | 0110010110 | 0 | N |
| 51 | 1010010110 | 0 | 0101101001 | 0 | N |
| 52 | 1001110001 | 0 | 0110001110 | 0 | N |
| 53 | 1010011010 | 0 | 0101100101 | 0 | N |
| 54 | 1010001101 | 0 | 0101110010 | 0 | N |
| 55 | 1010100110 | 0 | 0101011001 | 0 | N |
| 56 | 1010010101 | 0 | 0101101010 | 0 | N |
| 57 | 1010101010 | 0 | 0101010101 | 0 | N |
| 58 | 1010011001 | 0 | 0101100110 | 0 | N |
| 59 | 1010101100 | 0 | 0101010011 | 0 | N |
| 60 | 1010100101 | 0 | 0101011010 | 0 | N |
| 61 | 1010110010 | 0 | 0101001101 | 0 | N |
| 62 | 1010101001 | 0 | 0101010110 | 0 | N |
| 63 | 1010110100 | 0 | 0101001011 | 0 | N |
| 64 | 1110100001 | 0 | 0001011110 | 0 | N |
| 65 | 1110111110 | 6 | 0001000001 | −6 | Y |
| 66 | 1110111101 | 6 | 0001000010 | −6 | Y |
| 67 | 1110111100 | 4 | 0001000011 | −4 | Y |
| 68 | 1110111011 | 6 | 0001000100 | −6 | Y |
| 69 | 1110111010 | 4 | 0001000101 | −4 | Y |
| 70 | 1110111001 | 4 | 0001000110 | −4 | Y |
| 71 | 1110111000 | 2 | 0001000111 | −2 | Y |
| 72 | 1110110111 | 6 | 0001001000 | −6 | Y |
| 73 | 1110110110 | 4 | 0001001001 | −4 | Y |
| 74 | 1110110101 | 4 | 0001001010 | −4 | Y |
| 75 | 1110110100 | 2 | 0001001011 | −2 | Y |
| 76 | 1110110011 | 4 | 0001001100 | −4 | Y |
| 77 | 1110110010 | 2 | 0001001101 | −2 | Y |
| 78 | 1110110001 | 2 | 0001001110 | −2 | Y |
| 79 | 1110100010 | 0 | 0001011101 | 0 | N |
| 80 | 1110101111 | 6 | 0001010000 | −6 | Y |
| 81 | 1110101110 | 4 | 0001010001 | −4 | Y |
| 82 | 1110101101 | 4 | 0001010010 | −4 | Y |
| 83 | 1110101100 | 2 | 0001010011 | −2 | Y |
| 84 | 1110101011 | 4 | 0001010100 | −4 | Y |
| 85 | 1110101010 | 2 | 0001010101 | −2 | Y |
| 86 | 1110101001 | 2 | 0001010110 | −2 | Y |
| 87 | 0001010010 | 0 | 1110101000 | 0 | Y |
| 88 | 1110100111 | 4 | 0001011000 | −4 | Y |
| 89 | 1110100110 | 2 | 0001011001 | −2 | Y |
| 90 | 1110100101 | 2 | 0001011010 | −2 | Y |
| 91 | 0001011011 | 0 | 1110100100 | 0 | Y |
| 92 | 1110100011 | 2 | 0001011100 | −2 | Y |
| 93 | 0001011101 | 0 | 1110100010 | 0 | Y |
| 94 | 0001011110 | 0 | 1110100001 | 0 | Y |
| 95 | 1110100100 | 0 | 0001011011 | 0 | N |
| 96 | 1110010001 | 0 | 0001101110 | 0 | N |
| 97 | 1110011110 | 4 | 0001100001 | −4 | Y |
| 98 | 1110011101 | 4 | 0001100010 | −4 | Y |
| 99 | 1110011100 | 2 | 0001100011 | −2 | Y |
| 100 | 1110011011 | 4 | 0001100100 | −4 | Y |
| 101 | 1110011010 | 2 | 0001100101 | −2 | Y |
| 102 | 1110011001 | 2 | 0001100110 | −2 | Y |
| 103 | 0001100111 | 0 | 1110011000 | 0 | Y |
| 104 | 1110010111 | 4 | 0001101000 | −4 | Y |
| 105 | 1110010110 | 2 | 0001101001 | −2 | Y |
| 106 | 1110010101 | 2 | 0001101010 | −2 | Y |
| 107 | 0001101011 | 0 | 1110010100 | 0 | Y |
| 108 | 1110010011 | 2 | 0001101100 | −2 | Y |
| 109 | 0001101101 | 0 | 1110010010 | 0 | Y |
| 110 | 0001101110 | 0 | 1110010001 | 0 | Y |
| 111 | 1110010100 | 0 | 0001101011 | 0 | N |
| 112 | 1110101000 | 0 | 0001010111 | 0 | N |
| 113 | 1110001110 | 2 | 0001110001 | −2 | Y |
| 114 | 1110001101 | 2 | 0001110010 | −2 | Y |
| 115 | 0001110011 | 0 | 1110001100 | 0 | Y |
| 116 | 1110001011 | 2 | 0001110100 | −2 | Y |
| 117 | 0001110101 | 0 | 1110001010 | 0 | Y |
| 118 | 0001110110 | 0 | 1110001001 | 0 | Y |
| 119 | 1110001100 | 0 | 0001110011 | 0 | N |
| 120 | 1010100001 | 0 | 0101001110 | 0 | N |
| 121 | 0001111001 | 0 | 1110000110 | 0 | Y |
| 122 | 0001111010 | 0 | 1110000101 | 0 | Y |
| 123 | 1110010010 | 0 | 0001101101 | 0 | N |
| 124 | 1011011000 | 0 | 0100100111 | 0 | N |
| 125 | 1110001010 | 0 | 0001110101 | 0 | N |
| 126 | 1110001001 | 0 | 0001110110 | 0 | N |
| 127 | 1110011000 | 0 | 0001100111 | 0 | N |
| 128 | 1101000011 | 0 | 0010111100 | 0 | N |
| 129 | 1101111110 | 6 | 0010000001 | −6 | Y |
| 130 | 1101111101 | 6 | 0010000010 | −6 | Y |
| 131 | 1101111100 | 4 | 0010000011 | −4 | Y |
| 132 | 1101111011 | 6 | 0010000100 | −4 | Y |
| 133 | 1101111010 | 4 | 0010000101 | −4 | Y |
| 134 | 1101111001 | 4 | 0010000110 | −4 | Y |

TABLE 5-continued

| Symbol | Positive Code | Positive Disparity | Negative Code | Negative Disparity | Primary Mapping? |
|---|---|---|---|---|---|
| 135 | 1101111000 | 2 | 0010000111 | −2 | Y |
| 136 | 1101110111 | 6 | 0010001000 | −6 | Y |
| 137 | 1101110110 | 4 | 0010001001 | −4 | Y |
| 138 | 1101110101 | 4 | 0010001010 | −4 | Y |
| 139 | 1101110100 | 2 | 0010001011 | −2 | Y |
| 140 | 1101110011 | 4 | 0010001100 | −4 | Y |
| 141 | 1101110010 | 2 | 0010001101 | −2 | Y |
| 142 | 1101110001 | 2 | 0010001110 | −2 | Y |
| 143 | 1101100001 | 0 | 0010011110 | 0 | N |
| 144 | 1101101111 | 6 | 0010010000 | −6 | Y |
| 145 | 1101101110 | 4 | 0010010001 | −4 | Y |
| 146 | 1101101101 | 4 | 0010010010 | −4 | Y |
| 147 | 1101101100 | 2 | 0010010011 | −2 | Y |
| 148 | 1101101011 | 4 | 0010010100 | −4 | Y |
| 149 | 1101101010 | 2 | 0010010101 | −2 | Y |
| 150 | 1101101001 | 2 | 0010010110 | −2 | Y |
| 151 | 0010010111 | 0 | 1101101000 | 0 | Y |
| 152 | 1101100111 | 4 | 0010011000 | −4 | Y |
| 153 | 1101100110 | 2 | 0010011001 | −2 | Y |
| 154 | 1101100101 | 2 | 1010011010 | −2 | Y |
| 155 | 0010011011 | 0 | 1101100100 | 0 | Y |
| 156 | 1101100011 | 2 | 0010011100 | −2 | Y |
| 157 | 0010011101 | 0 | 1101100010 | 0 | Y |
| 158 | 0010011110 | 0 | 1101100001 | 0 | Y |
| 159 | 1101100100 | 0 | 0010011011 | 0 | N |
| 160 | 1101000101 | 0 | 0010111010 | 0 | N |
| 161 | 1101011110 | 4 | 0010100001 | −4 | Y |
| 162 | 1101011101 | 4 | 0010100010 | 4 | Y |
| 163 | 1101011100 | 2 | 0010100011 | −2 | Y |
| 164 | 1101011011 | 4 | 0010100100 | −4 | Y |
| 165 | 1101011010 | 2 | 0010100101 | −2 | Y |
| 166 | 1101011001 | 2 | 0010100110 | −2 | Y |
| 167 | 0010100111 | 0 | 1101011000 | 0 | Y |
| 168 | 1101010111 | 4 | 0010101000 | −4 | Y |
| 169 | 1101010110 | 2 | 0010101001 | −2 | Y |
| 170 | 1101010101 | 2 | 0010101010 | −2 | Y |
| 171 | 0010101011 | 0 | 1101010100 | 0 | Y |
| 172 | 1101010011 | 2 | 0010101100 | −2 | Y |
| 173 | 0010101101 | 0 | 1101010010 | 0 | Y |
| 174 | 0010101110 | 0 | 1101010001 | 0 | Y |
| 175 | 1101010010 | 2 | 1101010000 | −2 | Y |
| 176 | 1101001111 | 4 | 0010110000 | −4 | Y |
| 177 | 1101001110 | 2 | 0010110001 | −2 | Y |
| 178 | 1101001101 | 2 | 0010110010 | −2 | Y |
| 179 | 0010110011 | 0 | 1101001100 | 0 | Y |
| 180 | 1101001011 | 2 | 0010110100 | −2 | Y |
| 181 | 0010110101 | 0 | 1101001010 | 0 | Y |
| 182 | 0010110110 | 0 | 1101001001 | 0 | Y |
| 183 | 0010110111 | 2 | 1101001000 | −2 | Y |
| 184 | 1101000111 | 2 | 0010111000 | −2 | Y |
| 185 | 0010111001 | 0 | 1101000110 | 0 | Y |
| 186 | 0010111010 | 0 | 1101000101 | 0 | Y |
| 187 | 0010111011 | 2 | 1101000100 | −2 | Y |
| 188 | 0010111100 | 0 | 1101000011 | 0 | Y |
| 189 | 0010111101 | 2 | 1101000010 | −2 | Y |
| 190 | 0010111110 | 2 | 1101000001 | −2 | Y |
| 191 | 1101001100 | 0 | 0010110011 | 0 | N |
| 192 | 1101001001 | 0 | 0010110110 | 0 | N |
| 193 | 1100111110 | 4 | 0011000001 | −4 | Y |
| 194 | 1100111101 | 4 | 0011000010 | −4 | Y |
| 195 | 1100111100 | 2 | 0011000011 | −2 | Y |
| 196 | 1100111011 | 4 | 0011000100 | −4 | Y |
| 197 | 1100111010 | 2 | 0011000101 | −2 | Y |
| 198 | 1100111001 | 2 | 0011000110 | −2 | Y |
| 199 | 0011000111 | 0 | 1100111000 | 0 | Y |
| 200 | 1100110111 | 4 | 0011001000 | −4 | Y |
| 201 | 1100110110 | 2 | 0011001001 | −2 | Y |
| 202 | 1100110101 | 2 | 0011001010 | −2 | Y |
| 203 | 0011001011 | 0 | 1100110100 | 0 | Y |
| 204 | 1100110011 | 2 | 0011001100 | −2 | Y |
| 205 | 0011001101 | 0 | 1100110010 | 0 | Y |
| 206 | 0011001110 | 0 | 1100110001 | 0 | Y |
| 207 | 0011001111 | 2 | 1100110000 | −2 | Y |
| 208 | 1100101111 | 4 | 0011010000 | −4 | Y |
| 209 | 1100101110 | 2 | 0011010001 | −2 | Y |
| 210 | 1100101101 | 2 | 0011010010 | −2 | Y |
| 211 | 0011010011 | 0 | 1100101100 | 0 | Y |
| 212 | 1100101011 | 2 | 0011010100 | −2 | Y |
| 213 | 0011010101 | 0 | 1100101010 | 0 | Y |
| 214 | 0011010110 | 0 | 1100101001 | 0 | Y |
| 215 | 0011010111 | 2 | 1100101000 | −2 | Y |
| 216 | 1100100111 | 2 | 0011011000 | −2 | Y |
| 217 | 0011011001 | 0 | 1100100110 | 0 | Y |
| 218 | 0011011010 | 0 | 1100100101 | 0 | Y |
| 219 | 0011011011 | 2 | 1100100100 | −2 | Y |
| 220 | 0011011100 | 0 | 1100100011 | 0 | Y |
| 221 | 0011011101 | 2 | 1100100010 | −2 | Y |
| 222 | 0011011110 | 2 | 1100100001 | −2 | Y |
| 223 | 1100111000 | 0 | 0011000111 | 0 | N |
| 224 | 1101010001 | 0 | 0010101110 | 0 | N |
| 225 | 1100011110 | 2 | 0011100001 | −2 | Y |
| 226 | 1100011101 | 2 | 0011100010 | −2 | Y |
| 227 | 0011100011 | 0 | 1100011100 | 0 | Y |
| 228 | 1100011011 | 2 | 0011100100 | −2 | Y |
| 229 | 0011100101 | 0 | 1100011010 | 0 | Y |
| 230 | 0011100110 | 0 | 1100011001 | 0 | Y |
| 231 | 0011100111 | 2 | 1100011000 | −2 | Y |
| 232 | 1100010111 | 2 | 0011101000 | −2 | Y |
| 233 | 0011101001 | 0 | 1100010110 | 0 | Y |
| 234 | 0011101010 | 0 | 1100010101 | 0 | Y |
| 235 | 0011101011 | 2 | 1100010100 | −2 | Y |
| 236 | 0011101100 | 0 | 1100010011 | 0 | Y |
| 237 | 0011101101 | 2 | 1100010010 | −2 | Y |
| 238 | 0011101110 | 2 | 1100010001 | −2 | Y |
| 239 | 0011101111 | 4 | 1100010000 | −4 | Y |
| 240 | 1101000110 | 0 | 0010111001 | 0 | N |
| 241 | 0011110001 | 0 | 1100001110 | 0 | Y |
| 242 | 0011110010 | 0 | 1100001101 | 0 | Y |
| 243 | 0011110011 | 2 | 1100001100 | −2 | Y |
| 244 | 0011110100 | 0 | 1100001011 | 0 | Y |
| 245 | 0011110101 | 2 | 1100001010 | −2 | Y |
| 246 | 0011110110 | 2 | 1100001001 | −2 | Y |
| 247 | 0011110111 | 4 | 1100001000 | −4 | Y |
| 248 | 1101001010 | 0 | 0010110101 | 0 | N |
| 249 | 0011111001 | 2 | 1100000110 | −2 | Y |
| 250 | 0011111010 | 2 | 1100000101 | −2 | Y |
| 251 | 0011111011 | 4 | 1100000100 | −4 | Y |
| 252 | 1100010011 | 0 | 0011101100 | 0 | N |
| 253 | 0011111101 | 4 | 1100000010 | −4 | Y |
| 254 | 1100011001 | 0 | 0011100110 | 0 | N |
| 255 | 1100011100 | 0 | 0011100011 | 0 | N |
| 256 | 1010000111 | 0 | 0101111000 | 0 | N |
| 257 | 1011100001 | 0 | 0100011110 | 0 | N |
| 258 | 1011111101 | 6 | 0100000010 | −6 | Y |
| 259 | 1011111100 | 4 | 0100000011 | −4 | Y |
| 260 | 1011111011 | 6 | 0100000100 | −6 | Y |
| 261 | 1011111010 | 4 | 0100000101 | −4 | Y |
| 262 | 1011111001 | 4 | 0100000110 | −4 | Y |
| 263 | 1011111000 | 2 | 0100000111 | −2 | Y |
| 264 | 1011110111 | 6 | 0100001000 | −6 | Y |
| 265 | 1011110110 | 4 | 0100001001 | −4 | Y |
| 266 | 1011110101 | 4 | 0100001010 | −4 | Y |
| 267 | 1011110100 | 2 | 0100001011 | −2 | Y |
| 268 | 1011110011 | 4 | 0100001100 | −4 | Y |
| 269 | 1011110010 | 2 | 0100001101 | −2 | Y |
| 270 | 1011110001 | 2 | 0100001110 | −2 | Y |
| 271 | 1011100010 | 0 | 0100011101 | 0 | N |
| 272 | 1011101111 | 6 | 0100010000 | −6 | Y |
| 273 | 1011101110 | 4 | 0100010001 | −4 | Y |
| 274 | 1011101101 | 4 | 0100010010 | 4 | Y |
| 275 | 1011101100 | 2 | 0100010011 | −2 | Y |
| 276 | 1011101011 | 4 | 0100010100 | −4 | Y |
| 277 | 1011101010 | 2 | 0100010101 | −2 | Y |
| 278 | 1011101001 | 2 | 0100010110 | −2 | Y |
| 279 | 0100010111 | 0 | 1011101000 | 0 | Y |
| 280 | 1011100111 | 4 | 0100011000 | −4 | Y |
| 281 | 1011100110 | 2 | 0100011001 | −2 | Y |
| 282 | 1011100101 | 2 | 0100011010 | −2 | Y |
| 283 | 0100011011 | 0 | 1011100100 | 0 | Y |
| 284 | 1011100011 | 2 | 0100011100 | −2 | Y |
| 285 | 0100011101 | 0 | 1011100010 | 0 | Y |
| 286 | 0100011110 | 0 | 1011100001 | 0 | Y |

TABLE 5-continued

| Symbol | Positive Code | Positive Disparity | Negative Code | Negative Disparity | Primary Mapping? |
|---|---|---|---|---|---|
| 287 | 1011100100 | 0 | 0100011011 | 0 | N |
| 288 | 1011000011 | 0 | 0100111100 | 0 | N |
| 289 | 1011011110 | 4 | 0100100001 | −4 | Y |
| 290 | 1011011101 | 4 | 0100100010 | −4 | Y |
| 291 | 1011011100 | 2 | 0100100011 | −2 | Y |
| 292 | 1011011011 | 4 | 0100100100 | −4 | Y |
| 293 | 1011011010 | 2 | 0100100101 | −2 | Y |
| 294 | 1011011001 | 2 | 0100100110 | −2 | Y |
| 295 | 0100100111 | 0 | 1011011000 | 0 | Y |
| 296 | 1011010111 | 4 | 0100101000 | −4 | Y |
| 297 | 1011010110 | 2 | 0100101001 | −2 | Y |
| 298 | 1011010101 | 2 | 0100101010 | −2 | Y |
| 299 | 0100101011 | 0 | 1011010100 | 0 | Y |
| 300 | 1011010011 | 2 | 0100101100 | −2 | Y |
| 301 | 0100101101 | 0 | 1011010010 | 0 | Y |
| 302 | 0100101110 | 0 | 1011010001 | 0 | Y |
| 303 | 0100101111 | 2 | 1011010000 | −2 | Y |
| 304 | 1011001111 | 4 | 0100110000 | −4 | Y |
| 305 | 1011001110 | 2 | 0100110001 | −2 | Y |
| 306 | 1011001101 | 2 | 0100110010 | −2 | Y |
| 307 | 0100110011 | 0 | 1011001100 | 0 | Y |
| 308 | 1011001011 | 2 | 0100110100 | −2 | Y |
| 309 | 0100110101 | 0 | 1011001010 | 0 | Y |
| 310 | 0100110110 | 0 | 1011001001 | 0 | Y |
| 311 | 0100110111 | 2 | 1011001000 | −2 | Y |
| 312 | 1011000111 | 2 | 0100111000 | −2 | Y |
| 313 | 0100111001 | 0 | 1011000110 | 0 | Y |
| 314 | 0100111010 | 0 | 1011000101 | 0 | Y |
| 315 | 0100111011 | 2 | 1011000100 | −2 | Y |
| 316 | 0100111100 | 0 | 1011000011 | 0 | Y |
| 317 | 0100111101 | 2 | 1011000010 | −2 | Y |
| 318 | 0100111110 | 2 | 1011000001 | −2 | Y |
| 319 | 1011001100 | 0 | 0100110011 | 0 | N |
| 320 | 1011000101 | 0 | 0100111010 | 0 | N |
| 321 | 1010111110 | 4 | 0101000001 | −4 | Y |
| 322 | 1010111101 | 4 | 0101000010 | −4 | Y |
| 323 | 1010111100 | 2 | 0101000011 | −2 | Y |
| 324 | 1010111011 | 4 | 0101000100 | −4 | Y |
| 325 | 1010111010 | 2 | 0101000101 | −2 | Y |
| 326 | 1010111001 | 2 | 0101000110 | −2 | Y |
| 327 | 0101000111 | 0 | 1010111000 | 0 | Y |
| 328 | 1010110111 | 4 | 0101001000 | −4 | Y |
| 329 | 1010110110 | 2 | 0101001001 | −2 | Y |
| 330 | 1010110101 | 2 | 0101001010 | −2 | Y |
| 331 | 0101001011 | 0 | 1010110100 | 0 | Y |
| 332 | 1010110011 | 2 | 0101001100 | −2 | Y |
| 333 | 0101001101 | 0 | 1010110010 | 0 | Y |
| 334 | 0101001110 | 0 | 1010110001 | 0 | Y |
| 335 | 0101001111 | 2 | 1010110000 | −2 | Y |
| 336 | 1010101111 | 4 | 0101010000 | −4 | Y |
| 337 | 1010101110 | 2 | 0101010001 | 2 | Y |
| 338 | 1010101101 | 2 | 0101010010 | −2 | Y |
| 339 | 0101010011 | 0 | 1010101100 | 0 | Y |
| 340 | 1010101011 | 2 | 0101010100 | −2 | Y |
| 341 | 0101010101 | 0 | 1010101010 | 0 | Y |
| 342 | 0101010110 | 0 | 1010101001 | 0 | Y |
| 343 | 0101010111 | 2 | 1010101000 | −2 | Y |
| 344 | 0101100111 | 2 | 1010011000 | −2 | Y |
| 345 | 0101011001 | 0 | 1010100110 | 0 | Y |
| 346 | 0101011010 | 0 | 1010100101 | 0 | Y |
| 347 | 0101011011 | 2 | 1010100100 | −2 | Y |
| 348 | 0101011100 | 0 | 1010100011 | 0 | Y |
| 349 | 0101011101 | 2 | 1010100010 | −2 | Y |
| 350 | 0101011110 | 2 | 1010100001 | −2 | Y |
| 351 | 1010111000 | 0 | 0101000111 | 0 | N |
| 352 | 1011001001 | 0 | 0100110110 | 0 | N |
| 353 | 1010011110 | 2 | 0101100001 | −2 | Y |
| 354 | 1010011101 | 2 | 0101100010 | −2 | Y |
| 355 | 0101100011 | 0 | 1010011100 | 0 | Y |
| 356 | 1010011011 | 2 | 0101100100 | −2 | Y |
| 357 | 0101100101 | 0 | 1010011010 | 0 | Y |
| 358 | 0101100110 | 0 | 1010011001 | 0 | Y |
| 359 | 0101100111 | 2 | 1010011000 | −2 | Y |
| 360 | 1010010111 | 2 | 0101101000 | −2 | Y |
| 361 | 0101101001 | 0 | 1010010110 | 0 | Y |
| 362 | 0101101010 | 0 | 1010010101 | 0 | Y |
| 363 | 0101101011 | 2 | 1010010100 | −2 | Y |
| 364 | 1101101100 | 0 | 1010010011 | 0 | Y |
| 365 | 0101101101 | 2 | 1010010010 | −2 | Y |
| 366 | 0101101110 | 2 | 1010010001 | −2 | Y |
| 367 | 0101101111 | 4 | 1010010000 | −4 | Y |
| 368 | 1010001111 | 2 | 0101110000 | −2 | Y |
| 369 | 0101110001 | 0 | 1010001110 | 0 | Y |
| 370 | 0101110010 | 0 | 1110001101 | 0 | Y |
| 371 | 0101110011 | 2 | 1010001100 | −2 | Y |
| 372 | 0101110100 | 0 | 1010011011 | 0 | Y |
| 373 | 0101110101 | 2 | 1010001010 | −2 | Y |
| 374 | 0101110110 | 2 | 1010001001 | −2 | Y |
| 375 | 0101110111 | 4 | 1010001000 | −4 | Y |
| 376 | 0101111000 | 0 | 1010000111 | 0 | Y |
| 377 | 0101111001 | 2 | 1010000110 | −2 | Y |
| 378 | 0101111010 | 2 | 1010000101 | −2 | Y |
| 379 | 0101111011 | 4 | 1010000100 | −4 | Y |
| 380 | 0101111100 | 2 | 1010000011 | −2 | Y |
| 381 | 0101111101 | 4 | 1010000010 | −4 | Y |
| 382 | 0101111110 | 4 | 1010000001 | −4 | Y |
| 383 | 1010011100 | 0 | 0101100011 | 0 | N |
| 384 | 1011010001 | 0 | 0100101110 | 0 | N |
| 385 | 1001111110 | 4 | 0110000001 | −4 | Y |
| 386 | 1001111101 | 4 | 0110000010 | −4 | Y |
| 387 | 1001111100 | 2 | 1111000011 | −2 | Y |
| 388 | 1001111011 | 4 | 0110000100 | −4 | Y |
| 389 | 1001111010 | 2 | 0110000101 | −2 | Y |
| 390 | 1001111001 | 2 | 0110000110 | −2 | Y |
| 391 | 0110000100 | 0 | 1001111010 | 0 | Y |
| 392 | 1001110111 | 4 | 0110001000 | −4 | Y |
| 393 | 111110110 | 2 | 0110001001 | −2 | Y |
| 394 | 1001110101 | 2 | 0110001010 | −2 | Y |
| 395 | 0110001011 | 0 | 1001110100 | 0 | Y |
| 396 | 1001110011 | 2 | 0110001100 | −2 | Y |
| 397 | 0110001101 | 0 | 1001110010 | 0 | Y |
| 398 | 0110001110 | 0 | 1001110001 | 0 | Y |
| 399 | 0110001111 | 2 | 1001110000 | −2 | Y |
| 400 | 1001101111 | 4 | 0110010000 | −4 | Y |
| 401 | 1001101110 | 2 | 0110010001 | −2 | Y |
| 402 | 1001101101 | 2 | 0110010010 | −2 | Y |
| 403 | 0110010011 | 0 | 1001101100 | 0 | Y |
| 404 | 1001101011 | 2 | 0110010100 | −2 | Y |
| 405 | 0110010101 | 0 | 1001101010 | 0 | Y |
| 406 | 0110010110 | 0 | 1001101001 | 0 | Y |
| 407 | 0110010111 | 2 | 1001101000 | −2 | Y |
| 408 | 1001100111 | 2 | 0110011000 | −2 | Y |
| 409 | 0110011001 | 0 | 1001100110 | 0 | Y |
| 410 | 0110011010 | 0 | 1001100101 | 0 | Y |
| 411 | 0110011011 | 2 | 1001100100 | −2 | Y |
| 412 | 0110011100 | 0 | 1001100011 | 0 | Y |
| 413 | 0110011101 | 2 | 1001100010 | −2 | Y |
| 414 | 0110011110 | 2 | 1001100001 | −2 | Y |
| 415 | 1001111000 | 0 | 0110000111 | 0 | N |
| 416 | 1011100000 | 0 | 0100111011 | 0 | N |
| 417 | 1001011110 | 2 | 0110100001 | −2 | Y |
| 418 | 1001011101 | 2 | 0110100010 | −2 | Y |
| 419 | 0110100011 | 0 | 1001011100 | 0 | Y |
| 420 | 1001011011 | 2 | 0110100100 | −2 | Y |
| 421 | 0110100101 | 0 | 1001011010 | 0 | Y |
| 422 | 0110100110 | 0 | 1001011001 | 0 | Y |
| 423 | 0110100111 | 2 | 1001011000 | −2 | Y |
| 424 | 1001010111 | 2 | 0110101000 | −2 | Y |
| 425 | 0110101001 | 0 | 1001010110 | 0 | Y |
| 426 | 0110101010 | 0 | 1001010101 | 0 | Y |
| 427 | 0110101011 | 2 | 1001010100 | −2 | Y |
| 428 | 0110101100 | 0 | 1001010011 | 0 | Y |
| 429 | 0110101101 | 2 | 1001010010 | −2 | Y |
| 430 | 0110101110 | 2 | 1001010001 | −2 | Y |
| 431 | 0110101111 | 4 | 1001010000 | −4 | Y |
| 432 | 1001001111 | 2 | 0110110000 | −2 | Y |
| 433 | 0110110001 | 0 | 1001001110 | 0 | Y |
| 434 | 0110110010 | 0 | 1001001101 | 0 | Y |
| 435 | 0110110011 | 2 | 1001001100 | −2 | Y |
| 436 | 0110110100 | 0 | 1001001011 | 0 | Y |
| 437 | 0110110101 | 2 | 1001001010 | −2 | Y |
| 438 | 0110110110 | 2 | 1001001001 | −2 | Y |

TABLE 5-continued

| Symbol | Positive Code | Positive Disparity | Negative Code | Negative Disparity | Primary Mapping? |
|---|---|---|---|---|---|
| 439 | 0110110111 | 4 | 1001001000 | −4 | Y |
| 440 | 0110111000 | 0 | 1001000111 | 0 | Y |
| 441 | 0110111001 | 2 | 1001000110 | −2 | Y |
| 442 | 0110111010 | 2 | 1001000101 | −2 | Y |
| 443 | 0110111011 | 4 | 1001000100 | −4 | Y |
| 444 | 0110111100 | 2 | 1001000011 | −2 | Y |
| 445 | 0110111101 | 4 | 1001000010 | −4 | Y |
| 446 | 0110111110 | 4 | 1001000001 | −4 | Y |
| 447 | 1000111100 | 0 | 0111000011 | 0 | N |
| 448 | 1011001010 | 0 | 0100110101 | 0 | N |
| 449 | 1000111110 | 2 | 0111000001 | −2 | Y |
| 450 | 1000111101 | 2 | 0111000010 | −2 | Y |
| 451 | 0111000011 | 0 | 1000111100 | 0 | Y |
| 452 | 1000111011 | 2 | 0111000100 | −2 | Y |
| 453 | 0111000101 | 0 | 1000111010 | 0 | Y |
| 454 | 0111000110 | 0 | 1000111001 | 0 | Y |
| 455 | 0111000111 | 2 | 1000111000 | −2 | Y |
| 456 | 1000110111 | 2 | 0111001000 | −2 | Y |
| 457 | 0111001001 | 0 | 1000110110 | 0 | Y |
| 458 | 0111001010 | 0 | 1000110101 | 0 | Y |
| 459 | 0111001011 | 2 | 1000110100 | −2 | Y |
| 460 | 0111001100 | 0 | 1000110011 | 0 | Y |
| 461 | 0111001101 | 2 | 1000110010 | −2 | Y |
| 462 | 0111001110 | 2 | 1000110001 | −2 | Y |
| 463 | 0111001111 | 4 | 1000110000 | 4 | Y |
| 464 | 1000101111 | 2 | 0111010000 | −2 | Y |
| 465 | 0111010001 | 0 | 1000101110 | 0 | Y |
| 466 | 0111010010 | 0 | 1000101101 | 0 | Y |
| 467 | 0111010011 | 2 | 1000101100 | −2 | Y |
| 468 | 0111010100 | 0 | 1000101011 | 0 | Y |
| 469 | 0111010101 | 2 | 1000101010 | −2 | Y |
| 470 | 0111010110 | 2 | 1000101001 | −2 | Y |
| 471 | 0111010111 | 4 | 1000101000 | −4 | Y |
| 472 | 0111011000 | 0 | 1000100111 | 0 | Y |
| 473 | 0111011001 | 2 | 1000100110 | −2 | Y |
| 474 | 0111011010 | 2 | 1000100101 | −2 | Y |
| 475 | 0111011011 | 4 | 1000100100 | −4 | Y |
| 476 | 0111011100 | 2 | 1000100011 | −2 | |
| 477 | 0111011101 | 4 | 1000100010 | −4 | Y |
| 478 | 0111011110 | 4 | 1000100001 | −4 | Y |
| 479 | 1001011100 | 0 | 0110100011 | 0 | N |
| 480 | 1011010010 | 0 | 0100101101 | 0 | N |
| 481 | 0111100001 | 0 | 1000011110 | 0 | Y |
| 482 | 0111100010 | 0 | 1000011101 | 0 | Y |
| 483 | 0111100011 | 2 | 1000011100 | −2 | Y |
| 484 | 0111100100 | 0 | 1000011011 | 0 | Y |
| 485 | 0111100101 | 2 | 1000011010 | −2 | Y |
| 486 | 0111100110 | 2 | 1000011001 | −2 | Y |
| 487 | 0111100111 | 4 | 1000011000 | −4 | Y |
| 488 | 0111101000 | 0 | 1000010111 | 0 | Y |
| 489 | 0111101001 | 2 | 1000010110 | −2 | Y |
| 490 | 0111101010 | 2 | 1000010101 | −2 | Y |
| 491 | 0111101011 | 4 | 1000010100 | 4 | Y |
| 492 | 0111101100 | 2 | 1000010011 | −2 | Y |
| 493 | 0111101101 | 4 | 1000010010 | −4 | Y |
| 494 | 0111101110 | 4 | 1000010001 | −4 | Y |
| 495 | 0111101111 | 6 | 1000010000 | −6 | Y |
| 496 | 1011010100 | 0 | 0100101011 | 0 | N |
| 497 | 0111110001 | 2 | 1000001110 | −2 | Y |
| 498 | 0111110010 | 2 | 1000001101 | −2 | Y |
| 499 | 0111110011 | 4 | 1000001100 | −4 | Y |
| 500 | 0111110100 | 2 | 1000001011 | −2 | Y |
| 501 | 0111110101 | 4 | 1000001010 | −4 | Y |
| 502 | 0111110110 | 4 | 1000001001 | −4 | Y |
| 503 | 0111110111 | 6 | 1000001000 | −6 | Y |
| 504 | 1000100111 | 0 | 0111011000 | 0 | N |
| 505 | 0111111001 | 4 | 1000000110 | −4 | Y |
| 506 | 0111111010 | 4 | 1000000101 | −4 | Y |
| 507 | 0111111011 | 6 | 1000000100 | −6 | Y |
| 508 | 1000110011 | 0 | 0111001100 | 0 | N |
| 509 | 1000111010 | 0 | 0111000101 | 0 | N |
| 510 | 1000111001 | 0 | 0111000110 | 0 | N |
| 511 | 1001101100 | 0 | 0110010011 | 0 | N |

In Table 5, the 512 code words set forth in the second column from the left mine the positive disparity codebook of the Table 5 code to which the input symbols map. Each code word in the positive disparity codebook (sometimes referred to as the "positive" codebook) has the non-negative disparity indicated (in the third column from the left in Table 5). The complement of each code word of positive disparity codebook determines the code word of the negative disparity codebook to which the relevant input symbol maps. This determines the 512 code words of the negative disparity codebook (set forth in Table 5 in the fourth column from the left) to which the input symbols map. Each code word in the negative disparity codebook (sometimes referred to as the "negative" codebook) has the non-positive disparity indicated (in the second column from the right in Table 5).

The secondary mapping for the 9B/10B code of Table 5 determines those code words in each row of Table 5 in which there is an "N" symbol in the right column. (The primary mapping for this code determines those code words in each row of Table 4 in which there is a "Y" symbol in the right column).

The Table 5 code favors higher transition density over lower digital sum variation with the goal of providing better clock data recovery performance for transmission over short distances. The code space is defined as follows:

each code word having disparity 0 has a run of length three or less on either end, and includes no run of length greater than six away from its ends;

each code word having disparity 2, −2, 4, −4, 6, or −6 that has a run of zeroes on the left has a run of zeroes of length two or less on the left;

each code word having disparity 2, −2, 4, −4, 6, or −6 that has a run of zeroes on the right has a run of zeroes of length three or less on the right;

each code word having disparity 2, −2, 4, −4, 6, or −6 that has a run of ones on the left has a run of ones of length three or less on the left;

each code word having disparity 2, −2, 4, −4, 6, or −6 that has a run of ones on the right has a run of ones of length four or less on the right;

no code word having disparity 2, −2, 4, −4, 6, or −6 has a run of zeroes of length greater than six away from its ends;

no code word having disparity 2, −2, 4, −4, 6, or −6 has a run of ones of length greater than seven away from its ends;

no code word has disparity greater than 6 or less than −6; and no code word has less than 3 transitions.

These rules select 513 code words out of the 1024 possible 10-bit code words.

The code set forth in Table 5 differs from (and is improved in several respects over) the 9B/10B block code outlined in above-cited U.S. Pat. No. 6,198,413. The code of Table 5 has a maximum run length of 7, a maximum digital sum variation of 20, an average of 5.29 transitions per code word (over all legal code pairs), and a normalized DC offset of 6.9. Of the 512 code words in the positive codebook, only 113 are not determined by the primary mapping.

In variations on the code set forth in Table 5, the positive and negative codebooks are not strictly complements of each other. Rather, the code words having nonzero disparity are identical to those of Table 5 (the code words of the negative codebook having nonzero disparity are complements of corresponding code words of the positive codebook) but the code words of the negative codebook that have zero disparity are identical to corresponding code words of the positive codebook. The code words having zero disparity can be either the zero-disparity code words of the positive codebook of Table 5 or the zero-disparity code words of the negative codebook of Table 5.

For each of the Table 1 code, the Table 4 code, and the Table 5 code, the same prefixes for denoting control/out-of-band characters are used. In particular, when current running disparity is <0, the prefix is 0011111111. The prefix is 1100000000 when current running disparity is >0. A comma or control code contains a 10-bit code following this prefix so that the total disparity across the 20 bits is 0 and so that it does not end with a run of length greater than 3. This gives 25 possible combinations for each prefix, i.e. 25 possible 20-bit out-of-band characters. If one allows the OOB characters to be longer than 20 bits, one can have more possible values.

The exemplary codes described with reference to Tables 1, 3, 4, and 5 were generated in accordance with the invention using the above-described method in which guidelines for the desired spectral properties of the encoded data are established, and a positive codebook is then determined by using automated filtering to select candidate code spaces using the guidelines, determining a candidate mapping from input symbols to code words for each candidate code space, and evaluating the candidate mappings using a small set of metrics to select one code (consisting of a set of input symbols, a positive codebook, and a mapping between each input symbol to a different code word of the positive codebook). The negative codebook for each code was then determined from the positive codebook.

In the exemplary codes described with reference to Tables 1, 3, 4, and 5, all code words determined by the secondary mapping have zero disparity. This results in an optimization in the encoding and decoding circuitry typically employed for implementing the codes, in that the disparity of the code words output from the look up table (which implements the secondary mapping or its inverse) need not be stored or added to the input disparity.

However, other codes used or generated in accordance with the invention have code words that are determined by the secondary mapping but which have nonzero disparity. The circuitry employed for encoding data in accordance with codes of this type (or for decoding the code words) would typically require circuitry for storing indications of the disparity of the code words output from a look up table (which implements the secondary mapping or its inverse) and for adding the disparities of such code words to the input disparity during the encoding (or decoding).

In a class of embodiments, the invention is a method of encoding data, including the steps of generating N-bit input words; and encoding the input words in accordance with a block code to generate a code word sequence of (N+1)-bit code words. In some such embodiments, the block code is specified by a line code, the line code also specifies special characters, and the method also includes the step of generating encoded data such that the encoded data are a sequence of at least one of the special characters and the code words of the code word sequence. Preferably, "N" is an odd integer.

In another class of embodiments, the invention is a method of encoding data, including the steps of generating (N+M)-bit input words; and encoding the input words in accordance with a block code to generate a code word sequence of (N+M+2)-bit code words, by using a first block code to encode an N-bit fragment of each input word as an (N+1)-bit code word, using a second block code to encode the remaining M bits of the input word as an (M+1)-bit code word, and concatenating the (N+1)-bit code word with the (M+1)-bit code word. Preferably, "N" and "M" are odd integers. In some such embodiments, the block code is specified by a line code, the line code also specifies special characters, and the method also includes the step of generating encoded data such that the encoded data are a sequence of at least one of the special characters and the code words of the code word sequence.

Data encoded using an NB/(N+1)B block code can be used for many different purposes, some of which have been described with reference to FIGS. 1 and 2. Another exemplary use of NB/(N+1)B block coding is to concatenate (N−1)-bit input data words with single control bits (or single bits of a logical channel distinct from the input data channel) to generate N-bit input symbols, and then to encode the N-bit input symbols as (N+1)-bit code words. Another exemplary use of NB/(N+1)B block coding is to increase the deliverable bandwidth to the application by grouping the bits of (N−1)-bit input data words as N-bit input symbols (e.g., by concatenating a first (N−1)-bit input data word with the first bit of a second (N−1)-bit input data word, and so on), and then encoding the N-bit input symbols as (N+1)-bit code words.

A 9B/10B block code (or other NB/(N+1)B block code) is modular, in the sense that it does not have to be entwined with a particular protocol. Its interface could simply be to map between a fixed number of symbols and code words once every clock cycle.

The term "includes" as used in the claims denotes "consists of or includes."

It should be understood that while certain forms of the present invention are illustrated and described herein, the invention is defined by the claims and is not to be limited to the specific embodiments described and shown. claims

What is claimed is:

1. A method for determining codebooks for use in encoding data according to an NB/(N+1)B block code, including the steps of:

(a) determining a positive codebook that specifies a bijective mapping between a set of $2^N$ N-bit symbols, x, and a set of $2^N$ (N+1)-bit code words, $f_p(x)$, by determining candidate code words and selecting a subset of the candidate code words as the code words, $f_p(x)$, including by performing automated filtering on each of at least some of the candidate code words to exclude from the subset each of the candidate code words having at least one predetermined spectral property, wherein each of the candidate code words is an (N+1)-bit word but none of the candidate code words has negative disparity; and (b) determining a negative codebook that specifies a bijective mapping between the set of symbols and a set Of $2^N$ (N+1)-bit code words, $f_n(x)$.

2. The method of claim 1, where $f_n(x)=f_p(x)^C$ for each of the symbols, with $f_p(x)^C$ denoting the complement of $f_p(x)$.

3. The method of claim 1, where $f_n(x)=f_p(x)^C$ for each of the symbols for which $f_p(x)$ has positive disparity, with $f_p(x)^C$ denoting the complement of $f_p(x)$, and $f_n(x)=f_p(x)$ for each of the symbols for which $f_p(x)$ has zero disparity.

4. The method of claim 1, wherein step (a) includes the steps of:

(c) determining candidate code spaces, each consisting of a different set of $2^N$ of the candidate code words, including by performing automated filtering on each of at least some of the candidate code words to exclude from the candidate code spaces at least some of the candidate code words having at least one predetermined spectral property;

(d) for each of the candidate code spaces, determining a candidate mapping from the set of symbols to said each of the candidate code spaces; and (e) evaluating each said candidate mapping using a small set of metrics, and as a result of the evaluation, selecting one of the candidate code spaces as the set of code words, $f_p(x)$.

5. The method of claim 4, wherein the metrics indicate at least one of:

minimum number of transitions per code word, average transitions per code word over all possible pairs of code words that could appear in a transmission stream of valid code words according to one of the candidate code spaces, normalized DC offset, maximum run length, and maximum digital sum variation.

6. The method of claim 4, wherein each said candidate mapping specifies a primary mapping of each symbol of a first subset of the symbols to a different one of the code words of one of the candidate code spaces, and a secondary mapping of each other one of the symbols to a different one of the code words of said one of the candidate code spaces, and wherein the metrics indicate at least one of: minimum number of transitions per code word, average transitions per code word over all possible pairs of code words that could appear in a transmission stream of valid code words according to one of the candidate code spaces, normalized DC offset, maximum run length, maximum digital sum variation, and size of the first subset specified by the candidate mapping for one of the candidate code spaces.

7. The method of claim 4, wherein N is an odd integer.

8. The method of claim 4, wherein step (d) includes the steps of:

(f) for each of the candidate code spaces, identifying systematic mappings of at least some of the symbols to code words of said candidate code space, and selecting as a primary mapping one of the systematic mappings that maps a maximal number of the symbols to code words of said candidate code space; and (g) after step (f), for said each of the candidate code spaces, determining a secondary mapping, of each of the symbols not mapped by the primary mapping, to code words of said candidate code space, whereby the primary mapping and the secondary mapping determine the candidate mapping for said candidate code space.

9. The method of claim 8, wherein step (g) is performed in such a manner that the secondary mapping minimizes error magnification during decoding.

10. The method of claim 8; wherein step (g) includes the steps of:

(h) identifying a selected code word, said selected code word being a code word of the candidate code space to which a symbol has not been mapped;

(i) identifying a first set of the symbols that map to all code words of the candidate code space that differ from the selected code word by a target error magnification, where the target error magnification is a single bit during an initial performance of step (i);

(j) after step (i), searching for an unmapped symbol that differs from each member of the first set by no more than the target error magnification, and if such unmapped symbol is found, mapping said unmapped symbol to the selected code word;

(k) if at least one of the symbols remains unmapped, repeating steps (h), (i), and (j), until all previously unmapped ones of the symbols are mapped or no new mapping having the target error magnification can be determined, wherein each repetition of steps (h), (i), and j) employs a different selected code word, and the target error magnification remains unchanged during each repetition of steps (h), (i), and j); and (l) if at least one of the symbols remains unmapped after step (k), incrementing the target error magnification by one, and repeating steps (h), (i), (j), and (k), using the incremented target error magnification until all previously unmapped ones of the symbols are mapped or no new mapping having the incremented target error magnification limit can be determined.

11. The method of claim 10, wherein step (g) also includes the step of:

(m) if at least one of the symbols remains unmapped after step (l), further incrementing the target error magnification by one, and repeating step (l) using the further incremented target error magnification until all previously unmapped ones of the symbols are mapped or no new mapping having the further incremented target error magnification limit can be determined.

12. The method of claim 1, wherein the automated filtering includes the step of excluding from the subset each of the candidate code words having at least one of a transition density below a predetermined transition density, a disparity greater than a predetermined disparity, a transition-free run of length that exceeds a predetermined maximum run length, a transition-free run, at one code word end, of length that exceeds a predetermined maximum run length, and a transition-free run, away from each code word end, of length that exceeds a predetermined maximum run length.

13. The method of claim 1, wherein N is an odd integer.

14. The method of claim 1, wherein the symbols consist of a first subset and a second subset of said symbols, the first subset includes more of the symbols than does the second subset, the positive codebook specifies a primary mapping of each of the symbols in the first subset to a different one of the code words, $f_p(x)$, and the primary mapping is implementable by logic circuitry.

15. The method of claim 14, wherein N=7, and the first subset includes at least 98 of the symbols.

16. The method of claim 15, wherein the first subset includes 98 of the symbols, and wherein each of the code words, $f_p(x)$, that has non-negative disparity and to which the primary mapping maps a member, x, of the first subset, consists of the bit sequence (0,x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

17. The method of claim 15, wherein each of the code words, $f_p(x)$ and $f_n(x)$, has disparity equal to one of 4, −4, 2, −2, and zero, none of the code words, $f_p(x)$ and $f_n(x)$, has a run of length greater than three at either end or a run of length greater than six away from its ends, and none of the code words, $f_p(x)$ and $f_n(x)$, has less than two transitions.

18. The method of claim 14, wherein N=9, and the first subset includes at least 408 of the symbols.

19. The method of claim 18, wherein the first subset includes 408 of the symbols, and wherein each of the code words, $f_p(x)$, that has non-negative disparity and to which the primary mapping maps a member, x, of the first subset, consists of the bit sequence (0, x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

20. The method of claim 18, wherein each of the code words, $f_p(x)$ and $f_n(x)$, has disparity equal to one of 6, −6, 4, −4, 2, −2, and zero, none of the code words, $f_p(x)$ and $f_n(x)$, has a run of length greater than three at one end, a run of length greater than four at its other end, or a run of length greater than seven away from its ends, and none of the code words, $f_p(x)$ and $f_n(x)$, has less than three transitions.

21. The method of claim 12, wherein N=9, and the first subset includes at least 396 of the symbols.

22. The method of claim 21, wherein each of the code words, $f_p(x)$ and $f_n(x)$, has disparity equal to one of 4, −4, 2, −2, and zero, none of the code words, $f_p(x)$ and $f_n(x)$, having zero disparity has a run of length greater than three at either end or a run of length greater than six away from its ends, none of the code words, $f_p(x)$ and $f_n(x)$, having disparity 2, −2, 4, or −4 has a run of length greater than four at one end, a run of length greater than three at its other end or a run of length greater than seven away from its ends, and none of the code words, $f_p(x)$ and $f_n(x)$, has less than two transitions.

23. The method of claim 22, wherein the NB/(N+1)B block code has a maximum digital sum variation of 16, and a normalized DC offset that is not greater than 4.9.

24. The method of claim 12, wherein N=9, and the first subset includes at least 399 of the symbols.

25. The method of claim 24, wherein each of the code words, $f_p(x)$ and $f_n(x)$, has disparity equal to one of 6, −6, 4, −4, 2, −2, and zero, none of the code words, $f_p(x)$ and $f_n(x)$, having zero disparity has a run of length greater than three at either end or a run of length greater than six away from its ends, none of the code words, $f_p(x)$ and $f_n(x)$, having disparity 2, −2, 4, −4, 6, or −6 has a run of zeroes of length greater than two at one end, a run of zeroes of length greater than three at its other end, a run of zeroes of length greater than six away from its ends, a run of ones of length greater than three at one end, a run of ones of length greater than four at its other end, or a run of ones of length greater than seven away from its ends, and none of the code words, $f_p(x)$ and $f_n(x)$, has less than three transitions.

26. The method of claim 25, wherein the NB/(N+1)B block code has a maximum digital sum variation of 20, and a normalized DC offset that is not greater than 6.9.

27. A method for encoding data, including the steps of:

(a) determining a positive codebook and a negative codebook such that the positive codebook specifies a bijective mapping between a set of $2^N$ N-bit words, x, and a set Of $2^N$ (N+)-bit code words, $f_p(x)$, and the negative codebook specifies a bijective mapping between the set of words, x, and a set of $2^N$ (N+1)-bit code words, $f_n(x)$; and (b) encoding a sequence of N-bit input words of the data using the positive codebook and the negative codebook to generate a code word sequence of (N+1)-bit code words by replacing a first one of the input words with a code word from one of the positive codebook and the negative codebook, and replacing each other one of the input words with a code word from the positive codebook if the cumulative disparity of all previously generated code words of the code word sequence is not greater than zero, and with a code word from the negative codebook if the cumulative disparity of all previously generated code words of the code word sequence is greater than zero, wherein step (a) includes the steps of:

determining candidate code words, wherein each of the candidate code words is an (N+1)-bit word but none of the candidate code words has negative disparity; and selecting a subset of the candidate code words as the code words, $f_p(x)$, including by performing automated filtering on each of at least some of the candidate code words to exclude from the subset each of the candidate code words having at least one predetermined spectral property.

28. The method of claim 27, where $f_n(x)=f_p(x)^C$ for each of the words, x, with $f_p(x)^C$ denoting the complement of $f_p(x)$.

29. The method of claim 27, where $f_n(x)=f_{p(x)}{}^C$ for each of the words, x, for which $f_p(x)$ has positive disparity, with $f_p(x)^C$ denoting the complement of $f_p(x)$, and $f_n(x)=f_p(x)$ for each of the words, x, for which $f_p(x)$ has zero disparity.

30. The method of claim 27, wherein the automated filtering step includes the step of excluding from the subset each of the candidate code words having at least one of a transition density below a predetermined transition density, a disparity greater than a predetermined disparity, and a transition-free run of length that exceeds a predetermined maximum run length.

31. The method of claim 27, wherein N is an odd integer.

32. A method for encoding data, including the steps of:

(a) determining a positive codebook and a negative codebook such that the positive codebook specifies a bijective mapping between a set of $2^N$ N-bit words, x, and a set of $2^N$ (N+1)-bit code words, $f_p(x)$, and the negative codebook specifies a bijective mapping between the set of words, x, and a set of $2^N$ (N+1)-bit code words, $f_n(x)$; and (b) encoding a sequence of N-bit input words of the data using the positive codebook and the negative codebook to generate a code word sequence of (N+1)-bit code words by replacing a first one of the input words with a code word from one of the positive codebook and the negative codebook, and replacing each other one of the input words with a code word from the positive codebook if the cumulative disparity is less than zero and with a code word from the negative codebook if the cumulative disparity is not less than zero, wherein step (a) includes the steps of:

(c) determining candidate code words, wherein each of the candidate code words is an (N+1)-bit word but none of the candidate code words has negative disparity; and (d) selecting a subset of the candidate code words as the code words, $f_p(x)$, including by performing automated filtering on each of at least some of the candidate code words to exclude from the subset each of the candidate code words having at least one predetermined spectral property.

33. The method of claim 32, where $f_n(x)=f_p(x)^C$ for each of the words, x, with $f_p(x)^C$ denoting the complement of $f_p(x)$.

34. The method of claim 32, where $f_n(x)=f_p(x)^C$ for each of the words, x, for which $f_p(x)$ has positive disparity, with $f_p(x)^C$ denoting the complement of $f_p(x)$, and $f_n(x)=f_p(x)$ for each of the words, x, for which $f_p(x)$ has zero disparity.

35. The method of claim 32, wherein the automated filtering step includes the step of excluding from the subset each of the candidate code words having at least one of a transition density below a predetermined transition density, a disparity greater than a predetermined disparity, and a transition-free run of length that exceeds a predetermined maximum run length.

36. The method of claim 32, wherein N is an odd integer.

37. A method for encoding data, including the steps of:
(a) determining a bijective mapping between a data word set of $2^N$ N-bit data words and a code word set of (N+1)-bit code words, where the data words consist of a first subset and a second subset of the data word set, the first subset of the data word set includes more of the data words than does the second subset of the data word set, the bijective mapping includes a secondary mapping and a primary mapping, the primary mapping maps data words of the first subset of the data word set to a first subset of the code word set, and the secondary mapping maps data words of the second subset of the data word set to a second subset of the code word set; and
(b) encoding a sequence of N-bit input words of the data in accordance with the bijective mapping to generate a code word sequence of (N+1)-bit code words, including by employing first circuitry to generate one of the code words in response to each of the input words that belongs to the second subset of the data word set, and employing logic circuitry to generate one of the code words in response to each of the input words that belongs to the first subset of the data word set.

38. The method of claim 37, wherein step (b) includes the step of performing a table lookup operation using the first circuitry to generate one of the code words in response to said each of the input words that belongs to the second subset of the data word set.

39. The method of claim 37, wherein the logic circuitry includes circuitry configured to concatenate a bit of predetermined value with each N-bit input word asserted thereto, and step (b) includes the step of asserting to the logic circuitry each of the input words that belongs to the first subset of the data word set to cause said logic circuitry to generate one of the code words in response to said each of the input words.

40. The method of claim 37, wherein the logic circuitry includes circuitry configured to insert a bit of predetermined value in a predetermined position among the bits of each N-bit input word asserted thereto, and step (b) includes the step of asserting to the logic circuitry each of the input words that belongs to the first subset of the data word set to cause said logic circuitry to generate one of the code words in response to said each of the input words.

41. The method of claim 37, wherein the logic circuitry includes circuitry configured to insert a bit of predetermined value between a predetermined pair of bits of each N-bit input word asserted thereto, and step (b) includes the step of asserting to the logic circuitry each of the input words that belongs to the first subset of the data word set to cause said logic circuitry to generate one of the code words in response to said each of the input words.

42. The method of claim 37, wherein step (a) includes the step of:
determining a positive codebook and a negative codebook such that the positive codebook specifies a bijective mapping between the data word set and a set of (N+1)-bit code words, $f_p(x)$, where x is any data word of the data word set, and the negative codebook specifies a bijective mapping between the data word set and a set of(N+1)-bit code words, $f_n(x)$, and
wherein step (b) includes the step of employing the first circuitry to generate one of the code words, $f_p(x)$, in response to each of the input words that belongs to the second subset of the data word set when the accumulated disparity of the previously generated code words of the code word sequence satisfies a first criterion, employing the first circuitry to generate one of the code words, $f_n(x)$, in response to said each of the input words that belongs to the second subset of the data word set when the accumulated disparity of the previously generated code words of the code word sequence does not satisfy the first criterion, employing the logic circuitry to generate one of the code words, $f_p(x)$, in response to each of the input words that belongs to the first subset of the data word set when the accumulated disparity of the previously generated code words of the code word sequence satisfies the first criterion, and employing the logic circuitry to generate one of the code words, $f_n(x)$, in response to said each of the input words that belongs to the second subset of the data word set when the accumulated disparity of the previously generated code words of the code word sequence does not satisfy the first criterion.

43. The method of claim 42, where $f_n(x)=f_p(x)^C$ for each said data word, x, with $f_p(x)^C$ denoting the complement of $f_p(x)$.

44. The method of claim 42, where $f_n(x)=f_p(x)^C$ for each said data word, x, for which $f_p(x)$ has positive disparity, with $f_p(x)^C$ denoting the complement of $f_p(x)$, and $f_n(x)=f_p(x)$ for each said data word, x, for which $f_p(x)$ has zero disparity.

45. The method of claim 42, wherein N=7, and the first subset includes at least 98 of the data words.

46. The method of claim 45, wherein the first subset includes 98 of the data words, and wherein each of the code words, $f_p(x)$, that has non-negative disparity and to which the primary mapping maps a member, x, of the first subset consists of the bit sequence (0,x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

47. The method of claim 42, wherein N=9, and the first subset includes at least 408 of the data words.

48. The method of claim 47, wherein the first subset includes 408 of the data words, and wherein each of the code words, $f_p(x)$, that has non-negative disparity and to wich the primary mapping maps a member, x, of the first subset consists of the bit sequence (0,x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

49. The method of claim 37, wherein N is an odd integer.

50. A method for encoding a sequence of 9-bit input words of data in accordance with a mapping to generate a code word sequence of 10-bit code words, wherein the mapping is between a data word set of $2^9$-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code Word of Positive Codebook | Code Word of Negative Codebook |
|---|---|---|
| 001000001 | 1110111110 | 0001000001 |
| 001000010 | 1110111101 | 0001000010 |
| 001000011 | 1110111100 | 0001000011 |
| 001000100 | 1110111011 | 0001000100 |
| 001000101 | 1110111010 | 0001000101 |
| 001000110 | 1110111001 | 0001000110 |
| 001000111 | 1110111000 | 0001000111 |
| 001001000 | 1110110111 | 0001001000 |
| 001001001 | 1110110110 | 0001001001 |
| 001001010 | 1110110101 | 0011001010 |
| 001001011 | 1110110100 | 0001001011 |
| 001001100 | 1110110011 | 0001001100 |
| 001001101 | 1110110010 | 0001001101 |
| 001001110 | 1110110001 | 0001001110 |
| 001001111 | 0001001111 | 1110110000 |
| 001010000 | 1110101111 | 0001010000 |
| 001010001 | 1110101110 | 0001010001 |
| 001010010 | 1110101101 | 0001010010 |
| 001010011 | 1110101100 | 0001010011 |
| 001010100 | 1110101011 | 0001010100 |
| 001010101 | 1110101010 | 0001010101 |
| 001010110 | 1110101001 | 0001010110 |
| 001010111 | 0001010111 | 1110101000 |
| 001011000 | 1110100111 | 0001011000 |
| 001011001 | 1110100110 | 0001011001 |
| 001011010 | 1110100101 | 0001011010 |
| 001011011 | 0001011011 | 1110100100 |
| 001011100 | 1110100011 | 0001011100 |
| 001011101 | 0001011101 | 1110100010 |
| 001011110 | 0001011110 | 1110100001 |
| 001100001 | 1110011110 | 0001100001 |
| 001100010 | 1110011101 | 0001100010 |
| 001100011 | 1110011100 | 0001100011 |
| 001100100 | 1110011011 | 0001100100 |
| 001100101 | 1110011010 | 0001100101 |
| 001100110 | 1110011001 | 0001100110 |
| 001100111 | 0001100111 | 1110011000 |
| 001101000 | 1110010111 | 0001101000 |
| 001101001 | 1110010110 | 0001101001 |
| 001101010 | 1110010101 | 0001101010 |
| 001101011 | 0001101011 | 1110010100 |
| 001101100 | 1110010011 | 0001101100 |
| 001101101 | 0001101101 | 1110010010 |
| 001101110 | 0001101110 | 1110010001 |
| 001101111 | 0001101111 | 1110010000 |
| 001110001 | 1110001110 | 0001110001 |
| 001110010 | 1110001101 | 0001110010 |
| 001110011 | 0001110011 | 1110001100 |
| 001110100 | 1110001011 | 0001110100 |
| 001110101 | 0001110101 | 1110001010 |
| 001110110 | 0001110110 | 1110001001 |
| 001110111 | 0001110111 | 1110001000 |
| 001111001 | 0001111001 | 1110000110 |
| 001111010 | 0001111010 | 1110000101 |
| 001111011 | 0001111011 | 1110000100 |
| 001111101 | 0001111101 | 1110000010 |
| 010000001 | 1101111110 | 0010000001 |
| 010000010 | 1101111101 | 0010000010 |
| 010000011 | 1101111100 | 0010000011 |
| 010000100 | 1101111011 | 0010000100 |
| 010000101 | 1101111010 | 0010000101 |
| 010000110 | 1101111001 | 0010000110 |
| 010000111 | 1101111000 | 0010000111 |
| 010001000 | 1101110111 | 0010001000 |
| 010001001 | 1101110110 | 0010001001 |
| 010001010 | 1101110101 | 0010001010 |
| 010001011 | 1101110100 | 0010001011 |
| 010001100 | 1101110011 | 0010001100 |
| 010001101 | 1101110010 | 0010001101 |
| 010001110 | 1101110001 | 0010001110 |
| 010001111 | 0010001111 | 1101110000 |
| 010010000 | 1101101111 | 0010010000 |
| 010010001 | 1101101110 | 0010010001 |
| 010010010 | 1101101101 | 0010010010 |
| 010010011 | 1101101100 | 0010010011 |
| 010010100 | 1101101011 | 0010010100 |
| 010010101 | 1101101010 | 0010010101 |
| 010010110 | 1101101001 | 0010010110 |
| 010010111 | 0010010111 | 1101101000 |
| 010011000 | 1101100111 | 0010011000 |
| 010011001 | 1101100110 | 0010011001 |
| 010011010 | 1101100101 | 0010011010 |
| 010011011 | 0010011011 | 1101100100 |
| 010011100 | 1101100011 | 0010011100 |
| 010011101 | 0010011101 | 1101100010 |
| 010011110 | 0010011110 | 1101100001 |
| 010100001 | 1101011110 | 0010100001 |
| 010100010 | 1101011101 | 0010100010 |
| 010100011 | 1101011100 | 0010100011 |
| 010100100 | 1101011011 | 0010100100 |
| 010100101 | 1101011010 | 0010100101 |
| 010100110 | 1101011001 | 0010100110 |
| 010100111 | 0010100111 | 1101011000 |
| 010101000 | 1101010111 | 0010101000 |
| 010101001 | 1101010110 | 0010101001 |
| 010101010 | 1101010101 | 0010101010 |
| 010101011 | 0010101011 | 1101010100 |
| 010101100 | 1101010011 | 0010101100 |
| 010101101 | 0010101101 | 1101010010 |
| 010101110 | 0010101110 | 1101010001 |
| 010101111 | 0010101111 | 1101010000 |
| 010110000 | 1101001111 | 0010110000 |
| 010110001 | 1101001110 | 0010110001 |
| 010110010 | 1101001101 | 0010110010 |
| 010110011 | 0010110011 | 1101001100 |
| 010110100 | 1101001011 | 0010110100 |
| 010110101 | 0010110101 | 1101001010 |
| 010110110 | 0010110110 | 1101001001 |
| 010110111 | 0010110111 | 1101001000 |
| 010111000 | 1101000111 | 0010111000 |
| 010111001 | 0010111001 | 1101000110 |
| 010111010 | 0010111010 | 1101000101 |
| 010111011 | 0010111011 | 1101000100 |
| 010111100 | 0010111100 | 1101000011 |
| 010111101 | 0010111101 | 1101000010 |
| 010111110 | 0010111110 | 1101000001 |
| 011000001 | 1100111110 | 0011000001 |
| 011000010 | 1100111101 | 0011000010 |
| 011000011 | 1100111100 | 0011000011 |
| 011000100 | 1100111011 | 0011000100 |
| 011000101 | 1100111010 | 0011000101 |
| 011000110 | 1100111001 | 0011000110 |
| 011000111 | 0011000111 | 1100111000 |
| 011001000 | 1100110111 | 0011001000 |
| 011001001 | 1100110110 | 0011001001 |
| 011001010 | 1100110101 | 0011001010 |
| 011001011 | 0011001011 | 1100110100 |
| 011001100 | 1100110011 | 0011001100 |
| 011001101 | 0011001101 | 1100110010 |
| 011001110 | 0011001110 | 1100110001 |
| 011001111 | 0011001111 | 1100110000 |
| 011010000 | 1100101111 | 0011010000 |
| 011010001 | 1100101110 | 0011010001 |
| 011010010 | 1100101101 | 0011010010 |
| 011010011 | 0011010011 | 1100101100 |
| 011010100 | 1100101011 | 0011010100 |
| 011010101 | 0011010101 | 1100101010 |
| 011010110 | 0011010110 | 1100101001 |
| 011010111 | 0011010111 | 1100101000 |
| 011011000 | 1100100111 | 0011011000 |
| 011011001 | 0011011001 | 1100100110 |
| 011011010 | 0011011010 | 1100100101 |
| 011011011 | 0011011011 | 1100100100 |
| 011011100 | 0011011100 | 1100100011 |
| 011011101 | 0011011101 | 1100100010 |
| 011011110 | 0011011110 | 1100100001 |
| 011100001 | 1100011110 | 0011100001 |

-continued

| Input Word | Code Word of Positive Codebook | Code Word of Negative Codebook |
|---|---|---|
| 011100010 | 1100011101 | 0011100010 |
| 011100011 | 0011100011 | 1100011100 |
| 011100100 | 1100011011 | 0011100100 |
| 011100101 | 0011100101 | 1100011010 |
| 011100110 | 0011100110 | 1100011001 |
| 011100111 | 0011100111 | 1100011000 |
| 011101000 | 1100010111 | 0011101000 |
| 011101001 | 0011101001 | 1100010110 |
| 011101010 | 0011101010 | 1100010101 |
| 011101011 | 0011101011 | 1100010100 |
| 011101100 | 0011101100 | 1100010011 |
| 011101101 | 0011101101 | 1100010010 |
| 011101110 | 0011101110 | 1100010001 |
| 011101111 | 0011101111 | 1100010000 |
| 011110001 | 0011110001 | 1100001110 |
| 011110010 | 0011110010 | 1100001101 |
| 011110011 | 0011110011 | 1100001100 |
| 011110100 | 0011110100 | 1100001011 |
| 011110101 | 0011110101 | 1100001010 |
| 011110110 | 0011110110 | 1100001001 |
| 011110111 | 0011110111 | 1100001000 |
| 011111001 | 0011111001 | 1100000110 |
| 011111010 | 0011111010 | 1100000101 |
| 011111011 | 0011111011 | 1100000100 |
| 011111101 | 0011111101 | 1100000010 |
| 100000001 | 1011111110 | 0100000001 |
| 100000010 | 1011111101 | 0100000010 |
| 100000011 | 1011111100 | 0100000011 |
| 100000100 | 1011111011 | 0100000100 |
| 100000101 | 1011111010 | 0100000101 |
| 100000110 | 1011111001 | 0100000110 |
| 100000111 | 1011111000 | 0100000111 |
| 100001000 | 1011110111 | 0100001000 |
| 100001001 | 1011110110 | 0100001001 |
| 100001010 | 1011110101 | 0100001010 |
| 100001011 | 1011110100 | 0100001011 |
| 100001100 | 1011110011 | 0100001100 |
| 100001101 | 1011110010 | 0100001101 |
| 100001110 | 1011110001 | 0100001110 |
| 100001111 | 0100001111 | 1011110000 |
| 100010000 | 1011101111 | 0100010000 |
| 100010001 | 1011101110 | 0100010001 |
| 100010010 | 1011101101 | 0100010010 |
| 100010011 | 1011101100 | 0100010011 |
| 100010100 | 1011101011 | 0100010100 |
| 100010101 | 1011101010 | 0100010101 |
| 100010110 | 1011101001 | 0100010110 |
| 100010111 | 0100010111 | 1011101000 |
| 100011000 | 1011100111 | 0100011000 |
| 100011001 | 1011100110 | 0100011001 |
| 100011010 | 1011100101 | 0100011010 |
| 100011011 | 0100011011 | 1011100100 |
| 100011100 | 1011100011 | 0100011100 |
| 100011101 | 0100011101 | 1011100010 |
| 100011110 | 0100011110 | 1011100001 |
| 100100001 | 1011011110 | 0100100001 |
| 100100010 | 1011011101 | 0100100010 |
| 100100011 | 1011011100 | 0100100011 |
| 100100100 | 1011011011 | 0100100100 |
| 100100101 | 1011011010 | 0100100101 |
| 100100110 | 1011011001 | 0100100110 |
| 100100111 | 0100100111 | 1011011000 |
| 100101000 | 1011010111 | 0100101000 |
| 100101001 | 1011010110 | 0100101001 |
| 100101010 | 1011010101 | 0100101010 |
| 100101011 | 0100101011 | 1011010100 |
| 100101100 | 1011010011 | 0100101100 |
| 100101101 | 0100101101 | 1011010010 |
| 100101110 | 0100101110 | 1011010001 |
| 100101111 | 0100101111 | 1011010000 |
| 100110000 | 1011001111 | 0100110000 |
| 100110001 | 1011001110 | 0100110001 |
| 100110010 | 1011001101 | 0100110010 |
| 100110011 | 0100110011 | 1011001100 |
| 100110100 | 1011001011 | 0100110100 |

-continued

| Input Word | Code Word of Positive Codebook | Code Word of Negative Codebook |
|---|---|---|
| 100110101 | 0100110101 | 1011001010 |
| 100110110 | 0100110110 | 1011001001 |
| 100110111 | 0100110111 | 1011001000 |
| 100111000 | 1011000111 | 0100111000 |
| 100111001 | 0100111001 | 1011000110 |
| 100111010 | 0100111010 | 1011000101 |
| 100111011 | 0100111011 | 1011000100 |
| 100111100 | 0100111100 | 1011000011 |
| 100111101 | 0100111101 | 1011000010 |
| 100111110 | 0100111110 | 1011000001 |
| 101000001 | 1010111110 | 0101000001 |
| 101000010 | 1010111101 | 0101000010 |
| 101000011 | 1010111100 | 0101000011 |
| 101000100 | 1010111011 | 0101000100 |
| 101000101 | 1010111010 | 0101000101 |
| 101000110 | 1010111001 | 0101000110 |
| 101000111 | 0101000111 | 1010111000 |
| 101001000 | 1010110111 | 0101001000 |
| 101001001 | 1010110110 | 0101001001 |
| 101001010 | 1010110101 | 0101001010 |
| 101001011 | 0101001011 | 1010110100 |
| 101001100 | 1010110011 | 0101001100 |
| 101001101 | 0101001101 | 1010110010 |
| 101001110 | 0101001110 | 1010110001 |
| 101001111 | 0101001111 | 1010110000 |
| 101010000 | 1010101111 | 0101010000 |
| 101010001 | 1010101110 | 0101010001 |
| 101010010 | 1010101101 | 0101010010 |
| 101010011 | 1010101011 | 0101010100 |
| 101010100 | 1010101011 | 0101010100 |
| 101010101 | 0101010101 | 1010101010 |
| 101010110 | 0101010110 | 1010101001 |
| 101010111 | 0101010111 | 1010101000 |
| 101011000 | 1010100111 | 0101011000 |
| 101011001 | 0101011001 | 1010100110 |
| 101011010 | 0101011010 | 1010100101 |
| 101011011 | 0101011011 | 1010100100 |
| 101011100 | 0101011100 | 1010100011 |
| 101011101 | 0101011101 | 1010100010 |
| 101011110 | 0101011110 | 1010100001 |
| 101100001 | 1010011110 | 0101100001 |
| 101100010 | 1010011101 | 0101100010 |
| 101100011 | 0101100011 | 1010011100 |
| 101100100 | 1010011011 | 0101100100 |
| 101100101 | 0101100101 | 1010011010 |
| 101100110 | 0101100110 | 1010011001 |
| 101100111 | 0101100111 | 1010011000 |
| 101101000 | 1010010111 | 0101101000 |
| 101101001 | 0101101001 | 1010010110 |
| 101101010 | 0101101010 | 1010010101 |
| 101101011 | 0101101011 | 1010010100 |
| 101101100 | 0101101100 | 1010010011 |
| 101101101 | 0101101101 | 1010010010 |
| 101101110 | 0101101110 | 1010010001 |
| 101101111 | 0101101111 | 1010010000 |
| 101110000 | 1010001111 | 0101110000 |
| 101110001 | 0101110001 | 1010001110 |
| 101110010 | 0101110010 | 1010001101 |
| 101110011 | 0101110011 | 1010001100 |
| 101110100 | 0101110100 | 1010001011 |
| 101110101 | 0101110101 | 1010001010 |
| 101110110 | 0101110110 | 1010001001 |
| 101110111 | 0101110111 | 1010001000 |
| 101111000 | 0101111000 | 1010000111 |
| 101111001 | 0101111001 | 1010000110 |
| 101111010 | 0101111010 | 1010000101 |
| 101111011 | 0101111011 | 1010000100 |
| 101111100 | 0101111100 | 1010000011 |
| 101111101 | 0101111101 | 1010000010 |
| 101111110 | 0101111110 | 1010000001 |
| 110000001 | 1001111110 | 0110000001 |
| 110000010 | 1001111101 | 0110000010 |
| 110000011 | 1001111100 | 0110000011 |
| 110000100 | 1001111011 | 0110000100 |
| 110000101 | 1001111010 | 0110000101 |

-continued

| Input Word | Code Word of Positive Codebook | Code Word of Negative Codebook |
|---|---|---|
| 110000110 | 1001111001 | 0110000110 |
| 110000111 | 0110000111 | 1001111000 |
| 110001000 | 1001110111 | 0110001000 |
| 110001001 | 1001110110 | 0110001001 |
| 110001010 | 1001110101 | 0110001010 |
| 110001011 | 0110001011 | 1001110100 |
| 110001100 | 1001110011 | 0110001100 |
| 110001101 | 0110001101 | 1001110010 |
| 110001110 | 0110001110 | 1001110001 |
| 110001111 | 0110001111 | 1001110000 |
| 110010000 | 1001101111 | 0110010000 |
| 110010001 | 1001101110 | 0110010001 |
| 110010010 | 1001101101 | 0110010010 |
| 110010011 | 0110010011 | 1001101100 |
| 110010100 | 1001101011 | 0110010100 |
| 110010101 | 0110010101 | 1001101010 |
| 110010110 | 0110010110 | 1001101001 |
| 110010111 | 0110010111 | 1001101000 |
| 110011000 | 1001100111 | 0110011000 |
| 110011001 | 0110011001 | 1001100110 |
| 110011010 | 0110011010 | 1001100101 |
| 110011011 | 0110011011 | 1001100100 |
| 110011100 | 0110011100 | 1001100011 |
| 110011101 | 0110011101 | 1001100010 |
| 110011110 | 0110011110 | 1001100001 |
| 110100001 | 1001011110 | 0110100001 |
| 110100010 | 1001011101 | 0110100010 |
| 110100011 | 0110100011 | 1001011100 |
| 110100100 | 1001011011 | 0110100100 |
| 110100101 | 0110100101 | 1001011010 |
| 110100110 | 0110100110 | 1001011001 |
| 110100111 | 0110100111 | 1001011000 |
| 110101000 | 1001010111 | 0110101000 |
| 110101001 | 0110101001 | 1001010110 |
| 110101010 | 0110101010 | 1001010101 |
| 110101011 | 0110101011 | 1001010100 |
| 110101100 | 0110101100 | 1001010011 |
| 110101101 | 0110101101 | 1001010010 |
| 110101110 | 0110101110 | 1001010001 |
| 110101111 | 0110101111 | 1001010000 |
| 110110000 | 1001001111 | 0110110000 |
| 110110001 | 0110110001 | 1001001110 |
| 110110010 | 0110110010 | 1001001101 |
| 110110011 | 0110110011 | 1001001100 |
| 110110100 | 0110110100 | 1001001011 |
| 110110101 | 0110110101 | 1001001010 |
| 110110110 | 0110110110 | 1001001001 |
| 110110111 | 0110110111 | 1001001000 |
| 110111000 | 0110111000 | 1001000111 |
| 110111001 | 0110111001 | 1001000110 |
| 110111010 | 0110111010 | 1001000101 |
| 110111011 | 0110111011 | 1001000100 |
| 110111100 | 0110111100 | 1001000011 |
| 110111101 | 0110111101 | 1001000010 |
| 110111110 | 0110111110 | 1001000001 |
| 111000001 | 1000111110 | 0111000001 |
| 111000010 | 1000111101 | 0111000010 |
| 111000011 | 0111000011 | 1000111100 |
| 111000100 | 1000111011 | 0111000100 |
| 111000101 | 0111000101 | 1000111010 |
| 111000110 | 0111000110 | 1000111001 |
| 111000111 | 0111000111 | 1000111000 |
| 111001000 | 1000110111 | 0111001000 |
| 111001001 | 0111001001 | 1000110110 |
| 111001010 | 0111001010 | 1000110101 |
| 111001011 | 0111001011 | 1000110100 |
| 111001100 | 0111001100 | 1000110011 |
| 111001101 | 0111001101 | 1000110010 |
| 111001110 | 0111001110 | 1000110001 |
| 111001111 | 0111001111 | 1000110000 |
| 111010000 | 1000101111 | 0111010000 |
| 111010001 | 0111010001 | 1000101110 |
| 111010010 | 0111010010 | 1000101101 |
| 111010011 | 0111010011 | 1000101100 |
| 111010100 | 0111010100 | 1000101011 |
| 111010101 | 0111010101 | 1000101010 |
| 111010110 | 0111010110 | 1000101001 |
| 111010111 | 0111010111 | 1000101000 |
| 111011000 | 0111011000 | 1000100111 |
| 111011001 | 0111011001 | 1000100110 |
| 111011010 | 0111011010 | 1000100101 |
| 111011011 | 0111011011 | 1000100100 |
| 111011100 | 0111011100 | 1000100011 |
| 111011101 | 0111011101 | 1000100010 |
| 111011110 | 0111011110 | 1000100001 |
| 111100001 | 0111100001 | 1000011110 |
| 111100010 | 0111100010 | 1000011101 |
| 111100011 | 0111100011 | 1000011100 |
| 111100100 | 0111100100 | 1000011011 |
| 111100101 | 0111100101 | 1000011010 |
| 111100110 | 0111100110 | 1000011001 |
| 111100111 | 0111100111 | 1000011000 |
| 111101000 | 0111101000 | 1000010111 |
| 111101001 | 0111101001 | 1000010110 |
| 111101010 | 0111101010 | 1000010101 |
| 111101011 | 0111101011 | 1000010100 |
| 111101100 | 0111101100 | 1000010011 |
| 111101101 | 0111101101 | 1000010010 |
| 111101110 | 0111101110 | 1000010001 |
| 111101111 | 0111101111 | 1000010000 |
| 111110001 | 0111110001 | 1000001110 |
| 111110010 | 0111110010 | 1000001101 |
| 111110011 | 0111110011 | 1000001100 |
| 111110100 | 0111110100 | 1000001011 |
| 111110101 | 0111110101 | 1000001010 |
| 111110110 | 0111110110 | 1000001001 |
| 111110111 | 0111110111 | 1000001000 |
| 111111001 | 0111111001 | 1000000110 |
| 111111010 | 0111111010 | 1000000101 |
| 111111011 | 0111111011 | 1000000100 |
| 111111101 | 0111111101 | 1000000010, | and the secondary mapping is

| Input Word | Code Word of Positive Codebook | Code Word of Negative Codebook |
|---|---|---|
| 000000000 | 1001000111 | 0110111000 |
| 000000001 | 1000011110 | 0111100001 |
| 000000010 | 1000011101 | 0111100010 |
| 000000011 | 1110011000 | 0001100111 |
| 000000100 | 1000011011 | 0111100100 |
| 000000101 | 1110100010 | 0001011101 |
| 000000110 | 1100010101 | 0011101010 |
| 000000111 | 1110101000 | 0001010111 |
| 000001000 | 1000010111 | 0111101000 |
| 000001001 | 1110000110 | 0001111001 |
| 000001010 | 1110000101 | 0001111010 |
| 000001011 | 1110110000 | 0001001111 |
| 000001100 | 1100100011 | 0011011100 |
| 000001101 | 1100110110 | 0011101001 |
| 000001110 | 1100100101 | 0011011010 |
| 000001111 | 1100011010 | 0011100101 |
| 000010000 | 1000101011 | 0111010100 |
| 000010001 | 1100001110 | 0011110001 |
| 000010010 | 1100001101 | 0011110010 |
| 000010011 | 1100100110 | 0011011001 |
| 000010100 | 1100001011 | 0011110100 |
| 000010101 | 1100101010 | 0011010101 |
| 000010110 | 1100101001 | 0011010110 |
| 000010111 | 1100101100 | 0011010011 |
| 000011000 | 1001001011 | 0110110100 |
| 000011001 | 1100110010 | 0011001101 |
| 000011010 | 1100110001 | 0011001110 |
| 000011011 | 1100110100 | 0011001011 |

-continued

| Input Word | Code Word of Positive Codebook | Code Word of Negative Codebook |
|---|---|---|
| 000011100 | 1001010011 | 0110101100 |
| 000011101 | 1101001010 | 0010110101 |
| 000011110 | 1000101101 | 0111010010 |
| 000011111 | 1101010010 | 0010101101 |
| 000100000 | 1001100011 | 0110011100 |
| 000100001 | 1101010100 | 0010101011 |
| 000100010 | 1000110101 | 0111001010 |
| 000100011 | 1101011000 | 0010100111 |
| 000100100 | 1010001011 | 0101110100 |
| 000100101 | 1101100010 | 0010011101 |
| 000100110 | 1001001101 | 0110110010 |
| 000100111 | 1101101000 | 0010010111 |
| 000101000 | 1010010011 | 0101101100 |
| 000101001 | 1101110000 | 0010001111 |
| 000101010 | 1001010101 | 0110101010 |
| 000101011 | 1000101110 | 0111010001 |
| 000101100 | 1010100011 | 0101011100 |
| 000101101 | 1000110110 | 0111001001 |
| 000101110 | 1001011001 | 0110100110 |
| 000101111 | 1000111010 | 0111000101 |
| 000110000 | 1001100101 | 0110011010 |
| 000110001 | 1001001110 | 0110110001 |
| 000110010 | 1001101001 | 0110010110 |
| 000110011 | 1001010110 | 0110101001 |
| 000110100 | 1001110001 | 0110001110 |
| 000110101 | 1001011010 | 0110100101 |
| 000110110 | 1010001101 | 0101110010 |
| 000110111 | 1001100110 | 0110011001 |
| 000111000 | 1010010101 | 0101101010 |
| 000111001 | 1001101010 | 0110010101 |
| 000111010 | 1010011001 | 0101100110 |
| 000111011 | 1001110010 | 0110001101 |
| 000111100 | 1010100101 | 0101011010 |
| 000111101 | 1001110100 | 0110001011 |
| 000111110 | 1010101001 | 0101010110 |
| 000111111 | 1010010001 | 0101101110 |
| 001000000 | 1110100001 | 0001011110 |
| 001011111 | 1110100100 | 0001011011 |
| 001100000 | 1110010001 | 0001101110 |
| 001110000 | 1110001010 | 0001110101 |
| 001111000 | 1110010010 | 0001101101 |
| 001111100 | 1110010100 | 0001101011 |
| 001111110 | 1110001001 | 0001110110 |
| 001111111 | 1110001100 | 0001110011 |
| 010000000 | 1101000011 | 0010111100 |
| 010011111 | 1101100100 | 0010011011 |
| 010100000 | 1101000101 | 0010111010 |
| 010111111 | 1101001100 | 0010110011 |
| 011000000 | 1101001001 | 0010110110 |
| 011011111 | 1100111000 | 0011000111 |
| 011100000 | 1101010001 | 0010101110 |
| 011110000 | 1101100001 | 0010011110 |
| 011111000 | 1101100110 | 0010011001 |
| 011111100 | 1100010011 | 0011101100 |
| 011111110 | 1100011001 | 0011100110 |
| 011111111 | 1100011100 | 0011100011 |
| 100000000 | 1010000111 | 0101111000 |
| 100011111 | 1011100100 | 0100011011 |
| 100100000 | 1011000011 | 0100111100 |
| 100111111 | 1011001100 | 0100110011 |
| 101000000 | 1011000101 | 0100101010 |
| 101011111 | 1010111000 | 0101000111 |
| 101100000 | 1011001001 | 0100110110 |
| 101111111 | 1010011100 | 0101100011 |
| 110000000 | 1011010001 | 0100101110 |
| 110011111 | 1001111000 | 0110000111 |
| 110100000 | 1011100001 | 0100011110 |
| 110111111 | 1000111100 | 0111000011 |
| 111000000 | 1010110001 | 0101001110 |
| 111011111 | 1001011100 | 0110100011 |
| 111100000 | 1011000110 | 0100111001 |
| 111110000 | 1011001010 | 0100110101 |
| 111111000 | 1000100111 | 0111011000 |
| 111111100 | 1000110011 | 0111001100 |
| 111111110 | 1000111001 | 0111000110 |

-continued

| Input Word | Code Word of Positive Codebook | Code Word of Negative Codebook |
|---|---|---|
| 111111111 | 1001101100 | 0110010011, | said method including the steps of:

employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the first criterion; and employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set when the accumulated disparity of the previously generated code words of the code word sequence does not satisfy the first criterion.

51. A method for encoding a sequence of 9-bit input words of data in accordance with a mapping to generate a code word sequence of 10-bit code words, wherein the mapping is between a data word set of $2_9$9-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code Word of Positive Codebook | Code Word of Negative Codebook |
|---|---|---|
| 001000001 | 1110111110 | 0001000001 |
| 001000010 | 1110111101 | 0001000010 |
| 001000011 | 1110111100 | 0001000011 |
| 001000100 | 1110111011 | 0001000100 |
| 001000101 | 1110111010 | 0001000101 |
| 001000110 | 1110111001 | 0001000110 |
| 001000111 | 1110111000 | 0001000111 |
| 001001000 | 1110110111 | 0001001000 |
| 001001001 | 1110110110 | 0001001001 |
| 001001010 | 1110110101 | 0001001010 |
| 001001011 | 1110110100 | 0001001011 |
| 001001100 | 1110110011 | 0001001100 |
| 001001101 | 1110110010 | 0001001101 |
| 001001110 | 1110110001 | 0001001110 |
| 001001111 | 0001001111 | 0001001111 |
| 001010000 | 1110101111 | 0001010000 |
| 001010001 | 1110101110 | 0001010001 |
| 001010010 | 1110101101 | 0001010010 |

-continued

| Input Word | Code Word of Positive Codebook | Code Word of Negative Codebook |
|---|---|---|
| 001010011 | 1110101100 | 0001010011 |
| 001010100 | 1110101011 | 0001010100 |
| 001010101 | 1110101010 | 0001010101 |
| 001010110 | 1110101001 | 0001010110 |
| 001010111 | 0001010111 | 0001010111 |
| 001011000 | 1110100111 | 0001011000 |
| 001011001 | 1110100110 | 0001011001 |
| 001011010 | 1110100101 | 0001011010 |
| 001011011 | 0001011011 | 0001011011 |
| 001011100 | 1110100011 | 0001011100 |
| 001011101 | 0001011101 | 0001011101 |
| 001011110 | 0001011110 | 0001011110 |
| 001100001 | 1110011110 | 0001100001 |
| 001100010 | 1110011101 | 0001100010 |
| 001100011 | 1110011100 | 0001100011 |
| 001100100 | 1110011011 | 0001100100 |
| 001100101 | 1110011010 | 0001100101 |
| 001100110 | 1110011001 | 0001100110 |
| 001100111 | 0001100111 | 0001100111 |
| 001101000 | 1110010111 | 0001101000 |
| 001101001 | 1110010110 | 0001101001 |
| 001101010 | 1110010101 | 0001101010 |
| 001101011 | 0001101011 | 0001101011 |
| 001101100 | 1110010011 | 0001101100 |
| 001101101 | 0001101101 | 0001101101 |
| 001101110 | 0001101110 | 0001101110 |
| 001101111 | 0001101111 | 1110010000 |
| 001110001 | 1110001110 | 0001110001 |
| 001110010 | 1110001101 | 0001110010 |
| 001110011 | 0001110011 | 0001110011 |
| 001110100 | 1110001011 | 0001110100 |
| 001110101 | 0001110101 | 0001110101 |
| 001110110 | 0001110110 | 0001110110 |
| 001110111 | 0001110111 | 1110001000 |
| 001111001 | 0001111001 | 0001111001 |
| 001111010 | 0001111010 | 0001111010 |
| 001111011 | 0001111011 | 1110000100 |
| 001111101 | 0001111101 | 1110000010 |
| 010000001 | 1101111110 | 0010000001 |
| 010000010 | 1101111101 | 0010000010 |
| 010000011 | 1101111100 | 0010000011 |
| 010000100 | 1101111011 | 0010000100 |
| 010000101 | 1101111010 | 0010000101 |
| 010000110 | 1101111001 | 0010000110 |
| 010000111 | 1101111000 | 0010000111 |
| 010001000 | 1101110111 | 0010001000 |
| 010001001 | 1101110110 | 0010001001 |
| 010001010 | 1101110101 | 0010001010 |
| 010001011 | 1101110100 | 0010001011 |
| 010001100 | 1101110011 | 0010001100 |
| 010001101 | 1101110010 | 0010001101 |
| 010001110 | 1101110001 | 0010001110 |
| 010001111 | 0010001111 | 0010001111 |
| 010010000 | 1101101111 | 0010010000 |
| 010010001 | 1101101110 | 0010010001 |
| 010010010 | 1101101101 | 0010010010 |
| 010010011 | 1101101100 | 0010010011 |
| 010010100 | 1101101011 | 0010010100 |
| 010010101 | 1101101010 | 0010010101 |
| 010010110 | 1101101001 | 0010010110 |
| 010010111 | 0010010111 | 0010010111 |
| 010011000 | 1101100111 | 0010011000 |
| 010011001 | 1101100110 | 0010011001 |
| 010011010 | 1101100101 | 0010011010 |
| 010011011 | 0010011011 | 0010011011 |
| 010011100 | 1101100011 | 0010011100 |
| 010011101 | 0010011101 | 0010011101 |
| 010011110 | 0010011110 | 0010011110 |
| 010100001 | 1101011110 | 0010100001 |
| 010100010 | 1101011101 | 0010100010 |
| 010100011 | 1101011100 | 0010100011 |
| 010100100 | 1101011011 | 0010100100 |
| 010100101 | 1101011010 | 0010100101 |
| 010100110 | 1101011001 | 0010100110 |
| 010100111 | 0010100111 | 0010100111 |
| 010101000 | 1101010111 | 0010101000 |
| 010101001 | 1101010110 | 0010101001 |
| 010101010 | 1101010101 | 0010101010 |
| 010101011 | 0010101011 | 0010101011 |
| 010101100 | 1101010011 | 0010101100 |
| 010101101 | 0010101101 | 0010101101 |
| 010101110 | 0010101110 | 0010101110 |
| 010101111 | 0010101111 | 1101010000 |
| 010110000 | 1101001111 | 0010110000 |
| 010110001 | 1101001110 | 0010110001 |
| 010110010 | 1101001101 | 0010110010 |
| 010110011 | 0010110011 | 0010110011 |
| 010110100 | 1101001011 | 0010110100 |
| 010110101 | 0010110101 | 0010110101 |
| 010110110 | 0010110110 | 0010110110 |
| 010110111 | 0010110111 | 1101001000 |
| 010111000 | 1101000111 | 0010111000 |
| 010111001 | 0010111001 | 0010111001 |
| 010111010 | 0010111010 | 0010111010 |
| 010111011 | 0010111011 | 1101000100 |
| 010111100 | 0010111100 | 0010111100 |
| 010111101 | 0010111101 | 1101000010 |
| 010111110 | 0010111110 | 1101000001 |
| 011000001 | 1100111110 | 0011000001 |
| 011000010 | 1100111101 | 0011000010 |
| 011000011 | 1100111100 | 0011000011 |
| 011000100 | 1100111011 | 0011000100 |
| 011000101 | 1100111010 | 0011000101 |
| 011000110 | 1100111001 | 0011000110 |
| 011000111 | 0011000111 | 0011000111 |
| 111001000 | 1100110111 | 0011001000 |
| 011001001 | 1100110110 | 0011001001 |
| 011001010 | 1100110101 | 0011001010 |
| 011001011 | 0011001011 | 0011001011 |
| 011001100 | 1100110011 | 0011001100 |
| 011001101 | 0011001101 | 0011001101 |
| 011001110 | 0011001110 | 0011001110 |
| 011001111 | 0011001111 | 1100110000 |
| 011010000 | 1100101111 | 0011010000 |
| 111010001 | 1100101110 | 0011010001 |
| 011010010 | 1100101101 | 0011010010 |
| 011010011 | 0011010011 | 0011010011 |
| 011010100 | 1100101011 | 0011010100 |
| 011010101 | 0011010101 | 0011010101 |
| 011010110 | 0011010110 | 0011010110 |
| 011010111 | 0011010111 | 1100101000 |
| 011011000 | 1100100111 | 0011011000 |
| 011011001 | 0011011001 | 0011011001 |
| 011011010 | 0011011010 | 0011011010 |
| 011011011 | 0011011011 | 1100100100 |
| 011011100 | 0011011100 | 0011011100 |
| 011011101 | 0011011101 | 1100100010 |
| 011011110 | 0011011110 | 1100100001 |
| 011100001 | 1100011110 | 0011100001 |
| 011100010 | 1100011101 | 0011100010 |
| 011100011 | 0011100011 | 0011100011 |
| 011100100 | 1100011011 | 0011100100 |
| 011100101 | 0011100101 | 0011100101 |
| 011100110 | 0011100110 | 0011100110 |
| 011100111 | 0011100111 | 1100011000 |
| 011101000 | 1100010111 | 0011101000 |
| 011101001 | 0011101001 | 0011101001 |
| 011101010 | 0011101010 | 0011101010 |
| 011101011 | 0011101011 | 1100010100 |
| 011101100 | 0011101100 | 0011101100 |
| 011101101 | 0011101101 | 1100010010 |
| 011101110 | 0011101110 | 1100010001 |
| 011101111 | 0011101111 | 1100010000 |
| 011110001 | 0011110001 | 0011110001 |
| 011110010 | 0011110010 | 1100001100 |
| 011110011 | 0011110011 | 1100001100 |
| 011110100 | 0011110100 | 0011110100 |
| 011110101 | 0011110101 | 1100001010 |
| 011110110 | 0011110110 | 1100001001 |
| 011110111 | 0011110111 | 1100001000 |

| Input Word | Code Word of Positive Codebook | Code Word of Negative Codebook |
|---|---|---|
| 011111001 | 0011111001 | 1100000110 |
| 011111010 | 0011111010 | 1100000101 |
| 111111011 | 0011111011 | 1100000100 |
| 011111101 | 0011111101 | 1100000010 |
| 100000001 | 1011111110 | 0100000001 |
| 100000010 | 1011111101 | 0100000010 |
| 100000011 | 1011111100 | 0100000011 |
| 100000100 | 1011111011 | 0100000100 |
| 100000101 | 1011111010 | 0100000101 |
| 100000110 | 1011111001 | 0100000110 |
| 100000111 | 1011111000 | 0100000111 |
| 100001000 | 1011110111 | 0100001000 |
| 100001001 | 1011110110 | 0100001001 |
| 100001010 | 1011110101 | 0100001010 |
| 100001011 | 1011110100 | 0100001011 |
| 100001100 | 1011110011 | 0100001100 |
| 100001101 | 1011110010 | 0100001101 |
| 100001110 | 1011110001 | 0100001110 |
| 100001111 | 0100001111 | 0100001111 |
| 100010000 | 1011101111 | 0100010000 |
| 100010001 | 1011101110 | 0100010001 |
| 100010010 | 1011101101 | 0100010010 |
| 100010011 | 1011101100 | 0100010011 |
| 100010100 | 1011101011 | 0100010100 |
| 100010101 | 1011101010 | 0100010101 |
| 100010110 | 1011101001 | 0100010110 |
| 100010111 | 0100010111 | 0100010111 |
| 100011000 | 1011100111 | 0100011000 |
| 100011001 | 1011100110 | 0100011001 |
| 100011010 | 1011100101 | 0100011010 |
| 100011011 | 0100011011 | 0100011011 |
| 100011100 | 1011100011 | 0100011100 |
| 100011101 | 0100011101 | 0100011101 |
| 100011110 | 0100011110 | 0100011110 |
| 100100001 | 1011011110 | 0100100001 |
| 100100010 | 1011011101 | 0100100010 |
| 100100011 | 1011011100 | 0100100011 |
| 100100100 | 1011011011 | 0100100100 |
| 100100101 | 1011011010 | 0100100101 |
| 100100110 | 1011011001 | 0100100110 |
| 100100111 | 0100100111 | 0100100111 |
| 100101000 | 1011010111 | 0100101000 |
| 100101001 | 1011010110 | 0100101001 |
| 100101010 | 1011010101 | 0100101010 |
| 100101011 | 0100101011 | 0100101011 |
| 100101100 | 1011010011 | 0100101100 |
| 100101101 | 0100101101 | 0100101101 |
| 100101110 | 0100101110 | 0100101110 |
| 100101111 | 0100101111 | 1011010000 |
| 100110000 | 1011001111 | 0100110000 |
| 100110001 | 1011001110 | 0100110001 |
| 100110010 | 1011001101 | 0100110010 |
| 100110011 | 0100110011 | 0100110011 |
| 100110100 | 1011001011 | 0100110100 |
| 100110101 | 0100110101 | 0100110101 |
| 100110110 | 0100110110 | 0100110110 |
| 100110111 | 0100110111 | 1011001000 |
| 100111000 | 1011000111 | 0100111000 |
| 100111001 | 0100111001 | 0100111001 |
| 100111010 | 0100111010 | 0100111010 |
| 100111011 | 0100111011 | 1011000100 |
| 100111100 | 0100111100 | 0100111100 |
| 100111101 | 0100111101 | 1011000010 |
| 100111110 | 0100111110 | 1011000001 |
| 101000001 | 1010111110 | 0101000001 |
| 101000010 | 1010111101 | 0101000010 |
| 101000011 | 1010111100 | 0101000011 |
| 101000100 | 1010111011 | 0101000100 |
| 101000101 | 1010111010 | 0101000101 |
| 101000110 | 1010111001 | 0101000110 |
| 101000111 | 0101000111 | 0101000111 |
| 101001000 | 1010110111 | 0101001000 |
| 101001001 | 1010110110 | 0101001001 |
| 101001010 | 1010110101 | 0101001010 |
| 101001011 | 0101001011 | 0101001011 |

| Input Word | Code Word of Positive Codebook | Code Word of Negative Codebook |
|---|---|---|
| 101001100 | 1010110011 | 0101001100 |
| 101001101 | 0101001101 | 0101001101 |
| 101001110 | 0101001110 | 0101001110 |
| 101001111 | 0101001111 | 1010110000 |
| 101010000 | 1010101111 | 0101010000 |
| 101010001 | 1010101110 | 0101010001 |
| 101010010 | 1010101101 | 0101010010 |
| 101010011 | 0101010011 | 0101010011 |
| 101010100 | 1010101011 | 0101010100 |
| 101010101 | 0101010101 | 0101010101 |
| 101010110 | 0101010110 | 0101010110 |
| 101010111 | 0101010111 | 1010101000 |
| 101011000 | 1010100111 | 0101011000 |
| 101011001 | 0101011001 | 0101011001 |
| 101011010 | 0101011010 | 0101011010 |
| 101011011 | 0101011011 | 1010100100 |
| 101011100 | 0101011100 | 6101011100 |
| 101011101 | 0101011101 | 1010100010 |
| 101011110 | 0101011110 | 1010100001 |
| 101100001 | 1010011110 | 0101100001 |
| 101100010 | 1010011101 | 0101100010 |
| 101100011 | 0101100011 | 0101100011 |
| 101100100 | 1010011011 | 0101100100 |
| 101100101 | 0101100101 | 0101100101 |
| 101100110 | 0101100110 | 0101100110 |
| 101100111 | 0101100111 | 1010011000 |
| 101101000 | 1010010111 | 0101101000 |
| 101101001 | 0101101001 | 0101101001 |
| 101101010 | 0101101010 | 0101101010 |
| 101101011 | 0101101011 | 1010010100 |
| 101101100 | 0101101100 | 0101101100 |
| 101101101 | 0101101101 | 1010010010 |
| 101101110 | 0101101110 | 1010010001 |
| 101101111 | 0101101111 | 1010010000 |
| 101110000 | 1010001111 | 0101110000 |
| 101110001 | 0101110001 | 0101110001 |
| 101110010 | 0101110010 | 0101110010 |
| 101110011 | 0101110011 | 1010001100 |
| 101110100 | 0101110100 | 0101110100 |
| 101110101 | 0101110101 | 1010001010 |
| 101110110 | 0101110110 | 1010001001 |
| 101110111 | 0101110111 | 1010001000 |
| 101111000 | 0101111000 | 0101111000 |
| 101111001 | 0101111001 | 1010000110 |
| 101111010 | 0101111010 | 1010000101 |
| 101111011 | 0101111011 | 1010000100 |
| 101111100 | 0101111100 | 1010000011 |
| 101111101 | 0101111101 | 1010000010 |
| 101111110 | 0101111110 | 1010000001 |
| 110000001 | 1001111110 | 0110000001 |
| 110000010 | 1001111101 | 0110000010 |
| 110000011 | 1001111100 | 0110000011 |
| 110000100 | 1001111011 | 0110000100 |
| 110000101 | 1001111010 | 0110000101 |
| 110000110 | 1001111001 | 0110000110 |
| 110000111 | 0110000111 | 0110000111 |
| 110001000 | 1001110111 | 0110001000 |
| 110001001 | 1001110110 | 0110001001 |
| 110001010 | 1001110101 | 0110001010 |
| 110001011 | 0110001011 | 0110001011 |
| 110001100 | 1001110011 | 0110001100 |
| 110001101 | 0110001101 | 0110001101 |
| 110001110 | 0110001110 | 0110001110 |
| 110001111 | 0110001111 | 1001110000 |
| 110010000 | 1001101111 | 0110010000 |
| 110010001 | 1001101110 | 0110010001 |
| 110010010 | 1001101101 | 0110010010 |
| 110010011 | 0110010011 | 0110010011 |
| 110010100 | 1001101011 | 0110010100 |
| 110010101 | 0110010101 | 0110010101 |
| 110010110 | 0110010110 | 0110010110 |
| 110010111 | 0110010111 | 1001101000 |
| 110011000 | 1001100111 | 0110011000 |
| 110011001 | 0110011001 | 0110011001 |
| 110011010 | 0110011010 | 0110011010 |

-continued

| Input Word | Code Word of Positive Codebook | Code Word of Negative Codebook |
|---|---|---|
| 110011011 | 0110011011 | 1001100100 |
| 110011100 | 0110011100 | 0110011100 |
| 110011101 | 0110011101 | 1001100010 |
| 110011110 | 0110011110 | 1001100001 |
| 110100001 | 1001011110 | 0110100001 |
| 110100010 | 1001011101 | 0110100010 |
| 110100011 | 0110100011 | 0110100011 |
| 110100100 | 1001011011 | 0110100100 |
| 110100101 | 0110100101 | 0110100101 |
| 110100110 | 0110100110 | 0110100110 |
| 110100111 | 0110100111 | 1001011000 |
| 110101000 | 1001010111 | 0100001000 |
| 110101001 | 0110101001 | 0110101001 |
| 110101010 | 0110101010 | 0110101010 |
| 110101011 | 0110101011 | 1001010100 |
| 110101100 | 0110101100 | 0110101100 |
| 110101101 | 0110101101 | 1001010010 |
| 110101110 | 0110101110 | 1001010001 |
| 110101111 | 0110101111 | 1001010000 |
| 110110000 | 1001001111 | 0110110000 |
| 110110001 | 0110110001 | 0110110001 |
| 110110010 | 0110110010 | 0110110010 |
| 110110011 | 0110110011 | 1001001100 |
| 110110100 | 0110110100 | 0110110100 |
| 110110101 | 0110110101 | 1001001010 |
| 110110110 | 0110110110 | 1001001001 |
| 110110111 | 0110110111 | 1001001000 |
| 110111000 | 0110111000 | 0110111000 |
| 110111001 | 0110111001 | 1001000110 |
| 110111010 | 0110111010 | 1001000101 |
| 110111011 | 0110111011 | 1001000100 |
| 110111100 | 0110111100 | 1001000011 |
| 110111101 | 0110111101 | 1001000010 |
| 110111110 | 0110111110 | 1001000001 |
| 111000001 | 1000111110 | 0111000001 |
| 111000010 | 1000111101 | 0111000010 |
| 111000011 | 0111000011 | 0111000011 |
| 111000100 | 1000111011 | 0111000100 |
| 111000101 | 0111000101 | 0111000101 |
| 111000110 | 0111000110 | 0111000110 |
| 111000111 | 0111000111 | 1000111000 |
| 111001000 | 1000110111 | 0111001000 |
| 111001001 | 0111001001 | 0111001001 |
| 111001010 | 0111001010 | 0111001010 |
| 111001011 | 0111001011 | 1000110100 |
| 111001100 | 0111001100 | 0111001100 |
| 111001101 | 0111001101 | 1000110010 |
| 111001110 | 0111001110 | 1000110001 |
| 111001111 | 0111001111 | 1000110000 |
| 111010000 | 1000101111 | 0111010000 |
| 111010001 | 0111010001 | 0111010001 |
| 111010010 | 0111010010 | 0111010010 |
| 111010011 | 0111010011 | 1000101100 |
| 111010100 | 0111010100 | 0111010100 |
| 111010101 | 0111010101 | 1000101010 |
| 111010110 | 0111010110 | 1000101001 |
| 111010111 | 0111010111 | 1000101000 |
| 111011000 | 0111011000 | 0111011000 |
| 111011001 | 0111011001 | 1000100110 |
| 111011010 | 0111011010 | 1000100101 |
| 111011011 | 0111011011 | 1000100100 |
| 111011100 | 0111011100 | 1000100011 |
| 111011101 | 0111011101 | 1000100010 |
| 111011110 | 0111011110 | 1000100001 |
| 111100001 | 0111100001 | 0111100001 |
| 111100010 | 0111100010 | 0111100010 |
| 111100011 | 0111100011 | 1000011100 |
| 111100100 | 0111100100 | 0111100100 |
| 111100101 | 0111100101 | 1000011010 |
| 111100110 | 0111100110 | 1000011001 |
| 111100111 | 0111100111 | 1000011000 |
| 111101000 | 0111101000 | 0111101000 |
| 111101001 | 0111101001 | 1000010110 |
| 111101010 | 0111101010 | 1000010101 |
| 111101011 | 0111101011 | 1000010100 |
| 111101100 | 0111101100 | 1000010011 |
| 111101101 | 0111101101 | 1000010010 |
| 111101110 | 0111101110 | 1000010001 |
| 111101111 | 0111101111 | 1000010000 |
| 111110001 | 0111110001 | 1000001110 |
| 111110010 | 0111110010 | 1000001101 |
| 111110011 | 0111110011 | 1000001100 |
| 111110100 | 0111110100 | 1000001011 |
| 111110101 | 0111110101 | 1000001010 |
| 111110110 | 0111110110 | 1000001001 |
| 111110111 | 0111110111 | 1000001000 |
| 111111001 | 0111111001 | 1000000110 |
| 111111010 | 0111111010 | 1000000101 |
| 111111011 | 0111111011 | 1000000100 |
| 111111101 | 0111111101 | 1000000010, | and the secondary mapping is

| Input Word | Code Word of Positive Codebook | Code Word of Negative Codebook |
|---|---|---|
| 000000000 | 1001000111 | 1001000111 |
| 000000001 | 1000011110 | 1000011110 |
| 000000010 | 1000011101 | 1000011101 |
| 000000011 | 1110011000 | 1110011000 |
| 000000100 | 1000011011 | 1000011011 |
| 000000101 | 1110100010 | 1110100010 |
| 000000110 | 1100010101 | 1100010101 |
| 000000111 | 1110101000 | 1110101000 |
| 000001000 | 1000010111 | 1000010111 |
| 000001001 | 1110000110 | 1110000110 |
| 000001010 | 1110000101 | 1110000101 |
| 000001011 | 1110110000 | 1110110000 |
| 000001100 | 1100100011 | 1100100011 |
| 000001101 | 1100010110 | 1100010110 |
| 000001110 | 1100100101 | 1100100101 |
| 000001111 | 1100011010 | 1100011010 |
| 000010000 | 1000101011 | 1000101011 |
| 000010001 | 1100001110 | 1100001110 |
| 000010010 | 1100001101 | 1100001101 |
| 000010011 | 1100100110 | 1100100110 |
| 000010100 | 1100001011 | 1100001011 |
| 000010101 | 1100101010 | 1100101010 |
| 000010110 | 1100101001 | 1100101001 |
| 000010111 | 1100101100 | 1100101100 |
| 000011000 | 1001001011 | 1001001011 |
| 000011001 | 1100110010 | 1100110010 |
| 000011010 | 1100110001 | 1100110001 |
| 000011011 | 1100110100 | 1100110100 |
| 000011100 | 1001010011 | 1001010011 |
| 000011101 | 1101001010 | 1101001010 |
| 000011110 | 1000101101 | 1000101101 |
| 000011111 | 1101010010 | 1101010010 |
| 000100000 | 1001100011 | 1001100011 |
| 000100001 | 1101010100 | 1101010100 |
| 000100010 | 1000110101 | 1000110101 |
| 000100011 | 1101011000 | 1101011000 |
| 000100100 | 1010001011 | 1010001011 |
| 000100101 | 1101100010 | 1101100010 |
| 000100110 | 1001001101 | 1001001101 |
| 000100111 | 1101101000 | 1101101000 |
| 000101000 | 1010010011 | 1010010011 |
| 000101001 | 1101110000 | 1101110000 |
| 000101010 | 1001010101 | 1001010101 |
| 000101011 | 1000101110 | 1000101110 |
| 000101100 | 1010100011 | 1010100011 |
| 000101101 | 1000110110 | 1000110110 |
| 000101110 | 1001011001 | 1001011001 |
| 000101111 | 1000111010 | 1000111010 |
| 000110000 | 1001100101 | 1001100101 |

-continued

| Input Word | Code Word of Positive Codebook | Code Word of Negative Codebook |
|---|---|---|
| 000110001 | 1001001110 | 1001001110 |
| 000110010 | 1001101001 | 1001101001 |
| 000110011 | 1001010110 | 1001010110 |
| 000110100 | 1001110001 | 1001110001 |
| 000110101 | 1001011010 | 1001011010 |
| 000110110 | 1010001101 | 1010001101 |
| 000110111 | 1001100101 | 1001100110 |
| 000111000 | 1010010101 | 1010010101 |
| 000111001 | 1001101010 | 1001101010 |
| 000111010 | 1010011001 | 1010011001 |
| 000111011 | 1001110010 | 1001110010 |
| 000111100 | 1010100101 | 1010100101 |
| 000111101 | 1001110100 | 1001110100 |
| 000111110 | 1010101001 | 1010101001 |
| 000111111 | 1010001110 | 1010001110 |
| 001000000 | 1110100001 | 1110100001 |
| 001011111 | 1110100100 | 1110100100 |
| 001100000 | 1110010001 | 1110010001 |
| 001110000 | 1110001010 | 1110001010 |
| 001111000 | 1110010010 | 1110010010 |
| 001111100 | 1110010100 | 1110010100 |
| 001111110 | 1110001001 | 1110001001 |
| 001111111 | 1110001100 | 1110001100 |
| 010000000 | 1101000011 | 1101000011 |
| 010011111 | 1101100100 | 1101100100 |
| 010100000 | 1101000101 | 1101000101 |
| 010111111 | 1101001100 | 1101001100 |
| 011000000 | 1101001001 | 1101001001 |
| 011011111 | 1100111000 | 1100111000 |
| 011100000 | 1101010001 | 1101010001 |
| 011110000 | 1101100001 | 1101100001 |
| 111111000 | 1101000110 | 1101000110 |
| 011111100 | 1100010011 | 1100010011 |
| 011111110 | 1100011001 | 1100011001 |
| 011111111 | 1100011100 | 1100011100 |
| 100000000 | 1010000111 | 1010000111 |
| 100011111 | 1011100100 | 1011100100 |
| 100100000 | 1011000011 | 1011000011 |
| 100111111 | 1011001100 | 1011001100 |
| 101000000 | 1011000101 | 1011000101 |
| 101011111 | 1010111000 | 1010111000 |
| 101100000 | 1011001001 | 1011001001 |
| 101111111 | 1010011100 | 1010011100 |
| 110000000 | 1011010001 | 1011010001 |
| 110011111 | 1001111000 | 1001111000 |
| 110100000 | 1011100001 | 1011100001 |
| 110111111 | 1000111100 | 1000111100 |
| 111000000 | 1010110001 | 1010110001 |
| 111011111 | 1001011100 | 1001011100 |
| 111100000 | 1011000110 | 1011000110 |
| 111110000 | 1011001010 | 1011001010 |
| 111111000 | 1000100111 | 1000100111 |
| 111111100 | 1000110011 | 1000110011 |
| 111111110 | 1000111001 | 1000111001 |
| 111111111 | 1001101100 | 1001101100, | said method including the steps of:
employing first circuitry to generate one of the code words of the positive codebook in response to each of the input words that belongs to the second subset of the data word set when the accumulated disparity of the previously generated code words of the code word sequence satisfies a first criterion, and employing the first circuit to generate one of the code words of the negative codebook in response to said each of the input words that belongs to the second subset of the data word set when the accumulated disparity of the previously generated code words of the code word sequence does not satisfy the first criterion; and
employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set when the accumulated display of the previously generated code words of the code word sequence does not satisfy first criterion.

52. A method for encoding a sequence of 7-bit input words of data in accordance with a mapping to generate a code word sequence of 8-bit code words, wherein the mapping is between a data word set of $2^7$ 7-bit data words and a code word set of 8-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code Word of Positive Codebook | Code Word of Negative Codebook |
|---|---|---|
| 0010001 | 11101110 | 00010001 |
| 0010010 | 11101101 | 00010010 |
| 0010011 | 11101100 | 00010011 |
| 0010100 | 11101011 | 00010100 |
| 0010101 | 11101010 | 00010101 |
| 0010110 | 11101001 | 00010110 |
| 0010111 | 00010111 | 11101000 |
| 0011000 | 11100111 | 00011000 |
| 0011001 | 11100110 | 00011001 |
| 0011010 | 11100101 | 00011010 |
| 0011011 | 00011011 | 11100100 |
| 0011100 | 11100011 | 00011100 |
| 0011101 | 00011101 | 11100010 |
| 0011110 | 00011110 | 11100001 |
| 0100001 | 11011110 | 00100001 |
| 0100010 | 11011101 | 00100010 |
| 0100011 | 11011100 | 00100011 |
| 0100100 | 11011011 | 00100100 |
| 0100101 | 11011010 | 00100101 |
| 1100110 | 11011001 | 00100110 |
| 0100111 | 00100111 | 11011000 |
| 0101000 | 11010111 | 00101000 |
| 0101001 | 11010110 | 00101001 |
| 0101010 | 11010101 | 00101010 |
| 0101011 | 00101011 | 11010100 |
| 0101100 | 11010011 | 00101100 |
| 0101101 | 00101101 | 11010010 |
| 0101110 | 00101110 | 11010001 |
| 0110001 | 11001110 | 00110001 |
| 0110010 | 11001101 | 00110010 |
| 0110011 | 00110011 | 11001100 |
| 0110100 | 11001011 | 00110100 |
| 0110101 | 00110101 | 11001010 |
| 0110110 | 00110110 | 11001001 |
| 0110111 | 00110111 | 11001000 |
| 0111000 | 11000111 | 00111000 |
| 0111001 | 00111001 | 11000110 |
| 0111010 | 00111010 | 11000101 |
| 0111011 | 00111011 | 11000100 |
| 0111100 | 00111100 | 11000011 |
| 0111101 | 00111101 | 11000010 |
| 011110 | 00111110 | 11000001 |
| 1000001 | 10111110 | 01000001 |
| 1000010 | 10111101 | 01000010 |
| 1000011 | 10111100 | 01000011 |
| 1000100 | 10111011 | 01000100 |
| 1000101 | 10111010 | 01000101 |
| 1000110 | 10111001 | 01000110 |

-continued

| Input Word | Code Word of Positive Codebook | Code Word of Negative Codebook |
|---|---|---|
| 1000111 | 01000111 | 10111000 |
| 1001000 | 10110111 | 01001000 |
| 1001001 | 10110110 | 01001001 |
| 1001010 | 10110101 | 01001010 |
| 1001011 | 01001011 | 10110100 |
| 1001100 | 10110011 | 01001100 |
| 1001101 | 01001101 | 10110010 |
| 1001110 | 01001110 | 10110001 |
| 1010001 | 10101110 | 01010001 |
| 1010010 | 10101101 | 01010010 |
| 1010011 | 01010011 | 10101100 |
| 1010100 | 10101011 | 01010100 |
| 1010101 | 01010101 | 10101010 |
| 1010110 | 01010110 | 10101001 |
| 1010111 | 01010111 | 10101000 |
| 1011000 | 10100111 | 01011000 |
| 1011001 | 01011001 | 10100110 |
| 1011010 | 01011010 | 10100101 |
| 1011011 | 01011011 | 10100100 |
| 1011100 | 01011100 | 10100011 |
| 1011101 | 01011101 | 10100010 |
| 1011110 | 01011110 | 10100001 |
| 1100001 | 10011101 | 01100001 |
| 1100010 | 10011101 | 01100010 |
| 1100011 | 01100011 | 10011100 |
| 1100100 | 10011011 | 01100100 |
| 1100101 | 01100101 | 10011010 |
| 1100110 | 01100110 | 10011001 |
| 1100111 | 01100111 | 10011000 |
| 1101000 | 10010111 | 01101000 |
| 1101001 | 01101001 | 10010110 |
| 1101010 | 01101010 | 10010101 |
| 1101011 | 01101011 | 10010100 |
| 1101100 | 01101100 | 10010011 |
| 1101101 | 01101101 | 10010010 |
| 1101110 | 01101110 | 10010001 |
| 1110001 | 01110001 | 10001110 |
| 1110010 | 01110010 | 10001101 |
| 1110011 | 01110011 | 10001100 |
| 1110100 | 01110100 | 10001011 |
| 1110101 | 01110101 | 10001010 |
| 1110110 | 01110110 | 10001001 |
| 1110111 | 01110111 | 10001000 |
| 1111000 | 01111000 | 10000111 |
| 1111001 | 01111001 | 10000110 |
| 1111010 | 01111010 | 10000101 |
| 1111011 | 01111011 | 10000100 |
| 1111100 | 01111100 | 10000011 |
| 1111101 | 01111101 | 10000010 |
| 1111110 | 01111110 | 10000001, | and the secondary mapping is

| Input Word | Code Word of Positive Codebook | Code Word of Negative Codebook |
|---|---|---|
| 0000000 | 11000011 | 00111100 |
| 0000001 | 10001110 | 01110001 |
| 0000010 | 10001101 | 01110010 |
| 0000011 | 11100100 | 00011011 |
| 0000100 | 10001011 | 01110100 |
| 0000101 | 11101000 | 00010111 |
| 0000110 | 11000101 | 00111010 |
| 0000111 | 11000110 | 00111001 |
| 0001000 | 10000111 | 01111000 |
| 0001001 | 11001010 | 00110101 |
| 0001010 | 11001001 | 00110110 |
| 0001011 | 11010100 | 00101011 |
| 0001100 | 10010011 | 01101100 |
| 0001101 | 11011000 | 00100111 |

-continued

| Input Word | Code Word of Positive Codebook | Code Word of Negative Codebook |
|---|---|---|
| 0001110 | 10010101 | 01101010 |
| 0001111 | 10011010 | 01100101 |
| 0010000 | 11100001 | 00011110 |
| 0011111 | 11100010 | 00011101 |
| 0100000 | 11010001 | 00101110 |
| 0101111 | 11010010 | 00101101 |
| 0110000 | 10100011 | 01011100 |
| 0111111 | 11001100 | 00110011 |
| 1000000 | 10110001 | 01001110 |
| 1001111 | 10110010 | 01001101 |
| 1010000 | 10110100 | 01001011 |
| 1011111 | 10101100 | 01010011 |
| 1100000 | 10011001 | 01100110 |
| 1101111 | 10011100 | 01100011 |
| 1110000 | 10100101 | 01011010 |
| 1111111 | 10010110 | 01101001, | said method including the steps of:
employing first circuitry to generate one of the code words of the positive codebook in response to each of the input words that belongs to the second subset of the data word set when the accumulated disparity of the previously generated code words of the code word sequence satisfies a first criterion, and employing the first circuit to generate one of the code words of the negative codebook in response to said each of the input words that belongs to the second subset of the data word set when the accumulated disparity of the previously generated code words of the code word sequence does not satisfy the first criterion; and employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set wherein the accumulated disparity of the previously generated code words of the code word sequence does not satisfy the first criterion.

53. A method for encoding a sequence of 7-bit input words of data in accordance with a mapping to generate a code word sequence of 8-bit code words, wherein the mapping is between a data word set of $2^7$ 7-bit data words and a code word set of 8-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code Word of Positive Codebook | Code Word of Negative Codebook |
|---|---|---|
| 0010001 | 11101110 | 00010001 |
| 0010010 | 11101101 | 00010010 |
| 0010011 | 11101100 | 00010011 |

-continued

| Input Word | Code Word of Positive Codebook | Code Word of Negative Codebook |
|---|---|---|
| 0010100 | 11101011 | 00010100 |
| 0010101 | 11101010 | 00010101 |
| 0010110 | 11101001 | 00010110 |
| 0010111 | 00010111 | 00010111 |
| 0011000 | 11100111 | 00011000 |
| 0011001 | 11100110 | 00011001 |
| 0011010 | 11100101 | 00011010 |
| 0011011 | 00011011 | 00011011 |
| 0011100 | 11100011 | 00011100 |
| 0011101 | 00011101 | 00011101 |
| 0011110 | 00011110 | 00011110 |
| 0100001 | 11011110 | 00100001 |
| 0100010 | 11011101 | 00100010 |
| 0100011 | 11011100 | 00100011 |
| 0100100 | 11011011 | 00100100 |
| 0100101 | 11011010 | 00100101 |
| 0100110 | 11011001 | 00100110 |
| 0100111 | 00100111 | 00100111 |
| 0101000 | 11010111 | 00101000 |
| 0101001 | 11010110 | 00101001 |
| 0101010 | 11010101 | 00101010 |
| 0101011 | 00101011 | 00101011 |
| 0101100 | 11010011 | 00101100 |
| 0101101 | 00101101 | 00101101 |
| 0101110 | 00101110 | 00101110 |
| 0110001 | 11001110 | 00110001 |
| 0110010 | 11001101 | 00110010 |
| 0110011 | 00110011 | 00110011 |
| 0110100 | 11001011 | 00110100 |
| 0110101 | 00110101 | 00110101 |
| 0110110 | 00110110 | 00110110 |
| 0110111 | 00110111 | 11001000 |
| 0111000 | 11000111 | 00111000 |
| 0111001 | 00111001 | 00111001 |
| 0111010 | 00111010 | 00111010 |
| 0111011 | 00111011 | 11000100 |
| 0111100 | 00111100 | 00111100 |
| 0111101 | 00111101 | 11000010 |
| 0111110 | 00111110 | 11000001 |
| 1000001 | 10111110 | 01000001 |
| 1000010 | 10111101 | 01000010 |
| 1000011 | 10111100 | 01000011 |
| 1000100 | 10111011 | 01000100 |
| 1000101 | 10111010 | 01000101 |
| 1000110 | 10111001 | 01000110 |
| 1000111 | 01000111 | 01000111 |
| 1001000 | 10110111 | 01001000 |
| 1001001 | 10110110 | 01001001 |
| 1001010 | 10110101 | 01001010 |
| 1001011 | 01001011 | 01001011 |
| 1001100 | 10110011 | 01001100 |
| 1001101 | 01001101 | 01001101 |
| 1001110 | 01001110 | 01001110 |
| 1010001 | 10101110 | 01010001 |
| 1010010 | 10101101 | 01010010 |
| 1010011 | 01010011 | 01010011 |
| 1010100 | 10101011 | 01010100 |
| 1010101 | 01010101 | 01010101 |
| 1010110 | 01010110 | 01010110 |
| 1010111 | 01010111 | 10101000 |
| 1011000 | 10100111 | 01011000 |
| 1011001 | 01011001 | 01011001 |
| 1011010 | 01011010 | 01011010 |
| 1011011 | 01011011 | 10100100 |
| 1011100 | 01011100 | 01011100 |
| 1011101 | 01011101 | 10100010 |
| 1011110 | 01011110 | 10100001 |
| 1100001 | 10011110 | 01100001 |
| 1100010 | 10011101 | 01100010 |
| 1100011 | 01100011 | 01100011 |
| 1100100 | 10011011 | 01100100 |
| 1100101 | 01100101 | 01100101 |
| 1100110 | 01100110 | 01100110 |
| 1100111 | 01100111 | 10011000 |
| 1101000 | 10010111 | 01101000 |
| 1101001 | 01101001 | 01101001 |
| 1101010 | 01101010 | 01101010 |
| 1101011 | 01101011 | 10010100 |
| 1101100 | 01101100 | 01101100 |
| 1101101 | 01101101 | 10010010 |
| 1101110 | 01101110 | 10010001 |
| 1110001 | 01110001 | 01110001 |
| 1110010 | 01110010 | 01110010 |
| 1110011 | 01110011 | 10001100 |
| 1110100 | 01110100 | 01110100 |
| 1110101 | 01110101 | 10001010 |
| 1110110 | 01110110 | 10001001 |
| 1110111 | 01110111 | 10001000 |
| 1111000 | 01111000 | 01111000 |
| 1111001 | 01111001 | 10000110 |
| 1111010 | 01111010 | 10000101 |
| 1111011 | 01111011 | 10000100 |
| 1111100 | 01111100 | 10000011 |
| 1111101 | 01111101 | 10000010 |
| 1111110 | 01111110 | 10000001, | and the secondary mapping is

| Input Word | Code Word of Positive Codebook | Code Word of Negative Codebook |
|---|---|---|
| 0000000 | 11000011 | 11000011 |
| 0000001 | 10001110 | 10000110 |
| 0000010 | 10001101 | 10001101 |
| 0000011 | 11100100 | 11100100 |
| 0000100 | 10001011 | 10001011 |
| 0000101 | 11101000 | 11101000 |
| 0000110 | 11000101 | 11000101 |
| 0000111 | 11000110 | 11000110 |
| 0001000 | 10000111 | 10000111 |
| 0001001 | 11001010 | 11001010 |
| 0001010 | 11001001 | 11001001 |
| 0001011 | 11010100 | 11010100 |
| 0001100 | 10010011 | 10010011 |
| 0001101 | 11011000 | 11011000 |
| 0001110 | 10010101 | 10010101 |
| 0001111 | 10011010 | 10011010 |
| 0010000 | 11100001 | 11100001 |
| 0011111 | 11100010 | 11100010 |
| 0100000 | 11010001 | 11010001 |
| 0101111 | 11010010 | 11010010 |
| 0110000 | 10100011 | 10100011 |
| 0111111 | 11001100 | 11001100 |
| 1000000 | 10110001 | 10110001 |
| 1001111 | 10110010 | 10110010 |
| 1010000 | 10110100 | 10110100 |
| 1011111 | 10101100 | 10101100 |
| 1100000 | 10011001 | 10011001 |
| 1101111 | 10011100 | 10011100 |
| 1110000 | 10100101 | 10100101 |
| 1111111 | 10010110 | 10010110, | said method including the steps of:
employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the first criterion; and employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set when the accumulated disparity of the previously generated code words of the code word sequence does not satisfy the first criterion.

54. A method for encoding a sequence of 9-bit input words of data in accordance with a mapping to generate a code word sequence of 10-bit code words, wherein the mapping is between a data word set of $2^9$ 9-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Decimal Representation of Input Word | Code Word of Positive Codebook | Code Word of Negative Codebook |
|---|---|---|
| 35 | 1111011100 | 0000100011 |
| 37 | 1111011010 | 0000100101 |
| 38 | 1111011001 | 0000100110 |
| 39 | 1111011000 | 0000100111 |
| 41 | 1111010110 | 0000101001 |
| 42 | 1111010101 | 0000101010 |
| 43 | 1111010100 | 0000101011 |
| 44 | 1111010011 | 0000101100 |
| 45 | 1111010010 | 0000101101 |
| 46 | 1111010001 | 0000101110 |
| 49 | 1111001110 | 0000110001 |
| 50 | 1111001101 | 0000110010 |
| 51 | 1111001100 | 0000110011 |
| 52 | 1111001011 | 0000110100 |
| 53 | 1111001010 | 0000110101 |
| 54 | 1111001001 | 0000110110 |
| 56 | 1111000111 | 0000111000 |
| 57 | 1111000110 | 0000111001 |
| 58 | 1111000101 | 0000111010 |
| 60 | 1111000011 | 0000111100 |
| 67 | 1110111100 | 0001000011 |
| 69 | 1110111010 | 0001000101 |
| 70 | 1110111001 | 0001000110 |
| 71 | 1110111000 | 0001000111 |
| 73 | 1110110110 | 0001001001 |
| 74 | 1110110101 | 0001001010 |
| 75 | 1110110100 | 0001001011 |
| 76 | 1110110011 | 0001001100 |
| 77 | 1110110010 | 0001001101 |
| 78 | 1110110001 | 0001001110 |
| 81 | 1110101110 | 0001010001 |
| 82 | 1110101101 | 0001010010 |
| 83 | 1110101100 | 0001010011 |
| 84 | 1110101011 | 0001010100 |
| 85 | 1110101010 | 0001010101 |
| 86 | 1110101001 | 0001010110 |
| 87 | 0001010111 | 1110101000 |
| 88 | 1110100111 | 0001011000 |
| 89 | 1110100110 | 0001011001 |
| 90 | 1110100101 | 0001011010 |
| 91 | 0001011011 | 1110100100 |
| 92 | 1110100011 | 0001011100 |
| 93 | 0001011101 | 1110100010 |
| 94 | 0001011110 | 1110100001 |
| 97 | 1110011110 | 0001100001 |
| 98 | 1110011101 | 0001100010 |
| 99 | 1110011100 | 0001100011 |
| 100 | 1110011011 | 0001100100 |
| 101 | 1110011010 | 0001100101 |
| 102 | 1110011001 | 0001100110 |
| 103 | 0001100111 | 1110011000 |
| 104 | 1110010111 | 0001101000 |
| 105 | 1110010110 | 0001101001 |
| 106 | 1110010101 | 0001101010 |
| 107 | 0001101011 | 1110010100 |
| 108 | 1110010011 | 0001101100 |
| 109 | 0001101101 | 1110010010 |
| 110 | 0001101110 | 1110010001 |
| 113 | 1110001110 | 0001110001 |
| 114 | 1110001101 | 0001110010 |
| 115 | 0001110011 | 1110001100 |
| 116 | 1110001011 | 0001110100 |
| 117 | 0001110101 | 1110001010 |
| 118 | 0001110110 | 1110001001 |
| 119 | 0001110111 | 1110001000 |
| 120 | 1110000111 | 0001111000 |
| 121 | 0001111001 | 1110000110 |
| 122 | 0001111010 | 1110000101 |
| 123 | 0001111011 | 1110000100 |
| 124 | 0001111100 | 1110000011 |
| 125 | 0001111101 | 1110000010 |
| 126 | 0001111110 | 1110000001 |
| 131 | 1101111100 | 0010000011 |
| 133 | 1101111010 | 0010000101 |
| 134 | 1101111001 | 0010000110 |
| 135 | 1101111000 | 0010000111 |
| 137 | 1101110110 | 0010001001 |
| 138 | 1101110101 | 0010001010 |
| 139 | 1101110100 | 0010001011 |
| 140 | 1101110011 | 0010001100 |
| 141 | 1101110010 | 0010001101 |
| 142 | 1101110001 | 0010001110 |
| 145 | 1101101110 | 0010010001 |
| 146 | 1101101101 | 0010010010 |
| 147 | 1101101100 | 0010010011 |
| 148 | 1101101011 | 0010010100 |
| 149 | 1101101010 | 0010010101 |
| 150 | 1101101001 | 0010010110 |
| 151 | 0010010111 | 1101101000 |
| 152 | 1101100111 | 0010011000 |
| 153 | 1101100110 | 0010011001 |
| 154 | 1101100101 | 0010011010 |
| 155 | 0010011011 | 1101100100 |
| 156 | 1101100011 | 0010011100 |
| 157 | 0010011101 | 1101100010 |
| 158 | 0010011110 | 1101100001 |
| 161 | 1101011110 | 0010100001 |
| 162 | 1101011101 | 0010100010 |
| 163 | 1101011100 | 0010100011 |
| 164 | 1101011011 | 0010100100 |
| 165 | 1101011010 | 0010100101 |
| 166 | 1101011001 | 0010100110 |
| 167 | 0010100111 | 1101011000 |
| 168 | 1101010111 | 0010101000 |
| 169 | 1101010110 | 0010101001 |
| 170 | 1101010101 | 0010101010 |
| 171 | 0010101011 | 1101010100 |
| 172 | 1101010011 | 0010101100 |
| 173 | 0010101101 | 1101010010 |
| 174 | 0010101110 | 1101010001 |
| 177 | 1101001110 | 0010110001 |
| 178 | 1101001101 | 0010110010 |
| 179 | 0010110011 | 1101001100 |
| 180 | 1101001011 | 0010110100 |
| 181 | 0010110101 | 1101001010 |
| 182 | 0010110110 | 1101001001 |
| 183 | 0010110111 | 1101001000 |

-continued

| Decimal Representation of Input Word | Code Word of Positive Codebook | Code Word of Negative Codebook |
|---|---|---|
| 184 | 1101000111 | 0010111000 |
| 185 | 0010111001 | 1101000110 |
| 186 | 0010111010 | 1101000101 |
| 187 | 0010111011 | 1101000100 |
| 188 | 0010111100 | 1101000011 |
| 189 | 0010111101 | 1101000010 |
| 190 | 0010111110 | 1101000001 |
| 193 | 1100111110 | 0011000001 |
| 194 | 1100111101 | 0011000010 |
| 195 | 1100111100 | 0011000011 |
| 196 | 1100111011 | 0011000100 |
| 197 | 1100111010 | 0011000101 |
| 198 | 1100111001 | 0011000110 |
| 199 | 0011000111 | 1100111000 |
| 200 | 1100110111 | 0011001000 |
| 201 | 1100110110 | 0011001001 |
| 202 | 1100110101 | 0011001010 |
| 203 | 0011001011 | 1100110100 |
| 204 | 1100110011 | 0011001100 |
| 205 | 0011001101 | 1100110010 |
| 206 | 0011001110 | 1100110001 |
| 209 | 1100101110 | 0011010001 |
| 210 | 1100101101 | 0011010010 |
| 211 | 0011010011 | 1100101100 |
| 212 | 1100101011 | 0011010100 |
| 213 | 0011010101 | 1100101010 |
| 214 | 0011010110 | 1100101001 |
| 215 | 0011010111 | 1100101000 |
| 216 | 1100100111 | 0011011000 |
| 217 | 0011011001 | 1100100110 |
| 218 | 0011011010 | 1100100101 |
| 219 | 0011011011 | 1100100100 |
| 220 | 0011011100 | 1100100011 |
| 221 | 0011011101 | 1100100010 |
| 222 | 0011011110 | 1100100001 |
| 225 | 1100011110 | 0011100001 |
| 226 | 1100011101 | 0011100010 |
| 227 | 0011100011 | 1100011100 |
| 228 | 1100011011 | 0011100100 |
| 229 | 0011100101 | 1100011010 |
| 230 | 0011100110 | 1100011001 |
| 231 | 0011100111 | 1100011000 |
| 232 | 1100010111 | 0011101000 |
| 233 | 0011101001 | 1100010110 |
| 234 | 0011101010 | 1100010101 |
| 235 | 0011101011 | 1100010100 |
| 236 | 0011101100 | 1100010011 |
| 237 | 0011101101 | 1100010010 |
| 238 | 0011101110 | 1100010001 |
| 241 | 0011110001 | 1100001110 |
| 242 | 0011110010 | 1100001101 |
| 243 | 0011110011 | 1100001100 |
| 244 | 0011110100 | 1100001011 |
| 245 | 0011110101 | 1100001010 |
| 246 | 0011110110 | 1100001001 |
| 247 | 0011110111 | 1100001000 |
| 248 | 0011111000 | 1100000111 |
| 249 | 0011111001 | 1100000110 |
| 250 | 0011111010 | 1100000101 |
| 251 | 0011111011 | 1100000100 |
| 252 | 0011111100 | 1100000011 |
| 253 | 0011111101 | 1100000010 |
| 254 | 0011111110 | 1100000001 |
| 259 | 1011111100 | 0100000011 |
| 261 | 1011111010 | 0100000101 |
| 262 | 1011111001 | 0100000110 |
| 263 | 1011111000 | 0100000111 |
| 265 | 1011110110 | 0100001001 |
| 266 | 1011110101 | 0100001010 |
| 267 | 1011110100 | 0100001011 |
| 268 | 1011110011 | 0100001100 |
| 269 | 1011110010 | 0100001101 |
| 270 | 1011110001 | 0100001110 |
| 273 | 1011101110 | 0100010001 |
| 274 | 1011101101 | 0100010010 |

-continued

| Decimal Representation of Input Word | Code Word of Positive Codebook | Code Word of Negative Codebook |
|---|---|---|
| 275 | 1011101100 | 0100010011 |
| 276 | 1011101011 | 0100010100 |
| 277 | 1011101010 | 0100010101 |
| 278 | 1011101001 | 0100010110 |
| 279 | 0100010111 | 1011101000 |
| 280 | 1011100111 | 0100011000 |
| 281 | 1011100110 | 0100011001 |
| 282 | 1011100101 | 0100011010 |
| 283 | 0100011011 | 1011100100 |
| 284 | 1011100011 | 0100011100 |
| 285 | 0100011101 | 1011100010 |
| 286 | 0100011110 | 1011100001 |
| 289 | 1011011110 | 0100100001 |
| 290 | 1011011101 | 0100100010 |
| 291 | 1011011100 | 0100100011 |
| 292 | 1011011011 | 0100100100 |
| 293 | 1011011010 | 0100100101 |
| 294 | 1011011001 | 0100100110 |
| 295 | 0100100111 | 1011011000 |
| 296 | 1011010111 | 0100101000 |
| 297 | 1011010110 | 0100101001 |
| 298 | 1011010101 | 0100101010 |
| 299 | 0100101011 | 1011010100 |
| 300 | 1011010011 | 0100101100 |
| 301 | 0100101101 | 1011010010 |
| 302 | 0100101110 | 1011010001 |
| 305 | 1011001110 | 0100110001 |
| 306 | 1011001101 | 0100110010 |
| 307 | 0100110011 | 1011001100 |
| 308 | 1011001011 | 0100110100 |
| 309 | 0100110101 | 1011001010 |
| 310 | 0100110110 | 1011001001 |
| 311 | 0100110111 | 1011001000 |
| 312 | 1011000111 | 0100111000 |
| 313 | 0100111001 | 1011000110 |
| 314 | 0100111010 | 1011000101 |
| 315 | 0100111011 | 1011000100 |
| 316 | 0100111100 | 1011000011 |
| 317 | 0100111101 | 1011000010 |
| 318 | 0100111110 | 1011000001 |
| 321 | 1010111110 | 0101000001 |
| 322 | 1010111101 | 0101000010 |
| 323 | 1010111100 | 0101000011 |
| 324 | 1010111011 | 0101000100 |
| 325 | 1010111010 | 0101000101 |
| 326 | 1010111001 | 0101000110 |
| 327 | 0101000111 | 1010111000 |
| 328 | 1010110111 | 0101001000 |
| 329 | 1010110110 | 0101001001 |
| 330 | 1010110101 | 0101001010 |
| 331 | 0101001011 | 1010110100 |
| 332 | 1010110011 | 0101001100 |
| 333 | 0101001101 | 1010110010 |
| 334 | 0101001110 | 1010110001 |
| 337 | 1010101110 | 0101010001 |
| 338 | 1010101101 | 0101010010 |
| 339 | 0101010011 | 1010101100 |
| 340 | 1010101011 | 0101010100 |
| 341 | 0101010101 | 1010101010 |
| 342 | 0101010110 | 1010101001 |
| 343 | 0101010111 | 1010101000 |
| 344 | 1010100111 | 0101011000 |
| 345 | 0101011001 | 1010100110 |
| 346 | 0101011010 | 1010100101 |
| 347 | 0101011011 | 1010100100 |
| 348 | 0101011100 | 1010100011 |
| 349 | 0101011101 | 1010100010 |
| 350 | 0101011110 | 1010100001 |
| 353 | 1010011110 | 0101100001 |
| 354 | 1010011101 | 0101100010 |
| 355 | 0101100011 | 1010011100 |
| 356 | 1010011011 | 0101100100 |
| 357 | 0101100101 | 1010011010 |
| 358 | 0101100110 | 1010011001 |
| 359 | 0101100111 | 1010011000 |

| Decimal Representation of Input Word | Code Word of Positive Codebook | Code Word of Negative Codebook |
| --- | --- | --- |
| 360 | 1010010111 | 0101101000 |
| 361 | 0101101001 | 1010010110 |
| 362 | 0101101010 | 1010010101 |
| 363 | 0101101011 | 1010010100 |
| 364 | 0101101100 | 1010010011 |
| 365 | 0101101101 | 1010010010 |
| 366 | 0101101110 | 1010010001 |
| 369 | 0101110001 | 1010001110 |
| 370 | 0101110010 | 1010001101 |
| 371 | 0101110011 | 1010001100 |
| 372 | 0101110100 | 1010001011 |
| 373 | 0101110101 | 1010001010 |
| 374 | 0101110110 | 1010001001 |
| 375 | 0101110111 | 1010001000 |
| 376 | 0101111000 | 1010000111 |
| 377 | 0101111001 | 1010000110 |
| 378 | 0101111010 | 1010000101 |
| 379 | 0101111011 | 1010000100 |
| 380 | 0101111100 | 1010000011 |
| 381 | 0101111101 | 1010000010 |
| 382 | 0101111110 | 1010000001 |
| 385 | 1001111110 | 0110000001 |
| 386 | 1001111101 | 0110000010 |
| 387 | 1001111100 | 0110000011 |
| 388 | 1001111011 | 0110000100 |
| 389 | 1001111010 | 0110000101 |
| 390 | 1001111001 | 0110000110 |
| 391 | 0110000111 | 1001111000 |
| 392 | 1001110111 | 0110001000 |
| 393 | 1001110110 | 0110001001 |
| 394 | 1001110101 | 0110001010 |
| 395 | 0110001011 | 1001110100 |
| 396 | 1001110011 | 0110001100 |
| 397 | 0110001101 | 1001110010 |
| 398 | 0110001110 | 1001110001 |
| 401 | 1001101110 | 0110010001 |
| 402 | 1001101101 | 0110010010 |
| 403 | 0110010011 | 1001101100 |
| 404 | 1001101011 | 0110010100 |
| 405 | 0110010101 | 1001101010 |
| 406 | 0110010110 | 1001101001 |
| 407 | 0110010111 | 1001101000 |
| 408 | 1001100111 | 0110011000 |
| 409 | 0110011001 | 1001100110 |
| 410 | 0110011010 | 1001100101 |
| 411 | 0110011011 | 1001100100 |
| 412 | 0110011100 | 1001100011 |
| 413 | 0110011101 | 1001100010 |
| 414 | 0110011110 | 1001100001 |
| 417 | 1001011110 | 0110100001 |
| 418 | 1001011101 | 0110100010 |
| 419 | 0110100011 | 1001011100 |
| 420 | 1001011011 | 0110100100 |
| 421 | 0110100101 | 1001011010 |
| 422 | 0110100110 | 1001011001 |
| 423 | 0110100111 | 1001011000 |
| 424 | 1001010111 | 0110101000 |
| 425 | 0110101001 | 1001010110 |
| 426 | 0110101010 | 1001010101 |
| 427 | 0110101011 | 1001010100 |
| 428 | 0110101100 | 1001010011 |
| 429 | 0110101101 | 1001010010 |
| 430 | 0110101110 | 1001010001 |
| 433 | 0110110001 | 1001001110 |
| 434 | 0110110010 | 1001001101 |
| 435 | 0110110011 | 1001001100 |
| 436 | 0110110100 | 1001001011 |
| 437 | 0110110101 | 1001001010 |
| 438 | 0110110110 | 1001001001 |
| 439 | 0110110111 | 1001001000 |
| 440 | 0110111000 | 1001000111 |
| 441 | 0110111001 | 1001000110 |
| 442 | 0110111010 | 1001000101 |
| 443 | 0110111011 | 1001000100 |
| 444 | 0110111100 | 1001000011 |
| 445 | 0110111101 | 1001000010 |
| 446 | 0110111110 | 1001000001 |
| 449 | 1000111110 | 0111000001 |
| 450 | 1000111101 | 0111000010 |
| 451 | 0111000011 | 1000111100 |
| 452 | 1000111011 | 0111000100 |
| 453 | 0111000101 | 1000111010 |
| 454 | 0111000110 | 1000111001 |
| 455 | 0111000111 | 1000111000 |
| 456 | 1000110111 | 0111001000 |
| 457 | 0111001001 | 1000110110 |
| 458 | 0111001010 | 1000110101 |
| 459 | 0111001011 | 1000110100 |
| 460 | 0111001100 | 1000110011 |
| 461 | 0111001101 | 1000110010 |
| 462 | 0111001110 | 1000110001 |
| 465 | 0111010001 | 1000101110 |
| 466 | 0111010010 | 1000101101 |
| 467 | 0111010011 | 1000101100 |
| 468 | 0111010100 | 1000101011 |
| 469 | 0111010101 | 1000101010 |
| 470 | 0111010110 | 1000101001 |
| 471 | 0111010111 | 1000101000 |
| 472 | 0111011000 | 1000100111 |
| 473 | 0111011001 | 1000100110 |
| 474 | 0111011010 | 1000100101 |
| 475 | 0111011011 | 1000100100 |
| 476 | 0111011100 | 1000100011 |
| 477 | 0111011101 | 1000100010 |
| 478 | 0111011110 | 1000100001 |
| 481 | 0111100001 | 1000011110 |
| 482 | 0111100010 | 1000011101 |
| 483 | 0111100011 | 1000011100 |
| 484 | 0111100100 | 1000011011 |
| 485 | 0111100101 | 1000011010 |
| 486 | 0111100110 | 1000011001 |
| 487 | 0111100111 | 1000011000 |
| 488 | 0111101000 | 1000010111 |
| 489 | 0111101001 | 1000010110 |
| 490 | 0111101010 | 1000010101 |
| 491 | 0111101011 | 1000010100 |
| 492 | 0111101100 | 1000010011 |
| 493 | 0111101101 | 1000010010 |
| 494 | 0111101110 | 1000010001 |
| 497 | 0111110001 | 1000001110 |
| 498 | 0111110010 | 1000001101 |
| 499 | 0111110011 | 1000001100 |
| 500 | 0111110100 | 1000001011 |
| 501 | 0111110101 | 1000001010 |
| 502 | 0111110110 | 1000001001 |
| 504 | 0111111000 | 1000000111 |
| 505 | 0111111001 | 1000000110 |
| 506 | 0111111010 | 1000000101 |
| 508 | 0111111100 | 1000000011, | and the secondary mapping is

| Decimal Representation of Input Word | Code Word of Positive Codebook | Code Word of Negative Codebook |
| --- | --- | --- |
| 0 | 1100010011 | 0011101100 |
| 1 | 1000011110 | 0111100001 |
| 2 | 1000011101 | 0111100010 |
| 3 | 1110000110 | 0001111001 |
| 4 | 1000011011 | 0111100100 |
| 5 | 1110001010 | 0001110101 |
| 6 | 1110000101 | 0001111010 |
| 7 | 1110010010 | 0001101101 |
| 8 | 1000010111 | 0111101000 |
| 9 | 1110010100 | 0001101011 |

-continued

| Decimal Representation of Input Word | Code Word of Positive Codebook | Code Word of Negative Codebook |
|---|---|---|
| 10 | 1110001001 | 0001110110 |
| 11 | 1100010110 | 0011101001 |
| 12 | 1100100011 | 0011011100 |
| 13 | 1100011010 | 0011100101 |
| 14 | 1110010001 | 0001101110 |
| 15 | 1100100110 | 0011011001 |
| 16 | 1101000011 | 0010111100 |
| 17 | 1100001110 | 0011110001 |
| 18 | 1100001101 | 0011110010 |
| 19 | 1100101010 | 0011010101 |
| 20 | 1100001011 | 0011110100 |
| 21 | 1100110010 | 0011001101 |
| 22 | 1100010101 | 0011101010 |
| 23 | 1101000110 | 0010111001 |
| 24 | 1100000111 | 0011111000 |
| 25 | 1101001010 | 0010110101 |
| 26 | 1100011001 | 0011100110 |
| 27 | 1101010010 | 0010101101 |
| 28 | 1000110011 | 0111001100 |
| 29 | 1101010100 | 0010101011 |
| 30 | 1100100101 | 0011011010 |
| 31 | 1001110010 | 0110001101 |
| 32 | 1001010011 | 0110101100 |
| 33 | 1000101110 | 0111010001 |
| 34 | 1000101101 | 0111010010 |
| 36 | 1000101011 | 0111010100 |
| 40 | 1000100111 | 0111011000 |
| 47 | 1010010110 | 0101101001 |
| 48 | 1001100011 | 0110011100 |
| 55 | 1010011010 | 0101100101 |
| 59 | 1010100110 | 0101011001 |
| 61 | 1010101010 | 0101010101 |
| 62 | 1100101001 | 0011010110 |
| 63 | 1010110010 | 0101001101 |
| 64 | 1110100001 | 0001011110 |
| 65 | 1001001110 | 0110110001 |
| 66 | 1001001101 | 0110110010 |
| 68 | 1110000011 | 0001111100 |
| 72 | 1001000111 | 0110111000 |
| 79 | 1110100010 | 0001011101 |
| 80 | 1110101000 | 0001010111 |
| 95 | 1110100100 | 0001011011 |
| 96 | 1010010011 | 0101101100 |
| 111 | 1110011000 | 0001100111 |
| 112 | 1010100011 | 0101011100 |
| 127 | 1110001100 | 0001110011 |
| 128 | 1101100001 | 0010011110 |
| 129 | 1010001110 | 0101110001 |
| 130 | 1010001101 | 0101110010 |
| 132 | 1001001011 | 0110110100 |
| 136 | 1010000111 | 0101111000 |
| 143 | 1101100010 | 0010011101 |
| 144 | 1101101000 | 0010010111 |
| 159 | 1101100100 | 0010011011 |
| 160 | 1011000011 | 0100111100 |
| 175 | 1101011000 | 0010100111 |
| 176 | 1100110001 | 0011001110 |
| 191 | 1101001100 | 0010110011 |
| 192 | 1101000101 | 0010111010 |
| 207 | 1100111000 | 0011000111 |
| 208 | 1101001001 | 0010110110 |
| 223 | 1100011100 | 0011100011 |
| 224 | 1101010001 | 0010101110 |
| 239 | 1100101100 | 0011010011 |
| 240 | 1000110101 | 0111001010 |
| 255 | 1100110100 | 0011001011 |
| 256 | 1011100001 | 0100011110 |
| 257 | 1011100010 | 0100011101 |
| 258 | 1011101000 | 0100010111 |
| 260 | 1010001011 | 0101110100 |
| 264 | 1001010101 | 0110101010 |
| 271 | 1011011000 | 0100100111 |
| 272 | 1001011001 | 0110100110 |
| 287 | 1011100100 | 0100011011 |
| 288 | 1001100101 | 0110011010 |
| 303 | 1010011100 | 0101100011 |
| 304 | 1001101001 | 0110010110 |
| 319 | 1010101100 | 0101010011 |
| 320 | 1001110001 | 0110001110 |
| 335 | 1010111000 | 0101000111 |
| 336 | 1010010101 | 0101101010 |
| 351 | 1010110100 | 0101001011 |
| 352 | 1010011001 | 0101100110 |
| 367 | 1011001100 | 0100110011 |
| 368 | 1010100101 | 0101011010 |
| 383 | 1011010100 | 0100101011 |
| 384 | 1010101001 | 0101010110 |
| 399 | 1001111000 | 0110000111 |
| 400 | 1010110001 | 0101001110 |
| 415 | 1001011100 | 0110100011 |
| 416 | 1011000101 | 0100111010 |
| 431 | 1001101100 | 0110010011 |
| 432 | 1011001001 | 0100110110 |
| 447 | 1001110100 | 0110001011 |
| 448 | 1011010001 | 0100101110 |
| 463 | 1000110110 | 0111001001 |
| 464 | 1011000110 | 0100111001 |
| 479 | 1001010110 | 0110101001 |
| 480 | 1011001010 | 0100110101 |
| 495 | 1001011010 | 0 0110100101 |
| 496 | 1011010010 | 0 0100101101 |
| 503 | 1001100110 | 0 0110011001 |
| 507 | 1000111100 | 0 0111000011 |
| 509 | 1000111010 | 0 0111000101 |
| 510 | 1000111001 | 0 0111000110 |
| 511 | 1001101010 | 0 0110010101, | said method including the steps of:
employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the criterion; and
employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to first subset of the data word set when the accumulated disparity of the previously generated code words of the code word sequence does not satisfy the first criterion.

55. A method for encoding a sequence of 9-bit input words of data in accordance with a mapping to generate a code word sequence of 10-bit code words, wherein the mapping is between a data word set of $2^9$ 9-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code word of Positive Codebook | Code word of Negative Codebook |
| --- | --- | --- |
| 000100011 | 1111011100 | 0000100011 |
| 000100101 | 1111011010 | 0000100101 |
| 000100110 | 1111011001 | 0000100110 |
| 000100111 | 1111011000 | 0000100111 |
| 000101001 | 1111010110 | 0000101001 |
| 000101010 | 1111010101 | 0000101010 |
| 000101011 | 1111010100 | 0000101011 |
| 000101100 | 1111010011 | 0000101100 |
| 000101101 | 1111010010 | 0000101101 |
| 000101110 | 1111010001 | 0000101110 |
| 000110001 | 1111001110 | 0000110001 |
| 000110010 | 1111001101 | 0000110010 |
| 000110011 | 1111001100 | 0000110011 |
| 000110100 | 1111001011 | 0000110100 |
| 000110101 | 1111001010 | 0000110101 |
| 000110110 | 1111001001 | 0000110110 |
| 000111000 | 1111000111 | 0000111000 |
| 000111001 | 1111000110 | 0000111001 |
| 000111010 | 1111000101 | 0000111010 |
| 000111100 | 1111000011 | 0000111100 |
| 001000011 | 1110111100 | 0001000011 |
| 001000101 | 1110111010 | 0001000101 |
| 001000110 | 1110111001 | 0001000110 |
| 001000111 | 1110111000 | 0001000111 |
| 001001001 | 1110110110 | 0001001001 |
| 001001010 | 1110110101 | 0001001010 |
| 001001011 | 1110110100 | 0001001011 |
| 001001100 | 1110110011 | 0001001100 |
| 001001101 | 1110110010 | 0001001101 |
| 001001110 | 1110110001 | 0001001110 |
| 001010001 | 1110101110 | 0001010001 |
| 001010010 | 1110101101 | 0001010010 |
| 001010011 | 1110101100 | 0001010011 |
| 001010100 | 1110101011 | 0001010100 |
| 001010101 | 1110101010 | 0001010101 |
| 001010110 | 1110101001 | 0001010110 |
| 001010111 | 0001010111 | 0001010111 |
| 001011000 | 1110100111 | 0001011000 |
| 001011001 | 1110100110 | 0001011001 |
| 001011010 | 1110100101 | 0001011010 |
| 001011011 | 0001011011 | 0001011011 |
| 001011100 | 1110100011 | 0001011100 |
| 001011101 | 0001011101 | 0001011101 |
| 001011110 | 0001011110 | 0001011110 |
| 001100001 | 1110011110 | 0001100001 |
| 001100010 | 1110011101 | 0001100010 |
| 001100011 | 1110011100 | 0001100011 |
| 001100100 | 1110011011 | 0001100100 |
| 001100101 | 1110011010 | 0001100101 |
| 001100110 | 1110011001 | 0001100110 |
| 001100111 | 0001100111 | 0001100111 |
| 001101000 | 1110010111 | 0001101000 |
| 001101001 | 1110010110 | 0001101001 |
| 001101010 | 1110010101 | 0001101010 |
| 001101011 | 0001101011 | 0001101011 |
| 001101100 | 1110010011 | 0001101100 |
| 001101101 | 0001101101 | 0001101101 |
| 001101110 | 0001101110 | 0001101110 |
| 001110001 | 1110001110 | 0001110001 |
| 001110010 | 1110001101 | 0001110010 |
| 001110011 | 0001110011 | 0001110011 |
| 001110100 | 1110001011 | 0001110100 |
| 001110101 | 0001110101 | 0001110101 |
| 001110110 | 0001110110 | 0001110110 |
| 001110111 | 0001110111 | 1110001000 |
| 001111000 | 1110000111 | 0001111000 |
| 001111001 | 0001111001 | 0001111001 |
| 001111010 | 0001111010 | 0001111010 |
| 001111011 | 0001111011 | 1110000100 |
| 001111100 | 0001111100 | 0001111100 |
| 001111101 | 0001111101 | 1110000010 |
| 001111110 | 0001111110 | 1110000001 |

-continued

| Input Word | Code word of Positive Codebook | Code word of Negative Codebook |
| --- | --- | --- |
| 010000011 | 1101111100 | 0010000011 |
| 010000101 | 1101111010 | 0010000101 |
| 010000110 | 1101111001 | 0010000110 |
| 010000111 | 1101111000 | 0010000111 |
| 010001001 | 1101110110 | 0010001001 |
| 010001010 | 1101110101 | 0010001010 |
| 010001011 | 1101110100 | 0010001011 |
| 010001100 | 1101110011 | 0010001100 |
| 010001101 | 1101110010 | 0010001101 |
| 010001110 | 1101110001 | 0010001110 |
| 010010001 | 1101101110 | 0010010001 |
| 010010010 | 1101101101 | 0010010010 |
| 010010011 | 1101101100 | 0010010011 |
| 010010100 | 1101101011 | 0010010100 |
| 010010101 | 1101101010 | 0010010101 |
| 010010110 | 1101101001 | 0010010110 |
| 010010111 | 0010010111 | 0010010111 |
| 010011000 | 1101100111 | 0010011000 |
| 010011001 | 1101100110 | 0010011001 |
| 010011010 | 1101100101 | 0010011010 |
| 010011011 | 0010011011 | 0010011011 |
| 010011100 | 1101100011 | 0010011100 |
| 010011101 | 0010011101 | 0010011101 |
| 010011110 | 0010011110 | 0010011110 |
| 010100001 | 1101011110 | 0010100001 |
| 010100010 | 1101011101 | 0010100010 |
| 010100011 | 1101011100 | 0010100011 |
| 010100100 | 1101011011 | 0010100100 |
| 010100101 | 1101011010 | 0010100101 |
| 010100110 | 1101011001 | 0010100110 |
| 010100111 | 0010100111 | 0010100111 |
| 010101000 | 1101010111 | 0010101000 |
| 010101001 | 1101010110 | 0010101001 |
| 010101010 | 1101010101 | 0010101010 |
| 010101011 | 0010101011 | 0010101011 |
| 010101100 | 1101010011 | 0010101100 |
| 010101101 | 0010101101 | 0010101101 |
| 010101110 | 0010101110 | 0010101110 |
| 010110001 | 1101001110 | 0010110001 |
| 010110010 | 1101001101 | 0010110010 |
| 010110011 | 0010110011 | 0010110011 |
| 010110100 | 1101001011 | 0010110100 |
| 010110101 | 0010110101 | 0010110101 |
| 010110110 | 0010110110 | 0010110110 |
| 010110111 | 0010110111 | 1101001000 |
| 010111000 | 1101000111 | 0010111000 |
| 010111001 | 0010111001 | 0010111001 |
| 010111010 | 0010111010 | 0010111010 |
| 010111011 | 0010111011 | 1101000100 |
| 010111100 | 0010111100 | 0010111100 |
| 010111101 | 0010111101 | 1101000010 |
| 010111110 | 0010111110 | 1101000001 |
| 011000001 | 1100111110 | 0011000001 |
| 011000010 | 1100111101 | 0011000010 |
| 011000011 | 1100111100 | 0011000011 |
| 011000100 | 1100111011 | 0011000100 |
| 011000101 | 1100111010 | 0011000101 |
| 011000110 | 1100111001 | 0011000110 |
| 011000111 | 0011000111 | 0011000111 |
| 011001000 | 1100110111 | 0011001000 |
| 011001001 | 1100110110 | 0011001001 |
| 011001010 | 1100110101 | 0011001010 |
| 011001011 | 0011001011 | 0011001011 |
| 011001100 | 1100110011 | 0011001100 |
| 011001101 | 0011001101 | 0011001101 |
| 011001110 | 0011001110 | 0011001110 |
| 011010001 | 1100101110 | 0011010001 |
| 011010010 | 1100101101 | 0011010010 |
| 011010011 | 0011010011 | 0011010011 |
| 011010100 | 1100101011 | 0011010100 |
| 011010101 | 0011010101 | 0011010101 |
| 011010110 | 0011010110 | 0011010110 |
| 011010111 | 0011010111 | 1100101000 |
| 011011000 | 1100100111 | 0011011000 |
| 011011001 | 0011011001 | 0011011001 |

| Input Word | Code word of Positive Codebook | Code word of Negative Codebook |
| --- | --- | --- |
| 011011010 | 0011011010 | 0011011010 |
| 011011011 | 0011011011 | 1100100100 |
| 011011100 | 0011011100 | 0011011100 |
| 011011101 | 0011011101 | 1100100010 |
| 011011110 | 0011011110 | 1100100001 |
| 011100001 | 1100011110 | 0011100001 |
| 011100010 | 1100011101 | 0011100010 |
| 011100011 | 0011100011 | 0011100011 |
| 011100100 | 1100011011 | 0011100100 |
| 011100101 | 0011100101 | 0011100101 |
| 011100110 | 0011100110 | 0011100110 |
| 011100111 | 0011100111 | 1100011000 |
| 011101000 | 1100010111 | 0011101000 |
| 011101001 | 0011101001 | 0011101001 |
| 011101010 | 0011101010 | 0011101010 |
| 011101011 | 0011101011 | 1100010100 |
| 011101100 | 0011101100 | 0011101100 |
| 011101101 | 0011101101 | 1100010010 |
| 011101110 | 0011101110 | 1100010001 |
| 011110001 | 0011110001 | 0011110001 |
| 011110010 | 0011110010 | 0011110010 |
| 011110011 | 0011110011 | 1100001100 |
| 011110100 | 0011110100 | 0011110100 |
| 011110101 | 0011110101 | 1100001010 |
| 011110110 | 0011110110 | 1100001001 |
| 011110111 | 0011110111 | 1100001000 |
| 011111000 | 0011111000 | 0011111000 |
| 011111001 | 0011111001 | 1100000110 |
| 011111010 | 0011111010 | 1100000101 |
| 011111011 | 0011111011 | 1100000100 |
| 011111100 | 0011111100 | 1100000011 |
| 011111101 | 0011111101 | 1100000010 |
| 011111110 | 0011111110 | 1100000001 |
| 100000011 | 1011111100 | 0100000011 |
| 100000101 | 1011111010 | 0100000101 |
| 100000110 | 1011111001 | 0100000110 |
| 100000111 | 1011111000 | 0100000111 |
| 100001001 | 1011110110 | 0100001001 |
| 100001010 | 1011110101 | 0100001010 |
| 100001011 | 1011110100 | 0100001011 |
| 100001100 | 1011110011 | 0100001100 |
| 100001101 | 1011110010 | 0100001101 |
| 100001110 | 1011110001 | 0100001110 |
| 100010001 | 1011101110 | 0100010001 |
| 100010010 | 1011101101 | 0100010010 |
| 100010011 | 1011101100 | 0100010011 |
| 100010100 | 1011101011 | 0100010100 |
| 100010101 | 1011101010 | 0100010101 |
| 100010110 | 1011101001 | 0100010110 |
| 100010111 | 0100010111 | 0100010111 |
| 100011000 | 1011100111 | 0100011000 |
| 100011001 | 1011100110 | 0100011001 |
| 100011010 | 1011100101 | 0100011010 |
| 100011011 | 0100011011 | 0100011011 |
| 100011100 | 1011100011 | 0100011100 |
| 100011101 | 0100011101 | 0100011101 |
| 100011110 | 0100011110 | 0100011110 |
| 100100001 | 1011011110 | 0100100001 |
| 100100010 | 1011011101 | 0100100010 |
| 100100011 | 1011011100 | 0100100011 |
| 100100100 | 1011011011 | 0100100100 |
| 100100101 | 1011011010 | 0100100101 |
| 100100110 | 1011011001 | 0100100110 |
| 100100111 | 0100100111 | 0100100111 |
| 100101000 | 1011010111 | 0100101000 |
| 100101001 | 1011010110 | 0100101001 |
| 100101010 | 1011010101 | 0100101010 |
| 100101011 | 0100101011 | 0100101011 |
| 100101100 | 1011010011 | 0100101100 |
| 100101101 | 0100101101 | 0100101101 |
| 100101110 | 0100101110 | 0100101110 |
| 100110001 | 1011001110 | 0100110001 |
| 100110010 | 1011001101 | 0100110010 |
| 100110011 | 0100110011 | 0100110011 |
| 100110100 | 1011001011 | 0100110100 |
| 100110101 | 0100110101 | 0100110101 |
| 100110110 | 0100110110 | 0100110110 |
| 100110111 | 0100110111 | 1011001000 |
| 100111000 | 1011000111 | 0100111000 |
| 100111001 | 0100111001 | 0100111001 |
| 100111010 | 0100111010 | 0100111010 |
| 100111011 | 0100111011 | 1011000100 |
| 100111100 | 0100111100 | 0100111100 |
| 100111101 | 0100111101 | 1011000010 |
| 100111110 | 0100111110 | 1011000001 |
| 101000001 | 1010111110 | 0101000001 |
| 101000010 | 1010111101 | 0101000010 |
| 101000011 | 1010111100 | 0101000011 |
| 101000100 | 1010111011 | 0101000100 |
| 101000101 | 1010111010 | 0101000101 |
| 101000110 | 1010111001 | 0101000110 |
| 101000111 | 0101000111 | 0101000111 |
| 101001000 | 1010110111 | 0101001000 |
| 101001001 | 1010110110 | 0101001001 |
| 101001010 | 1010110101 | 0101001010 |
| 101001011 | 0101001011 | 0101001011 |
| 101001100 | 1010110011 | 0101001100 |
| 101001101 | 0101001101 | 0101001101 |
| 101001110 | 0101001110 | 0101001110 |
| 101010001 | 1010101110 | 0101010001 |
| 101010010 | 1010101101 | 0101010010 |
| 101010011 | 0101010011 | 0101010011 |
| 101010100 | 1010101011 | 0101010100 |
| 101010101 | 0101010101 | 0101010101 |
| 101010110 | 0101010110 | 0101010110 |
| 101010111 | 0101010111 | 1010101000 |
| 101011000 | 1010100111 | 0101011000 |
| 101011001 | 0101011001 | 0101011001 |
| 101011010 | 0101011010 | 0101011010 |
| 101011011 | 0101011011 | 1010100100 |
| 101011100 | 0101011100 | 0101011100 |
| 101011101 | 0101011101 | 1010100010 |
| 101011110 | 0101011110 | 1010100001 |
| 101100001 | 1010011110 | 0101100001 |
| 101100010 | 1010011101 | 0101100010 |
| 101100011 | 0101100011 | 0101100011 |
| 101100100 | 1010011011 | 0101100100 |
| 101100101 | 0101100101 | 0101100101 |
| 101100110 | 0101100110 | 0101100110 |
| 101100111 | 0101100111 | 1010011000 |
| 101101000 | 1010010111 | 0101101000 |
| 101101001 | 0101101001 | 0101101001 |
| 101101010 | 0101101010 | 0101101010 |
| 101101011 | 0101101011 | 1010010100 |
| 101101100 | 0101101100 | 0101101100 |
| 101101101 | 0101101101 | 1010010010 |
| 101101110 | 0101101110 | 1010010001 |
| 101110001 | 0101110001 | 0101110001 |
| 101110010 | 0101110010 | 0101110010 |
| 101110011 | 0101110011 | 1010001100 |
| 101110100 | 0101110100 | 0101110100 |
| 101110101 | 0101110101 | 1010001010 |
| 101110110 | 0101110110 | 1010001001 |
| 101110111 | 0101110111 | 1010001000 |
| 101111000 | 0101111000 | 0101111000 |
| 101111001 | 0101111001 | 1010000110 |
| 101111010 | 0101111010 | 1010000101 |
| 101111011 | 0101111011 | 1010000100 |
| 101111100 | 0101111100 | 1010000011 |
| 101111101 | 0101111101 | 1010000010 |
| 101111110 | 0101111110 | 1010000001 |
| 110000001 | 1001111110 | 0110000001 |
| 110000010 | 1001111101 | 0110000010 |
| 110000011 | 1001111100 | 0110000011 |
| 110000100 | 1001111011 | 0110000100 |
| 110000101 | 1001111010 | 0110000101 |
| 110000110 | 1001111001 | 0110000110 |
| 110000111 | 0110000111 | 0110000111 |
| 110001000 | 1001110111 | 0110001000 |
| 110001001 | 1001110110 | 0110001001 |

-continued

| Input Word | Code word of Positive Codebook | Code word of Negative Codebook |
|---|---|---|
| 110001010 | 1001110101 | 0110001010 |
| 110001011 | 0110001011 | 0110001011 |
| 110001100 | 1001110011 | 0110001100 |
| 110001101 | 0110001101 | 0110001101 |
| 110001110 | 0110001110 | 0110001110 |
| 110010001 | 1001101110 | 0110010001 |
| 110010010 | 1001101101 | 0110010010 |
| 110010011 | 0110010011 | 0110010011 |
| 110010100 | 1001101011 | 0110010100 |
| 110010101 | 0110010101 | 0110010101 |
| 110010110 | 0110010110 | 0110010110 |
| 110010111 | 0110010111 | 1001101000 |
| 110011000 | 1001100111 | 0110011000 |
| 110011001 | 0110011001 | 0110011001 |
| 110011010 | 0110011010 | 0110011010 |
| 110011011 | 0110011011 | 1001100100 |
| 110011100 | 0110011100 | 0110011100 |
| 110011101 | 0110011101 | 1001100010 |
| 110011110 | 0110011110 | 1001100001 |
| 110100001 | 1001011110 | 0110100001 |
| 110100010 | 1001011101 | 0110100010 |
| 110100011 | 0110100011 | 0110100011 |
| 110100100 | 1001011011 | 0110100100 |
| 110100101 | 0110100101 | 0110100101 |
| 110100110 | 0110100110 | 0110100110 |
| 110100111 | 0110100111 | 1001011000 |
| 110101000 | 1001010111 | 0110101000 |
| 110101001 | 0110101001 | 0110101001 |
| 110101010 | 0110101010 | 0110101010 |
| 110101011 | 0110101011 | 1001010100 |
| 110101100 | 0110101100 | 0110101100 |
| 110101101 | 0110101101 | 1001010010 |
| 110101110 | 0110101110 | 1001010001 |
| 110110001 | 0110110001 | 0110110001 |
| 110110010 | 0110110010 | 0110110010 |
| 110110011 | 0110110011 | 1001001100 |
| 110110100 | 0110110100 | 0110110100 |
| 110110101 | 0110110101 | 1001001010 |
| 110110110 | 0110110110 | 1001001001 |
| 110110111 | 0110110111 | 1001001000 |
| 110111000 | 0110111000 | 0110111000 |
| 110111001 | 0110111001 | 1001000110 |
| 110111010 | 0110111010 | 1001000101 |
| 110111011 | 0110111011 | 1001000100 |
| 110111100 | 0110111100 | 1001000011 |
| 110111101 | 0110111101 | 1001000010 |
| 110111110 | 0110111110 | 1001000001 |
| 111000001 | 1000111110 | 0111000001 |
| 111000010 | 1000111101 | 0111000010 |
| 111000011 | 0111000011 | 0111000011 |
| 111000100 | 1000111011 | 0111000100 |
| 111000101 | 0111000101 | 0111000101 |
| 111000110 | 0111000110 | 0111000110 |
| 111000111 | 0111000111 | 1000111000 |
| 111001000 | 1000110111 | 0111001000 |
| 111001001 | 0111001001 | 0111001001 |
| 111001010 | 0111001010 | 0111001010 |
| 111001011 | 0111001011 | 1000110100 |
| 111001100 | 0111001100 | 0111001100 |
| 111001101 | 0111001101 | 1000110010 |
| 111001110 | 0111001110 | 1000110001 |
| 111010001 | 0111010001 | 0111010001 |
| 111010010 | 0111010010 | 0111010010 |
| 111010011 | 0111010011 | 1000101100 |
| 111010100 | 0111010100 | 0111010100 |
| 111010101 | 0111010101 | 1000101010 |
| 111010110 | 0111010110 | 1000101001 |
| 111010111 | 0111010111 | 1000101000 |
| 111011000 | 0111011000 | 0111011000 |
| 111011001 | 0111011001 | 1000100110 |
| 111011010 | 0111011010 | 1000100101 |
| 111011011 | 0111011011 | 1000100100 |
| 111011100 | 0111011100 | 1000100011 |
| 111011101 | 0111011101 | 1000100010 |
| 111011110 | 0111011110 | 1000100001 |

-continued

| Input Word | Code word of Positive Codebook | Code word of Negative Codebook |
|---|---|---|
| 111100001 | 0111100001 | 0111100001 |
| 111100010 | 0111100010 | 0111100010 |
| 111100011 | 0111100011 | 1000011100 |
| 111100100 | 0111100100 | 0111100100 |
| 111100101 | 0111100101 | 1000011010 |
| 111100110 | 0111100110 | 1000011001 |
| 111100111 | 0111100111 | 1000011000 |
| 111101000 | 0111101000 | 0111101000 |
| 111101001 | 0111101001 | 1000010110 |
| 111101010 | 0111101010 | 1000010101 |
| 111101011 | 0111101011 | 1000010100 |
| 111101100 | 0111101100 | 1000010011 |
| 111101101 | 0111101101 | 1000010010 |
| 111101110 | 0111101110 | 1000010001 |
| 111110001 | 0111110001 | 1000001110 |
| 111110010 | 0111110010 | 1000001101 |
| 111110011 | 0111110011 | 1000001100 |
| 111110100 | 0111110100 | 1000001011 |
| 111110101 | 0111110101 | 1000001010 |
| 111110110 | 0111110110 | 1000001001 |
| 111111000 | 0111111000 | 1000000111 |
| 111111001 | 0111111001 | 1000000110 |
| 111111010 | 0111111010 | 1000000101 |
| 111111100 | 0111111100 | 1000000011, | and the secondary mapping is

| Input Word | Code Word Of Positive Codebook | Code Word Of Negative Codebook |
|---|---|---|
| 000000000 | 1100010011 | 1100010011 |
| 000000001 | 1000011110 | 1000011110 |
| 000000010 | 1000011101 | 1000011101 |
| 000000011 | 1110000110 | 1110000110 |
| 000000100 | 1000011011 | 1000011011 |
| 000000101 | 1110001010 | 1110001010 |
| 000000110 | 1110000101 | 1110000101 |
| 000000111 | 1110010010 | 1110010010 |
| 000001000 | 1000010111 | 1000010111 |
| 000001001 | 1110010100 | 1110010100 |
| 000001010 | 1100001001 | 1110001001 |
| 000001011 | 1100010110 | 1100010110 |
| 000001100 | 1100100011 | 1100100011 |
| 000001101 | 1100011010 | 1100011010 |
| 000001110 | 1110010001 | 1110010001 |
| 000001111 | 1100100110 | 1100100110 |
| 000010000 | 1101000011 | 1101000011 |
| 000010001 | 1100001110 | 1100001110 |
| 000010010 | 1100001101 | 1100001101 |
| 000010011 | 1100101010 | 1100101010 |
| 000010100 | 1100001011 | 1100001011 |
| 000010101 | 1100110010 | 1100110010 |
| 000010110 | 1100010101 | 1100010101 |
| 000010111 | 1101000110 | 1101000110 |
| 000011000 | 1100000111 | 1100000111 |
| 000011001 | 1101001010 | 1101001010 |
| 000011010 | 1100011001 | 1100011001 |
| 000011011 | 1101010010 | 1101010010 |
| 000011100 | 1000110011 | 1000110011 |
| 000011101 | 1101010100 | 1101010100 |
| 000011110 | 1100100101 | 1100100101 |
| 000011111 | 1001110010 | 1001110010 |
| 000100000 | 1001010011 | 1001010011 |
| 000100001 | 1000101110 | 1000101110 |
| 000100010 | 1000101101 | 1000101101 |
| 000100100 | 1000101011 | 1000101011 |
| 000101000 | 1000100111 | 1000100111 |
| 000101111 | 1010010110 | 1010010110 |
| 000110000 | 1001100011 | 1001100011 |
| 000110111 | 1010011010 | 1010011010 |

-continued

| Input Word | Code Word Of Positive Codebook | Code Word Of Negative Codebook |
|---|---|---|
| 000111011 | 1010100110 | 1010100110 |
| 000111101 | 1010101010 | 1010101010 |
| 000111110 | 1100101001 | 1100101001 |
| 000111111 | 1010110010 | 1010110010 |
| 001000000 | 1110100001 | 1110100001 |
| 001000001 | 1001001110 | 1001001110 |
| 001000010 | 1001001101 | 1001001101 |
| 001000100 | 1110000011 | 1110000011 |
| 001001000 | 1001000111 | 1001000111 |
| 001001111 | 1110100010 | 1110100010 |
| 001010000 | 1110101000 | 1110101000 |
| 001011111 | 1110100100 | 1110100100 |
| 001100000 | 1010010011 | 1010010011 |
| 001101111 | 1110011000 | 1110011000 |
| 001110000 | 1010100011 | 1010100011 |
| 001111111 | 1110001100 | 1110001100 |
| 010000000 | 1101100001 | 1101100001 |
| 010000001 | 1010001110 | 1010001110 |
| 010000010 | 1010001101 | 1010001101 |
| 010000100 | 1001001011 | 1001001011 |
| 010001000 | 1010000111 | 1010000111 |
| 010001111 | 1101100010 | 1101100010 |
| 010010000 | 1101101000 | 1101101000 |
| 010011111 | 1101100100 | 1101100100 |
| 010100000 | 1011000011 | 1011000011 |
| 010101111 | 1101011000 | 1101011000 |
| 010110000 | 1100110001 | 1100110001 |
| 010111111 | 1101001100 | 1101001100 |
| 011000000 | 1101000101 | 1101000101 |
| 011001111 | 1100111000 | 1100111000 |
| 011010000 | 1101001001 | 1101001001 |
| 011011111 | 1100011100 | 1100011100 |
| 011100000 | 1101010001 | 1101010001 |
| 011101111 | 1100101100 | 1100101100 |
| 011110000 | 1000110101 | 1000110101 |
| 011111111 | 1100110100 | 1100110100 |
| 100000000 | 1011100001 | 1011100001 |
| 100000001 | 1011100010 | 1011100010 |
| 100000010 | 1011101000 | 1011101000 |
| 100000100 | 1010001011 | 1010001011 |
| 100001000 | 1001010101 | 1001010101 |
| 100001111 | 1011011000 | 1011011000 |
| 100010000 | 1001011001 | 1001011001 |
| 100011111 | 1011100100 | 1011100100 |
| 100100000 | 1001100101 | 1001100101 |
| 100101111 | 1010011100 | 1010011100 |
| 100110000 | 1001101001 | 1001101001 |
| 100111111 | 1010101100 | 1010101100 |
| 101000000 | 1001110001 | 1001110001 |
| 101001111 | 1010111000 | 1010111000 |
| 101010000 | 1010010101 | 1010010101 |
| 101011111 | 1010110100 | 1010110100 |
| 101100000 | 1010011001 | 1010011001 |
| 101101111 | 1011001100 | 1011001100 |
| 101110000 | 1010100101 | 1010100101 |
| 101111111 | 1011010100 | 1011010100 |
| 110000000 | 1010101001 | 1010101001 |
| 110001111 | 1001111000 | 1001111000 |
| 110010000 | 1010110001 | 1010110001 |
| 110011111 | 1001011100 | 1001011100 |
| 110100000 | 1011000101 | 1011000101 |
| 110101111 | 1001101100 | 1001101100 |
| 110110000 | 1011001001 | 1011001001 |
| 110111111 | 1001110100 | 1001110100 |
| 111000000 | 1011010001 | 1011010001 |
| 111001111 | 1000110110 | 1000110110 |
| 111010000 | 1011000110 | 1011000110 |
| 111011111 | 1001010110 | 1001010110 |
| 111100000 | 1011001010 | 1011001010 |
| 111101111 | 1001011010 | 1001011010 |
| 111110000 | 1011010010 | 1011010010 |
| 111110111 | 1001100110 | 1001100110 |
| 111111011 | 1000111100 | 1000111100 |
| 111111101 | 1000111010 | 1000111010 |
| 111111110 | 1000111001 | 1000111001 |
| 111111111 | 1001101010 | 1001101010, | said method including the steps of:

employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the first criterion; and employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to first subset of the data word set when the accumulated disparity of the previously generated code words of the code word sequence does not satisfy the first criterion.

56. A method for encoding a sequence of 9-bit input words of data in accordance with a mapping to generate a code word sequence of 10-bit code words, wherein the mapping is between a data word set of $2^9$-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Decimal Representation of Input Word | Code Word of Positive Codebook | Code Word of Negative Codebook |
|---|---|---|
| 65 | 1110111110 | 0001000001 |
| 66 | 1110111101 | 0001000010 |
| 67 | 1110111100 | 0001000011 |
| 68 | 1110111011 | 0001000100 |
| 69 | 1110111010 | 0001000101 |
| 70 | 1110111001 | 0001000110 |
| 71 | 1110111000 | 0001000111 |
| 72 | 1110110111 | 0001001000 |
| 73 | 1110110110 | 0001001001 |
| 74 | 1110110101 | 0001001010 |
| 75 | 1110110100 | 0001001011 |
| 76 | 1110110011 | 0001001100 |
| 77 | 1110110010 | 0001001101 |
| 78 | 1110110001 | 0001001110 |
| 80 | 1110101111 | 0001010000 |
| 81 | 1110101110 | 0001010001 |
| 82 | 1110101101 | 0001010010 |
| 83 | 1110101100 | 0001010011 |

-continued

| Decimal Representation of Input Word | Code Word of Positive Codebook | Code Word of Negative Codebook |
|---|---|---|
| 84 | 1110101011 | 0001010100 |
| 85 | 1110101010 | 0001010101 |
| 86 | 1110101001 | 0001010110 |
| 87 | 0001010111 | 1110101000 |
| 88 | 1110100111 | 0001011000 |
| 89 | 1110100110 | 0001011001 |
| 90 | 1110100101 | 0001011010 |
| 91 | 0001011011 | 1110100100 |
| 92 | 1110100011 | 0001011100 |
| 93 | 0001011101 | 1110100010 |
| 94 | 0001011110 | 1110100001 |
| 97 | 1110011110 | 0001100001 |
| 98 | 1110011101 | 0001100010 |
| 99 | 1110011100 | 0001100011 |
| 100 | 1110011011 | 0001100100 |
| 101 | 1110011010 | 0001100101 |
| 102 | 1110011001 | 0001100110 |
| 103 | 0001100111 | 1110011000 |
| 104 | 1110010111 | 0001101000 |
| 105 | 1110010110 | 0001101001 |
| 106 | 1110010101 | 0001101010 |
| 107 | 0001101011 | 1110010100 |
| 108 | 1110010011 | 0001101100 |
| 109 | 0001101101 | 1110010010 |
| 110 | 0001101110 | 1110010001 |
| 113 | 1110001110 | 0001110001 |
| 114 | 1110001101 | 0001110010 |
| 115 | 0001110011 | 1110001100 |
| 116 | 1110001011 | 0001110100 |
| 117 | 0001110101 | 1110001010 |
| 118 | 0001110110 | 1110001001 |
| 121 | 0001111001 | 1110000110 |
| 122 | 0001111010 | 1110000101 |
| 129 | 1101111110 | 0010000001 |
| 130 | 1101111101 | 0010000010 |
| 131 | 1101111100 | 0010000011 |
| 132 | 1101111011 | 0010000100 |
| 133 | 1101111010 | 0010000101 |
| 134 | 1101111001 | 0010000110 |
| 135 | 1101111000 | 0010000111 |
| 136 | 1101110111 | 0010001000 |
| 137 | 1101110110 | 0010001001 |
| 138 | 1101110101 | 0010001010 |
| 139 | 1101110100 | 0010001011 |
| 140 | 1101110011 | 0010001100 |
| 141 | 1101110010 | 0010001101 |
| 142 | 1101110001 | 0010001110 |
| 144 | 1101101111 | 0010010000 |
| 145 | 1101101110 | 0010010001 |
| 146 | 1101101101 | 0010010010 |
| 147 | 1101101100 | 0010010011 |
| 148 | 1101101011 | 0010010100 |
| 149 | 1101101010 | 0010010101 |
| 150 | 1101101001 | 0010010110 |
| 151 | 0010010111 | 1101101000 |
| 152 | 1101100111 | 0010011000 |
| 153 | 1101100110 | 0010011001 |
| 154 | 1101100101 | 0010011010 |
| 155 | 0010011011 | 1101100100 |
| 156 | 1101100011 | 0010011100 |
| 157 | 0010011101 | 1101100010 |
| 158 | 0010011110 | 1101100001 |
| 161 | 1101011110 | 0010100001 |
| 162 | 1101011101 | 0010100010 |
| 163 | 1101011100 | 0010100011 |
| 164 | 1101011011 | 0010100100 |
| 165 | 1101011010 | 0010100101 |
| 166 | 1101011001 | 0010100110 |
| 167 | 0010100111 | 1101011000 |
| 168 | 1101010111 | 0010101000 |
| 169 | 1101010110 | 0010101001 |
| 170 | 1101010101 | 0010101010 |
| 171 | 0010101011 | 1101010100 |
| 172 | 1101010011 | 0010101100 |
| 173 | 0010101101 | 1101010010 |
| 174 | 0010101110 | 1101010001 |
| 175 | 0010101111 | 1101010000 |
| 176 | 1101001111 | 0010110000 |
| 177 | 1101001110 | 0010110001 |
| 178 | 1101001101 | 0010110010 |
| 179 | 0010110011 | 1101001100 |
| 180 | 1101001011 | 0010110100 |
| 181 | 0010110101 | 1101001010 |
| 182 | 0010110110 | 1101001001 |
| 183 | 0010110111 | 1101001000 |
| 184 | 1101000111 | 0010111000 |
| 185 | 0010111001 | 1101000110 |
| 186 | 0010111010 | 1101000101 |
| 187 | 0010111011 | 1101000100 |
| 188 | 0010111100 | 1101000011 |
| 189 | 0010111101 | 1101000010 |
| 190 | 0010111110 | 1101000001 |
| 193 | 1100111110 | 0011000001 |
| 194 | 1100111101 | 0011000010 |
| 195 | 1100111100 | 0011000011 |
| 196 | 1100111011 | 0011000100 |
| 197 | 1100111010 | 0011000101 |
| 198 | 1100111001 | 0011000110 |
| 199 | 0011000111 | 1100111000 |
| 200 | 1100110111 | 0011001000 |
| 201 | 1100110110 | 0011001001 |
| 202 | 1100110101 | 0011001010 |
| 203 | 0011001011 | 1100110100 |
| 204 | 1100110011 | 0011001100 |
| 205 | 0011001101 | 1100110010 |
| 206 | 0011001110 | 1100110001 |
| 207 | 0011001111 | 1100110000 |
| 208 | 1100101111 | 0011010000 |
| 209 | 1100101110 | 0011010001 |
| 210 | 1100101101 | 0011010010 |
| 211 | 0011010011 | 1100101100 |
| 212 | 1100101011 | 0011010100 |
| 213 | 0011010101 | 1100101010 |
| 214 | 0011010110 | 1100101001 |
| 215 | 0011010111 | 1100101000 |
| 216 | 1100100111 | 0011011000 |
| 217 | 0011011001 | 1100100110 |
| 218 | 0011011010 | 1100100101 |
| 219 | 0011011011 | 1100100100 |
| 220 | 0011011100 | 1100100011 |
| 221 | 0011011101 | 1100100010 |
| 222 | 0011011110 | 1100100001 |
| 225 | 1100011110 | 0011100001 |
| 226 | 1100011101 | 0011100010 |
| 227 | 0011100011 | 1100011100 |
| 228 | 1100011011 | 0011100100 |
| 229 | 0011100101 | 1100011010 |
| 230 | 0011100110 | 1100011001 |
| 231 | 0011100111 | 1100011000 |
| 232 | 1100010111 | 0011101000 |
| 233 | 0011101001 | 1100010110 |
| 234 | 0011101010 | 1100010101 |
| 235 | 0011101011 | 1100010100 |
| 236 | 0011101100 | 1100010011 |
| 237 | 0011101101 | 1100010010 |
| 238 | 0011101110 | 1100010001 |
| 239 | 0011101111 | 1100010000 |
| 241 | 0011110001 | 1100001110 |
| 242 | 0011110010 | 1100001101 |
| 243 | 0011110011 | 1100001100 |
| 244 | 0011110100 | 1100001011 |
| 245 | 0011110101 | 1100001010 |
| 246 | 0011110110 | 1100001001 |
| 247 | 0011110111 | 1100001000 |
| 249 | 0011111001 | 1100000110 |
| 250 | 0011111010 | 1100000101 |
| 251 | 0011111011 | 1100000100 |
| 253 | 0011111101 | 1100000010 |
| 258 | 1011111101 | 0100000010 |
| 259 | 1011111100 | 0100000011 |

-continued

| Decimal Representation of Input Word | Code Word of Positive Codebook | Code Word of Negative Codebook |
|---|---|---|
| 260 | 1011111011 | 0100000100 |
| 261 | 1011111010 | 0100000101 |
| 262 | 1011111001 | 0100000110 |
| 263 | 1011111000 | 0100000111 |
| 264 | 1011110111 | 0100001000 |
| 265 | 1011110110 | 0100001001 |
| 266 | 1011110101 | 0100001010 |
| 267 | 1011110100 | 0100001011 |
| 268 | 1011110011 | 0100001100 |
| 269 | 1011110010 | 0100001101 |
| 270 | 1011110001 | 0100001110 |
| 272 | 1011101111 | 0100010000 |
| 273 | 1011101110 | 0100010001 |
| 274 | 1011101101 | 0100010010 |
| 275 | 1011101100 | 0100010011 |
| 276 | 1011101011 | 0100010100 |
| 277 | 1011101010 | 0100010101 |
| 278 | 1011101001 | 0100010110 |
| 279 | 0100010111 | 1011101000 |
| 280 | 1011100111 | 0100011000 |
| 281 | 1011100110 | 0100011001 |
| 282 | 1011100101 | 0100011010 |
| 283 | 0100011011 | 1011100100 |
| 284 | 1011100011 | 0100011100 |
| 285 | 0100011101 | 1011100010 |
| 286 | 0100011110 | 1011100001 |
| 289 | 1011011110 | 0100100001 |
| 290 | 1011011101 | 0100100010 |
| 291 | 1011011100 | 0100100011 |
| 292 | 1011011011 | 0100100100 |
| 293 | 1011011010 | 0100100101 |
| 294 | 1011011001 | 0100100110 |
| 295 | 0100100111 | 1011011000 |
| 296 | 1011010111 | 0100101000 |
| 297 | 1011010110 | 0100101001 |
| 298 | 1011010101 | 0100101010 |
| 299 | 0100101011 | 1011010100 |
| 300 | 1011010011 | 0100101100 |
| 301 | 0100101101 | 1011010010 |
| 302 | 0100101110 | 1011010001 |
| 303 | 0100101111 | 1011010000 |
| 304 | 1011001111 | 0100110000 |
| 305 | 1011001110 | 0100110001 |
| 306 | 1011001101 | 0100110010 |
| 307 | 0100110011 | 1011001100 |
| 308 | 1011001011 | 0100110100 |
| 309 | 0100110101 | 1011001010 |
| 310 | 0100110110 | 1011001001 |
| 311 | 0100110111 | 1011001000 |
| 312 | 1011000111 | 0100111000 |
| 313 | 0100111001 | 1011000110 |
| 314 | 0100111010 | 1011000101 |
| 315 | 0100111011 | 1011000100 |
| 316 | 0100111100 | 1011000011 |
| 317 | 0100111101 | 1011000010 |
| 318 | 0100111110 | 1011000001 |
| 321 | 1010111110 | 0101000001 |
| 322 | 1010111101 | 0101000010 |
| 323 | 1010111100 | 0101000011 |
| 324 | 1010111011 | 0101000100 |
| 325 | 1010111010 | 0101000101 |
| 326 | 1010111001 | 0101000110 |
| 327 | 0101000111 | 1010111000 |
| 328 | 1010110111 | 0101001000 |
| 329 | 1010110110 | 0101001001 |
| 330 | 1010110101 | 0101001010 |
| 331 | 0101001011 | 1010110100 |
| 332 | 1010110011 | 0101001100 |
| 333 | 0101001101 | 1010110010 |
| 334 | 0101001110 | 1010110001 |
| 335 | 0101001111 | 1010110000 |
| 336 | 1010101111 | 0101010000 |
| 337 | 1010101110 | 0101010001 |
| 338 | 1010101101 | 0101010010 |
| 339 | 0101010011 | 1010101100 |
| 340 | 1010101011 | 0101010100 |
| 341 | 0101010101 | 1010101010 |
| 342 | 0101010110 | 1010101001 |
| 343 | 0101010111 | 1010101000 |
| 344 | 1010100111 | 0101011000 |
| 345 | 0101011001 | 1010100110 |
| 346 | 0101011010 | 1010100101 |
| 347 | 0101011011 | 1010100100 |
| 348 | 0101011100 | 1010100011 |
| 349 | 0101011101 | 1010100010 |
| 350 | 0101011110 | 1010100001 |
| 353 | 1010011110 | 0101100001 |
| 354 | 1010011101 | 0101100010 |
| 355 | 0101100011 | 1010011100 |
| 356 | 1010011011 | 0101100100 |
| 357 | 0101100101 | 1010011010 |
| 358 | 0101100110 | 1010011001 |
| 359 | 0101100111 | 1010011000 |
| 360 | 1010010111 | 0101101000 |
| 361 | 0101101001 | 1010010110 |
| 362 | 0101101010 | 1010010101 |
| 363 | 0101101011 | 1010010100 |
| 364 | 0101101100 | 1010010011 |
| 365 | 0101101101 | 1010010010 |
| 366 | 0101101110 | 1010010001 |
| 367 | 0101101111 | 1010010000 |
| 368 | 1010001111 | 0101110000 |
| 369 | 0101110001 | 1010001110 |
| 370 | 0101110010 | 1010001101 |
| 371 | 0101110011 | 1010001100 |
| 372 | 0101110100 | 1010001011 |
| 373 | 0101110101 | 1010001010 |
| 374 | 0101110110 | 1010001001 |
| 375 | 0101110111 | 1010001000 |
| 376 | 0101111000 | 1010000111 |
| 377 | 0101111001 | 1010000110 |
| 378 | 0101111010 | 1010000101 |
| 379 | 0101111011 | 1010000100 |
| 380 | 0101111100 | 1010000011 |
| 381 | 0101111101 | 1010000010 |
| 382 | 0101111110 | 1010000001 |
| 385 | 1001111110 | 0110000001 |
| 386 | 1001111101 | 0110000010 |
| 387 | 1001111100 | 0110000011 |
| 388 | 1001111011 | 0110000100 |
| 389 | 1001111010 | 0110000101 |
| 390 | 1001111001 | 0110000110 |
| 391 | 0110000111 | 1001111000 |
| 392 | 1001110111 | 0110001000 |
| 393 | 1001110110 | 0110001001 |
| 394 | 1001110101 | 0110001010 |
| 395 | 0110001011 | 1001110100 |
| 396 | 1001110011 | 0110001100 |
| 397 | 0110001101 | 1001110010 |
| 398 | 0110001110 | 1001110001 |
| 399 | 0110001111 | 1001110000 |
| 400 | 1001101111 | 0110010000 |
| 401 | 1001101110 | 0110010001 |
| 402 | 1001101101 | 0110010010 |
| 403 | 0110010011 | 1001101100 |
| 404 | 1001101011 | 0110010100 |
| 405 | 0110010101 | 1001101010 |
| 406 | 0110010110 | 1001101001 |
| 407 | 0110010111 | 1001101000 |
| 408 | 1001100111 | 0110011000 |
| 409 | 0110011001 | 1001100110 |
| 410 | 0110011010 | 1001100101 |
| 411 | 0110011011 | 1001100100 |
| 412 | 0110011100 | 1001100011 |
| 413 | 0110011101 | 1001100010 |
| 414 | 0110011110 | 1001100001 |
| 417 | 1001011110 | 0110100001 |
| 418 | 1001011101 | 0110100010 |
| 419 | 0110100011 | 1001011100 |
| 420 | 1001011011 | 0110100100 |

| Decimal Representation of Input Word | Code Word of Positive Codebook | Code Word of Negative Codebook |
| --- | --- | --- |
| 421 | 0110100101 | 1001011010 |
| 422 | 0110100110 | 1001011001 |
| 423 | 0110100111 | 1001011000 |
| 424 | 1001010111 | 0110101000 |
| 425 | 0110101001 | 1001010110 |
| 426 | 0110101010 | 1001010101 |
| 427 | 0110101011 | 1001010100 |
| 428 | 0110101100 | 1001010011 |
| 429 | 0110101101 | 1001010010 |
| 430 | 0110101110 | 1001010001 |
| 431 | 0110101111 | 1001010000 |
| 432 | 1001001111 | 0110110000 |
| 433 | 0110110001 | 1001001110 |
| 434 | 0110110010 | 1001001101 |
| 435 | 0110110011 | 1001001100 |
| 436 | 0110110100 | 1001001011 |
| 437 | 0110110101 | 1001001010 |
| 438 | 0110110110 | 1001001001 |
| 439 | 0110110111 | 1001001000 |
| 440 | 0110111000 | 1001000111 |
| 441 | 0110111001 | 1001000110 |
| 442 | 0110111010 | 1001000101 |
| 443 | 0110111011 | 1001000100 |
| 444 | 0110111100 | 1001000011 |
| 445 | 0110111101 | 1001000010 |
| 446 | 0110111110 | 1001000001 |
| 449 | 1000111110 | 0111000001 |
| 450 | 1000111101 | 0111000010 |
| 451 | 0111000011 | 1000111100 |
| 452 | 1000111011 | 0111000100 |
| 453 | 0111000101 | 1000111010 |
| 454 | 0111000110 | 1000111001 |
| 455 | 0111000111 | 1000111000 |
| 456 | 1000110111 | 0111001000 |
| 457 | 0111001001 | 1000110110 |
| 458 | 0111001010 | 1000110101 |
| 459 | 0111001011 | 1000110100 |
| 460 | 0111001100 | 1000110011 |
| 461 | 0111001101 | 1000110010 |
| 462 | 0111001110 | 1000110001 |
| 463 | 0111001111 | 1000110000 |
| 464 | 1000101111 | 0111010000 |
| 465 | 0111010001 | 1000101110 |
| 466 | 0111010010 | 1000101101 |
| 467 | 0111010011 | 1000101100 |
| 468 | 0111010100 | 1000101011 |
| 469 | 0111010101 | 1000101010 |
| 470 | 0111010110 | 1000101001 |
| 471 | 0111010111 | 1000101000 |
| 472 | 0111011000 | 1000100111 |
| 473 | 0111011001 | 1000100110 |
| 474 | 0111011010 | 1000100101 |
| 475 | 0111011011 | 1000100100 |
| 476 | 0111011100 | 1000100011 |
| 477 | 0111011101 | 1000100010 |
| 478 | 0111011110 | 1000100001 |
| 481 | 0111100001 | 1000011110 |
| 482 | 0111100010 | 1000011101 |
| 483 | 0111100011 | 1000011100 |
| 484 | 0111100100 | 1000011011 |
| 485 | 0111100101 | 1000011010 |
| 486 | 0111100110 | 1000011001 |
| 487 | 0111100111 | 1000011000 |
| 488 | 0111101000 | 1000010111 |
| 489 | 0111101001 | 1000010110 |
| 490 | 0111101010 | 1000010101 |
| 491 | 0111101011 | 1000010100 |
| 492 | 0111101100 | 1000010011 |
| 493 | 0111101101 | 1000010010 |
| 494 | 0111101110 | 1000010001 |
| 495 | 0111101111 | 1000010000 |
| 497 | 0111110001 | 1000001110 |
| 498 | 0111110010 | 1000001101 |
| 499 | 0111110011 | 1000001100 |
| 500 | 0111110100 | 1000001011 |
| 501 | 0111110101 | 1000001010 |
| 502 | 0111110110 | 1000001001 |
| 503 | 0111110111 | 1000001000 |
| 505 | 0111111001 | 1000000110 |
| 506 | 0111111010 | 1000000101 |
| 507 | 0111111011 | 1000000100, | and the secondary mapping is

| Decimal Representation of Input Word | Code Word of Positive Codebook | Code Word of Negative Codebook |
| --- | --- | --- |
| 0 | 1001000111 | 0110111000 |
| 1 | 1000011110 | 0111100001 |
| 2 | 1000011101 | 0111100010 |
| 3 | 1100010110 | 0011101001 |
| 4 | 1000011011 | 0111100100 |
| 5 | 1100011010 | 0011100101 |
| 6 | 1100010101 | 0011101010 |
| 7 | 1100100110 | 0011011001 |
| 8 | 1000010111 | 0111101000 |
| 9 | 1110000110 | 0001111001 |
| 10 | 1110000101 | 0001111010 |
| 11 | 1100101010 | 0011010101 |
| 12 | 1100100011 | 0011011100 |
| 13 | 1100101100 | 0011010011 |
| 14 | 1100100101 | 0011011010 |
| 15 | 1100110010 | 0011001101 |
| 16 | 1000101011 | 0111010100 |
| 17 | 1100001110 | 0011110001 |
| 18 | 1100001101 | 0011110010 |
| 19 | 1100110100 | 0011001011 |
| 20 | 1100001011 | 0011110100 |
| 21 | 1101010010 | 0010101101 |
| 22 | 1100101001 | 0011010110 |
| 23 | 1101010100 | 0010101011 |
| 24 | 1001001011 | 0110110100 |
| 25 | 1101011000 | 0010100111 |
| 26 | 1100110001 | 0011001110 |
| 27 | 1101100010 | 0010011101 |
| 28 | 1001010011 | 0110101100 |
| 29 | 1101101000 | 0010010111 |
| 30 | 1000101101 | 0111010010 |
| 31 | 1000101110 | 0111010001 |
| 32 | 1001100011 | 0110011100 |
| 33 | 1000110110 | 0111001001 |
| 34 | 1000110101 | 0111001010 |
| 35 | 1001001110 | 0110110001 |
| 36 | 1010001011 | 0101110100 |
| 37 | 1001010110 | 0110101001 |
| 38 | 1001001101 | 0110110010 |
| 39 | 1001011010 | 0110100101 |
| 40 | 1010010011 | 0101101100 |
| 41 | 1001100110 | 0110011001 |
| 42 | 1001010101 | 0110101010 |
| 43 | 1001101010 | 0110010101 |
| 44 | 1010100011 | 0101011100 |
| 45 | 1001110010 | 0110001101 |
| 46 | 1001011001 | 0110100110 |
| 47 | 1001110100 | 0110001011 |
| 48 | 1001100101 | 0110011010 |
| 49 | 1010001110 | 0101110001 |
| 50 | 1001101001 | 0110010110 |
| 51 | 1010010110 | 0101101001 |
| 52 | 1001110001 | 0110001110 |
| 53 | 1010011010 | 0101100101 |
| 54 | 1010001101 | 0101110010 |
| 55 | 1010100110 | 0101011001 |
| 56 | 1010010101 | 0101101010 |
| 57 | 1010101010 | 0101010101 |

-continued

| Decimal Representation of Input Word | Code Word of Positive Codebook | Code Word of Negative Codebook |
|---|---|---|
| 58 | 1010011001 | 0101100110 |
| 59 | 1010101100 | 0101010011 |
| 60 | 1010100101 | 0101011010 |
| 61 | 1010110010 | 0101001101 |
| 62 | 1010101001 | 0101010110 |
| 63 | 1010110100 | 0101001011 |
| 64 | 1110100001 | 0001011110 |
| 79 | 1110100010 | 0001011101 |
| 95 | 1110100100 | 0001011011 |
| 96 | 1110010001 | 0001101110 |
| 111 | 1110010100 | 0001101011 |
| 112 | 1110101000 | 0001010111 |
| 119 | 1110001100 | 0001110011 |
| 120 | 1010110001 | 0101001110 |
| 123 | 1110010010 | 0001101101 |
| 124 | 1011011000 | 0100100111 |
| 125 | 1110001010 | 0001110101 |
| 126 | 1110001001 | 0001110110 |
| 127 | 1110011000 | 0001100111 |
| 128 | 1101000011 | 0010111100 |
| 143 | 1101100001 | 0010011110 |
| 159 | 1101100100 | 0010011011 |
| 160 | 1101000101 | 0010111010 |
| 191 | 1101100010 | 0010110011 |
| 192 | 1101001001 | 0010110110 |
| 223 | 1100111000 | 0011000111 |
| 224 | 1101010001 | 0010101110 |
| 240 | 1101000110 | 0010111001 |
| 248 | 1101001010 | 0010110101 |
| 252 | 1100010011 | 0011101100 |
| 254 | 1100011001 | 0011100110 |
| 255 | 1100011100 | 0011100011 |
| 256 | 1010000111 | 0101111000 |
| 257 | 1011100001 | 0100011110 |
| 271 | 1011100010 | 0100011101 |
| 287 | 1011100100 | 0100011011 |
| 288 | 1011000011 | 0100111100 |
| 319 | 1011001100 | 0100110011 |
| 320 | 1011000101 | 0100111010 |
| 351 | 1010111000 | 0101000111 |
| 352 | 1011001001 | 0100110110 |
| 383 | 1010011100 | 0101100011 |
| 384 | 1011010001 | 0100101110 |
| 415 | 1001111000 | 0110000111 |
| 416 | 1011000110 | 0100111001 |
| 447 | 1000111100 | 0111000011 |
| 448 | 1011001010 | 0100110101 |
| 479 | 1001011100 | 0110100011 |
| 480 | 1011010010 | 0100101101 |
| 496 | 1011010100 | 0100101011 |
| 504 | 1000100111 | 0111011000 |
| 508 | 1000110011 | 0111001100 |
| 509 | 1000111010 | 0111000101 |
| 510 | 1000111001 | 0111000110 |
| 511 | 1001101100 | 0110010011, | said method including the steps of:
  employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the first criterion; and
  employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set when the accumulated disparity of the previously generated code words of the code word sequence does not satisfy the first criterion.

57. A method for encoding a sequence of 9-bit input words of data in accordance with a mapping to generate a code word sequence of 10-bit code words, wherein the mapping is between a data word set of $2^9$ 9-bit data words and a code word set of 10-bit code words consisting of a positive codebook and a negative codebook, the mapping includes a secondary mapping and a primary mapping, the primary mapping maps input words of a first subset of the data word set to a first subset of the code word set, the secondary mapping maps input words of a second subset of the data word set to a second subset of the code word set, the primary mapping is

| Input Word | Code Word of Positive Codebook | Code Word of Negative Codebook |
|---|---|---|
| 001000001 | 1110111110 | 0001000001 |
| 001000010 | 1110111101 | 0001000010 |
| 001000011 | 1110111100 | 0001000011 |
| 001000100 | 1110111011 | 0001000100 |
| 001000101 | 1110111010 | 0001000101 |
| 001000110 | 1110111001 | 0001000110 |
| 001000111 | 1110111000 | 0001000111 |
| 001001000 | 1110110111 | 0001001000 |
| 001001001 | 1110110110 | 0001001001 |
| 001001010 | 1110110101 | 0001001010 |
| 001001011 | 1110110100 | 0001001011 |
| 001001100 | 1110110011 | 0001001100 |
| 001001101 | 1110110010 | 0001001101 |
| 001001110 | 1110110001 | 0001001110 |
| 001010000 | 1110101111 | 0001010000 |
| 001010001 | 1110101110 | 0001010001 |
| 001010010 | 1110101101 | 0001010010 |
| 001010011 | 1110101100 | 0001010011 |
| 001010100 | 1110101011 | 0001010100 |
| 001010101 | 1110101010 | 0001010101 |
| 001010110 | 1110101001 | 0001010110 |
| 001010111 | 0001010111 | 0001010111 |
| 001011000 | 1110100111 | 0001011000 |
| 001011001 | 1110100110 | 0001011001 |
| 001011010 | 1110100101 | 0001011010 |
| 001011011 | 0001011011 | 0001011011 |
| 001011100 | 1110100011 | 0001011100 |
| 001011101 | 0001011101 | 0001011101 |
| 001011110 | 0001011110 | 0001011110 |
| 001100001 | 1110011110 | 0001100001 |
| 001100010 | 1110011101 | 0001100010 |
| 001100011 | 1110011100 | 0001100011 |
| 001100100 | 1110011011 | 0001100100 |
| 001100101 | 1110011010 | 0001100101 |
| 001100110 | 1110011001 | 0001100110 |
| 001100111 | 0001100111 | 0001100111 |
| 001101000 | 1110010111 | 0001101000 |
| 001101001 | 1110010110 | 0001101001 |
| 001101010 | 1110010101 | 0001101010 |
| 001101011 | 0001101011 | 0001101011 |
| 001101100 | 1110010011 | 0001101100 |
| 001101101 | 0001101101 | 0001101101 |
| 001101110 | 0001101110 | 0001101110 |
| 001110001 | 1110001110 | 0001110001 |
| 001110010 | 1110001101 | 0001110010 |
| 001110011 | 0001110011 | 0001110011 |
| 001110100 | 1110001011 | 0001110100 |
| 001110101 | 0001110101 | 0001110101 |

-continued

| Input Word | Code Word of Positive Codebook | Code Word of Negative Codebook |
|---|---|---|
| 001110110 | 0001110110 | 0001110110 |
| 001111001 | 0001111001 | 0001111001 |
| 001111010 | 0001111010 | 0001111010 |
| 010000001 | 1101111110 | 0010000001 |
| 010000010 | 1101111101 | 0010000010 |
| 010000011 | 1101111100 | 0010000011 |
| 010000100 | 1101111011 | 0010000100 |
| 010000101 | 1101111010 | 0010000101 |
| 010000110 | 1101111001 | 0010000110 |
| 010000111 | 1101111000 | 0010000111 |
| 010001000 | 1101110111 | 0010001000 |
| 010001001 | 1101110110 | 0010001001 |
| 010001010 | 1101110101 | 0010001010 |
| 010001011 | 1101110100 | 0010001011 |
| 010001100 | 1101110011 | 0010001100 |
| 010001101 | 1101110010 | 0010001101 |
| 010001110 | 1101110001 | 0010001110 |
| 010010000 | 1101101111 | 0010010000 |
| 010010001 | 1101101110 | 0010010001 |
| 010010010 | 1101101101 | 0010010010 |
| 010010011 | 1101101100 | 0010010011 |
| 010010100 | 1101101011 | 0010010100 |
| 010010101 | 1101101010 | 0010010101 |
| 010010110 | 1101101001 | 0010010110 |
| 010010111 | 0010010111 | 0010010111 |
| 010011000 | 1101100111 | 0010011000 |
| 010011001 | 1101100110 | 0010011001 |
| 010011010 | 1101100101 | 0010011010 |
| 010011011 | 0010011011 | 0010011011 |
| 010011100 | 1101100011 | 0010011100 |
| 010011101 | 0010011101 | 0010011101 |
| 010011110 | 0010011110 | 0010011110 |
| 010100001 | 1101011110 | 0010100001 |
| 010100010 | 1101011101 | 0010100010 |
| 010100011 | 1101011100 | 0010100011 |
| 010100100 | 1101011011 | 0010100100 |
| 010100101 | 1101011010 | 0010100101 |
| 010100110 | 1101011001 | 0010100110 |
| 010100111 | 0010100111 | 0010100111 |
| 010101000 | 1101010111 | 0010101000 |
| 010101001 | 1101010110 | 0010101001 |
| 010101010 | 1101010101 | 0010101010 |
| 010101011 | 0010101011 | 0010101011 |
| 010101100 | 1101010011 | 0010101100 |
| 010101101 | 0010101101 | 0010101101 |
| 010101110 | 0010101110 | 0010101110 |
| 010101111 | 0010101111 | 1101010000 |
| 010110000 | 1101001111 | 0010110000 |
| 010110001 | 1101001110 | 0010110001 |
| 010110010 | 1101001101 | 0010110010 |
| 010110011 | 0010110011 | 0010110011 |
| 010110100 | 1101001011 | 0010110100 |
| 010110101 | 0010110101 | 0010110101 |
| 010110110 | 0010110110 | 0010110110 |
| 010110111 | 0010110111 | 1101001000 |
| 010111000 | 1101000111 | 0010111000 |
| 010111001 | 0010111001 | 0010111001 |
| 010111010 | 0010111010 | 0010111010 |
| 010111011 | 0010111011 | 1101000100 |
| 010111100 | 0010111100 | 0010111100 |
| 010111101 | 0010111101 | 1101000010 |
| 010111110 | 0010111110 | 1101000001 |
| 011000001 | 1100111110 | 0011000001 |
| 011000010 | 1100111101 | 0011000010 |
| 011000011 | 1100111100 | 0011000011 |
| 011000100 | 1100111011 | 0011000100 |
| 011000101 | 1100111010 | 0011000101 |
| 011000110 | 1100111001 | 0011000110 |
| 011000111 | 0011000111 | 0011000111 |
| 011001000 | 1100110111 | 0011001000 |
| 011001001 | 1100110110 | 0011001001 |
| 011001010 | 1100110101 | 0011001010 |
| 011001011 | 0011001011 | 0011001011 |
| 011001100 | 1100110011 | 0011001100 |
| 011001101 | 0011001101 | 0011001101 |
| 011001110 | 0011001110 | 0011001110 |
| 011001111 | 0011001111 | 1100110000 |
| 011010000 | 1100101111 | 0011010000 |
| 011010001 | 1100101110 | 0011010001 |
| 011010010 | 1100101101 | 0011010010 |
| 011010011 | 0011010011 | 0011010011 |
| 011010100 | 1100101011 | 0011010100 |
| 011010101 | 0011010101 | 0011010101 |
| 011010110 | 0011010110 | 0011010110 |
| 011010111 | 0011010111 | 1100101000 |
| 011011000 | 1100100111 | 0011011000 |
| 011011001 | 0011011001 | 0011011001 |
| 011011010 | 0011011010 | 0011011010 |
| 011011011 | 0011011011 | 1100100100 |
| 011011100 | 0011011100 | 0011011100 |
| 011011101 | 0011011101 | 1100100010 |
| 011011110 | 0011011110 | 1100100001 |
| 011100001 | 1100011110 | 0011100001 |
| 011100010 | 1100011101 | 0011100010 |
| 011100011 | 0011100011 | 0011100011 |
| 011100100 | 1100011011 | 0011100100 |
| 011100101 | 0011100101 | 0011100101 |
| 011100110 | 0011100110 | 0011100110 |
| 011100111 | 0011100111 | 1100011000 |
| 011101000 | 1100010111 | 0011101000 |
| 011101001 | 0011101001 | 0011101001 |
| 011101010 | 0011101010 | 0011101010 |
| 011101011 | 0011101011 | 1100010100 |
| 011101100 | 0011101100 | 0011101100 |
| 011101101 | 0011101101 | 1100010010 |
| 011101110 | 0011101110 | 1100010001 |
| 011101111 | 0011101111 | 1100010000 |
| 011110001 | 0011110001 | 0011110001 |
| 011110010 | 0011110010 | 0011110010 |
| 011110011 | 0011110011 | 1100001100 |
| 011110100 | 0011110100 | 0011110100 |
| 011110101 | 0011110101 | 1100001010 |
| 011110110 | 0011110110 | 1100001001 |
| 011110111 | 0011110111 | 1100001000 |
| 011111000 | 1101001010 | 1101001010 |
| 011111001 | 0011111001 | 1100000110 |
| 011111010 | 0011111010 | 1100000101 |
| 011111011 | 0011111011 | 1100000100 |
| 011111101 | 0011111101 | 1100000010 |
| 100000010 | 1011111101 | 0100000010 |
| 100000011 | 1011111100 | 0100000011 |
| 100000100 | 1011111011 | 0100000100 |
| 100000101 | 1011111010 | 0100000101 |
| 100000110 | 1011111001 | 0100000110 |
| 100000111 | 1011111000 | 0100000111 |
| 100001000 | 1011110111 | 0100001000 |
| 100001001 | 1011110110 | 0100001001 |
| 100001010 | 1011110101 | 0100001010 |
| 100001011 | 1011110100 | 0100001011 |
| 100001100 | 1011110011 | 0100001100 |
| 100001101 | 1011110010 | 0100001101 |
| 100001110 | 1011110001 | 0100001110 |
| 100010000 | 1011101111 | 0100010000 |
| 100010001 | 1011101110 | 0100010001 |
| 100010010 | 1011101101 | 0100010010 |
| 100010011 | 1011101100 | 0100010011 |
| 100010100 | 1011101011 | 0100010100 |
| 100010101 | 1011101010 | 0100010101 |
| 100010110 | 1011101001 | 0100010110 |
| 100010111 | 0100010111 | 0100010111 |
| 100011000 | 1011100111 | 0100011000 |
| 100011001 | 1011100110 | 0100011001 |
| 100011010 | 1011100101 | 0100011010 |
| 100011011 | 0100011011 | 0100011011 |
| 100011100 | 1011100011 | 0100011100 |
| 100011101 | 0100011101 | 0100011101 |
| 100011110 | 0100011110 | 0100011110 |
| 100100001 | 1011011110 | 0100100001 |
| 100100010 | 1011011101 | 0100100010 |
| 100100011 | 1011011100 | 0100100011 |

| Input Word | Code Word of Positive Codebook | Code Word of Negative Codebook |
|---|---|---|
| 100100100 | 1011011011 | 0100100100 |
| 100100101 | 1011011010 | 0100100101 |
| 100100110 | 1011011001 | 0100100110 |
| 100100111 | 0100100111 | 0100100111 |
| 100101000 | 1011010111 | 0100101000 |
| 100101001 | 1011010110 | 0100101001 |
| 100101010 | 1011010101 | 0100101010 |
| 100101011 | 0100101011 | 0100101011 |
| 100101100 | 1011010011 | 0100101100 |
| 100101101 | 0100101101 | 0100101101 |
| 100101110 | 0100101110 | 0100101110 |
| 100101111 | 0100101111 | 1011010000 |
| 100110000 | 1011001111 | 0100110000 |
| 100110001 | 1011001110 | 0100110001 |
| 100110010 | 1011001101 | 0100110010 |
| 100110011 | 0100110011 | 0100110011 |
| 100110100 | 1011001011 | 0100110100 |
| 100110101 | 0100110101 | 0100110101 |
| 100110110 | 0100110110 | 0100110110 |
| 100110111 | 0100110111 | 1011001000 |
| 100111000 | 1011000111 | 0100111000 |
| 100111001 | 0100111001 | 0100111001 |
| 100111010 | 0100111010 | 0100111010 |
| 100111011 | 0100111011 | 1011000100 |
| 100111100 | 0100111100 | 0100111100 |
| 100111101 | 0100111101 | 1011000010 |
| 100111110 | 0100111110 | 1011000001 |
| 100111111 | 1011001100 | 1011001100 |
| 101000000 | 1011000101 | 1011000101 |
| 101000001 | 1010111110 | 0101000001 |
| 101000010 | 1010111101 | 0101000010 |
| 101000011 | 1010111100 | 0101000011 |
| 101000100 | 1010111011 | 0101000100 |
| 101000101 | 1010111010 | 0101000101 |
| 101000110 | 1010111001 | 0101000110 |
| 101000111 | 0101000111 | 0101000111 |
| 101001000 | 1010110111 | 0101001000 |
| 101001001 | 1010110110 | 0101001001 |
| 101001010 | 1010110101 | 0101001010 |
| 101001011 | 0101001011 | 0101001011 |
| 101001100 | 1010110011 | 0101001100 |
| 101001101 | 0101001101 | 0101001101 |
| 101001110 | 0101001110 | 0101001110 |
| 101001111 | 0101001111 | 1010110000 |
| 101010000 | 1010101111 | 0101010000 |
| 101010001 | 1010101110 | 0101010001 |
| 101010010 | 1010101101 | 0101010010 |
| 101010011 | 0101010011 | 0101010011 |
| 101010100 | 1010101011 | 0101010100 |
| 101010101 | 0101010101 | 0101010101 |
| 101010110 | 0101010110 | 0101010110 |
| 101010111 | 0101010111 | 1010101000 |
| 101011000 | 1010100111 | 0101011000 |
| 101011001 | 0101011001 | 0101011001 |
| 101011010 | 0101011010 | 0101011010 |
| 101011011 | 0101011011 | 1010100100 |
| 101011100 | 0101011100 | 0101011100 |
| 101011101 | 0101011101 | 1010100010 |
| 101011110 | 0101011110 | 1010100001 |
| 101100001 | 1010011110 | 0101100001 |
| 101100010 | 1010011101 | 0101100010 |
| 101100011 | 0101100011 | 0101100011 |
| 101100100 | 1010011011 | 0101100100 |
| 101100101 | 0101100101 | 0101100101 |
| 101100110 | 0101100110 | 0101100110 |
| 101100111 | 0101100111 | 1010011000 |
| 101101000 | 1010010111 | 0101101000 |
| 101101001 | 0101101001 | 0101101001 |
| 101101010 | 0101101010 | 0101101010 |
| 101101011 | 0101101011 | 1010010100 |
| 101101100 | 0101101100 | 0101101100 |
| 101101101 | 0101101101 | 1010010010 |
| 101101110 | 0101101110 | 1010010001 |
| 101101111 | 0101101111 | 1010010000 |
| 101110000 | 1010001111 | 0101110000 |
| 101110001 | 0101110001 | 0101110001 |
| 101110010 | 0101110010 | 0101110010 |
| 101110011 | 0101110011 | 1010001100 |
| 101110100 | 0101110100 | 0101110100 |
| 101110101 | 0101110101 | 1010001010 |
| 101110110 | 0101110110 | 1010001001 |
| 101110111 | 0101110111 | 1010001000 |
| 101111000 | 0101111000 | 0101111000 |
| 101111001 | 0101111001 | 1010000110 |
| 101111010 | 0101111010 | 1010000101 |
| 101111011 | 0101111011 | 1010000100 |
| 101111100 | 0101111100 | 1010000011 |
| 101111101 | 0101111101 | 1010000010 |
| 101111110 | 0101111110 | 1010000001 |
| 110000001 | 1001111110 | 0110000001 |
| 110000010 | 1001111101 | 0110000010 |
| 110000011 | 1001111100 | 0110000011 |
| 110000100 | 1001111011 | 0110000100 |
| 110000101 | 1001111010 | 0110000101 |
| 110000110 | 1001111001 | 0110000110 |
| 110000111 | 0110000111 | 0110000111 |
| 110001000 | 1001110111 | 0110001000 |
| 110001001 | 1001110110 | 0110001001 |
| 110001010 | 1001110101 | 0110001010 |
| 110001011 | 0110001011 | 0110001011 |
| 110001100 | 1001110011 | 0110001100 |
| 110001101 | 0110001101 | 0110001101 |
| 110001110 | 0110001110 | 0110001110 |
| 110001111 | 0110001111 | 1001110000 |
| 110010000 | 1001101111 | 0110010000 |
| 110010001 | 1001101110 | 0110010001 |
| 110010010 | 1001101101 | 0110010010 |
| 110010011 | 0110010011 | 0110010011 |
| 110010100 | 1001101011 | 0110010100 |
| 110010101 | 0110010101 | 0110010101 |
| 110010110 | 0110010110 | 0110010110 |
| 110010111 | 0110010111 | 1001101000 |
| 110011000 | 1001100111 | 0110011000 |
| 110011001 | 0110011001 | 0110011001 |
| 110011010 | 0110011010 | 0110011010 |
| 110011011 | 0110011011 | 1001100100 |
| 110011100 | 0110011100 | 0110011100 |
| 110011101 | 0110011101 | 1001100010 |
| 110011110 | 0110011110 | 1001100001 |
| 110100001 | 1001011110 | 0110100001 |
| 110100010 | 1001011101 | 0110100010 |
| 110100011 | 0110100011 | 0110100011 |
| 110100100 | 1001011011 | 0110100100 |
| 110100101 | 0110100101 | 0110100101 |
| 110100110 | 0110100110 | 0110100110 |
| 110100111 | 0110100111 | 1001011000 |
| 110101000 | 1001010111 | 0110101000 |
| 110101001 | 0110101001 | 0110101001 |
| 110101010 | 0110101010 | 0110101010 |
| 110101011 | 0110101011 | 1001010100 |
| 110101100 | 0110101100 | 0110101100 |
| 110101101 | 0110101101 | 1001010010 |
| 110101110 | 0110101110 | 1001010001 |
| 110101111 | 0110101111 | 1001010000 |
| 110110000 | 1001001111 | 0110110000 |
| 110110001 | 0110110001 | 0110110001 |
| 110110010 | 0110110010 | 0110110010 |
| 110110011 | 0110110011 | 1001001100 |
| 110110100 | 0110110100 | 0110110100 |
| 110110101 | 0110110101 | 1001001010 |
| 110110110 | 0110110110 | 1001001001 |
| 110110111 | 0110110111 | 1001001000 |
| 110111000 | 0110111000 | 0110111000 |
| 110111001 | 0110111001 | 1001000110 |
| 110111010 | 0110111010 | 1001000101 |
| 110111011 | 0110111011 | 1001000100 |
| 110111100 | 0110111100 | 1001000011 |
| 110111101 | 0110111101 | 1001000010 |
| 110111110 | 0110111110 | 1001000001 |
| 111000001 | 1000111110 | 0111000001 |

-continued

| Input Word | Code Word of Positive Codebook | Code Word of Negative Codebook |
|---|---|---|
| 111000010 | 1000111101 | 0111000010 |
| 111000011 | 0111000011 | 0111000011 |
| 111000100 | 1000111011 | 0111000100 |
| 111000101 | 0111000101 | 0111000101 |
| 111000110 | 0111000110 | 0111000110 |
| 111000111 | 0111000111 | 1000111000 |
| 111001000 | 1000110111 | 0111001000 |
| 111001001 | 0111001001 | 0111001001 |
| 111001010 | 0111001010 | 0111001010 |
| 111001011 | 0111001011 | 1000110100 |
| 111001100 | 0111001100 | 0111001100 |
| 111001101 | 0111001101 | 1000110010 |
| 111001110 | 0111001110 | 1000110001 |
| 111001111 | 0111001111 | 1000110000 |
| 111010000 | 1000101111 | 0111010000 |
| 111010001 | 0111010001 | 0111010001 |
| 111010010 | 0111010010 | 0111010010 |
| 111010011 | 0111010011 | 1000101100 |
| 111010100 | 0111010100 | 0111010100 |
| 111010101 | 0111010101 | 1000101010 |
| 111010110 | 0111010110 | 1000101001 |
| 111010111 | 0111010111 | 1000101000 |
| 111011000 | 0111011000 | 0111011000 |
| 111011001 | 0111011001 | 1000100110 |
| 111011010 | 0111011010 | 1000100101 |
| 111011011 | 0111011011 | 1000100100 |
| 111011100 | 0111011100 | 1000100011 |
| 111011101 | 0111011101 | 1000100010 |
| 111011110 | 0111011110 | 1000100001 |
| 111100001 | 0111100001 | 0111100001 |
| 111100010 | 0111100010 | 0111100010 |
| 111100011 | 0111100011 | 1000011100 |
| 111100100 | 0111100100 | 0111100100 |
| 111100101 | 0111100101 | 1000011010 |
| 111100110 | 0111100110 | 1000011001 |
| 111100111 | 0111100111 | 1000011000 |
| 111101000 | 0111101000 | 0111101000 |
| 111101001 | 0111101001 | 1000010110 |
| 111101010 | 0111101010 | 1000010101 |
| 111101011 | 0111101011 | 1000010100 |
| 111101100 | 0111101100 | 1000010011 |
| 111101101 | 0111101101 | 1000010010 |
| 111101110 | 0111101110 | 1000010001 |
| 111101111 | 0111101111 | 1000010000 |
| 111110001 | 0111110001 | 1000001110 |
| 111110010 | 0111110010 | 1000001101 |
| 111110011 | 0111110011 | 1000001100 |
| 111110100 | 0111110100 | 1000001011 |
| 111110101 | 0111110101 | 1000001010 |
| 111110110 | 0111110110 | 1000001001 |
| 111110111 | 0111110111 | 1000001000 |
| 111111001 | 0111111001 | 1000000110 |
| 111111010 | 0111111010 | 1000000101 |
| 111111011 | 0111111011 | 1000000100, | and the secondary mapping is

| Input Word | Code word Of Positive Codebook | Code word Of Negative Codebook |
|---|---|---|
| 000000000 | 1001000111 | 1001000111 |
| 000000001 | 1000011110 | 1000011110 |
| 000000010 | 1000011101 | 1000011101 |
| 000000011 | 1100010110 | 1100010110 |
| 000000100 | 1000011011 | 1000011011 |
| 000000101 | 1100011010 | 1100011010 |
| 000000110 | 1100010101 | 1100010101 |
| 000000111 | 1100100110 | 1100100110 |
| 000001000 | 1000010111 | 1000010111 |
| 000001001 | 1110000110 | 1110000110 |
| 000001010 | 1110000101 | 1110000101 |
| 000001011 | 1100101010 | 1100101010 |
| 000001100 | 1100100011 | 1100100011 |
| 000001101 | 1100101100 | 1100101100 |
| 000001110 | 1100100101 | 1100100101 |
| 000001111 | 1100110010 | 1100110010 |
| 000010000 | 1000101011 | 1000101011 |
| 000010001 | 1100001110 | 1100001110 |
| 000010010 | 1100001101 | 1100001101 |
| 000010011 | 1100110100 | 1100110100 |
| 000010100 | 1100001011 | 1100001011 |
| 000010101 | 1101010010 | 1101010010 |
| 000010110 | 1100101001 | 1100101001 |
| 000010111 | 1101010100 | 1101010100 |
| 000011000 | 1001001011 | 1001001011 |
| 000011001 | 1101011000 | 1101011000 |
| 000011010 | 1100110001 | 1100110001 |
| 000011011 | 1101100010 | 1101100010 |
| 000011100 | 1001010011 | 1001010011 |
| 000011101 | 1101101000 | 1101101000 |
| 000011110 | 1000101101 | 1000101101 |
| 000011111 | 1000101110 | 1000101110 |
| 000100000 | 1001100011 | 1001100011 |
| 000100001 | 1000110110 | 1000110110 |
| 000100010 | 1000110101 | 1000110101 |
| 000100011 | 1001001110 | 1001001110 |
| 000100100 | 1010001011 | 1010001011 |
| 000100101 | 1001010110 | 1001010110 |
| 000100110 | 1001001101 | 1001001101 |
| 000100111 | 1001011010 | 1001011010 |
| 000101000 | 1010010011 | 1010010011 |
| 000101001 | 1001100110 | 1001100110 |
| 000101010 | 1001010101 | 1001010101 |
| 000101011 | 1001101010 | 1001101010 |
| 000101100 | 1010100011 | 1010100011 |
| 000101101 | 1001110010 | 1001110010 |
| 000101110 | 1001011001 | 1001011001 |
| 000101111 | 1001110100 | 1001110100 |
| 000110000 | 1001100101 | 1001100101 |
| 000110001 | 1010001110 | 1010001110 |
| 000110010 | 1001101001 | 1001101001 |
| 000110011 | 1010010110 | 1010010110 |
| 000110100 | 1001110001 | 1001110001 |
| 000110101 | 1010011010 | 1010011010 |
| 000110110 | 1010001101 | 1010001101 |
| 000110111 | 1010100110 | 1010100110 |
| 000111000 | 1010010101 | 1010010101 |
| 000111001 | 1010101010 | 1010101010 |
| 000111010 | 1010011001 | 1010011001 |
| 000111011 | 1010101100 | 1010101100 |
| 000111100 | 1010100101 | 1010100101 |
| 000111101 | 1010110010 | 1010110010 |
| 000111110 | 1010101001 | 1010101001 |
| 000111111 | 1010110100 | 1010110100 |
| 001000000 | 1110100001 | 1110100001 |
| 001001111 | 1110100010 | 1110100010 |
| 001011111 | 1110100100 | 1110100100 |
| 001100000 | 1110010001 | 1110010001 |
| 001101111 | 1110010100 | 1110010100 |
| 001110000 | 1110101000 | 1110101000 |
| 001110111 | 1110001100 | 1110001100 |
| 001111000 | 1010110001 | 1010110001 |
| 001111011 | 1110010010 | 1110010010 |
| 001111100 | 1011011000 | 1011011000 |
| 001111101 | 1110001010 | 1110001010 |
| 001111110 | 1110001001 | 1110001001 |
| 001111111 | 1110011000 | 1110011000 |
| 010000000 | 1101000011 | 1101000011 |
| 010001111 | 1101100001 | 1101100001 |
| 010011111 | 1101100100 | 1101100100 |
| 010100000 | 1101000101 | 1101000101 |
| 010111111 | 1101001100 | 1101001100 |
| 011000000 | 1101001001 | 1101001001 |
| 011011111 | 1100111000 | 1100111000 |
| 011100000 | 1101010001 | 1101010001 |

-continued

| Input Word | Code word Of Positive Codebook | Code word Of Negative Codebook |
|---|---|---|
| 011110000 | 1101000110 | 1101000110 |
| 011111000 | 1101001010 | 1101001010 |
| 011111100 | 1100010011 | 1100010011 |
| 011111110 | 1100011001 | 1100011001 |
| 011111111 | 1100011100 | 1100011100 |
| 100000000 | 1010000111 | 1010000111 |
| 100000001 | 1011100001 | 1011100001 |
| 100001111 | 1011100010 | 1011100010 |
| 100011111 | 1011100100 | 1011100100 |
| 100100000 | 1011000011 | 1011000011 |
| 100111111 | 1011001100 | 1011001100 |
| 101000000 | 1011000101 | 1011000101 |
| 101011111 | 1010111000 | 1010111000 |
| 101100000 | 1011001001 | 1011001001 |
| 101111111 | 1010011100 | 1010011100 |
| 110000000 | 1011010001 | 1011010001 |
| 110011111 | 1001111000 | 1001111000 |
| 110100000 | 1011000110 | 1011000110 |
| 110111111 | 1000111100 | 1000111100 |
| 111000000 | 1011001010 | 1011001010 |
| 111011111 | 1001011100 | 1001011100 |
| 111100000 | 1011010010 | 1011010010 |
| 111110000 | 1011010100 | 1011010100 |
| 111111000 | 1000100111 | 1000100111 |
| 111111100 | 1000110011 | 1000110011 |
| 111111101 | 1000111010 | 1000111010 |
| 111111110 | 1000111001 | 1000111001 |
| 111111111 | 1001101100 | 1001101100, | said method including the steps of:

employing first circuitry to generate one of the code words of the positive codebook in response to each of the input words that belongs to the second subset of the data word set when the accumulated disparity of the previously generated code words of the code word sequence satisfies a first criterion, and employing the first circuitry to generate one of the code words of the negative codebook in response to said each of the input words that belongs to the second subset of the data word set when the accumulated disparity of the previously generated code words of the code word sequence does not satisfy the first criterion; and employing logic circuitry to generate one of the code words of the positive codebook in response to each of the input words that belongs to the first subset of the data word set when the accumulated disparity of the previously generated code words of the code word sequence satisfies the first criterion, and employing the logic circuitry to generate one of the code words of the negative codebook in response to each of the input words that belongs to the first subset of the data word set when the accumulated disparity of the previously generated code words of the code word sequence does not satisfy the first criterion.

58. A method for encoding data, including the steps of:
(a) determining a bijective mapping between a set of $2^N$ N-bit data words and a set of (N+1)-bit code words;
(b) encoding a sequence of N-bit input words of the data in accordance with the bijective mapping to generate a code word sequence of (N+1)-bit code words by asserting each of the input words to logic circuitry, thereby causing the logic circuitry to generate one of the code words in response to each of the input words.

59. The method of claim 58, wherein step (a) includes the step of:
determining at least one positive codebook and a negative codebook such that the positive codebook specifies a bijective mapping between the data words and a set of $2^N$ (N+1)-bit code words, $f_p(x)$, where x is any of the data words, and the negative codebook specifies a bijective mapping between the data words and a set of $2^N$ (N+1)-bit code words, $f_n(x)$.

60. The method of claim 59, where $f_n(x)=f_p(x)^C$ for each of the data words, x, with $f_p(x)^C$ denoting the complement of $f_p(x)$.

61. The method of claim 59, where $f_n(x)=f_p(x)^C$ for each of the data words, x, for which $f_p(x)$ has positive disparity, with $f_p(x)^C$ denoting the complement of $f_p(x)$, and $f_n(x)=f_p(x)$ for each of the data words, x, for which $f_p(x)$ has zero disparity.

62. The method of claim 58, wherein N is an odd integer.

63. A method for determining codebooks for use in encoding data according to an NB/(N+1)B block code, including the steps of:
(a) determining a positive codebook that specifies a bijective mapping between a set of N-bit words, x, consisting of a first subset and a second subset of said words, and a set of (N+1)-bit code words, $f_p(x)$, by determining candidate code words and selecting a subset of the candidate code words as the code words, $f_p(x)$; and
(b) determining a negative codebook that specifies a bijective mapping between the set of words, x, and a set of (N+1)-bit code words, $f_n(x)$,
wherein the first subset includes more of said words, x, than does the second subset, the positive codebook specifies a primary mapping of each of the words in the first subset to a different one of the code words, $f_p(x)$, and a secondary mapping of each of the words in the second subset to a different one of the code words, $f_p(x)$, and said primary mapping is implementable by logic circuitry.

64. The method of claim 63, where $f_n(x)=f_p(x)^C$ for each of the words, x, with $f_p(x)^C$ denoting the complement of $f_p(x)$.

65. The method of claim 63, where $f_n(x)=f_p(x)^C$ for each of the words, x, for which $f_p(x)$ has positive disparity, with $f_p(x)^C$ denoting the complement of $f_p(x)$, and $f_n(x)=f_p(x)$ for each of the words, x, for which $f_p(x)$ has zero disparity.

66. The method of claim 63, wherein N is an odd integer.

67. The method of claim 63, wherein N=7, and the first subset includes at least 98 of the words, x.

68. The method of claim 67, wherein the first subset includes 98 of the words, x, and wherein each of the code words, $f_p(x)$, that has non-negative disparity and to which the primary mapping maps a member, x, of the first subset, consists of the bit sequence (0,x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

69. The method of claim 63, wherein N=9, and the first subset includes at least 408 of the words, x.

70. The method of claim 69, wherein the first subset includes 408 of the words, x, and wherein each of the code words, $f_p(x)$, that has non-negative disparity and to which the primary mapping maps a member, x, of the first subset, consists of the bit sequence (0,x) if said bit sequence (0,x) has non-negative disparity, and consists of the bit sequence $(0,x)^C$ if said bit sequence (0,x) has negative disparity, where (0,x) denotes said member of the first subset concatenated with a zero bit, and $(0,x)^C$ denotes the complement of (0,x).

71. A method for decoding code words that have been encoded in accordance with an NB/(N+1)B block code that maps a set of $2^N$ N-bit data words to a set of (N+1)-bit words using a positive codebook and a negative codebook, the positive codebook specifying a bijective mapping between the set of data words and a set of $2^N$ (N+1)-bit words, $f_p(x)$, where x is any of the data words, and the negative codebook specifying a bijective mapping between the set of data words and a set of $2^N$ (N+1)-bit words, $f_n(x)$, where the data words consist of a first data word subset and a second data word subset, the first data word subset includes more of the data words than does the second data word subset, and the block code specifies a secondary mapping of each data word of the second data word subset to a different one of the words, $f_p(x)$, and a primary mapping of each data word of the first data word subset to a different one of the words, $f_p(x)$, said method including the steps of:

(a) monitoring accumulated disparity of a sequence of the code words;

(b) while performing step (a), in response to each of the code words, applying said each of the code words to table lookup circuitry if the accumulated disparity satisfies a first criterion to cause the table lookup circuitry to apply an inverse of the secondary mapping to generate a first decoded word in response to each of the code words that is an encoded version of a data word of the second data word subset, and applying the complement of said each of the code words to the table lookup circuitry if the accumulated disparity does not satisfy the first criterion to cause the table lookup circuitry to apply the inverse of the secondary mapping to generate a second decoded word in response to each of the code words whose complement is an encoded version of a data word of the second data word subset;

(c) while performing step (a), applying an inverse of the primary mapping to each of the code words to generate a third decoded word, and generating the complement of the third decoded word;

(d) selecting the first decoded word as a decoded version of said each of the code words if the table lookup circuitry generates the first decoded word in response to said each of the code words, selecting the second decoded word as a decoded version of said each of the code words if the table lookup circuitry generates the second decoded word in response to said each of the code words, and otherwise selecting the third decoded word as a decoded version of said each of the code words if said each of the code words satisfies a second criterion or the complement of the third decoded word as a decoded version of said each of the code words if said each of the code words does not satisfy the second criterion.

72. The method of claim 71, where $f_n(x)=f_p(x)^C$ for each of the data words, x, with $f_p(x)^C$ denoting the complement of $f_p(x)$.

73. The method of claim 71, where $f_n(x)=f_p(x)^C$ for each of the data words, x, for which $f_p(x)$ has positive disparity, with $f_p(x)^C$ denoting the complement of $f_p(x)$, and $f_n(x)=f_p(x)$ for each of the data words, x, for which $f_p(x)$ has zero disparity.

74. The method of claim 71, wherein N is an odd integer.

75. The method of claim 71, wherein step (c) includes the step of generating the third decoded word by systematically removing a bit from said each of the code words.

76. A method for decoding code words that have been encoded in accordance with an NB/(N+1)B block code that maps a set of $2^N$ N-bit data words to a set of (N+1)-bit words, where the data words consist of a first data word subset and a second data word subset, the first data word subset includes more of the data words than does the second data word subset, and the block code specifies a primary mapping of each data word of the first data word subset to a first subset of the set of (N+1)bit words and a secondary mapping of each data word of the second data word subset to a second subset of the set of (N+1)bit words, said method including the steps of:

(a) monitoring accumulated disparity of a sequence of the code words;

(b) while performing step (a), in response to each of the code words, applying said each of the code words to table lookup circuitry if the accumulated disparity satisfies a first criterion to cause the table lookup circuitry to apply an inverse of the secondary mapping to generate a first decoded word in response to each of the code words that is an encoded version of a data word of the second data word subset, and applying the complement of said each of the code words to the table lookup circuitry if the accumulated disparity does not satisfy the first criterion to cause the table lookup circuitry to apply the inverse of the secondary mapping to generate a second decoded word in response to each of the code words whose complement is an encoded version of a data word of the second data word subset;

(c) while performing step (a), applying an inverse of the primary mapping to each of the code words to generate a third decoded word, and generating the complement of the third decoded word;

(d) selecting the first decoded word as a decoded version of said each of the code words if the table lookup circuitry generates the first decoded word in response to said each of the code words, selecting the second decoded word as a decoded version of said each of the code words if the table lookup circuitry generates the second decoded word in response to said each of the code words, and otherwise selecting the third decoded word as a decoded version of said each of the code words if said each of the code words satisfies a second criterion or the complement of the third decoded word as a decoded version of said each of the code words if said each of the code words does not satisfy the second criterion.

77. The method of claim 76, wherein N is an odd integer.

78. The method of claim 76, wherein step (c) includes the step of generating the third decoded word by systematically removing a bit from said each of the code words.

79. A circuit for encoding a sequence of N-bit input words in accordance with an NB/(N+1)B block code to generate a code word sequence of (N+1)-bit code words, wherein each of the input words belongs to one of a first subset and a second subset of a data word set, the first subset of the data word set includes more of the data words than does the second subset of the data word set, said circuit including:

logic circuitry coupled and configured to generate one of the code words in response to each of the input words that belongs to the first subset of the data word set; and additional circuitry coupled and configured to generate one of the code words in response to each of the input words that belongs to the second subset of the data word set.

80. The circuit of claim 79, wherein the additional circuitry includes table lookup circuitry coupled to receive each of the input words.

81. The circuit of claim 79, wherein the logic circuitry includes:

first circuitry coupled to receive each of the input words and configured to generate an output word in response to said each of the input words by concatenating a bit of predetermined value with said each of the input words.

82. The circuit of claim 81, also including:
a disparity calculation circuit coupled to receive each of the input words and configured to generate a disparity signal indicative of the accumulated disparity of the code words generated by logic circuitry and the additional circuitry, and wherein the logic circuitry also includes:
code word selection circuitry, coupled to the first circuitry and configured to generate the complement of each output word generated by the first circuitry and to select one of the output word and the complement of said output word in response to the disparity signal.

83. The circuit of claim 79, wherein the logic circuitry includes:
first circuitry coupled to receive each of the input words and configured to generate an output word in response to said each of the input words by inserting a bit of predetermined value in a predetermined position among the bits of said each of the input words.

84. The circuit of claim 83, also including:
a disparity calculation circuit coupled to receive each of the input words and configured to generate a disparity signal indicative of the accumulated disparity of the code words generated by logic circuitry and the additional circuitry, and wherein the logic circuitry also includes:
code word selection circuitry, coupled to the first circuitry and configured to generate the complement of each output word generated by the first circuitry and to select one of the output word and the complement of said output word in response to the disparity signal.

85. The circuit of claim 84, wherein the additional circuitry includes:
table lookup circuitry having an input and an output, wherein the input is coupled to receive each of the input words and the table lookup circuitry is configured to assert at the output a valid output value in response to each of the input words that belongs to the second subset of the data word set; and
additional code word selection circuitry, coupled to the table lookup circuitry and configured to generate the complement of each valid output value generated by the table lookup circuitry and to select one of the valid output value and the complement of said valid output value in response to the disparity signal.

86. The circuit of claim 84, wherein N is an odd integer.

87. A circuit for encoding a sequence of N-bit input words in accordance with an NB/(N+1)B block code to generate a code word sequence of (N+1)bit code words, wherein the code words belong to a positive codebook and a negative codebook, the positive codebook specifies a bijective mapping between a data word set of $2^N$ N-bit data words and a set of (N+1)-bit code words, $f_p(x)$, where x is any data word of the data word set, the negative codebook specifies a bijective mapping between the data word set and a set of (N+1)-bit code words, $f_n(x)$, where each of the input words belongs to one of a first subset and a second subset of the data word set, and the first subset of the data word set includes more of the data words than does the second subset of the data word set, said circuit including:
logic circuitry coupled and configured to generate one of the code words in response to each of the input words that belongs to the first subset of the data word set;
additional circuitry coupled and configured to generate one of the code words in response to each of the input words that belongs to the second subset of the data word set; and
a disparity calculation circuit coupled to receive each of the input words and configured to generate a disparity signal indicative of the accumulated disparity of the code words generated by the logic circuitry and the additional circuitry,
wherein the logic circuitry is coupled to receive the disparity signal, and configured to generate one of the code words, $f_p(x)$, in response to one of the input words that belongs to the first subset of the data word set when the disparity signal indicates that the accumulated disparity of the previously generated code words of the code word sequence satisfies a first criterion, and to generate one of the code words, $f_n(x)$, in response to one of the input words that belongs to the first subset of the data word set when the disparity signal indicates that the accumulated disparity of the previously generated code words of the code word sequence does not satisfy the first criterion, and
wherein the additional circuitry is coupled to receive the disparity signal, and configured to generate one of the code words, $f_p(x)$, in response to one of the input words that belongs to second subset of the data word set when the disparity signal indicates that the accumulated disparity of the previously generated code words of the code word sequence satisfies the first criterion, and to generate one of the code words, $f_n(x)$, in response to one of the input words that belongs to the second subset of the data word set when the disparity signal indicates that the accumulated disparity of the previously generated code words of the code word sequence does not satisfy the first criterion.

88. The circuit of claim 87, where $f_n(x)=f_p(x)^C$ for each said data word, x, with $f_p(x)^C$ denoting the complement of $f_p(x)$.

89. The circuit of claim 87, where $f_n(x)=f_p(x)^C$ for each said data word, x, for which $f_p(x)$ has positive disparity, with $f_p(x)^C$ denoting the complement of $f_p(x)$, and $f_n(x)=f_p(x)$ for each said data word, x, for which $f_p(x)$ has zero disparity.

90. The circuit of claim 87, wherein N is an odd integer.

91. A circuit for decoding a sequence of (N+1)-bit code words that have been encoded in accordance with an NB/(N+1)B block code that maps a set of $2^N$ N-bit data words to a set of (N+1)-bit words, where the data words consist of a first data word subset and a second data word subset, the first data word subset includes more of the data words than does the second data word subset, and the block code specifies a secondary mapping of each data word of the second data word subset to a different one of the (N+1)-bit words, and a primary mapping of each data word of the first data word subset to a different one of the (N+1)-bit words, said circuit including:
a disparity calculation circuit coupled to receive each of the code words and configured to generate a disparity signal indicative of the accumulated disparity of said code words;
logic circuitry coupled to the disparity calculation circuit and configured to apply an inverse of the primary mapping to each of the code words to generate a first decoded word, and to generate the complement of the first decoded word in response to each of the code words that is an encoded version of a data word that belongs to the first subset of the data word set; and additional circuitry, including table lookup circuitry and code word selection circuitry, the code word selection circuitry being coupled to the disparity calculation circuit and configured to apply each of the code words to the table lookup circuitry if the disparity signal indicates that the accumulated disparity satisfies a first criterion to cause the table lookup circuitry to apply an inverse of the secondary mapping to generate a second decoded word in response to each of the code words that is an encoded version of a data word of the second data word subset, and to apply the complement of each of the code words to the table lookup circuitry if the disparity signal indicates that the accumulated disparity does not satisfy the first criterion to cause the table lookup circuitry to apply the inverse of the secondary mapping to generate a third decoded word in response to each of the code words whose complement is an encoded version of a data word of the second data word subset; and selection circuitry coupled to the logic circuitry and the additional circuitry and configured to select the second decoded word as a decoded version of said each of the code words if the table lookup circuitry generates the second decoded word in response to said each of the code words, to select the third decoded word as a decoded version of said each of the code words if the table lookup circuitry generates the third decoded word in response to said each of the code words, and otherwise to select the first decoded word as a decoded version of said each of the code words if said each of the code words satisfies a second criterion or the complement of the first decoded word as a decoded version of said each of the code words if said each of the code words does not satisfy the second criterion.

92. The circuit of claim 91, wherein the logic circuitry includes:

first circuitry coupled to receive each of the code words and configured to generate an output word in response to said each of the code words by systematically removing a bit from said each of the code words.

93. The circuit of claim 91, wherein N is an odd integer.

* * * * *

UNITED STATES PATENT AND TRADEMARK OFFICE
CERTIFICATE OF CORRECTION

PATENT NO. : 6,747,580 B1
DATED : June 8, 2004
INVENTOR(S) : Brian K. Schmidt

It is certified that error appears in the above-identified patent and that said Letters Patent is hereby corrected as shown below:

Column 52,
Line 52, "Of" should be -- of --.

Column 55,
Line 59, "Of $2^N$ (N+)" should be -- of $2^N$ (N+1) --.

Column 56,
Line 22, "$f_{p(x)}{}^C$" should be -- $f_p(x)^C$ --.

Column 58,
Line 61, "$29^9$-bit" should be -- $2^9$ 9-bit --.

Column 66,
Line 37, "$2_9$9-bit" should be -- $2^9$ 9-bit --.

Column 74,
Line 13, "$2^7$7-bit" should be -- $2^7$ 7-bit --.

Column 76,
Line 49, "$2^7$7-bit" should be -- $2^7$ 7-bit --.

Column 79,
Line 18, "$2^9$9-bit" should be -- $2^9$ 9-bit --.

Column 86,
Line 61, "$2^9$9-bit" should be -- $2^9$ 9-bit --.

UNITED STATES PATENT AND TRADEMARK OFFICE
CERTIFICATE OF CORRECTION

PATENT NO. : 6,747,580 B1
DATED : June 8, 2004
INVENTOR(S) : Brian K. Schmidt

It is certified that error appears in the above-identified patent and that said Letters Patent is hereby corrected as shown below:

<u>Column 94,</u>
Line 37, "$2^9$9-bit" should be -- $2^9$ 9-bit --.

<u>Column 102,</u>
Line 13, "$2^9$9-bit" should be -- $2^9$ 9-bit --.

Signed and Sealed this

Fourth Day of October, 2005

JON W. DUDAS
*Director of the United States Patent and Trademark Office*